(12) United States Patent
Chan et al.

(10) Patent No.: US 12,464,802 B2
(45) Date of Patent: Nov. 4, 2025

(54) MANUFACTURABLE GALLIUM AND NITROGEN CONTAINING SINGLE FREQUENCY LASER DIODE

(71) Applicant: KYOCERA SLD Laser, Inc., Goleta, CA (US)

(72) Inventors: Philip Chan, Santa Barbara, CA (US); Phillip Skahan, Santa Barbara, CA (US); Nick Pfister, Goleta, CA (US); Christian Zollner, Santa Barbara, CA (US); James W. Raring, Santa Barbara, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 560 days.

(21) Appl. No.: 17/849,848

(22) Filed: Jun. 27, 2022

(65) Prior Publication Data
US 2022/0344476 A1    Oct. 27, 2022

Related U.S. Application Data

(63) Continuation-in-part of application No. 17/078,389, filed on Oct. 23, 2020, now Pat. No. 11,955,521, (Continued)

(51) Int. Cl.
*H10D 84/01*    (2025.01)
*H01L 21/02*    (2006.01)
(Continued)

(52) U.S. Cl.
CPC ....... *H10D 84/01* (2025.01); *H01L 21/02458* (2013.01); *H01L 21/311* (2013.01);
(Continued)

(58) Field of Classification Search
CPC ............ H01L 21/02458; H01L 21/311; H01L 21/6835; H01L 21/7806; H01L 24/95;
(Continued)

(56) References Cited

U.S. PATENT DOCUMENTS 9,362,715 B2    6/2016 Sztein et al.
9,379,525 B2    6/2016 McLaurin et al.
(Continued)

OTHER PUBLICATIONS

U.S. Appl. No. 14/312,427 , "Restriction Requirement", May 18, 2015, 7 pages.
(Continued)

*Primary Examiner* — Scott B Geyer
(74) *Attorney, Agent, or Firm* — Kilpatrick Townsend & Stockton LLP

(57) ABSTRACT

A method for manufacturing an optical device includes providing a carrier waver, provide a first substrate having a first surface region, and forming a first gallium and nitrogen containing epitaxial material overlying the first surface region. The first epitaxial material includes a first release material overlying the first substrate. The method also includes patterning the first epitaxial material to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; and forming an optical waveguide in each of the mesa regions, the optical waveguide configured as a cavity to form a laser diode of the electromagnetic radiation.

25 Claims, 100 Drawing Sheets

Die Expanded Laser Diode

Epitaxial Wafer Before Die Expansion

Pitch 1 - Epitaxial Wafer Die Pitch

Die Expanded Laser Diode:

Pitch 2 - Carrier Wafer Die Pitch

Related U.S. Application Data which is a continuation of application No. 16/835,082, filed on Mar. 30, 2020, now Pat. No. 10,854,778, which is a continuation of application No. 16/796,154, filed on Feb. 20, 2020, now Pat. No. 10,854,776, which is a continuation of application No. 16/005,255, filed on Jun. 11, 2018, now Pat. No. 10,629,689, which is a continuation of application No. 15/480,239, filed on Apr. 5, 2017, now Pat. No. 10,002,928, which is a continuation of application No. 15/209,309, filed on Jul. 13, 2016, now Pat. No. 9,653,642, which is a continuation-in-part of application No. 14/580,693, filed on Dec. 23, 2014, now Pat. No. 9,666,677.

(51) Int. Cl.
| | |
|---|---|
| H01L 21/311 | (2006.01) |
| H01S 5/02 | (2006.01) |
| H01S 5/227 | (2006.01) |
| H01S 5/343 | (2006.01) |
| H10D 8/01 | (2025.01) |
| H10D 10/01 | (2025.01) |
| H10D 30/01 | (2025.01) |
| H10D 62/824 | (2025.01) |
| H10D 84/00 | (2025.01) |
| H10D 84/05 | (2025.01) |
| H10D 84/80 | (2025.01) |
| H10D 84/83 | (2025.01) |
| H10D 86/01 | (2025.01) |
| H10D 86/40 | (2025.01) |
| H10D 86/60 | (2025.01) |
| H10H 20/01 | (2025.01) |
| H10H 20/811 | (2025.01) |
| H10H 20/812 | (2025.01) |
| H10H 20/824 | (2025.01) |
| H10H 20/825 | (2025.01) |
| H10H 29/10 | (2025.01) |
| H10D 8/00 | (2025.01) |
| H10D 8/60 | (2025.01) |
| H10D 30/47 | (2025.01) |
| H10D 62/17 | (2025.01) |
| H10D 62/85 | (2025.01) |
| H10D 64/27 | (2025.01) |
| H10D 64/60 | (2025.01) |
| H10D 84/08 | (2025.01) |
| H10D 84/82 | (2025.01) |

(52) U.S. Cl.
CPC .......... *H01S 5/0203* (2013.01); *H01S 5/0217* (2013.01); *H01S 5/227* (2013.01); *H01S 5/34333* (2013.01); *H10D 8/045* (2025.01); *H10D 8/051* (2025.01); *H10D 10/021* (2025.01); *H10D 30/015* (2025.01); *H10D 30/0516* (2025.01); *H10D 62/824* (2025.01); *H10D 84/05* (2025.01); *H10D 84/204* (2025.01); *H10D 84/811* (2025.01); *H10D 84/83* (2025.01); *H10D 86/021* (2025.01); *H10D 86/481* (2025.01); *H10D 86/60* (2025.01); *H10H 20/0133* (2025.01); *H10H 20/01335* (2025.01); *H10H 20/0137* (2025.01); *H10H 20/018* (2025.01); *H10H 20/811* (2025.01); *H10H 20/812* (2025.01); *H10H 20/824* (2025.01); *H10H 20/825* (2025.01); *H10H 29/10* (2025.01); H01L 2224/95 (2013.01); H01L 2924/12032 (2013.01); H01L 2924/12041 (2013.01); H01L 2924/1305 (2013.01); H01L 2924/13055 (2013.01); H01L 2924/13062 (2013.01); H01L 2924/13064 (2013.01); H01L 2924/13091 (2013.01); *H10D 8/422* (2025.01); *H10D 8/60* (2025.01); *H10D 30/475* (2025.01); *H10D 62/343* (2025.01); *H10D 62/8503* (2025.01); *H10D 64/513* (2025.01); *H10D 64/602* (2025.01); *H10D 84/08* (2025.01); *H10D 84/82* (2025.01)

(58) Field of Classification Search
CPC ......... H01L 24/05; H01L 24/16; H01L 24/19; H01L 24/20; H01L 24/29; H01L 24/32; H01L 24/73; H01L 24/81; H01L 24/83; H01L 25/167; H10H 20/0133; H10H 20/01335; H10H 20/0137; H10H 20/018; H10H 20/811; H10H 20/812; H10H 20/824; H10H 20/825; H10H 29/10; H01S 5/0203; H01S 5/0217; H01S 5/227; H01S 5/34333; H01S 5/0216; H01S 5/1231; H01S 5/0201; H01S 5/0234; H01S 5/0265; H01S 5/0287; H01S 5/06256; H01S 5/1085; H01S 5/1203; H01S 5/185; H01S 5/187; H01S 5/320225; H01S 5/32341; H01S 2301/173; H01S 5/04256; H01S 5/22

See application file for complete search history.

(56) References Cited

U.S. PATENT DOCUMENTS

| | | | |
|---|---|---|---|
| 9,653,642 B1 | 5/2017 | Raring et al. | |
| 9,666,677 B1 | 5/2017 | Raring et al. | |
| 10,002,928 B1 | 6/2018 | Raring et al. | |
| 10,367,334 B2 | 7/2019 | McLaurin et al. | |
| 10,629,689 B1 | 4/2020 | Raring et al. | |
| 10,854,776 B1 | 12/2020 | Raring et al. | |
| 10,854,778 B1 | 12/2020 | Raring et al. | |
| 10,903,625 B2 | 1/2021 | McLaurin et al. | |
| 11,387,629 B1 | 7/2022 | Raring et al. | |
| 2002/0097962 A1 | 7/2002 | Yoshimura et al. | |
| 2004/0209402 A1 | 10/2004 | Chai et al. | |
| 2005/0158896 A1 | 7/2005 | Hayashi et al. | |
| 2008/0219309 A1 | 9/2008 | Hata et al. | |
| 2010/0317132 A1* | 12/2010 | Rogers | H01L 25/50 257/E33.059 |
| 2011/0064102 A1 | 3/2011 | Raring et al. | |
| 2011/0204376 A1 | 8/2011 | Su et al. | |
| 2012/0187412 A1* | 7/2012 | D'Evelyn | H01L 24/83 257/E29.089 |
| 2013/0214284 A1 | 8/2013 | Holder et al. | |
| 2013/0313516 A1 | 11/2013 | David et al. | |
| 2014/0023102 A1 | 1/2014 | Holder et al. | |
| 2015/0140710 A1 | 5/2015 | McLaurin et al. | |
| 2015/0229107 A1 | 8/2015 | McLaurin et al. | |
| 2016/0294162 A1 | 10/2016 | McLaurin et al. | |
| 2017/0229612 A1* | 8/2017 | Shatalov | H10H 20/821 |
| 2021/0226421 A1 | 7/2021 | McLaurin et al. | |
| 2022/0344476 A1 | 10/2022 | Chan et al. | |
| 2023/0178611 A1 | 6/2023 | Raring et al. | |

OTHER PUBLICATIONS

U.S. Appl. No. 14/312,427, "Non-Final Office Action", Aug. 21, 2015, 13 pages.

U.S. Appl. No. 14/312,427, "Final Office Action", Dec. 16, 2015, 18 pages.

U.S. Appl. No. 14/312,427, "Notice of Allowance", Mar. 4, 2016, 8 pages.

U.S. Appl. No. 15/176,076, "Restriction Requirement", Dec. 30, 2016, 4 pages.

U.S. Appl. No. 15/176,076, "Non-Final Office Action", Jun. 6, 2017, 14 pages.

(56) References Cited

OTHER PUBLICATIONS

U.S. Appl. No. 15/176,076 , "Non-Final Office Action", Apr. 30, 2018, 10 pages.
U.S. Appl. No. 15/176,076 , "Notice of Allowance", Mar. 6, 2019, 7 pages.
U.S. Appl. No. 15/176,076 , "Final Office Action", Dec. 8, 2017, 12 pages.
U.S. Appl. No. 16/835,082 Non-Final Office Action mailed Jul. 9, 2020, 11 pages.
U.S. Appl. No. 16/835,082 Notice of Allowance mailed Jul. 31, 2020, 5 pages.
U.S. Appl. No. 17/897,765 Non-Final Office Action mailed Aug. 23, 2023, 8 pages.
U.S. Appl. No. 16/903,188 Non-Final Office Action mailed Oct. 1, 2021, 9 pages.
U.S. Appl. No. 16/903,188 Notice of Allowance mailed Feb. 24, 2022, 7 pages.
U.S. Appl. No. 17/143,912 Non-Final Office Action mailed May 6, 2022, 8 pages.
U.S. Appl. No. 17/143,912 Notice of Allowance mailed Sep. 12, 2022, 9 pages.
U.S. Appl. No. 16/844,299 Notice of Allowance mailed Jun. 11, 2021, 10 pages.
U.S. Appl. No. 16/844,299 Non-Final Office Action mailed Mar. 3, 2021, 10 pages.
U.S. Appl. No. 16/876,569 Notice of Allowance mailed Apr. 9, 2021, 9 pages.
U.S. Appl. No. 16/876,569 Non-Final Office Action mailed Dec. 21, 2020, 8 pages.

* cited by examiner

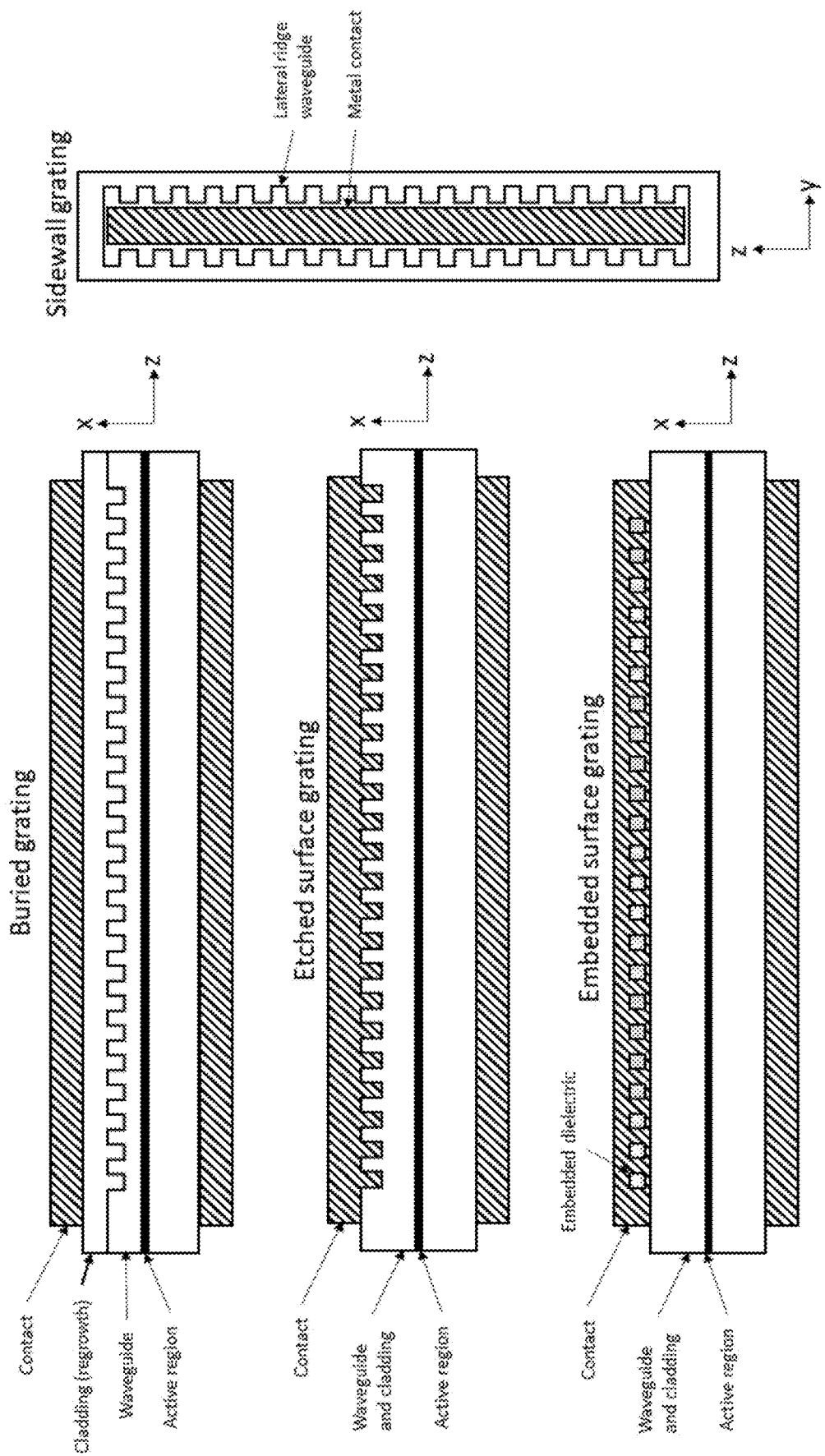
Figure 1: Various Types of Gratings

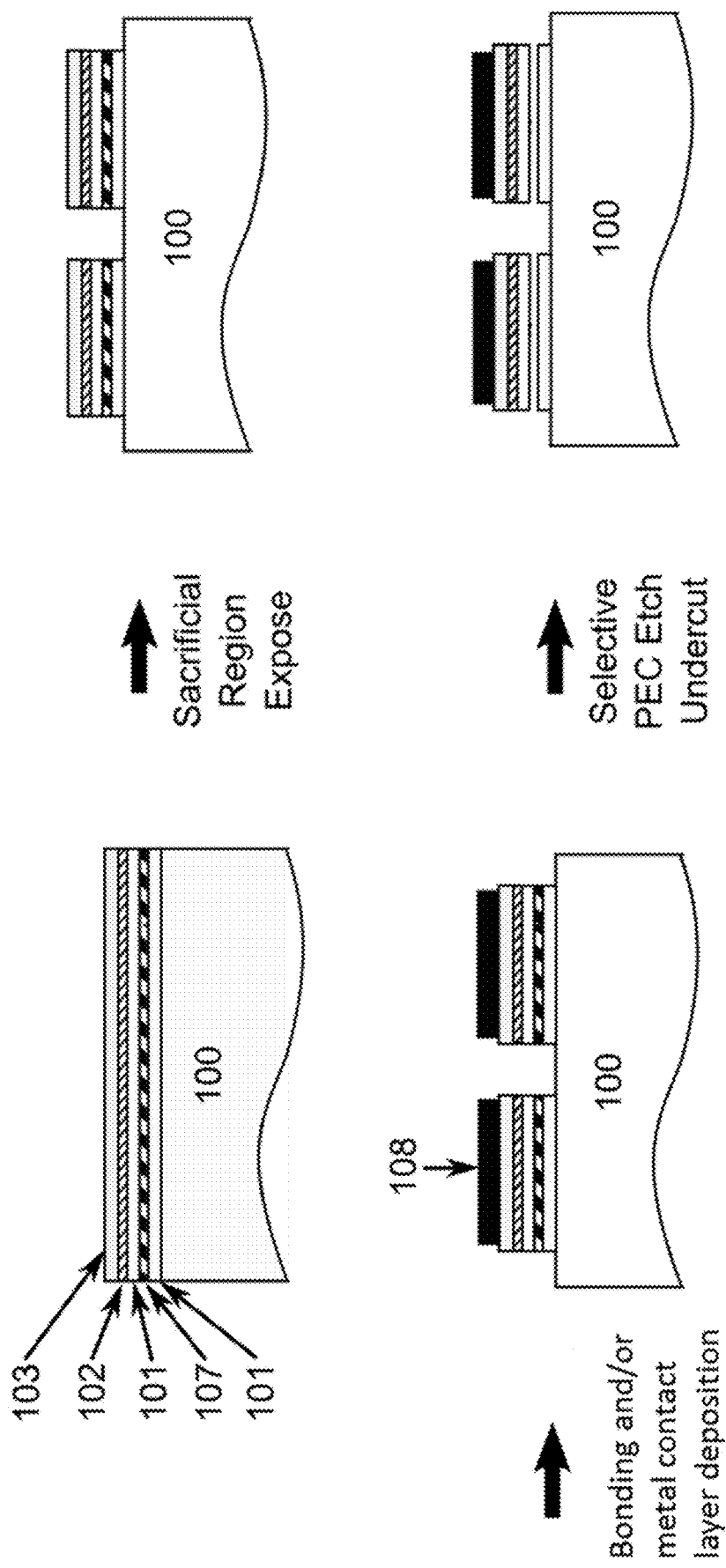

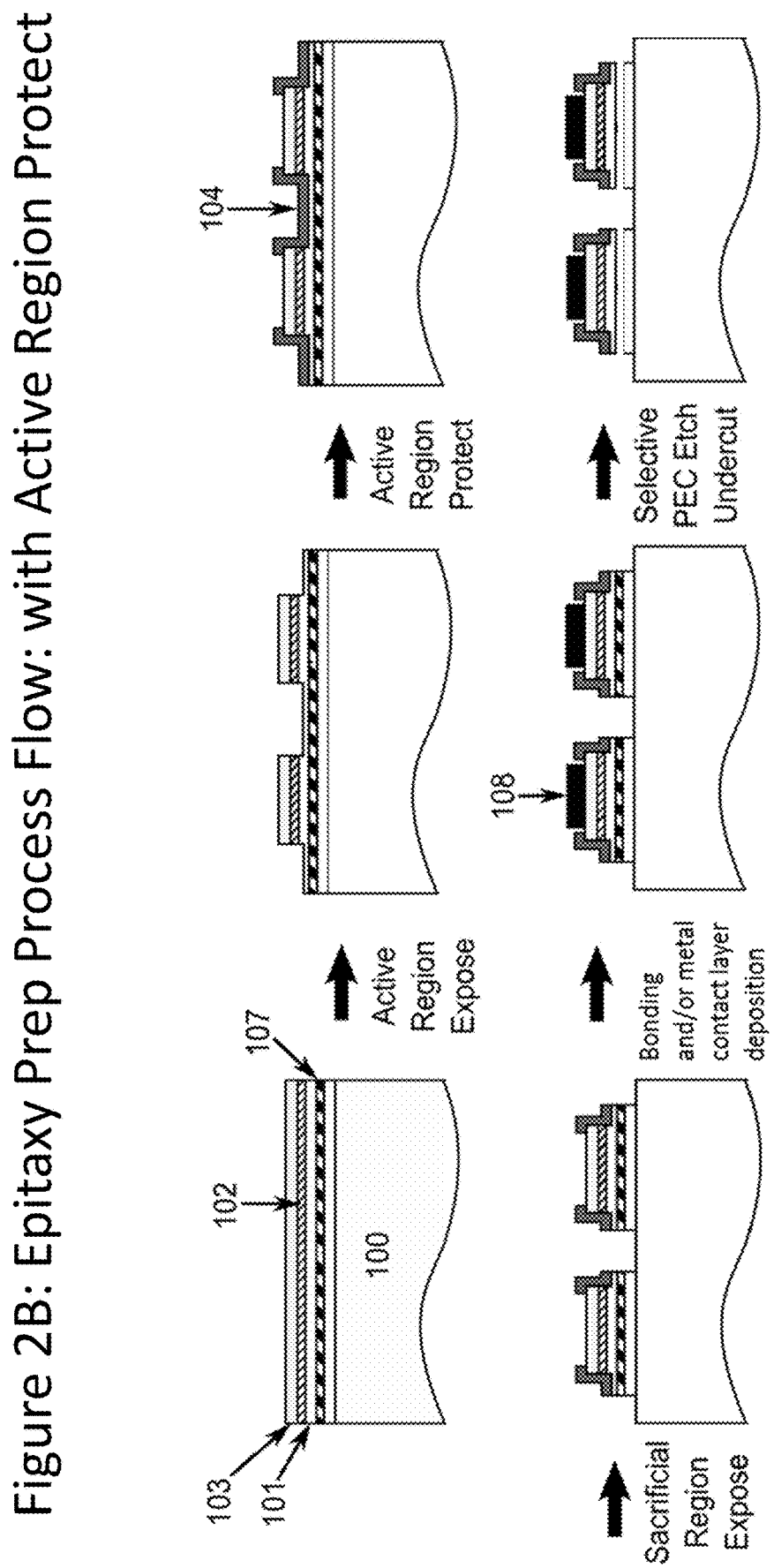

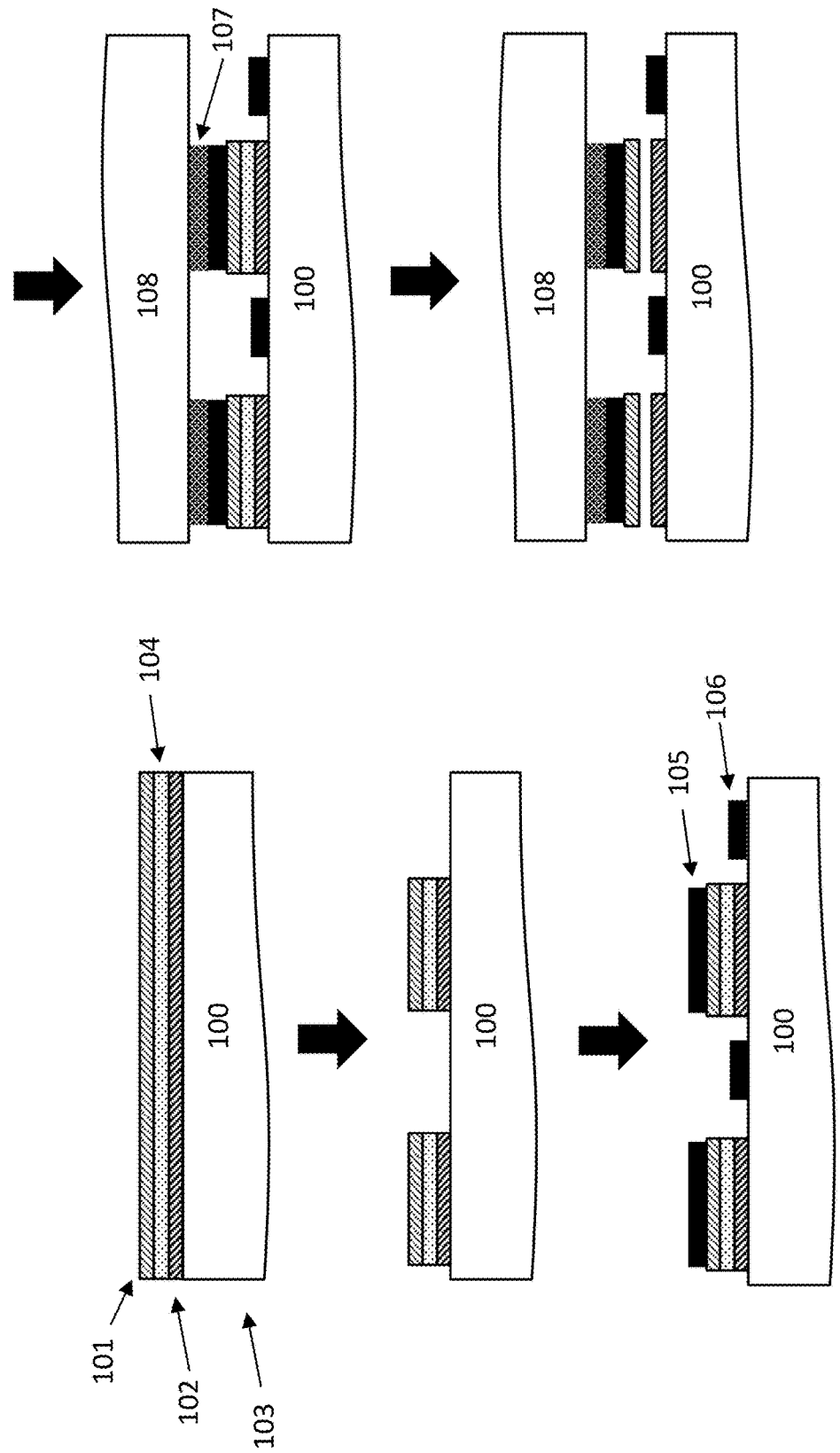
Figure 3A: Bond then etch

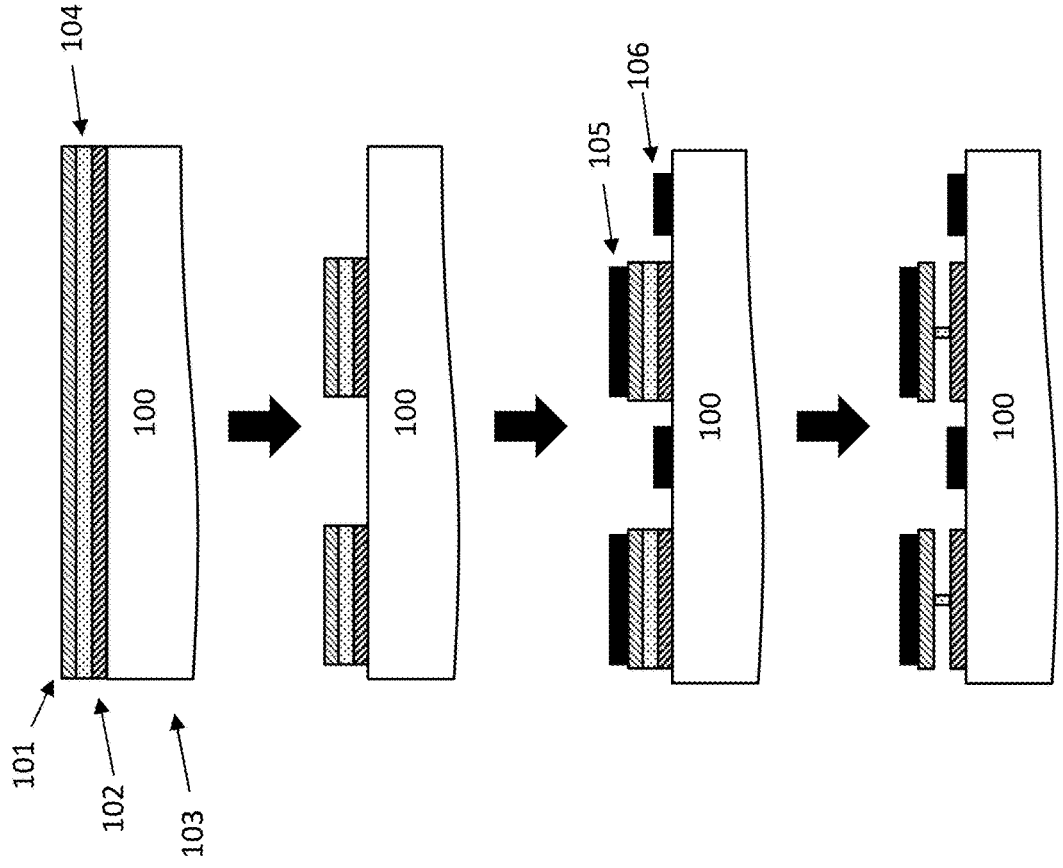
Figure 3B: Etch then bond: sacrificial layer not fully removed

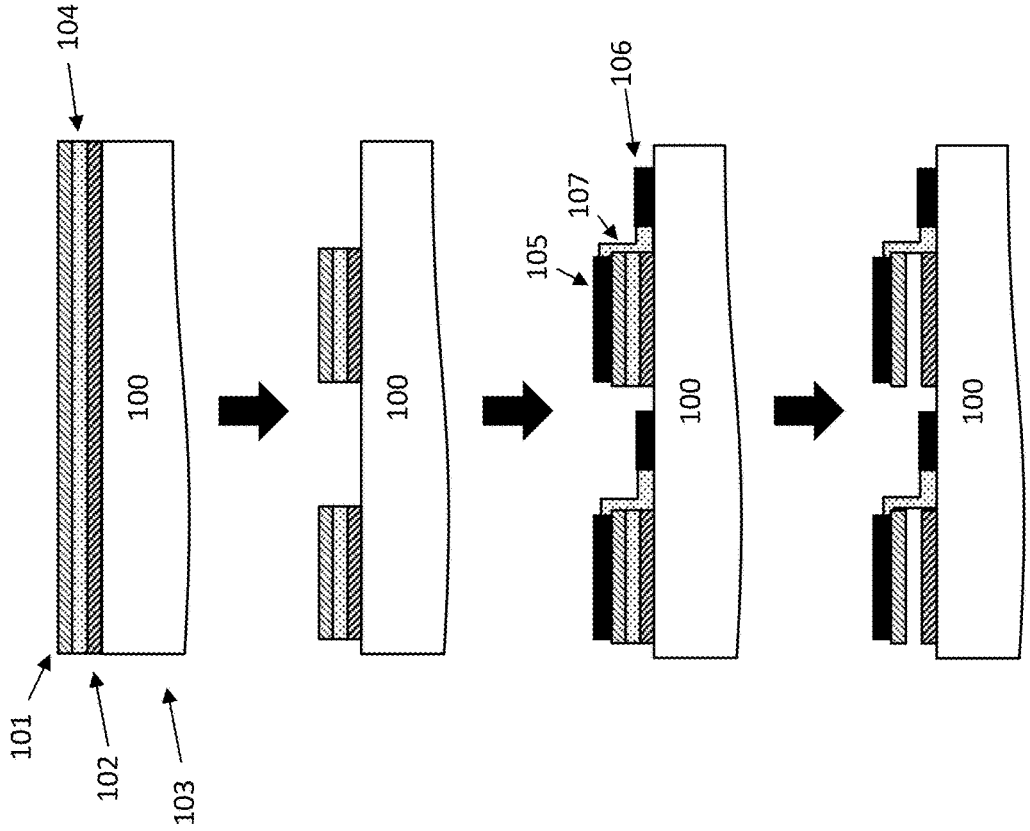
Figure 3C: Etch then bond: microfabricated anchor made from metal, ceramic, polymer, or the like.

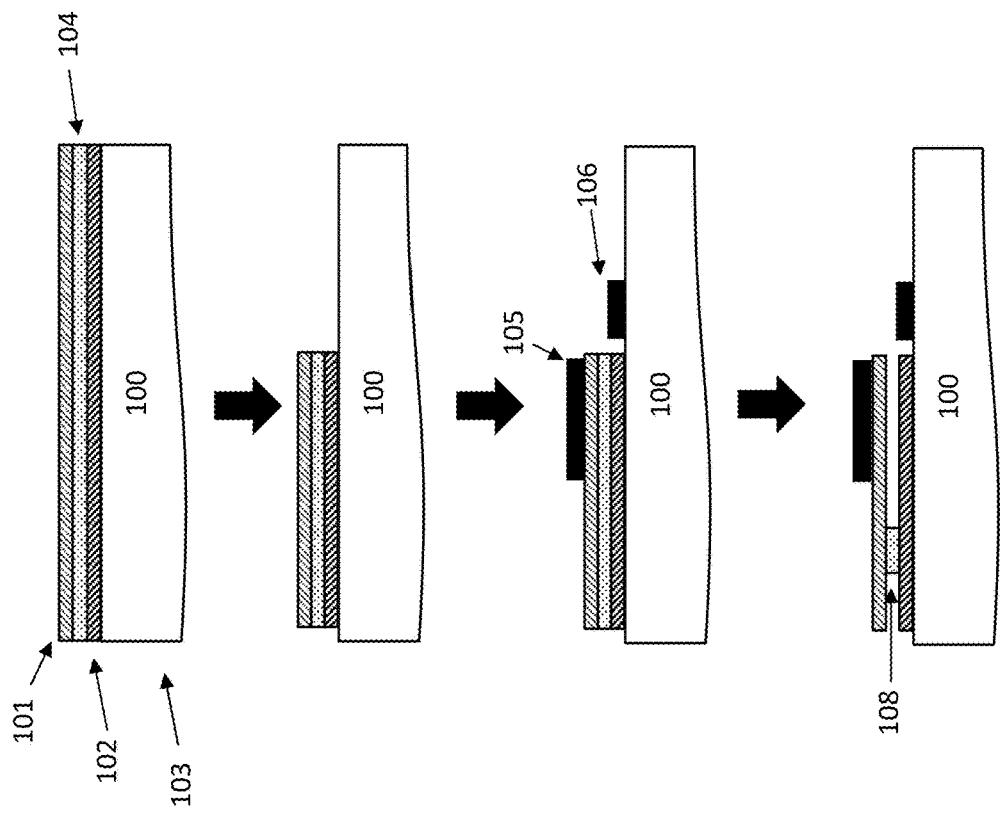
Figure 3D: Etch then bond: anchor composed of epitaxial semiconductor material

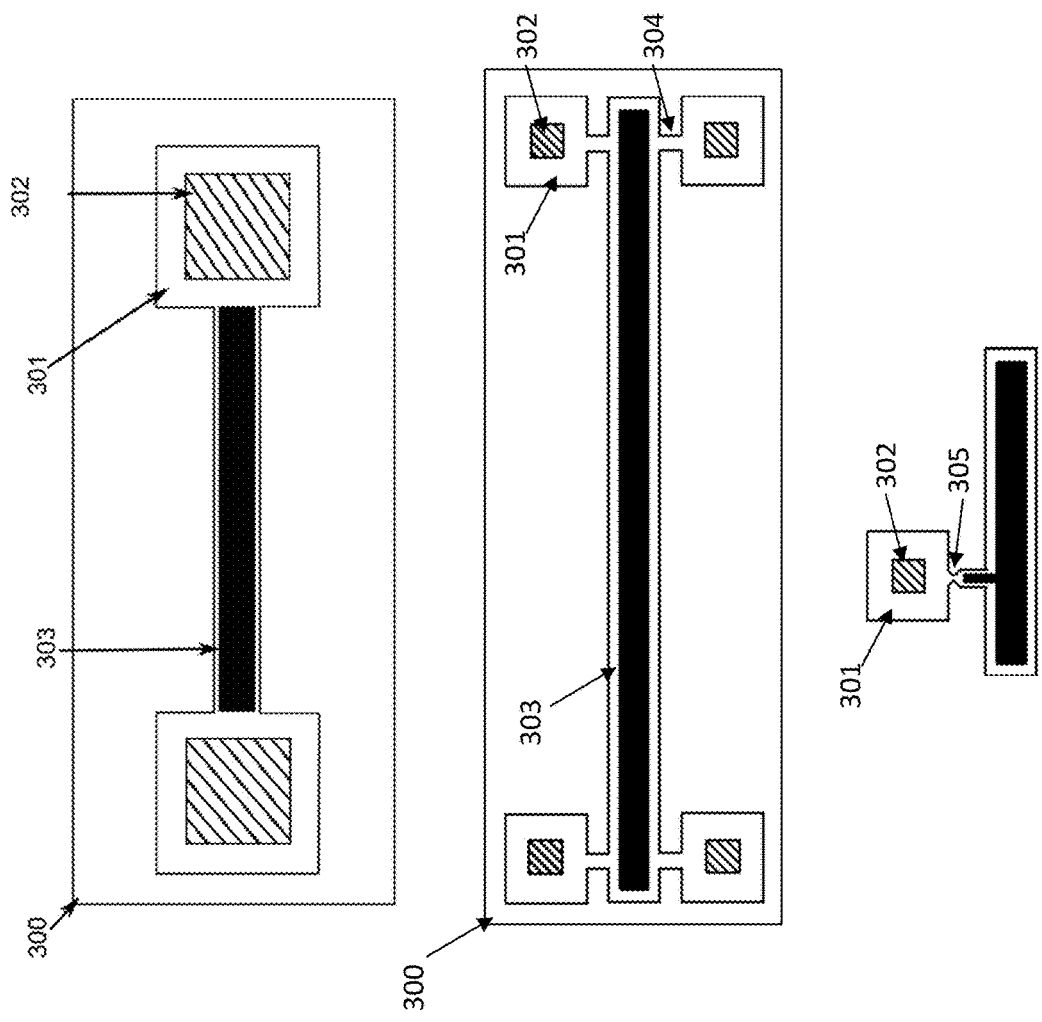
Figure 3E: Anchored PEC Undercut Top View

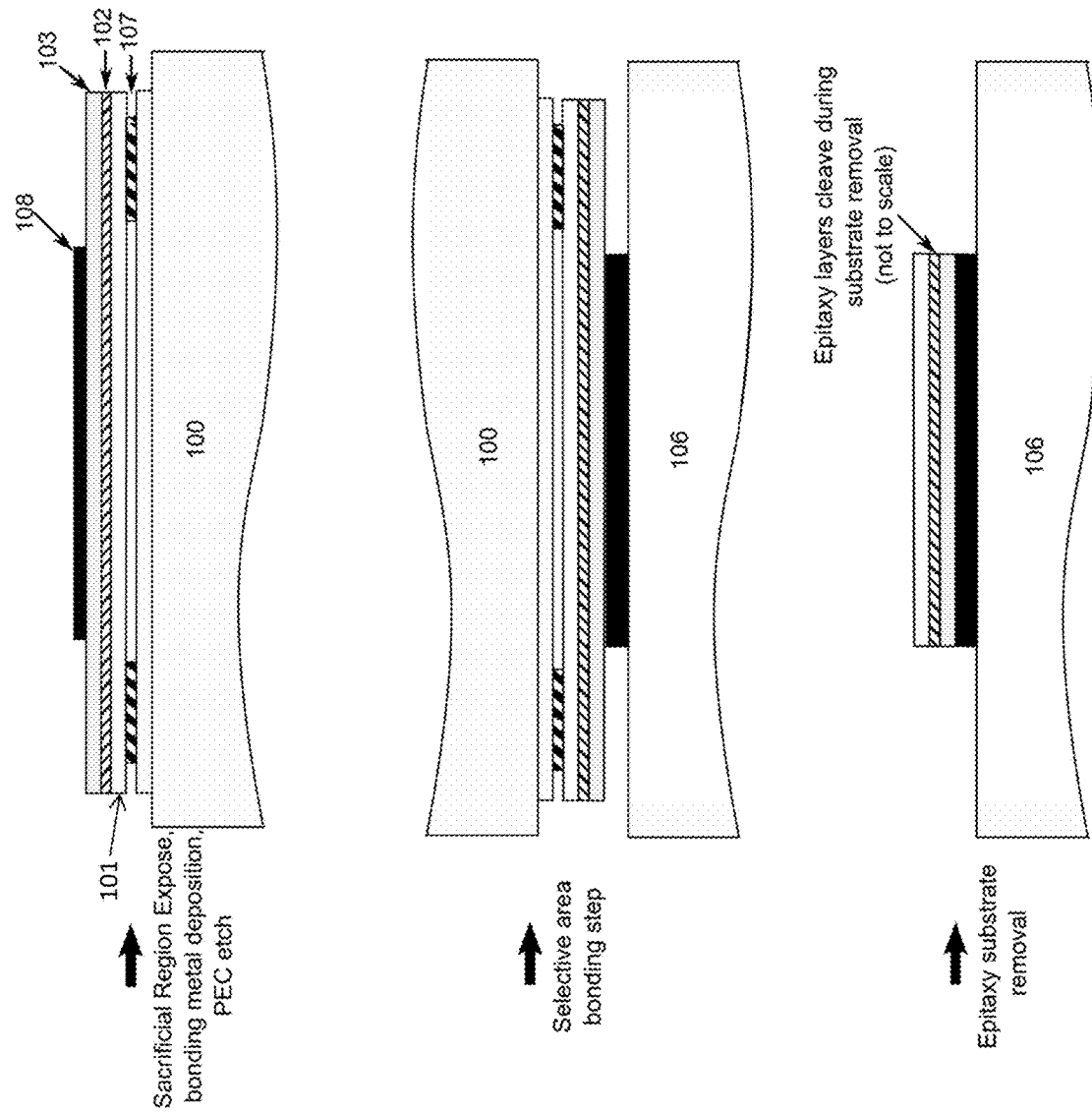

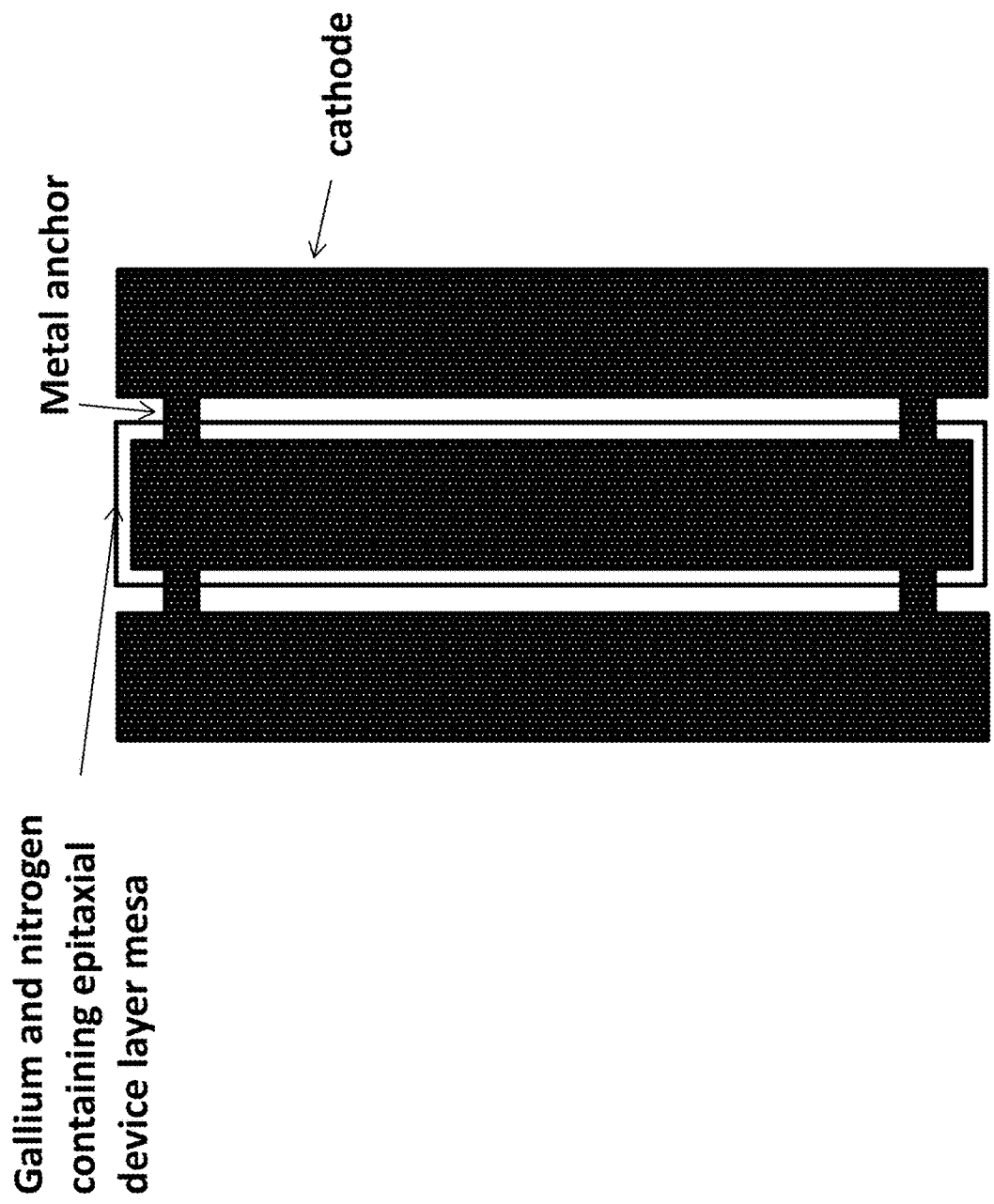
Figure 3G: plan view of transferrable mesa with metal anchors

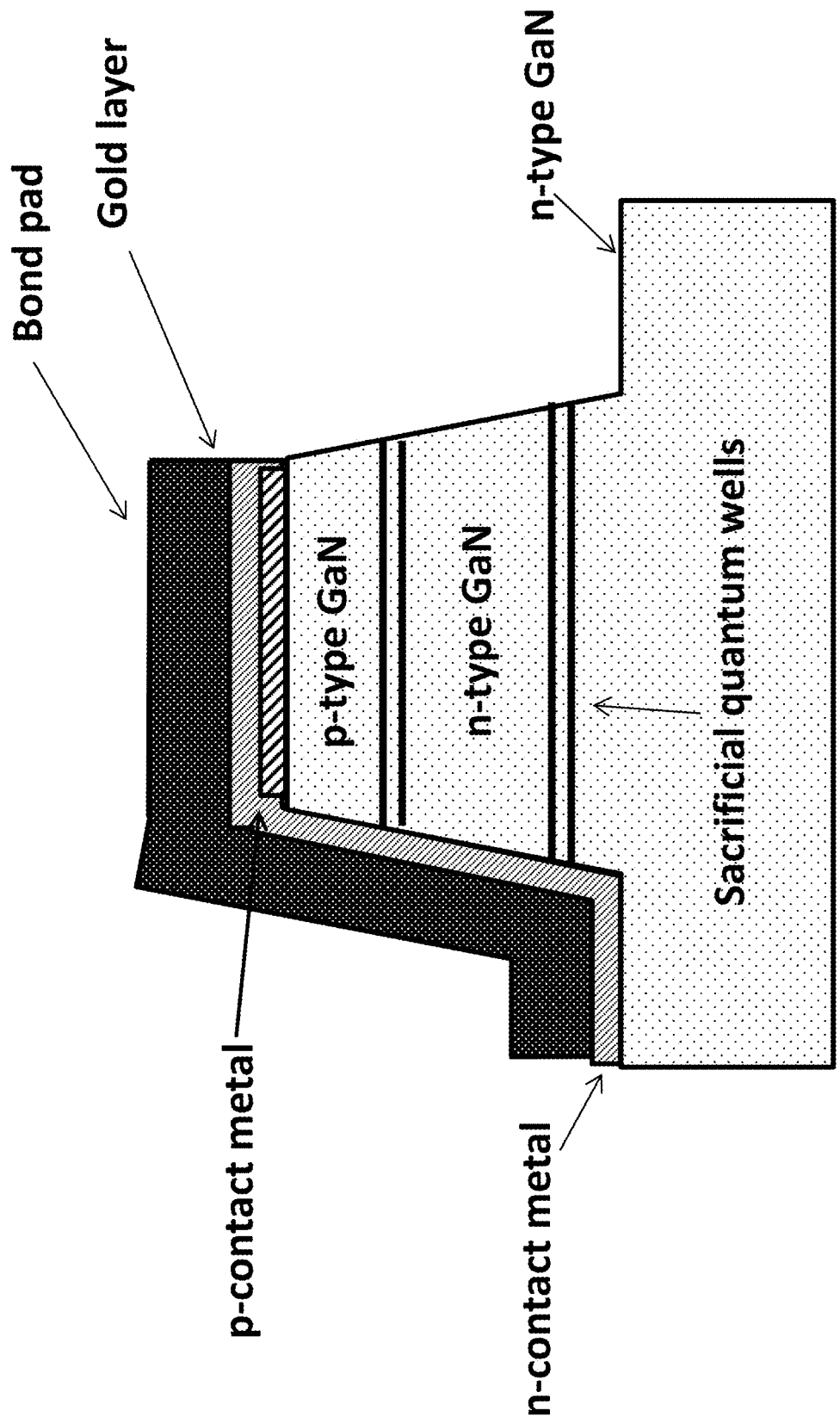
Figure 3H: cross sectional view of metal anchor

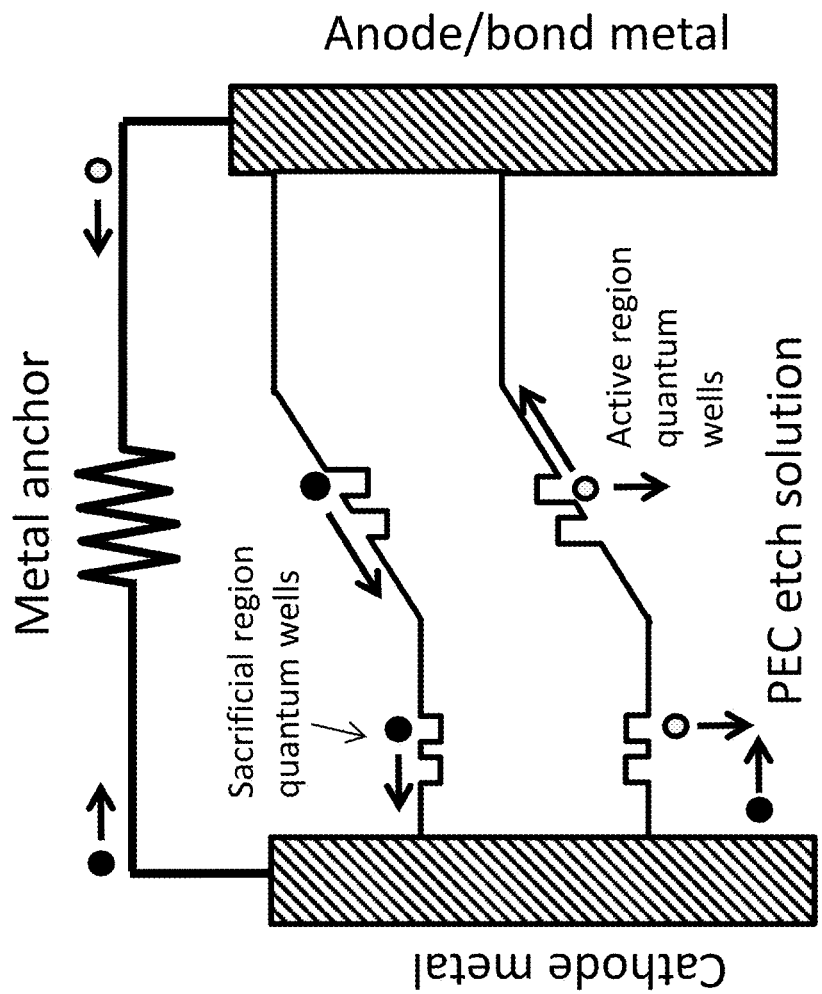
Figure 3l: Schematic of electrical circuit formed during PEC etching with metal anchors.

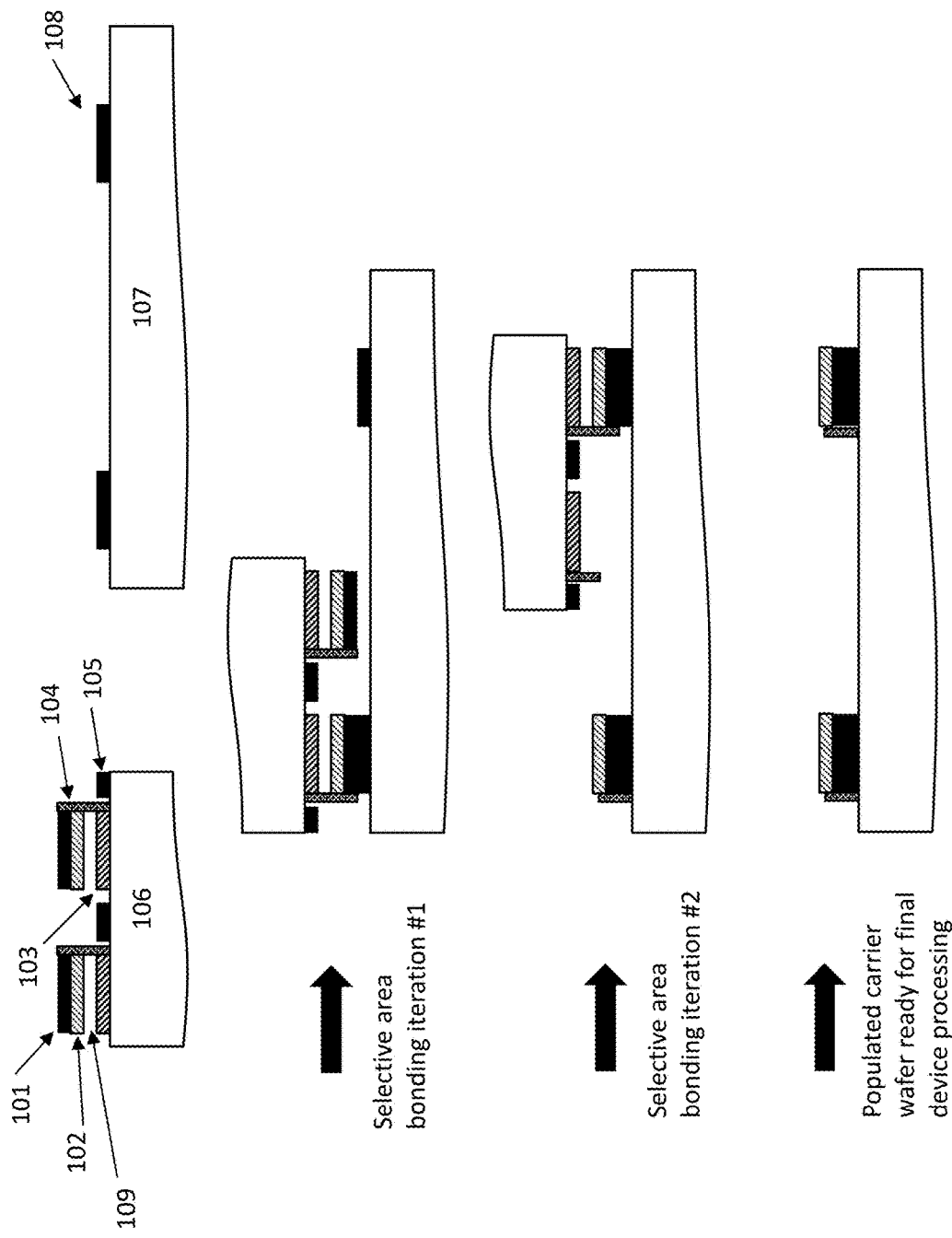
Figure 4: Side view of die expansion with selective area bonding

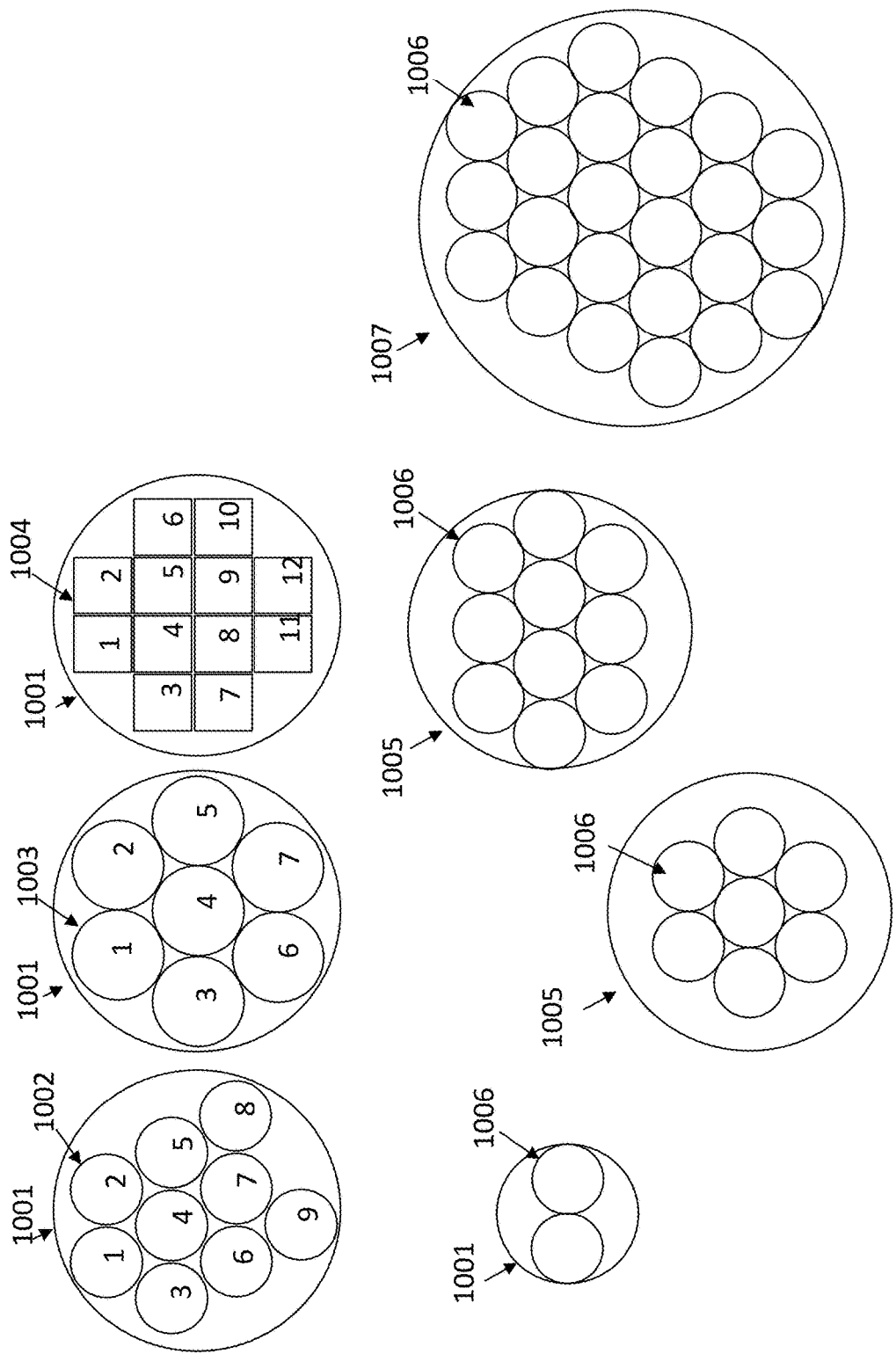
Figure 5A: Transferable regions for various substrate sizes on 100, 200 and 300 mm carrier wafers

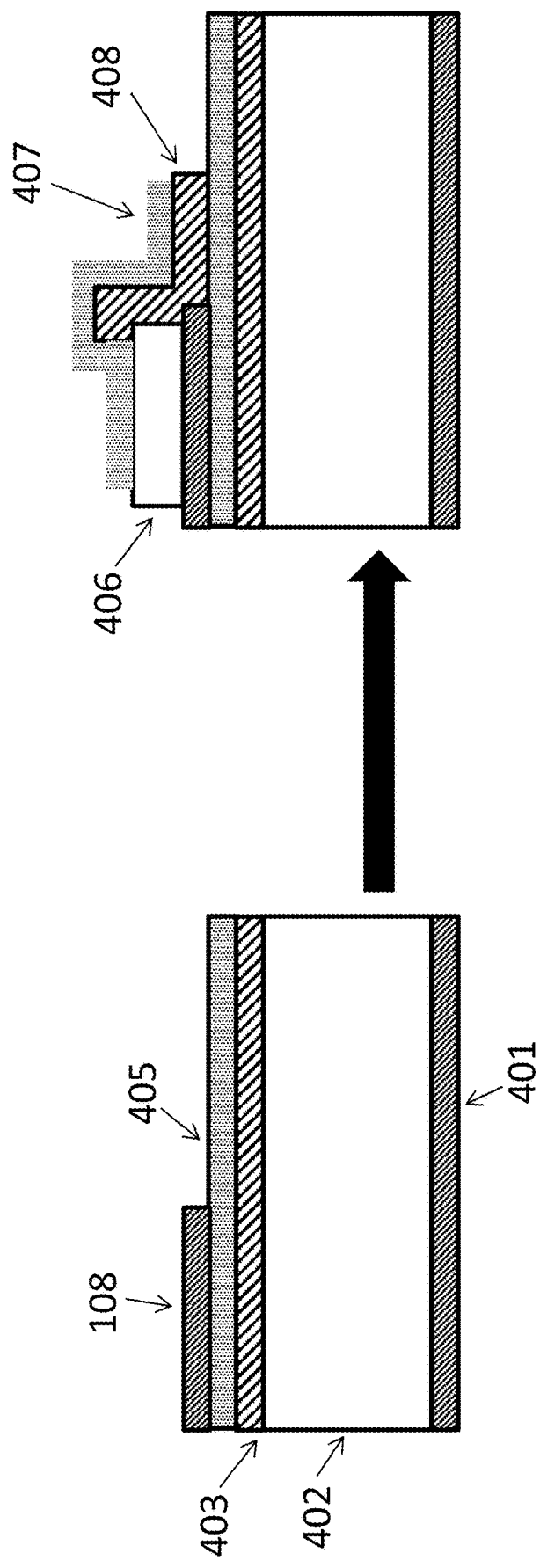
Figure 5B: Example of carrier wafer processed to act as submount

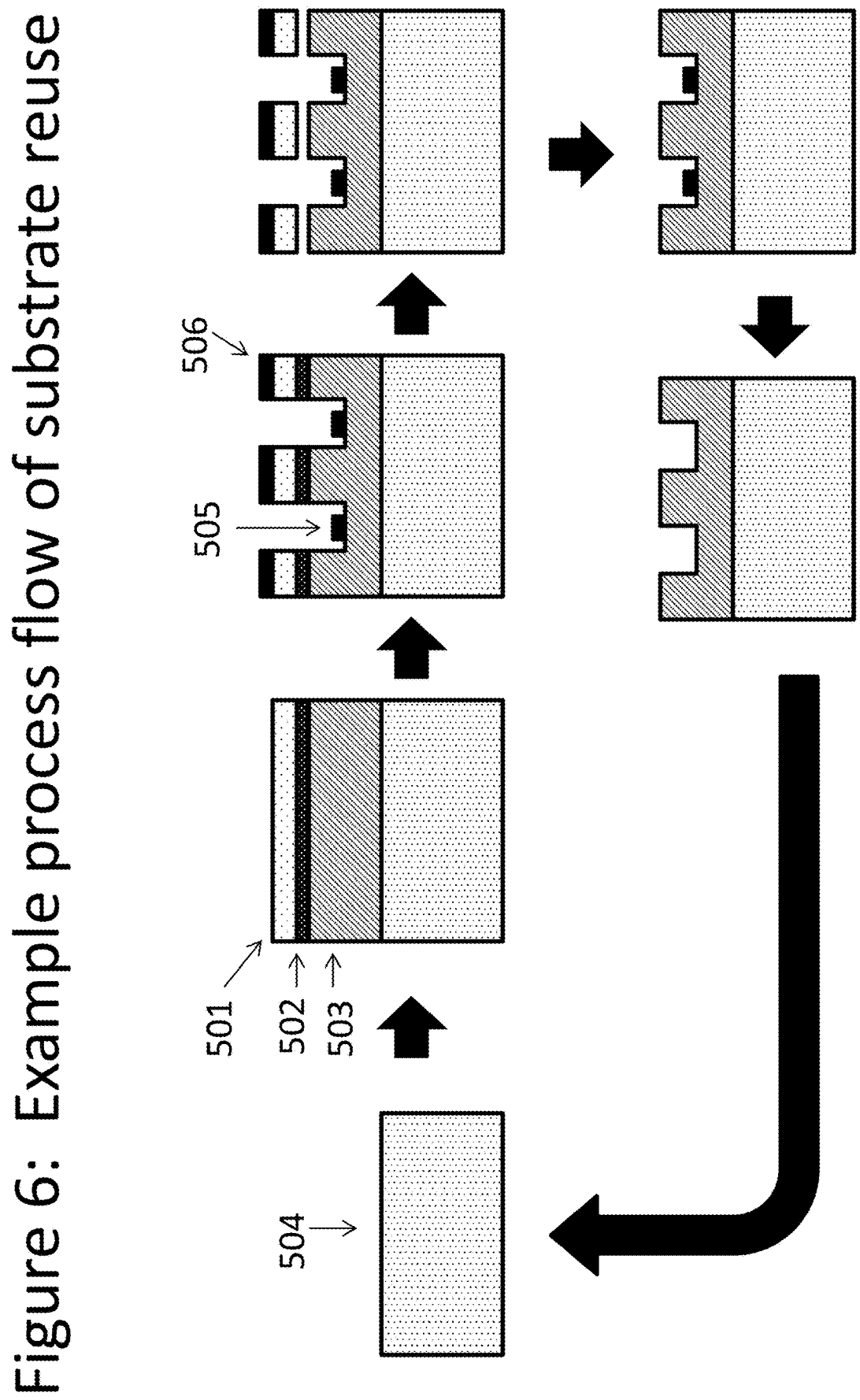
Figure 6: Example process flow of substrate reuse

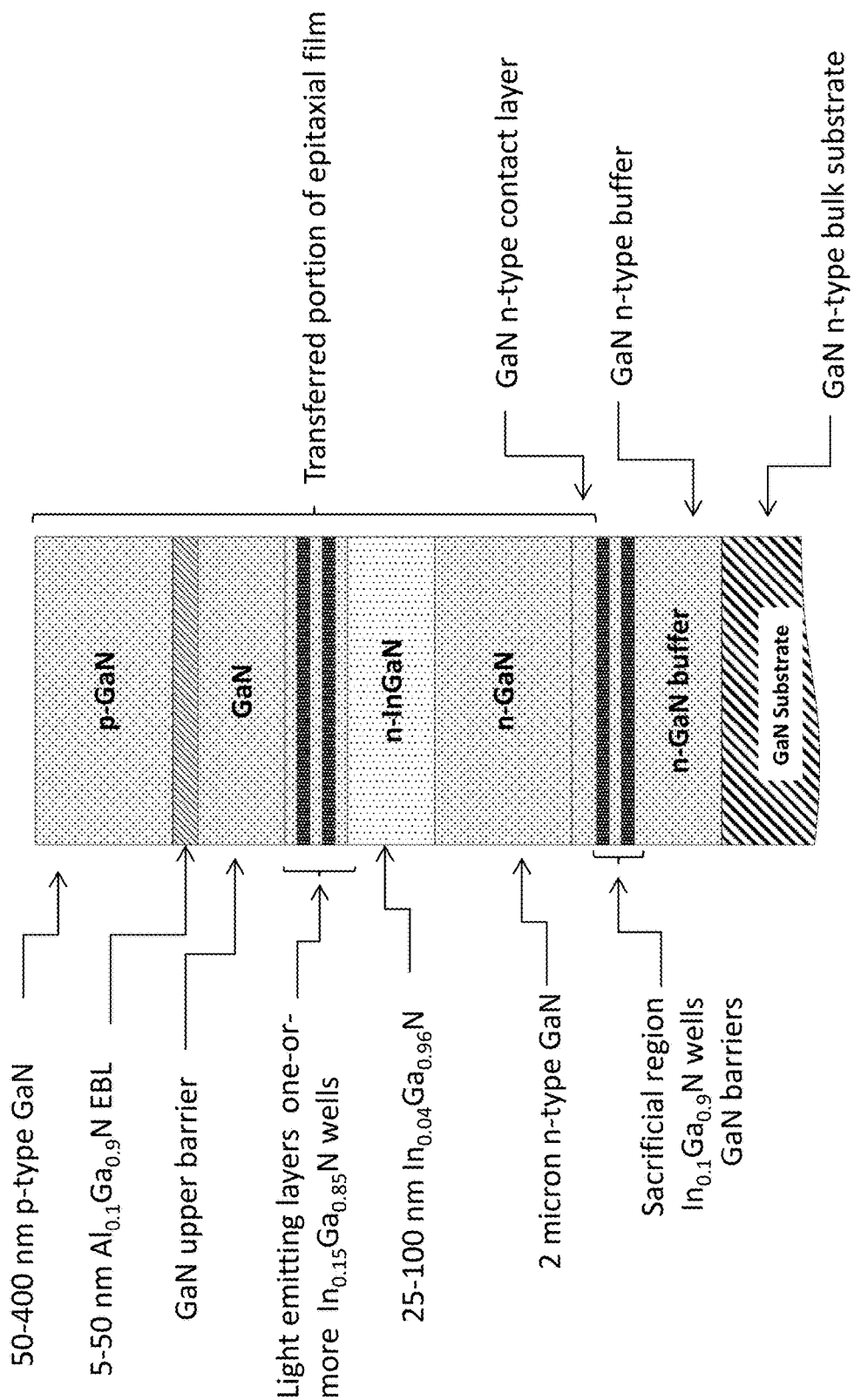
Figure 7A: schematic of epitaxial structure of LED

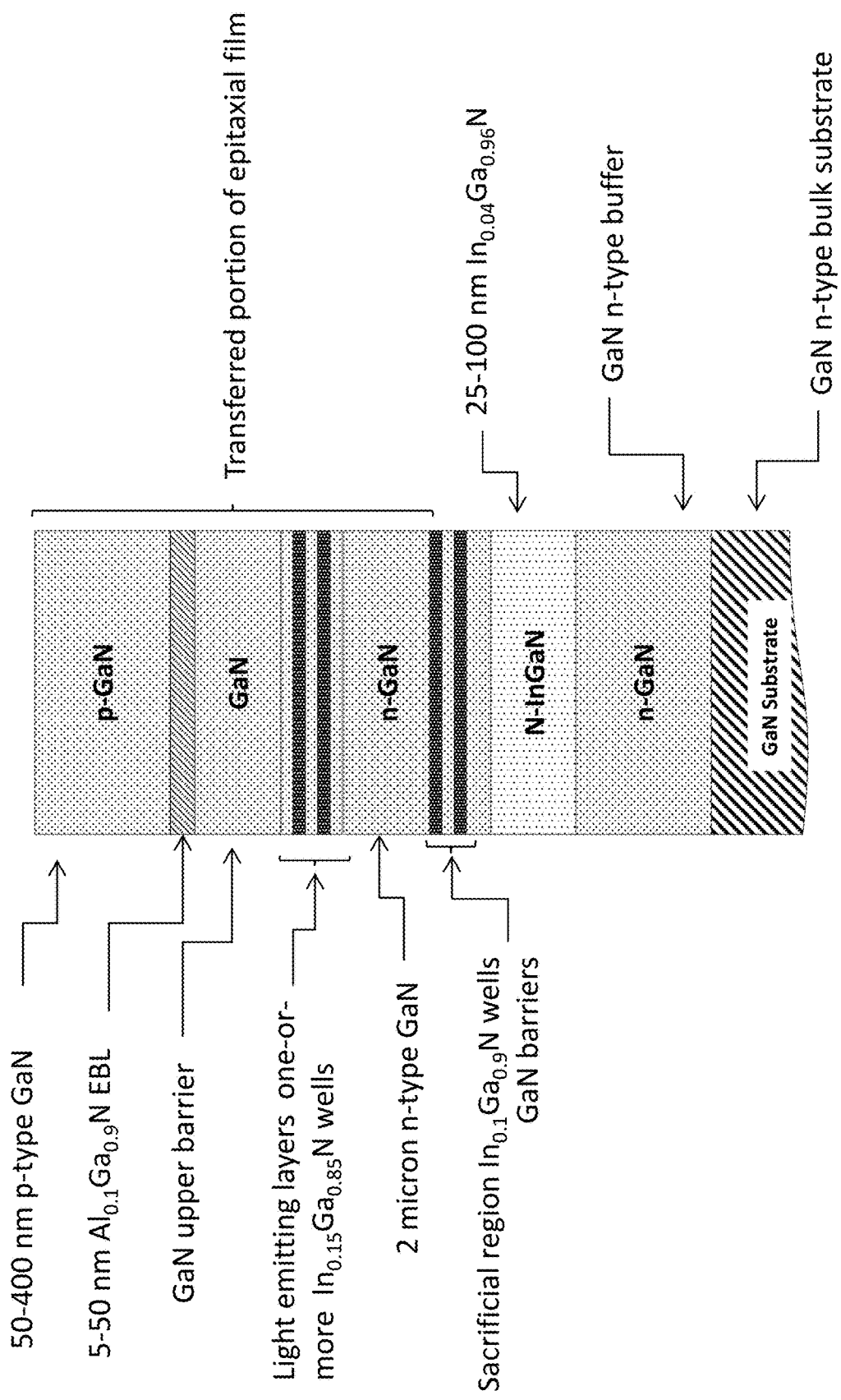
Figure 7B: schematic of epitaxial structure of LED

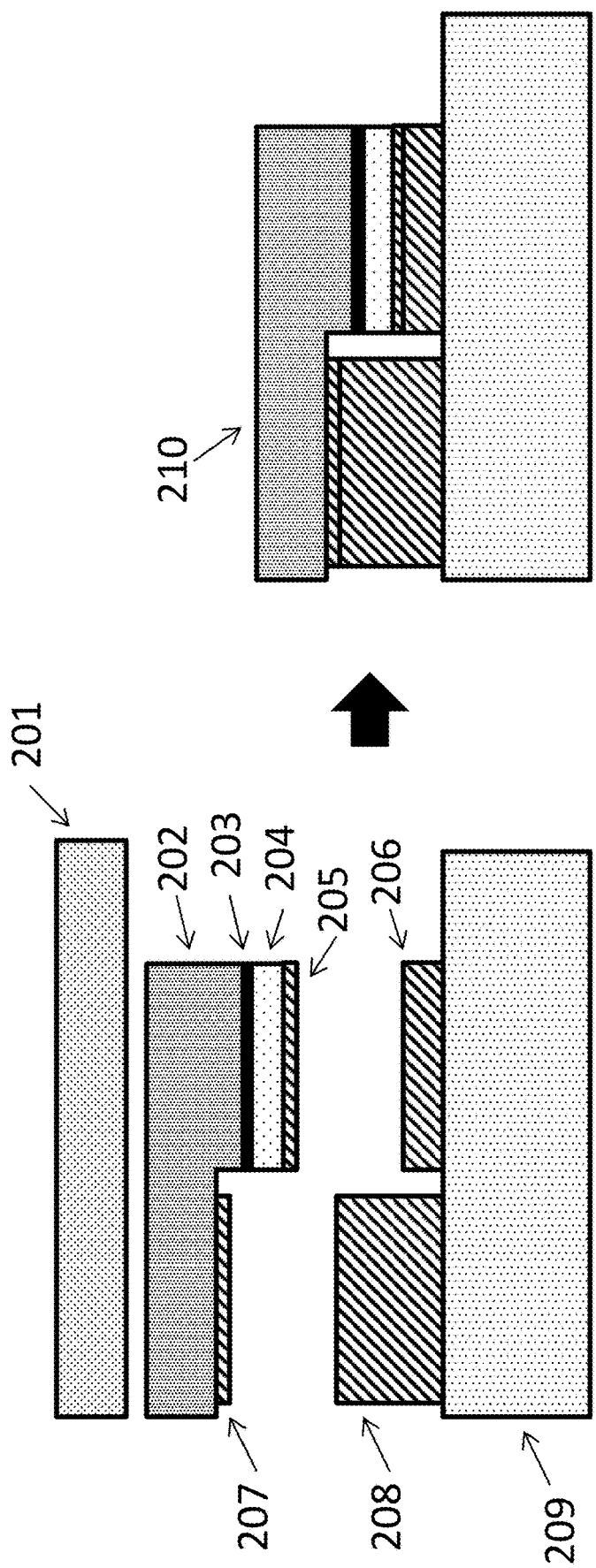

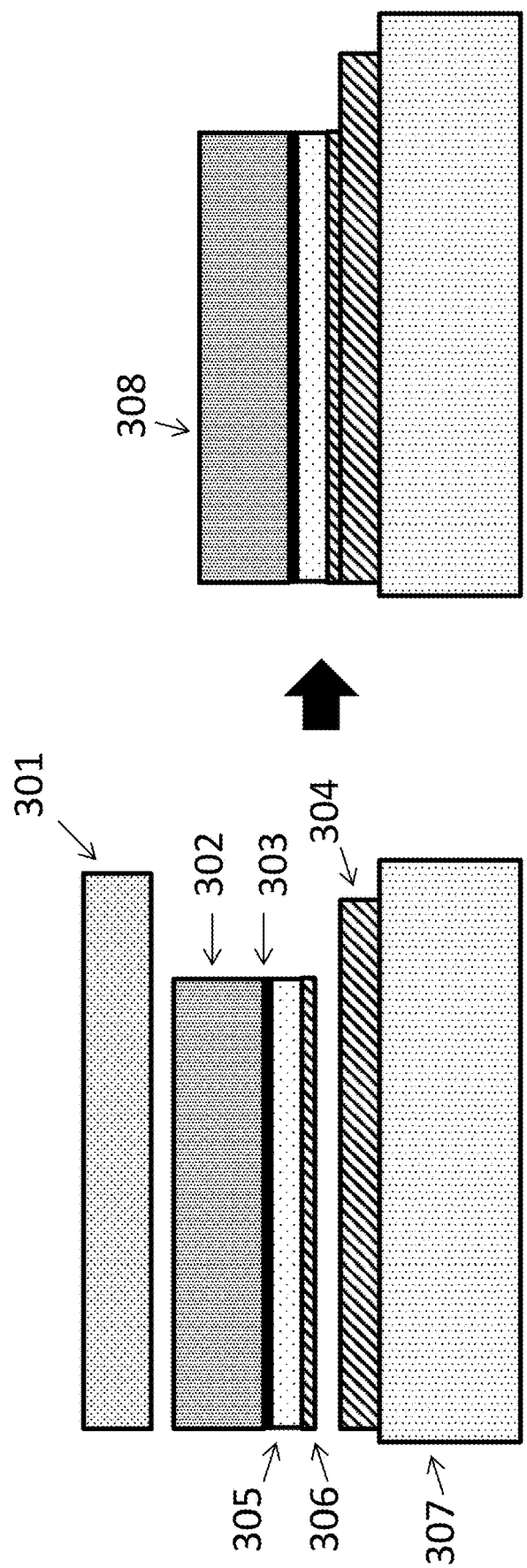
Figure 7D: bonding of LED wafer

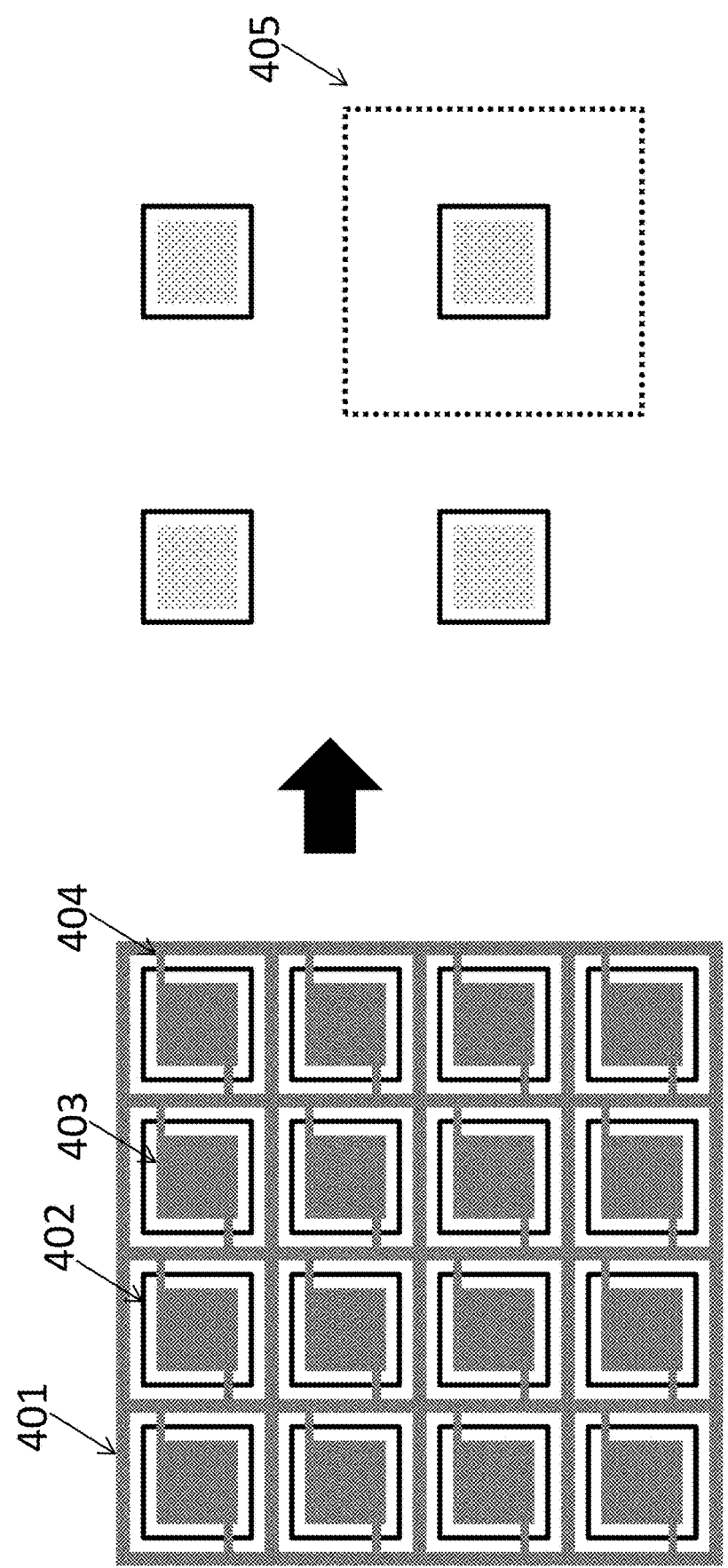
Figure 7E: die expansion of LEDs

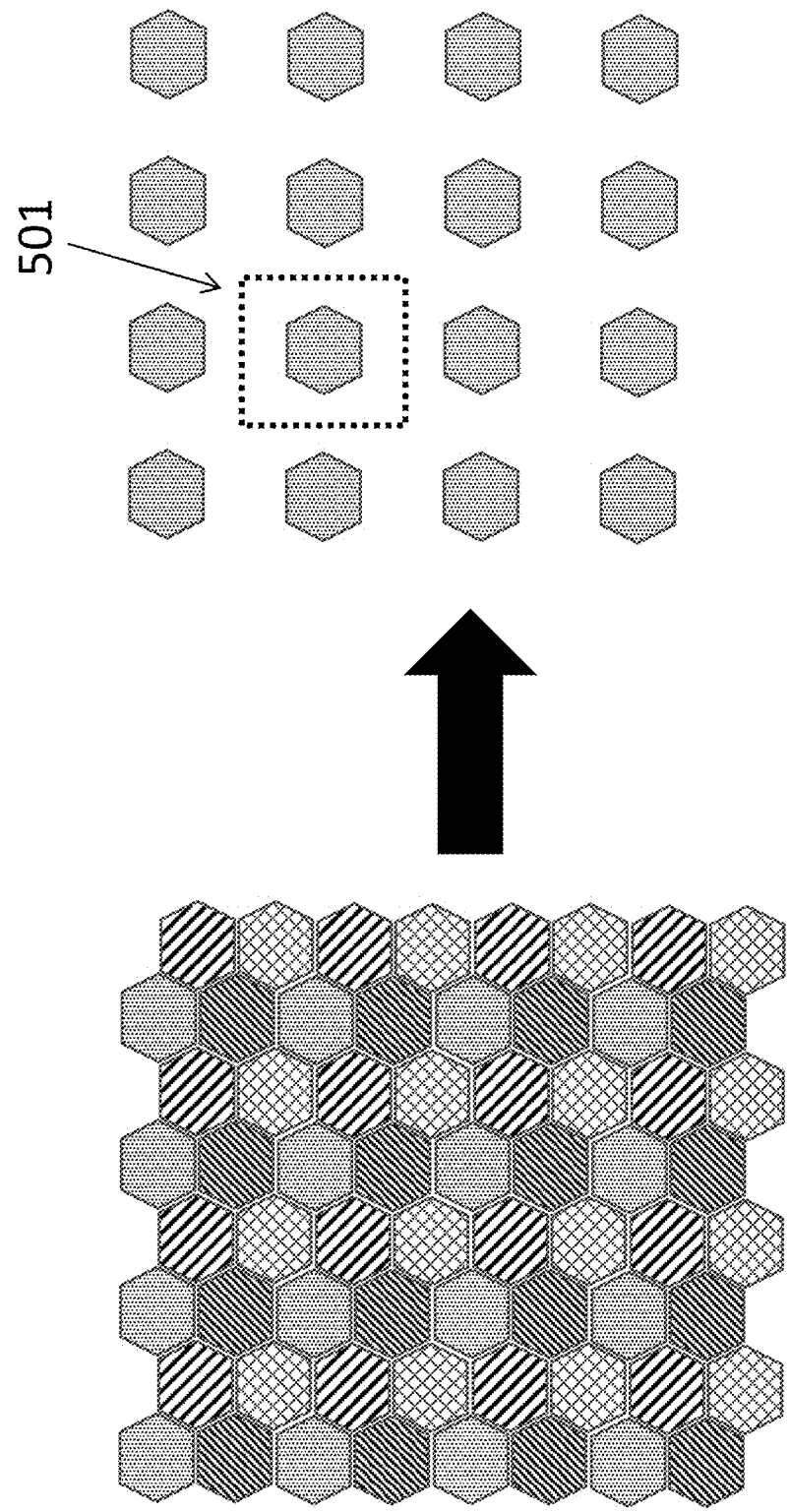
Figure 7F: die expansion of LEDs with non-rectangular shape

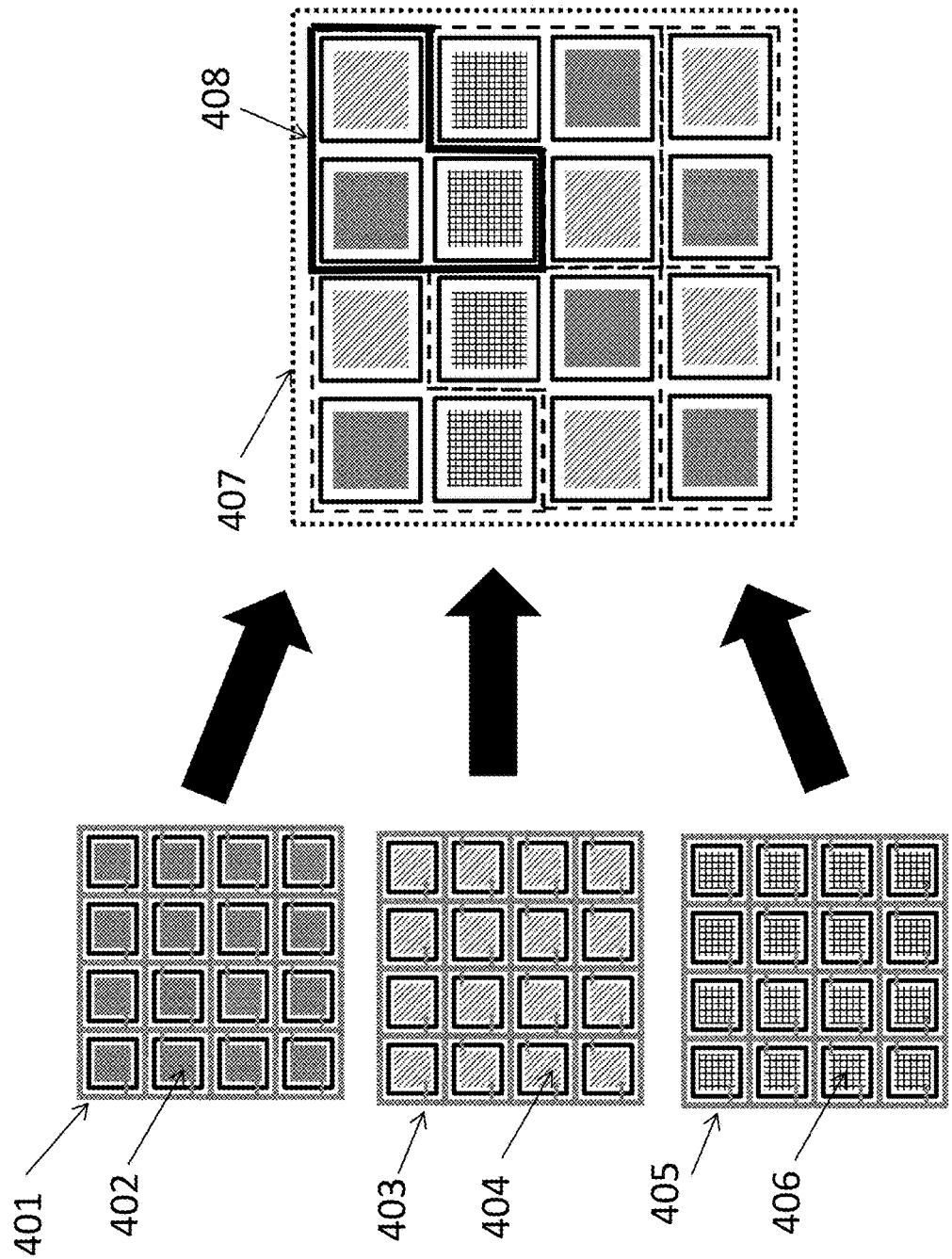

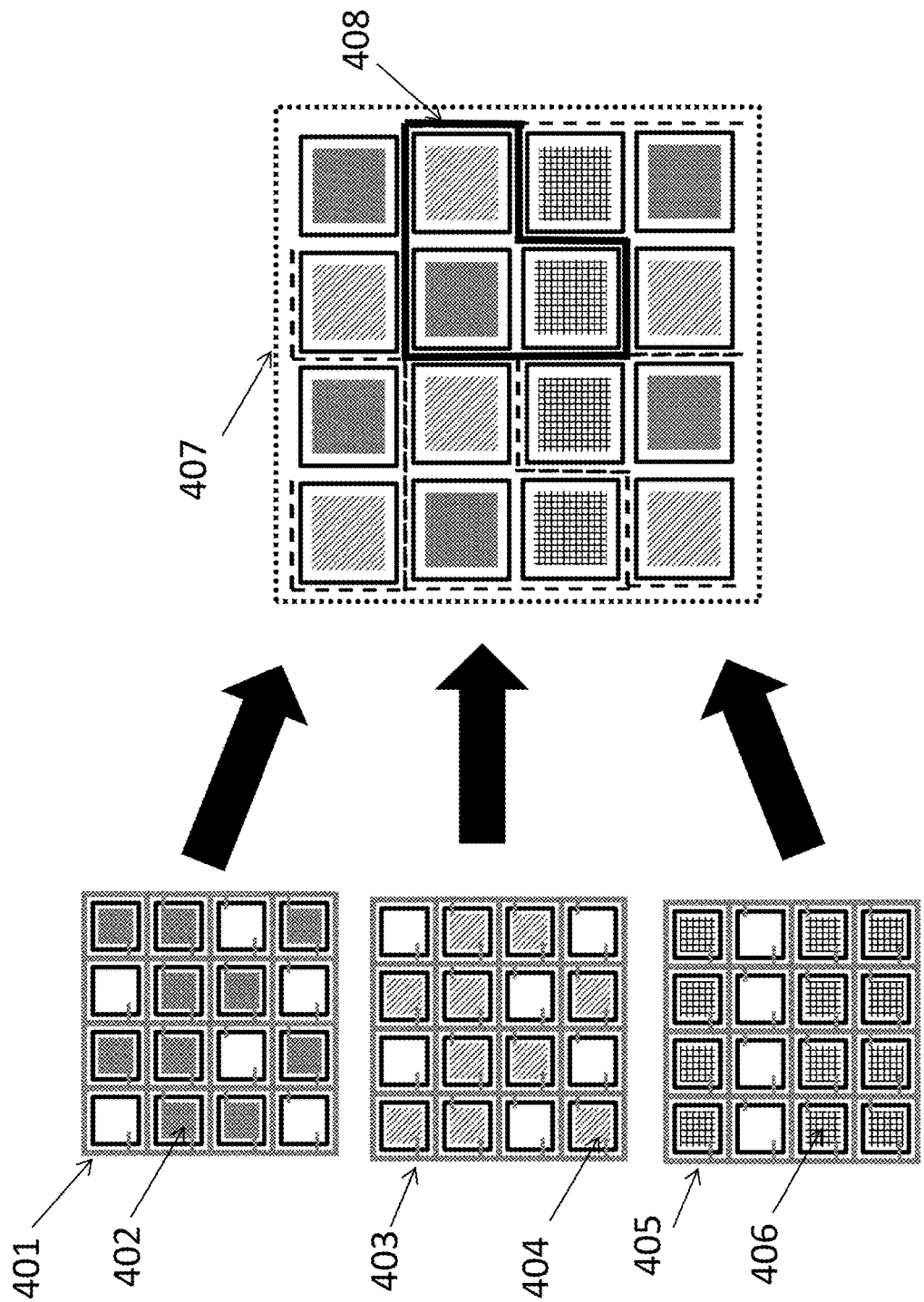
Figure 7H: die expansion of LEDs

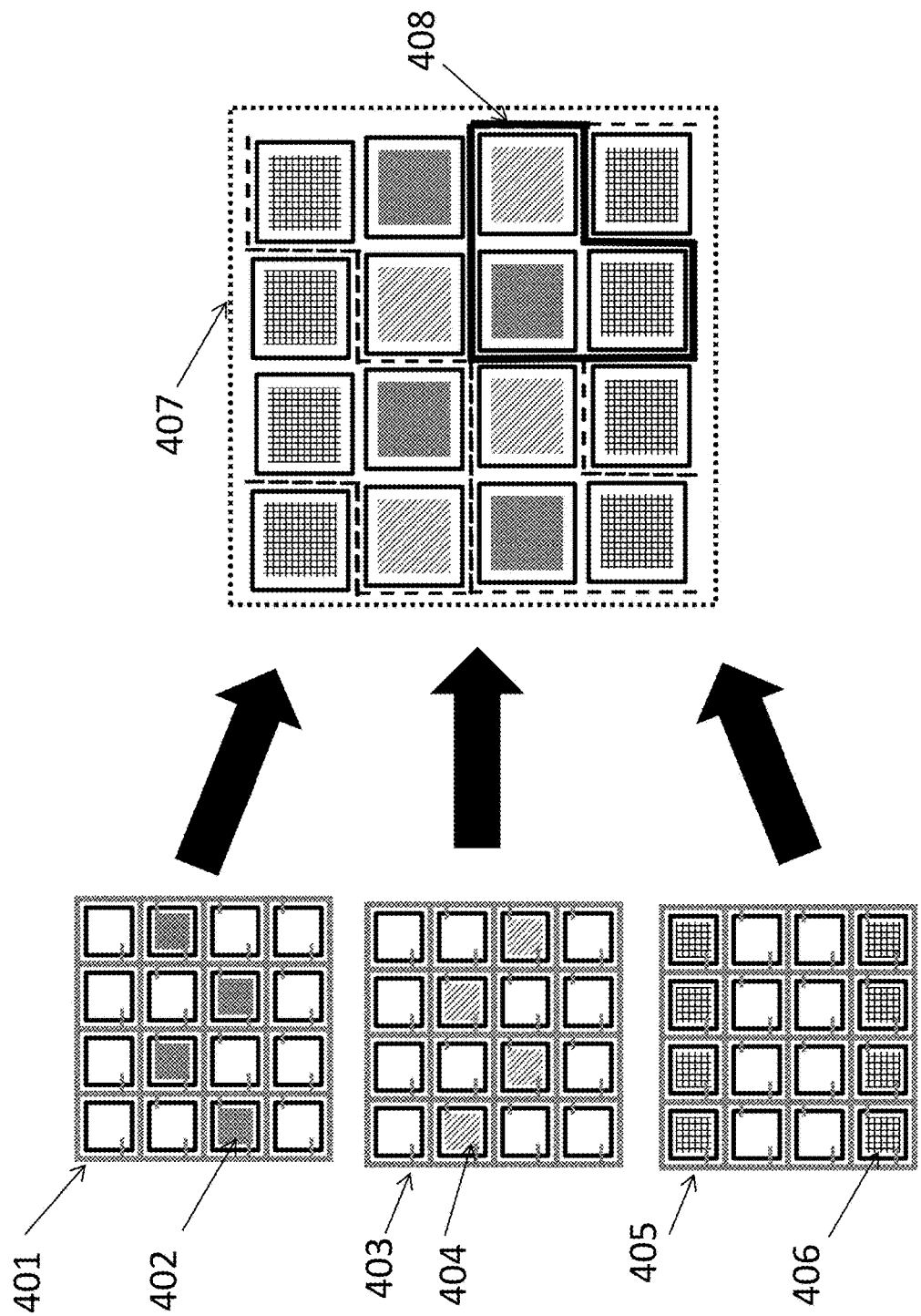
Figure 7l: die expansion of LEDs

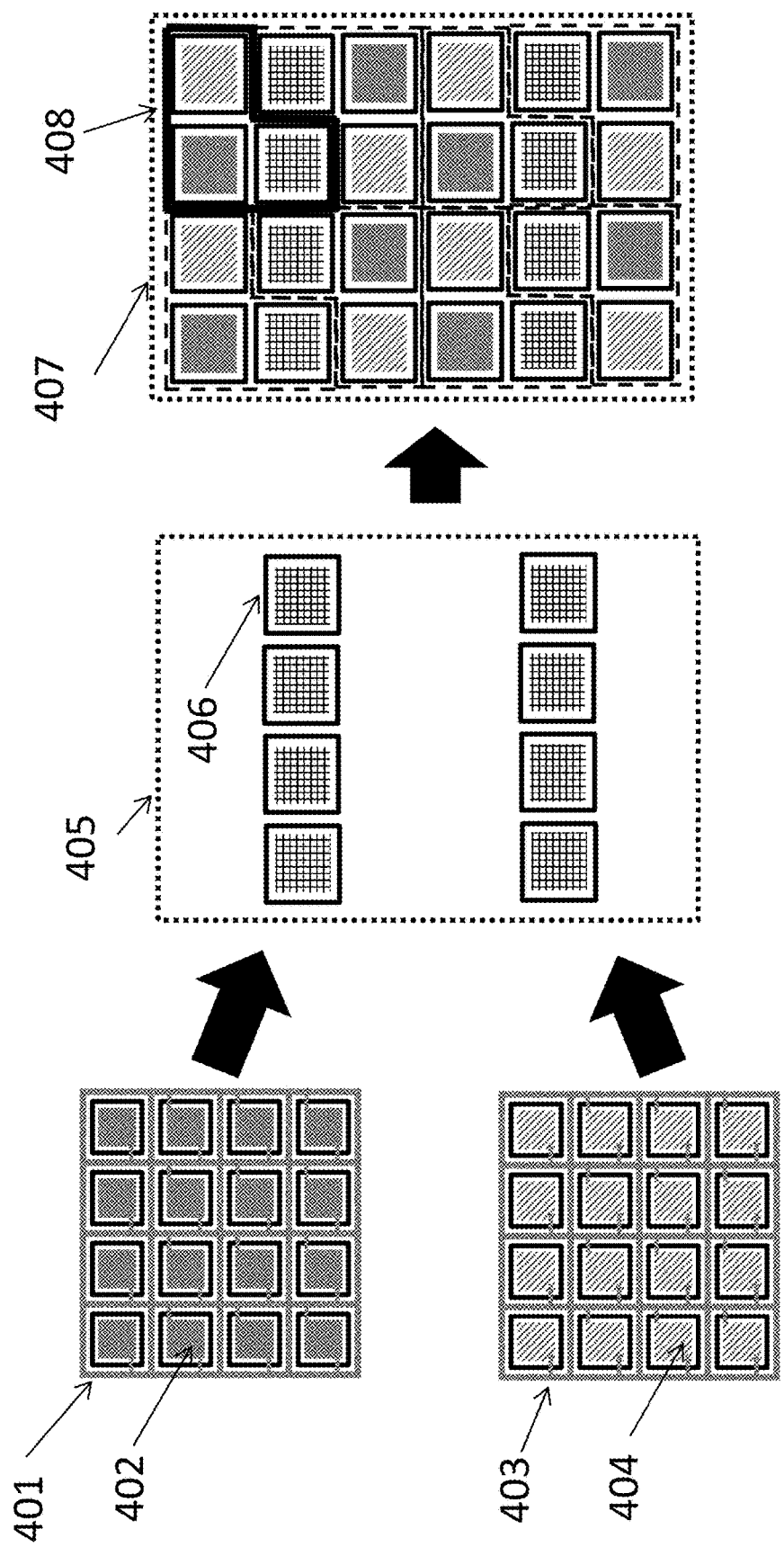

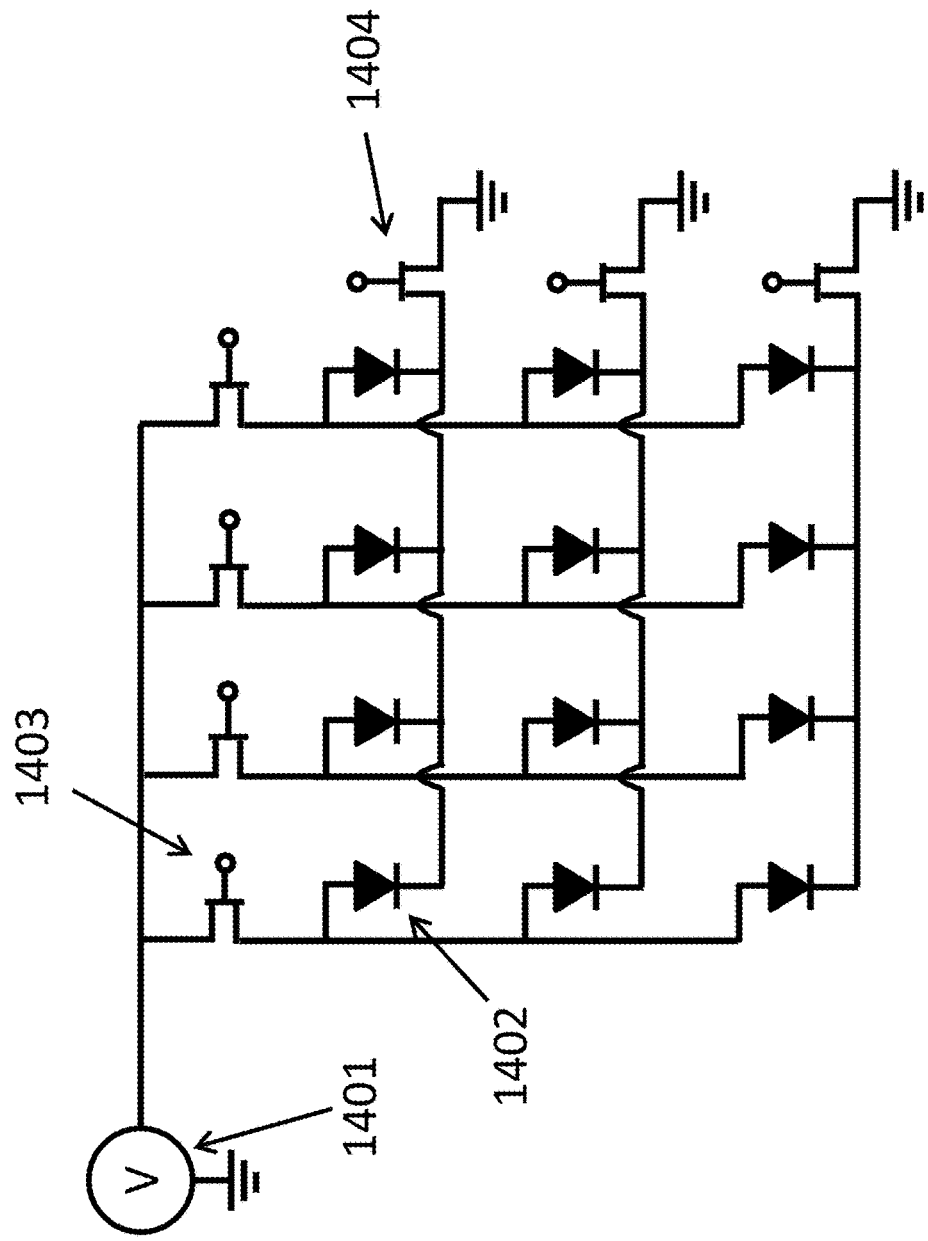
Figure 7K: Example of multiplexing in a transferred micro LED display array

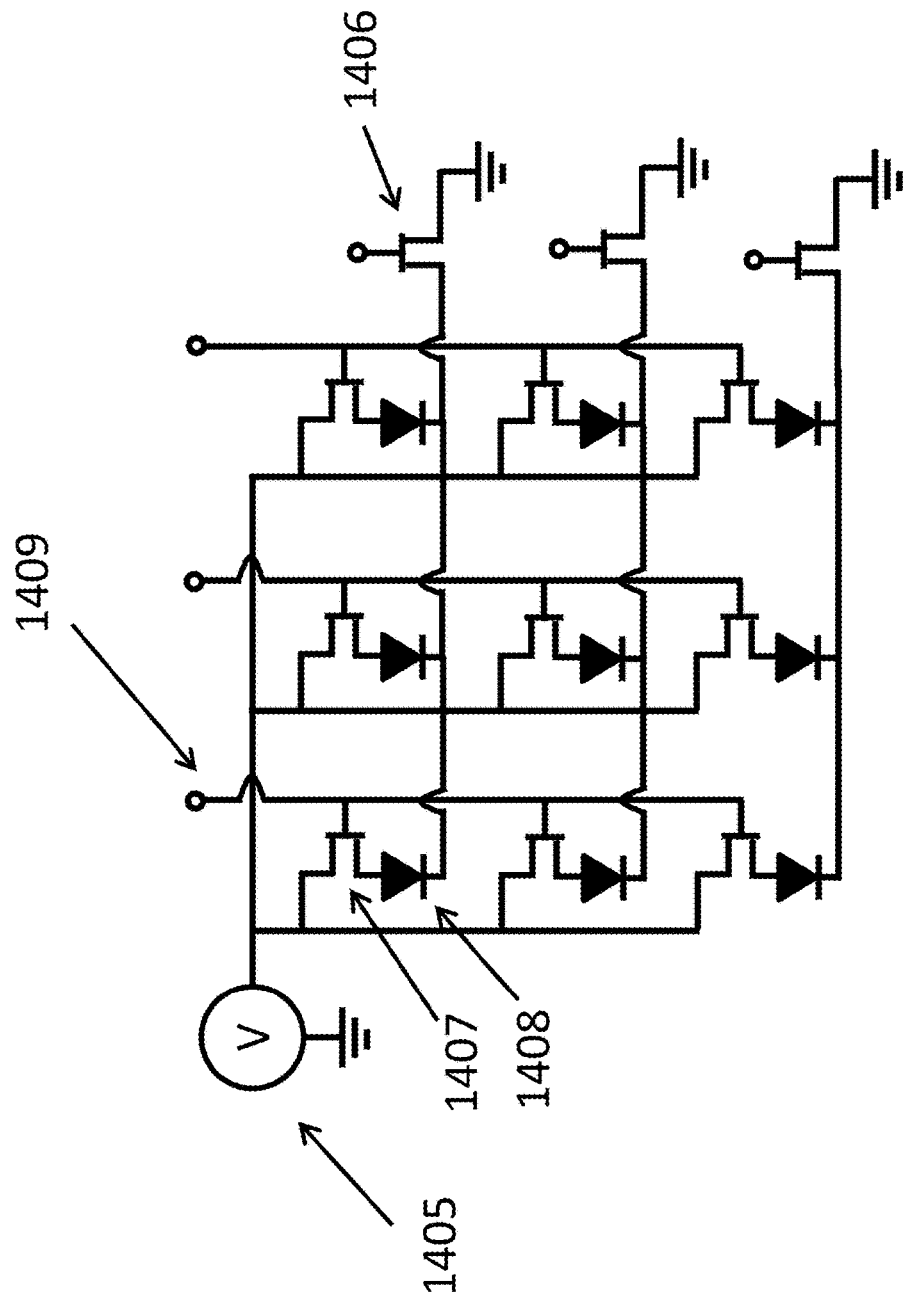
Figure 7L: Example of multiplexing in a transferred micro LED display array

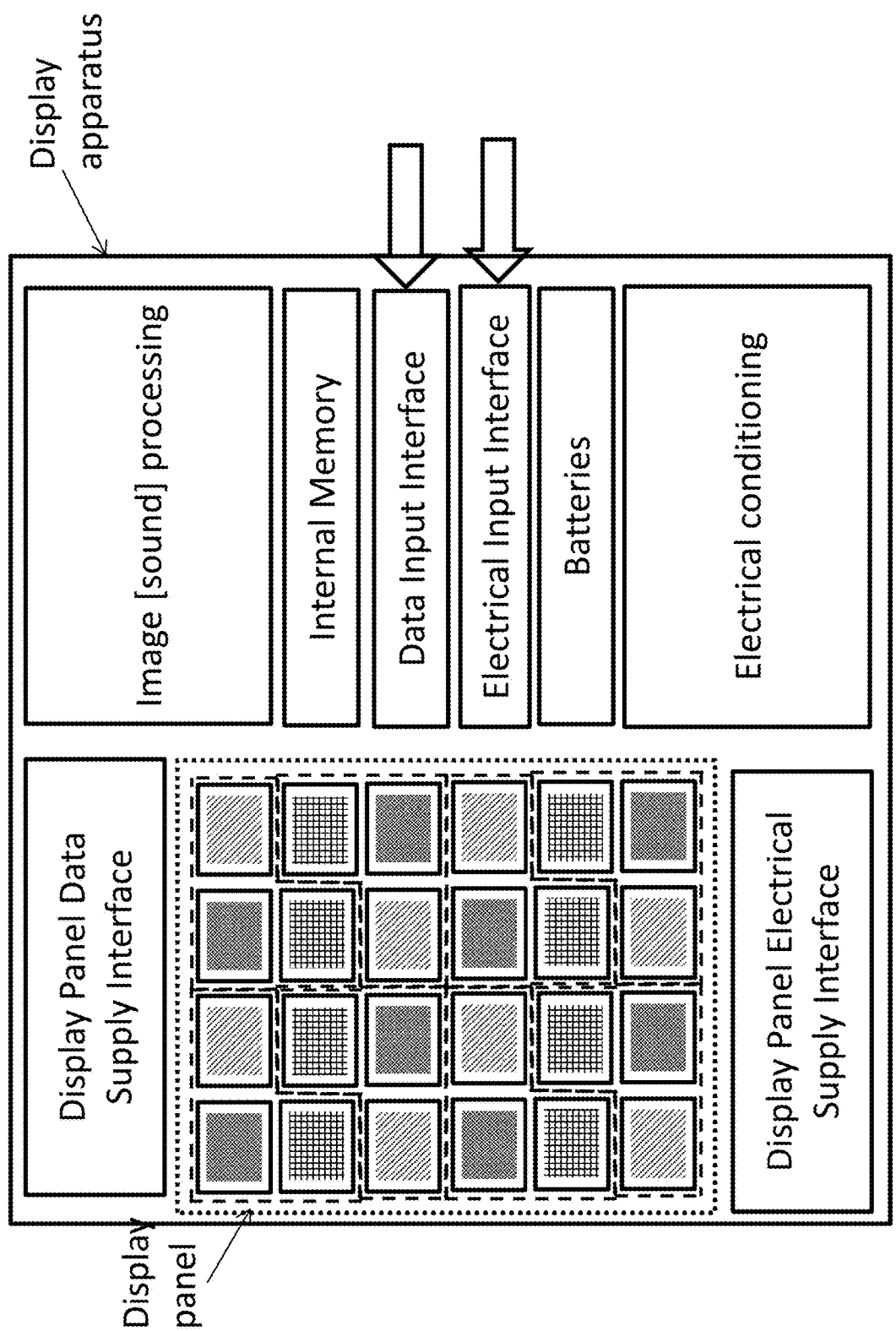

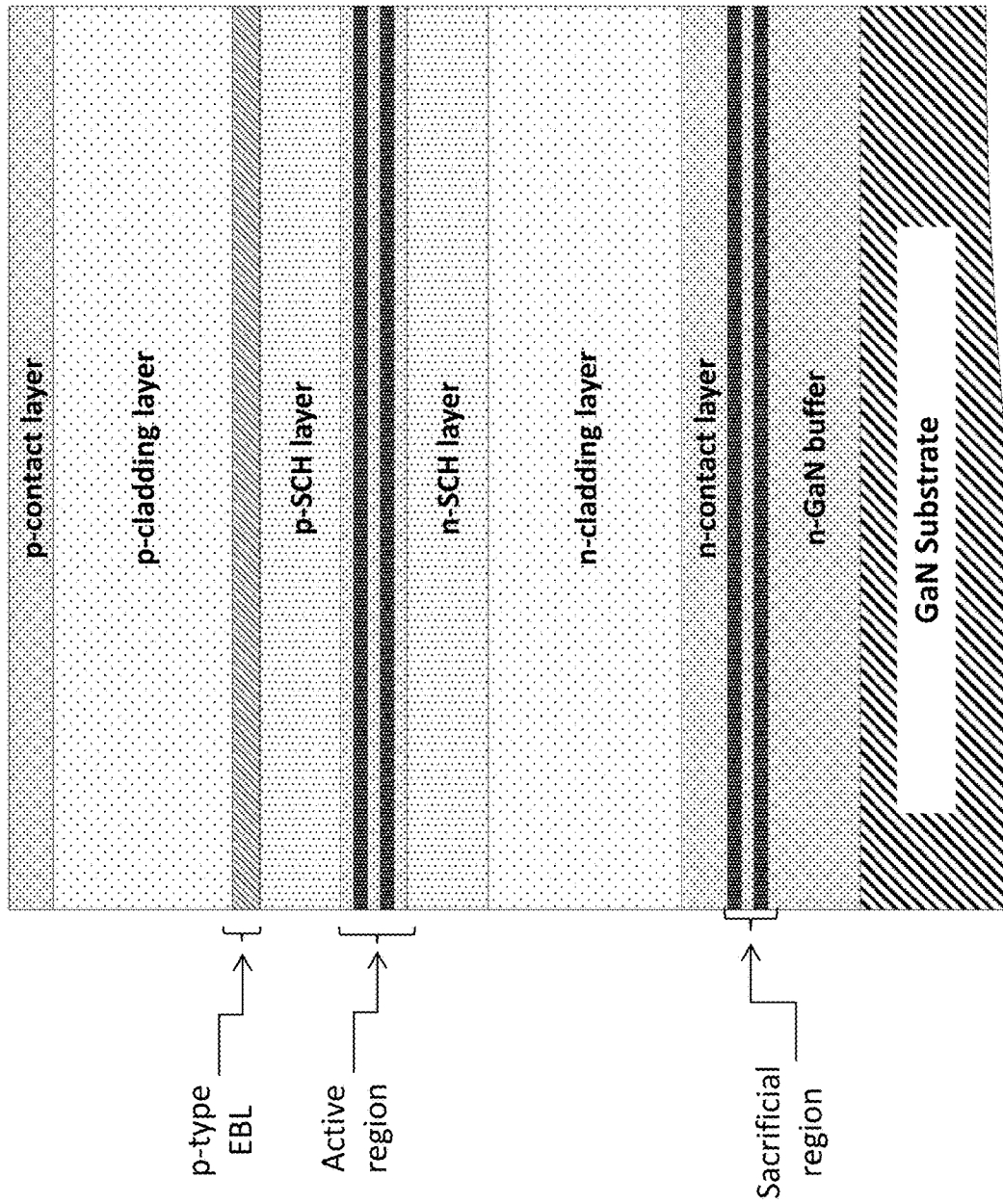
Figure 8A: Example of LD epitaxial structure

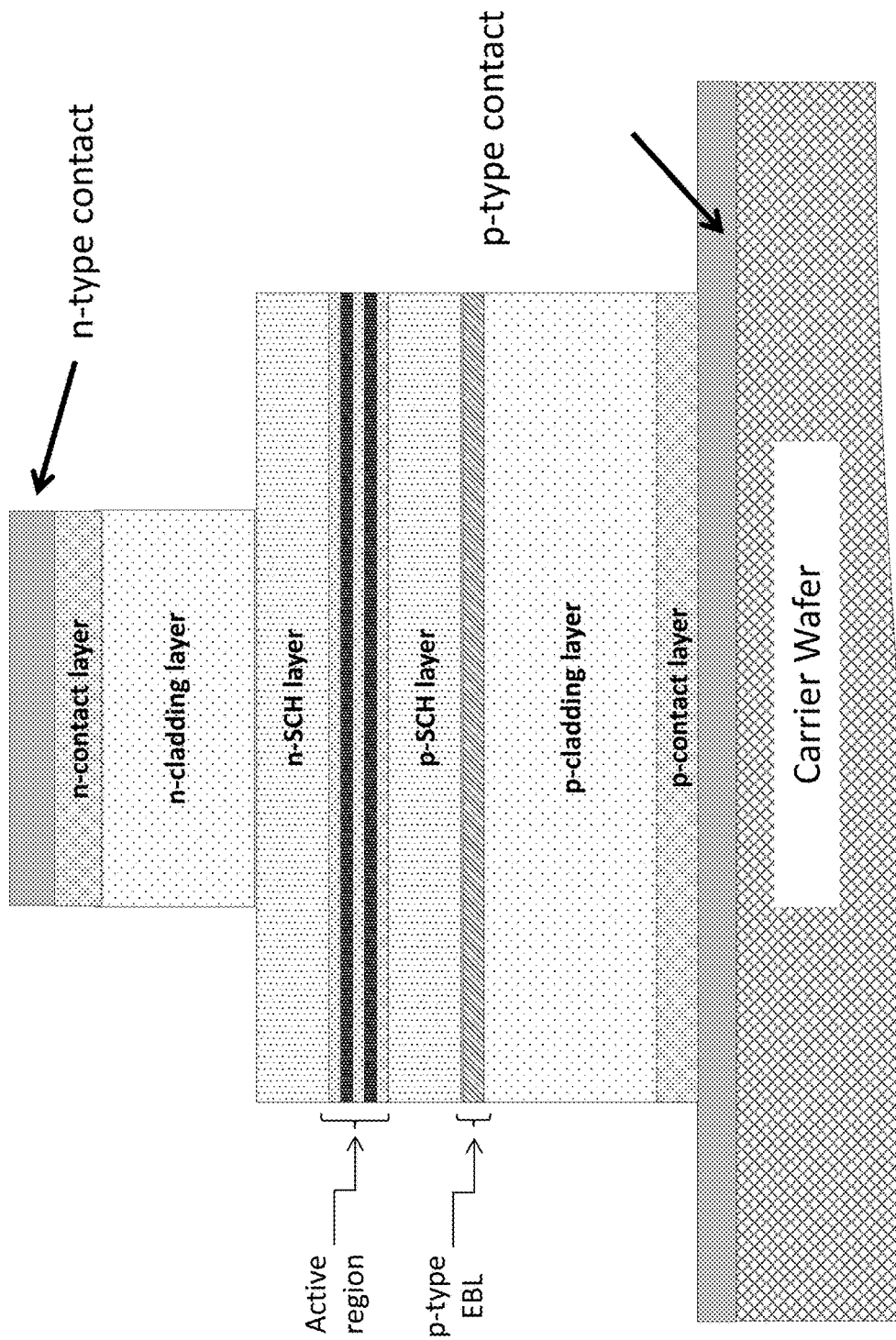
Figure 8B: Example of LD device structure formed on carrier wafer from epitaxial structure in Figure 8A

Figure 8C: Die Expanded Laser Diode
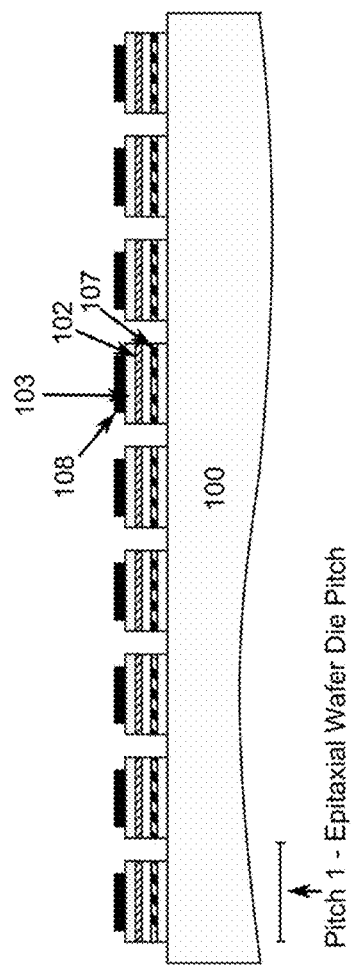
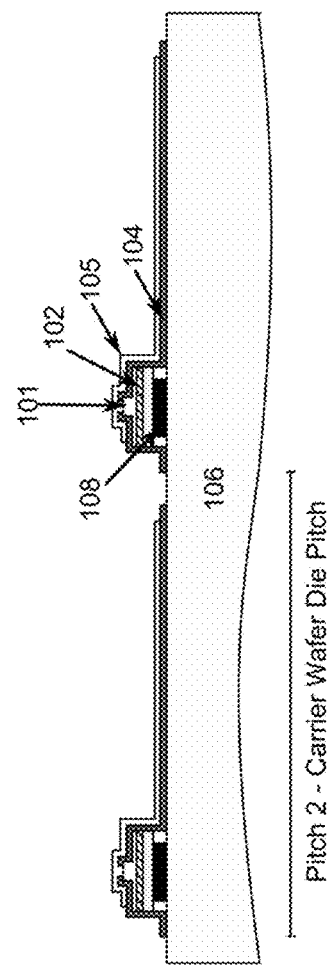

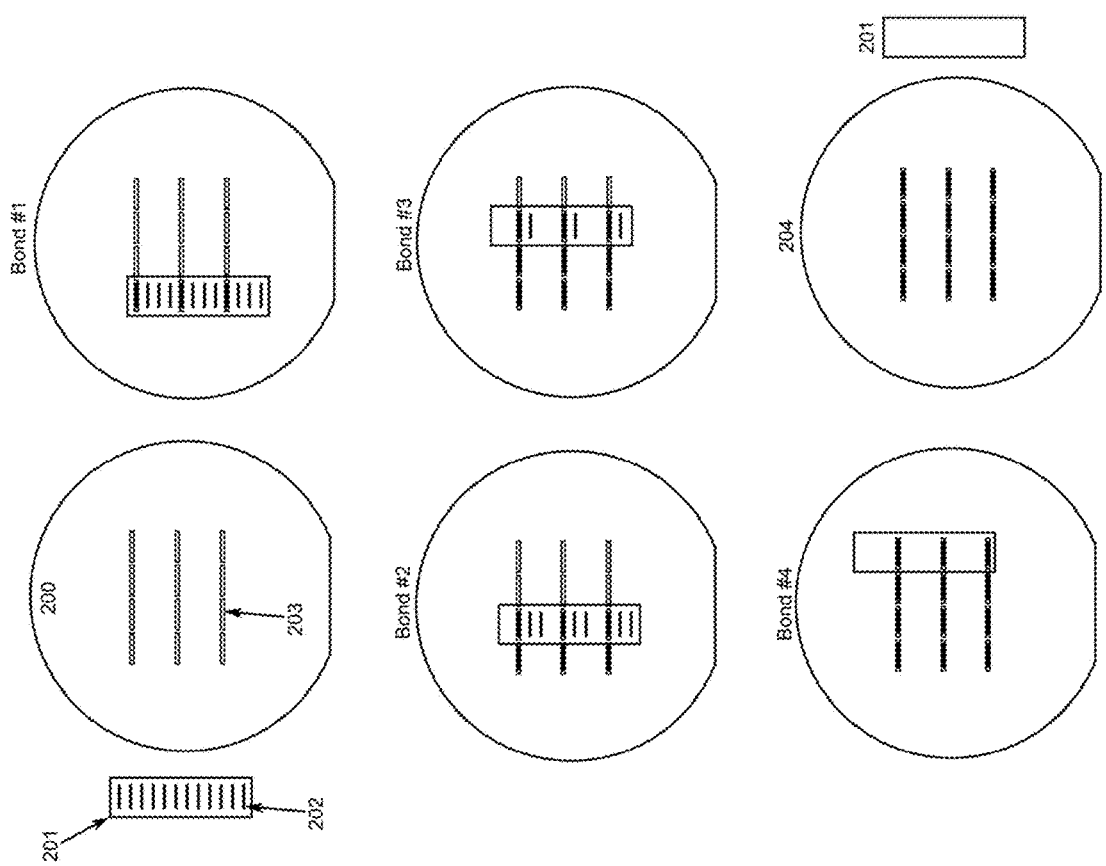
Figure 8D - Top view of die expansion for LD devices

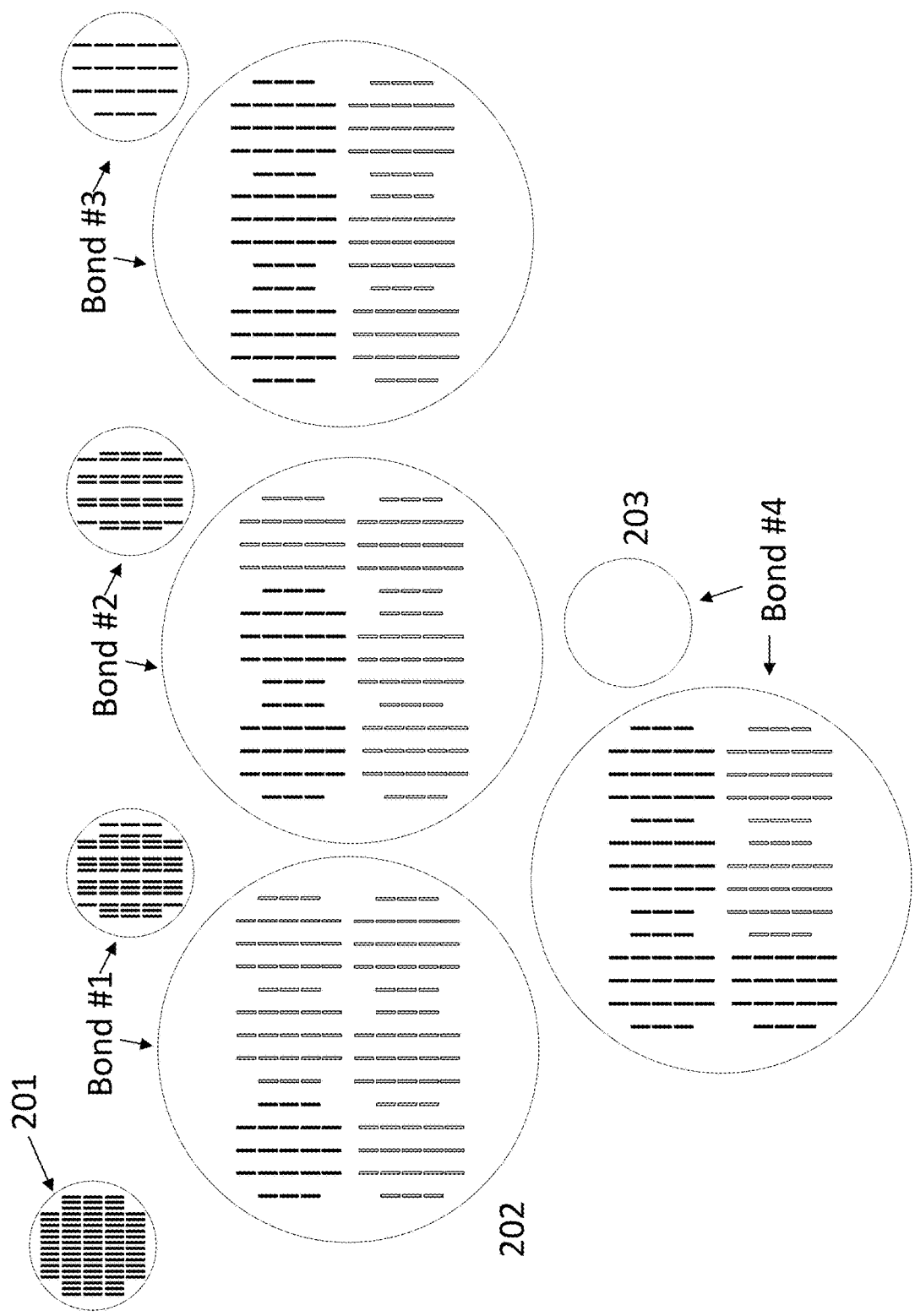
Figure 8E - Top view of die expansion for LD devices

Figure 9A: Material properties of GaN, SiC, and Si at 300K

| Properties* | GaN | Si | SiC |
|---|---|---|---|
| $E_G$ (eV) | 3.4 | 1.12 | 3.2 |
| $E_{BR}$ (MV/cm) | 3.3 | 0.3 | 3.5 |
| $V_S$ (x $10^7$ cm/s) | 2.5 | 1.0 | 2.0 |
| $\mu$ (cm$^2$/Vs) | 990 – 2000 | 1500 | 650 |

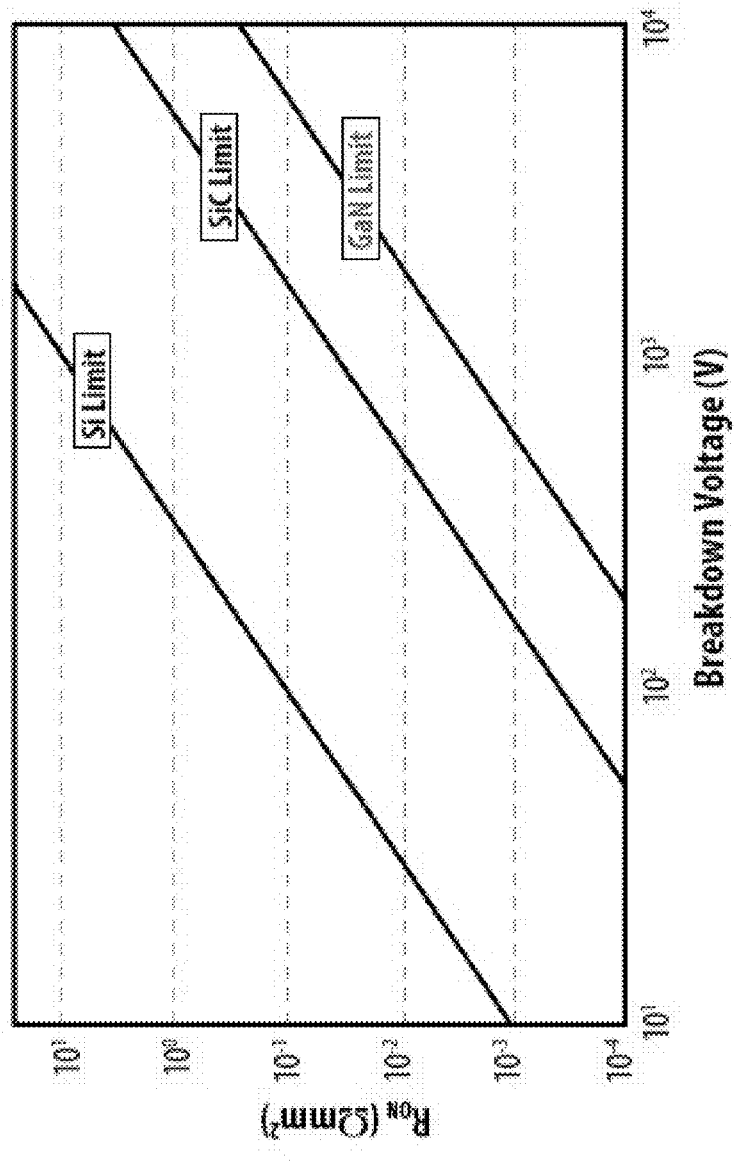
Figure 9B: Theoretical on-resistance vs blocking voltage for GaN, SiC, and Si

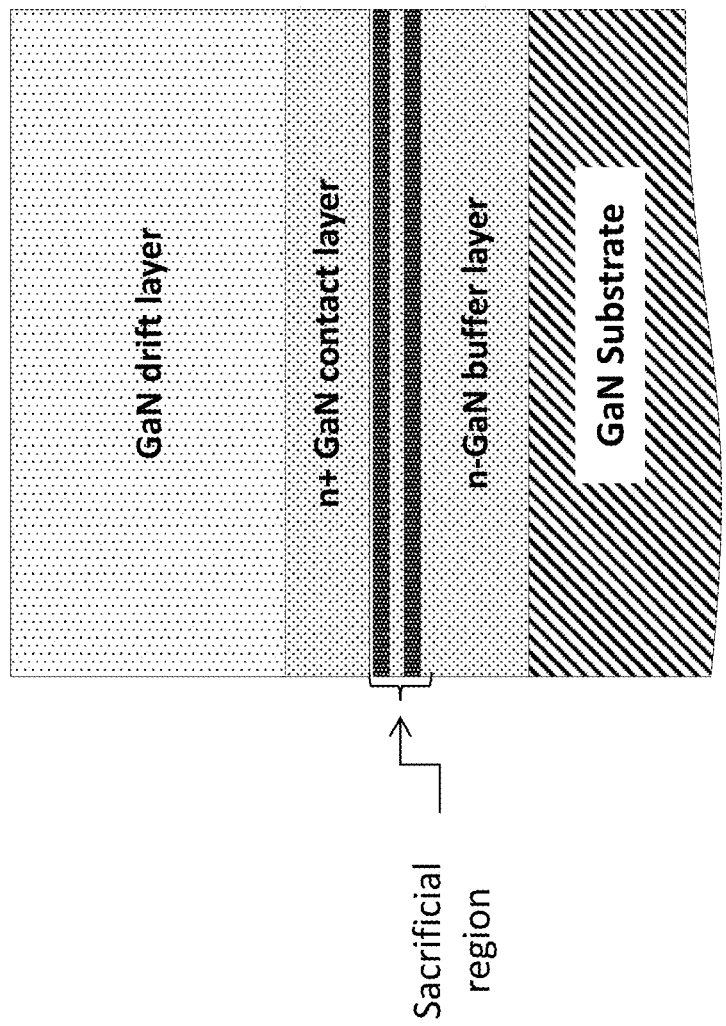
FIG. 10A: Example of an epitaxial stack

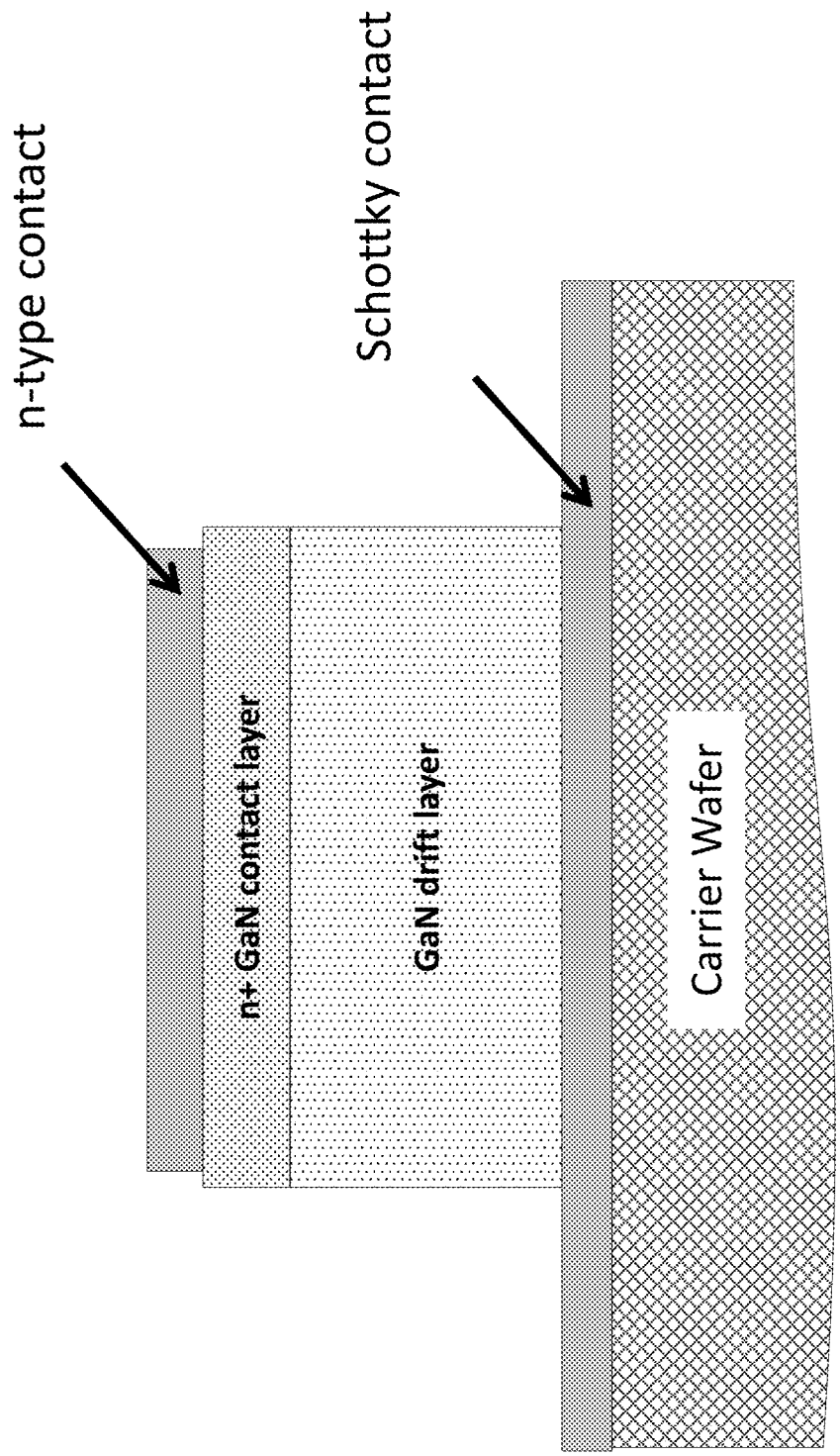
FIG. 10B: Vertical Schottky barrier diode device

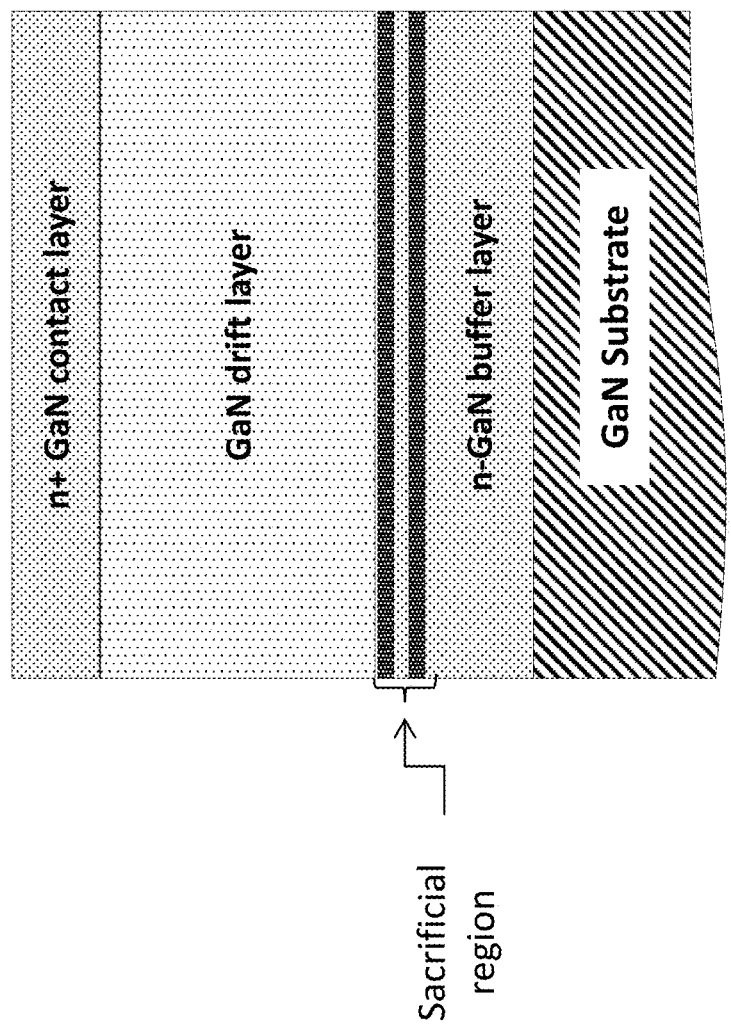
FIG. 10C: Example of an epitaxial stack

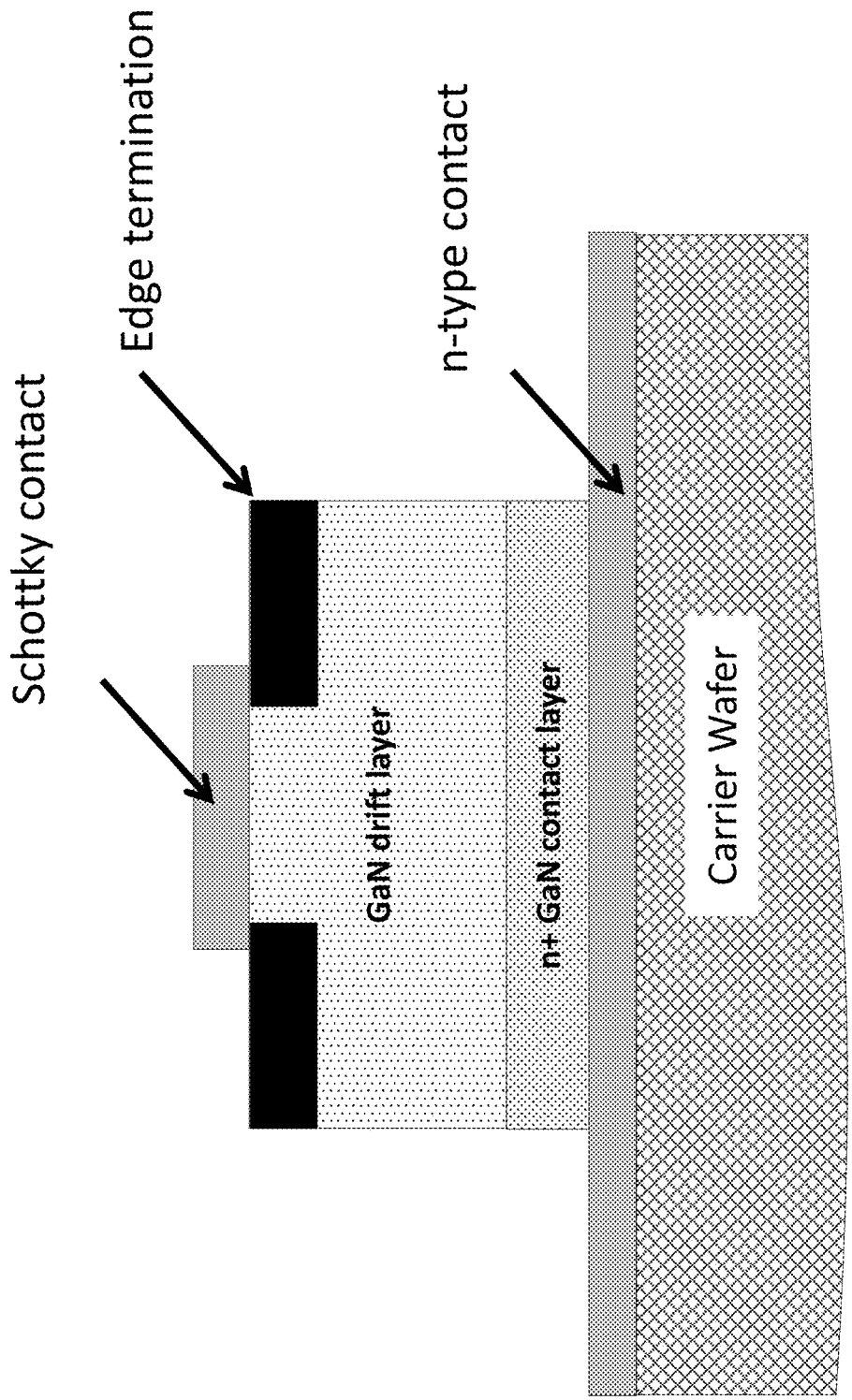
FIG. 10D: Vertical Schottky barrier diode device

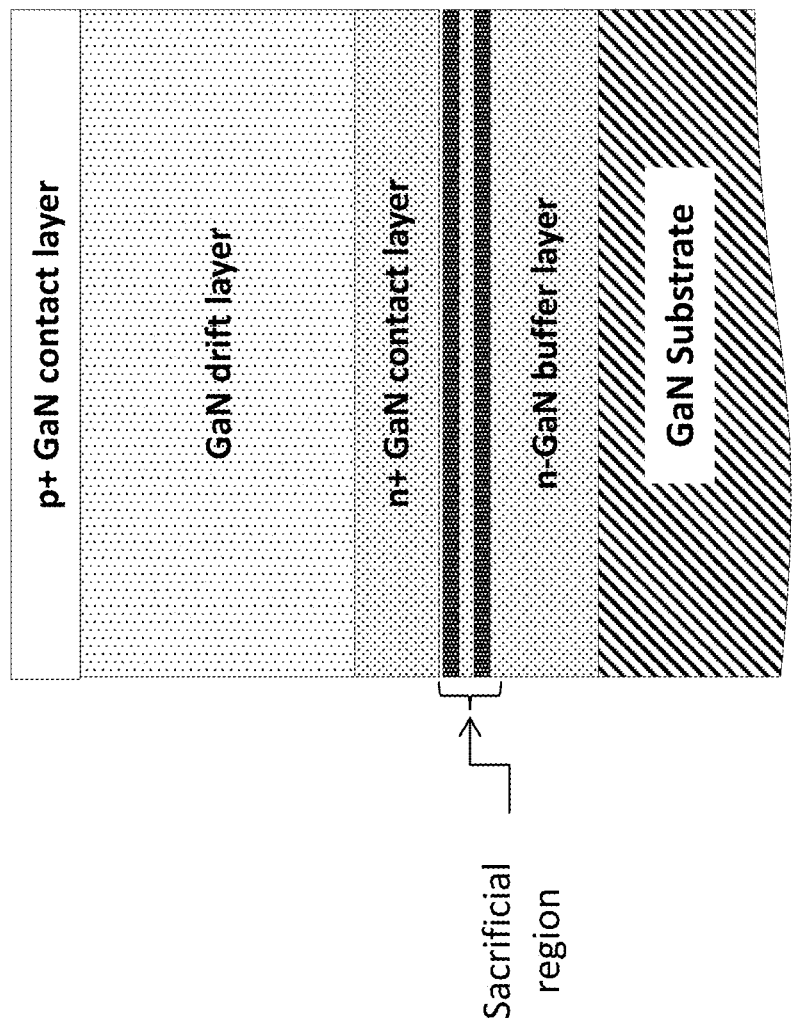
FIG. 11A: Example of epitaxial stack

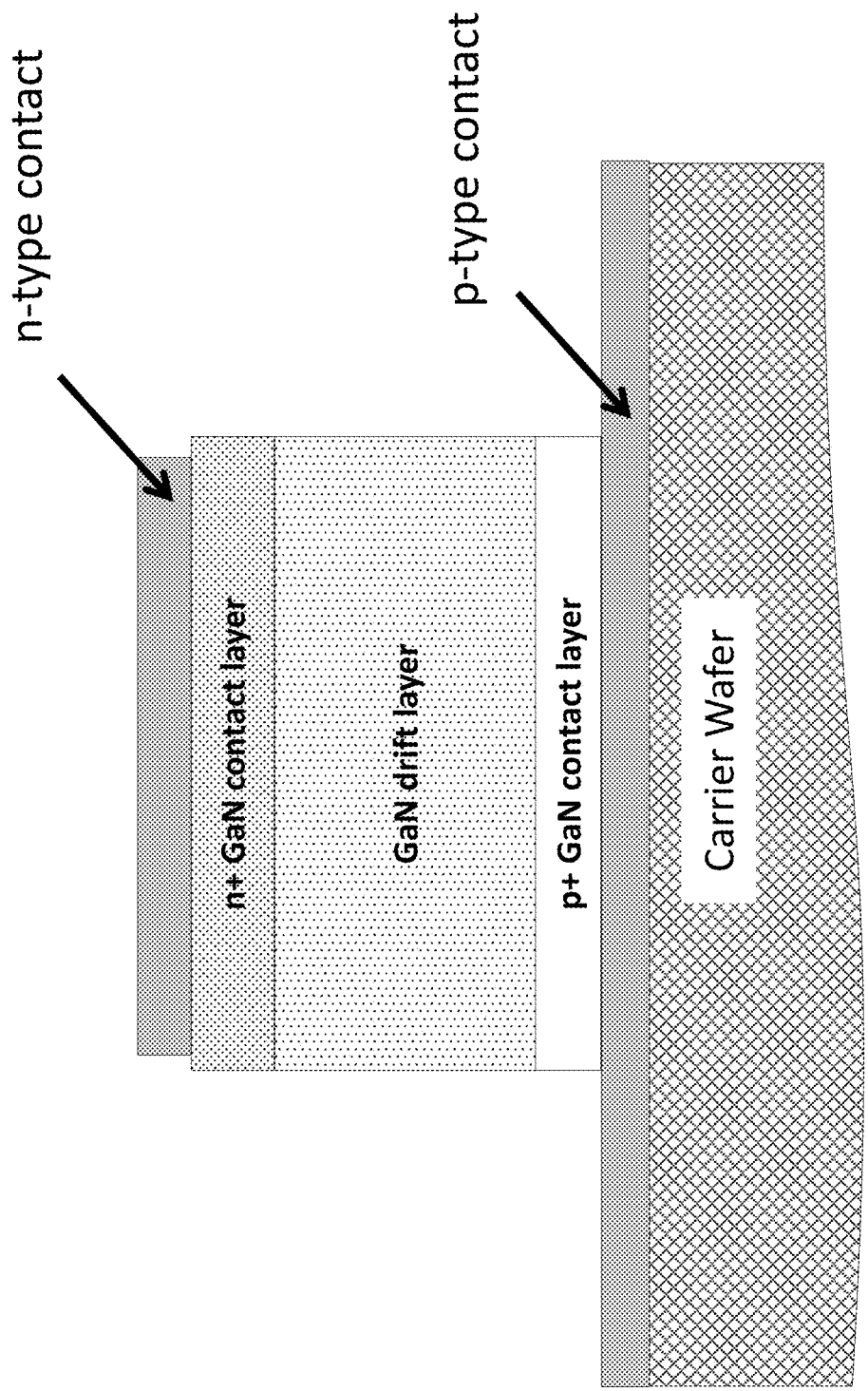
FIG. 11B: Vertical pn diode device

FIG. 11C: Example of epitaxial stack
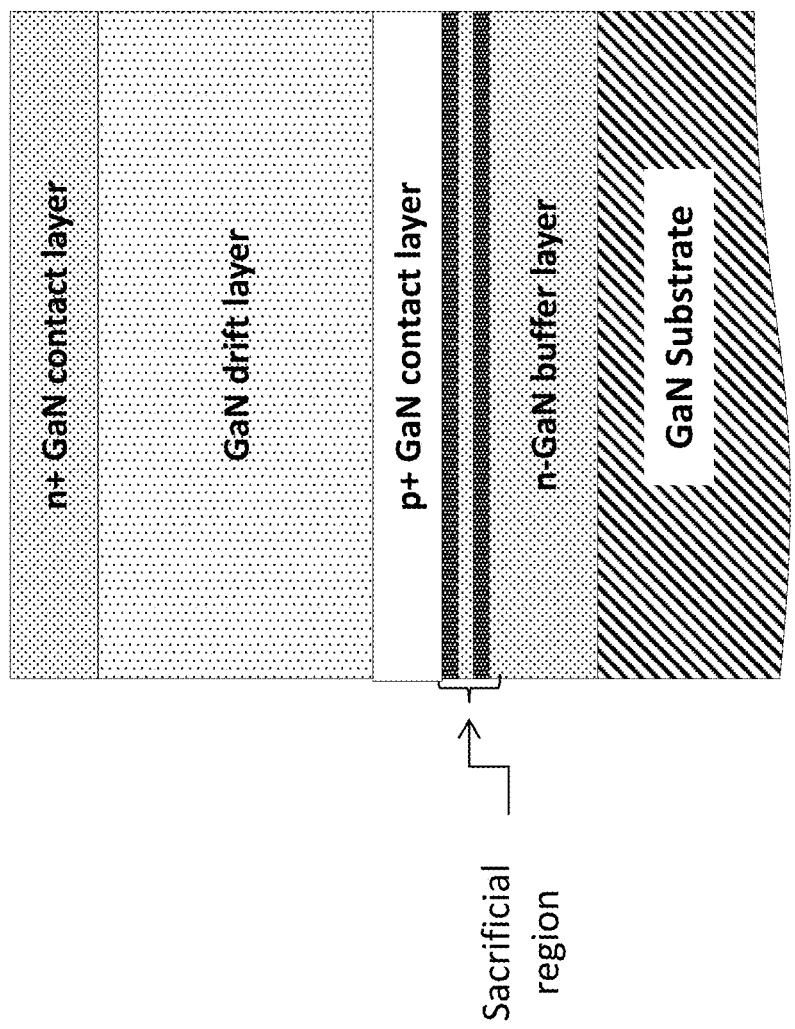

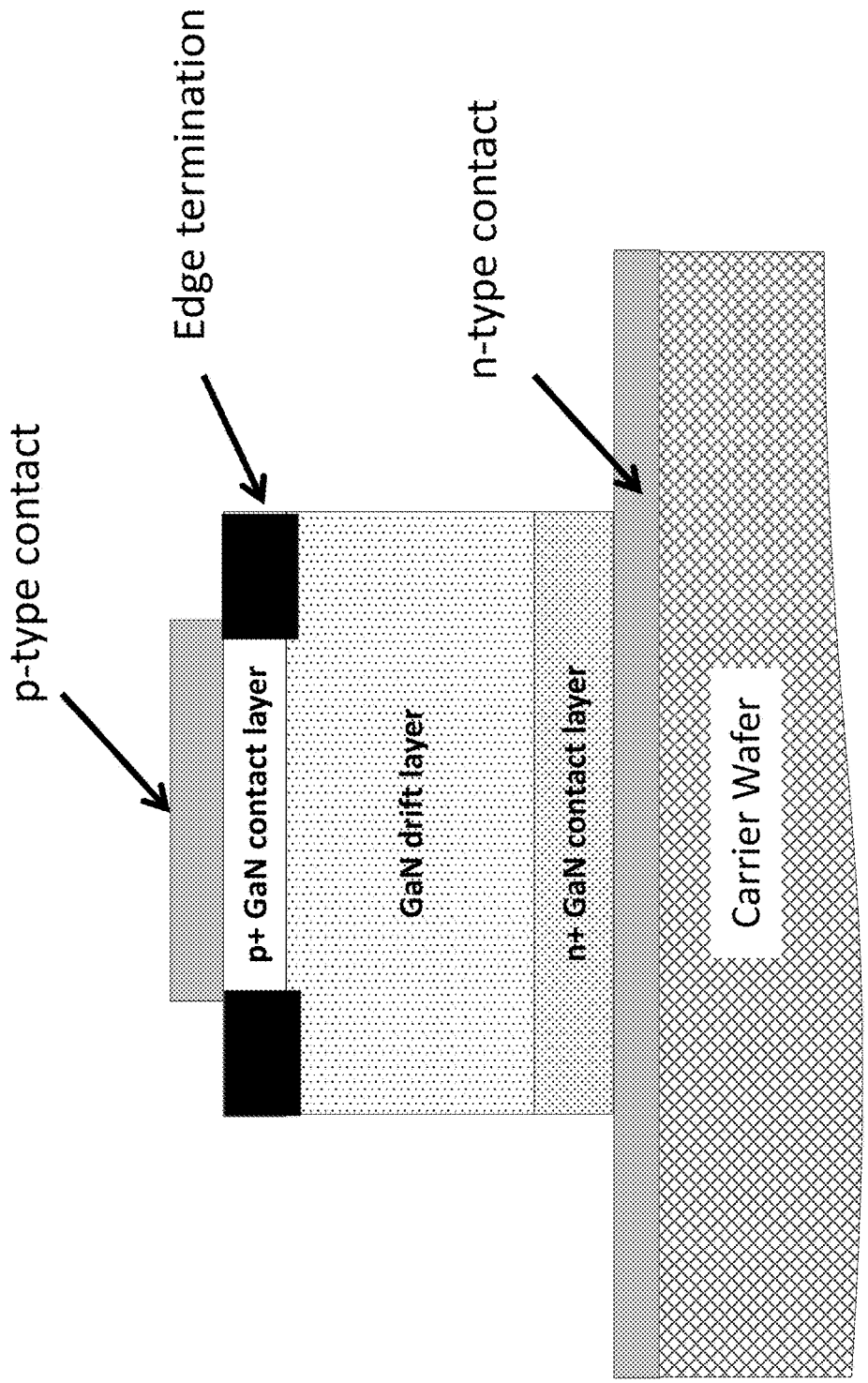
FIG. 11D: Vertical pn diode device

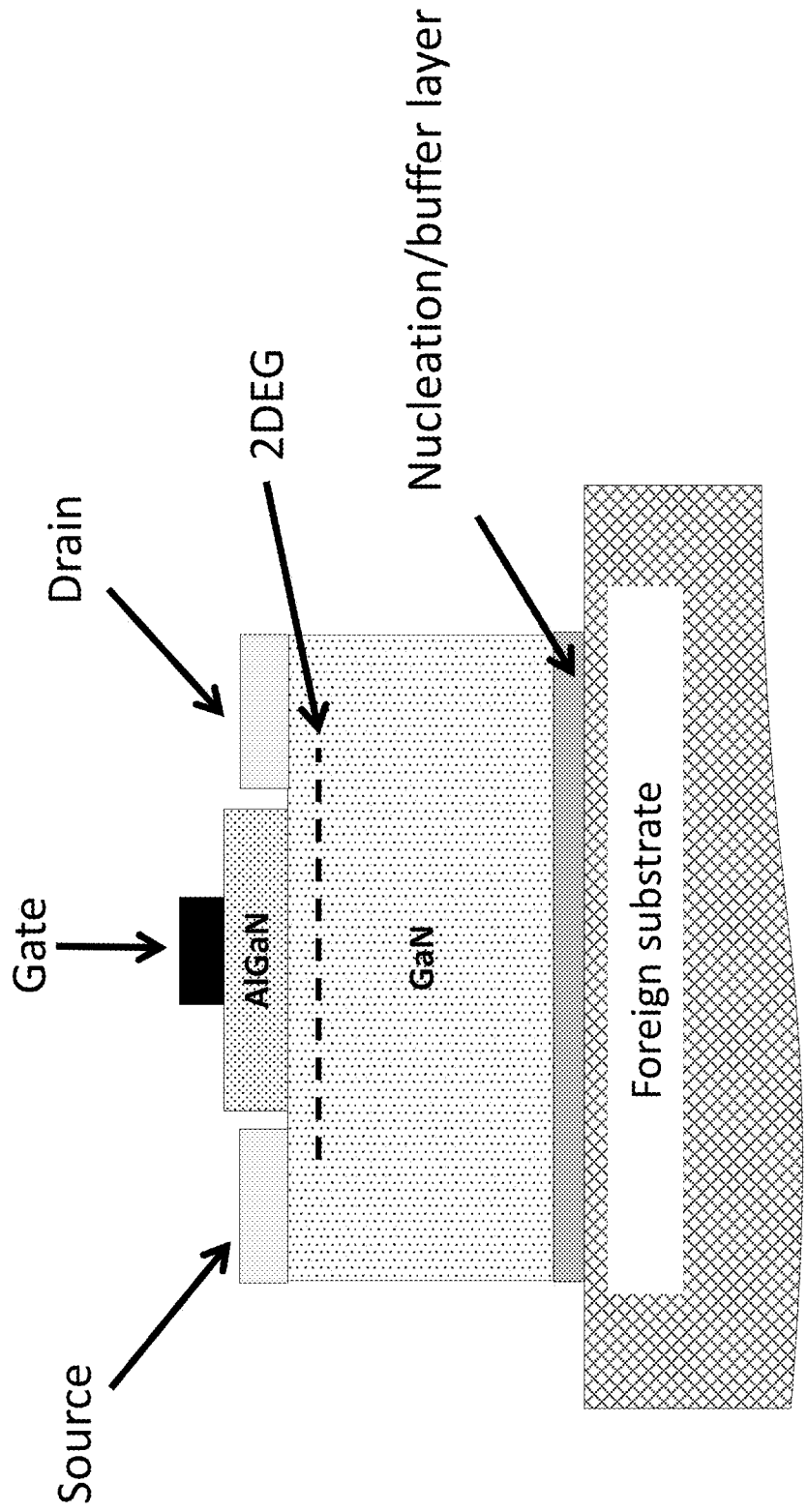
FIG. 12A: Example of a conventional HEMT device

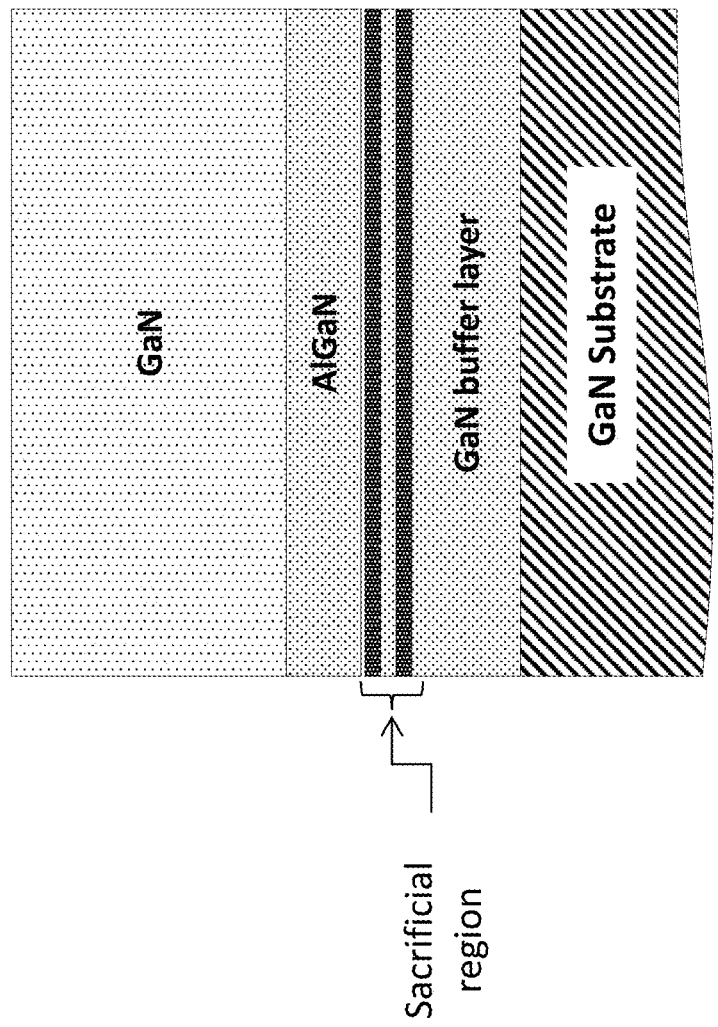
FIG. 12B: Example of epitaxial stack

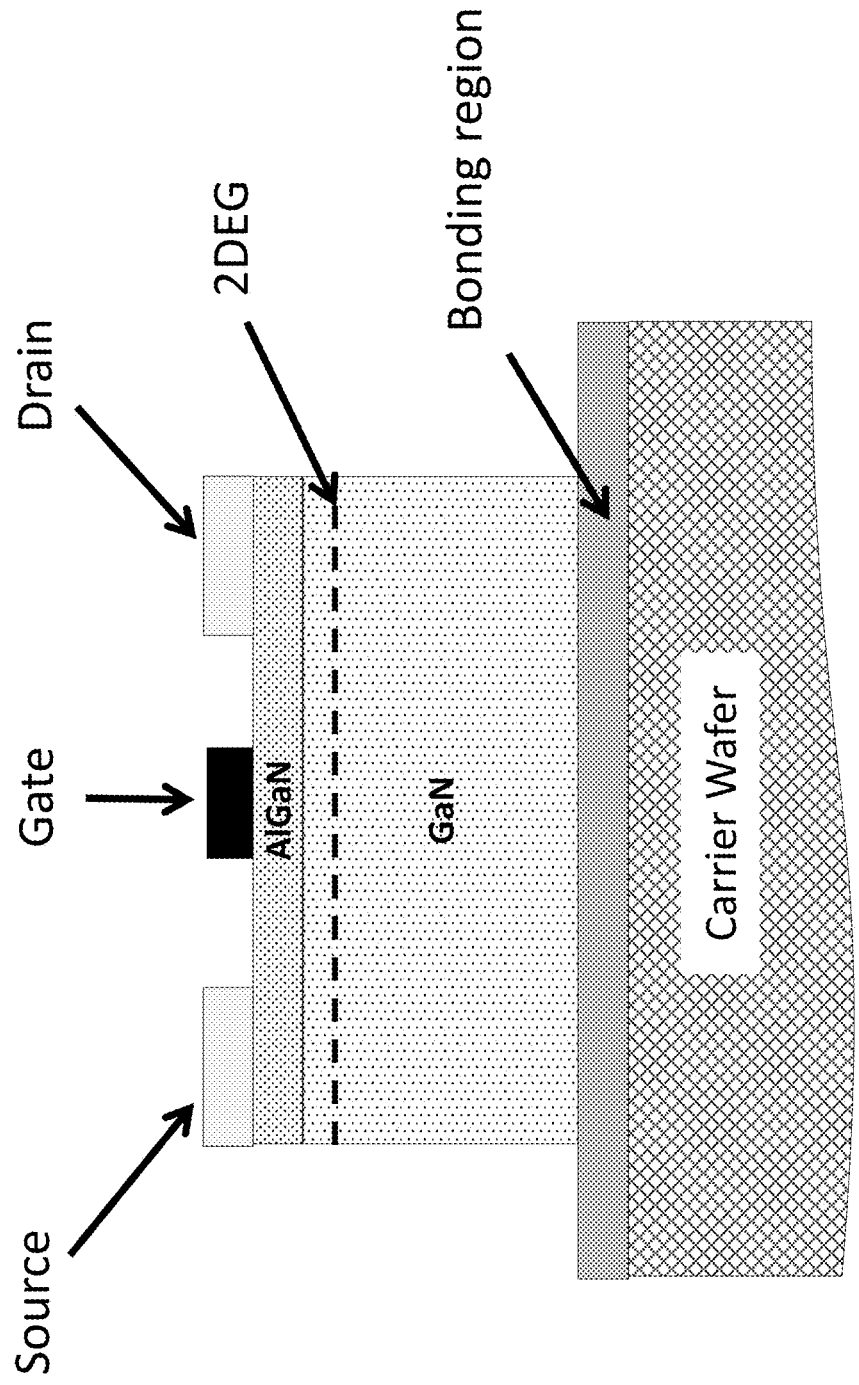
FIG. 12C: Example of a HEMT/HFET device

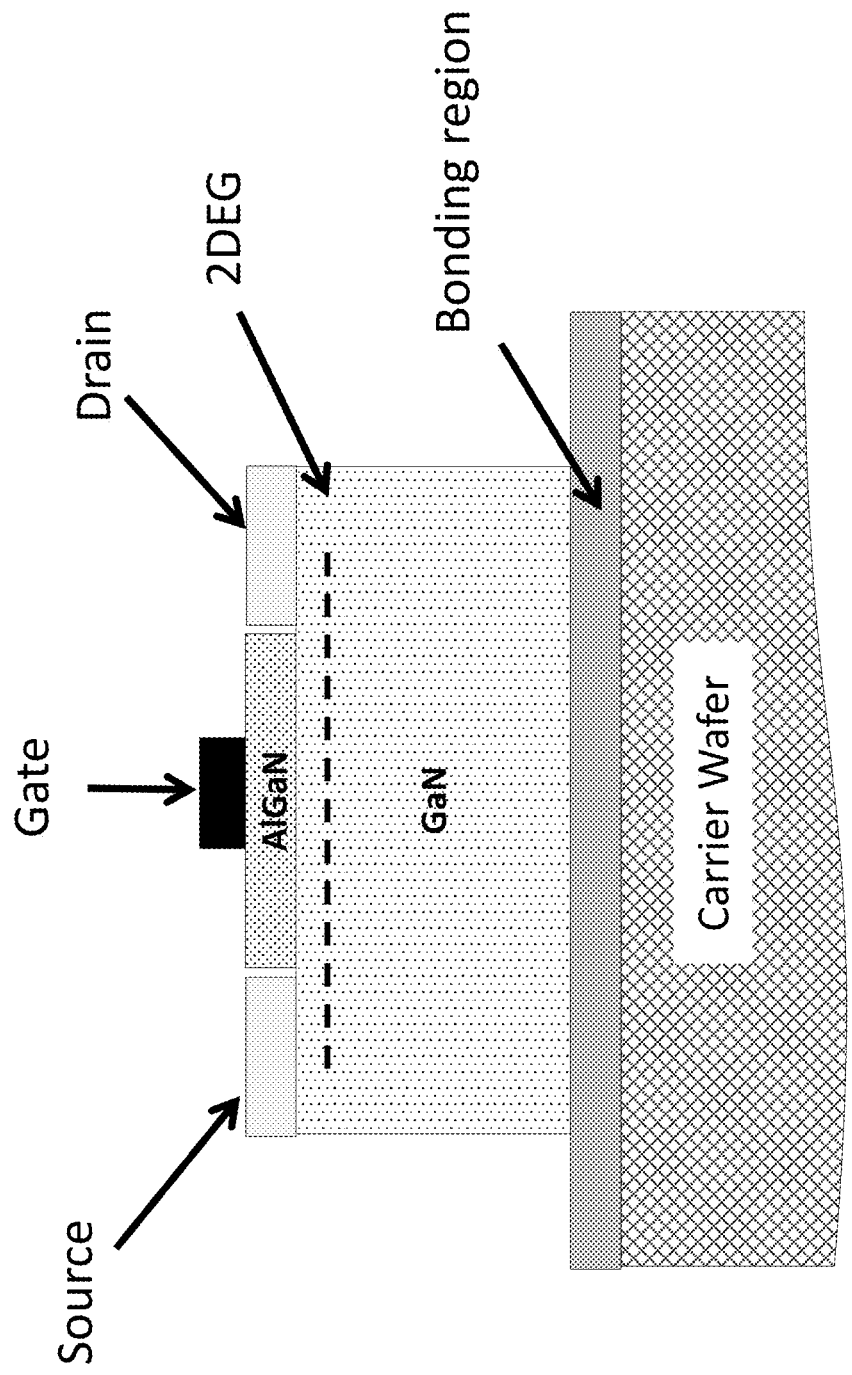
FIG. 12D: Example of a HEMT/HFET device

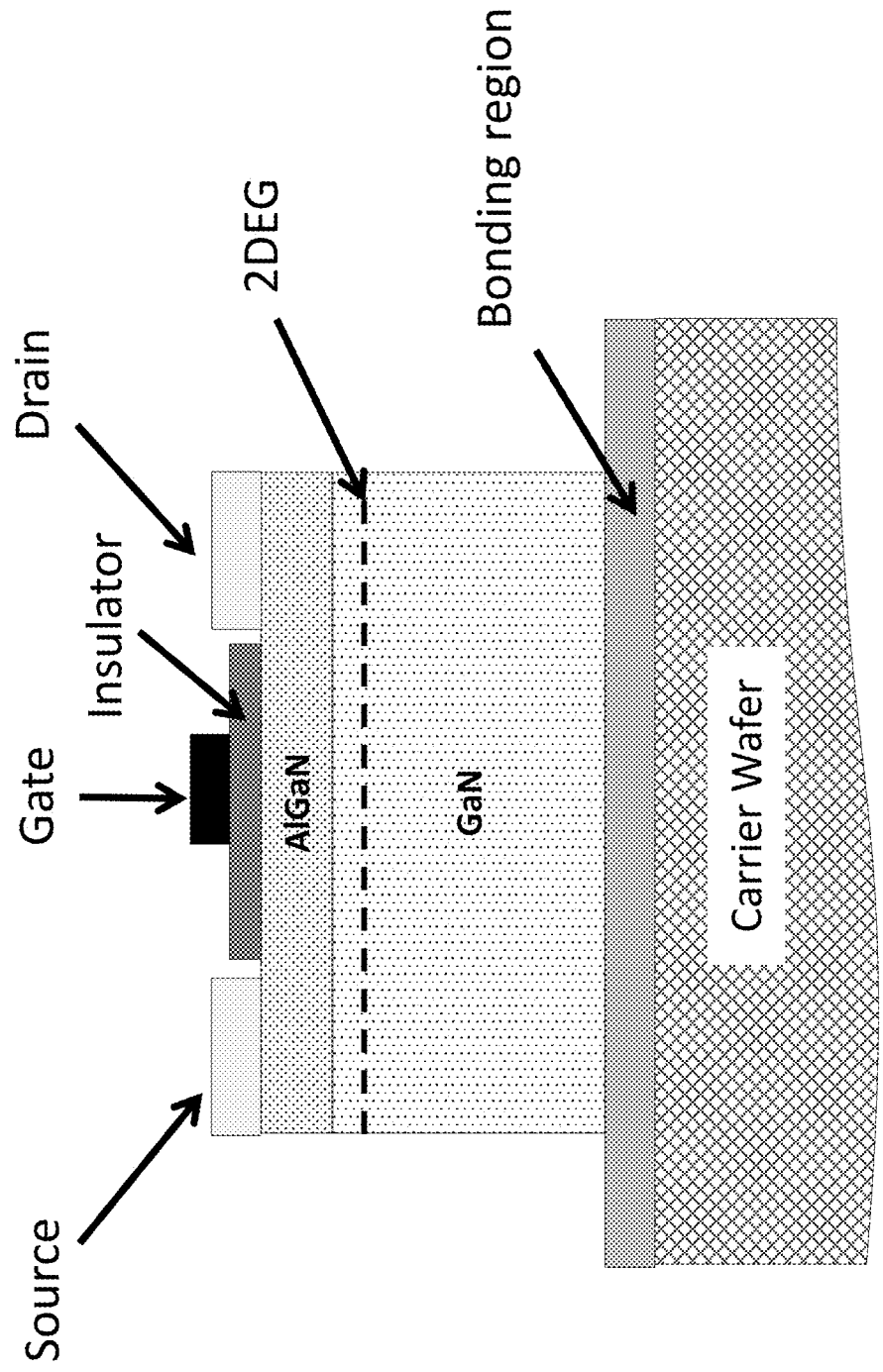
FIG. 12E: Example of an insulated gate HEMT

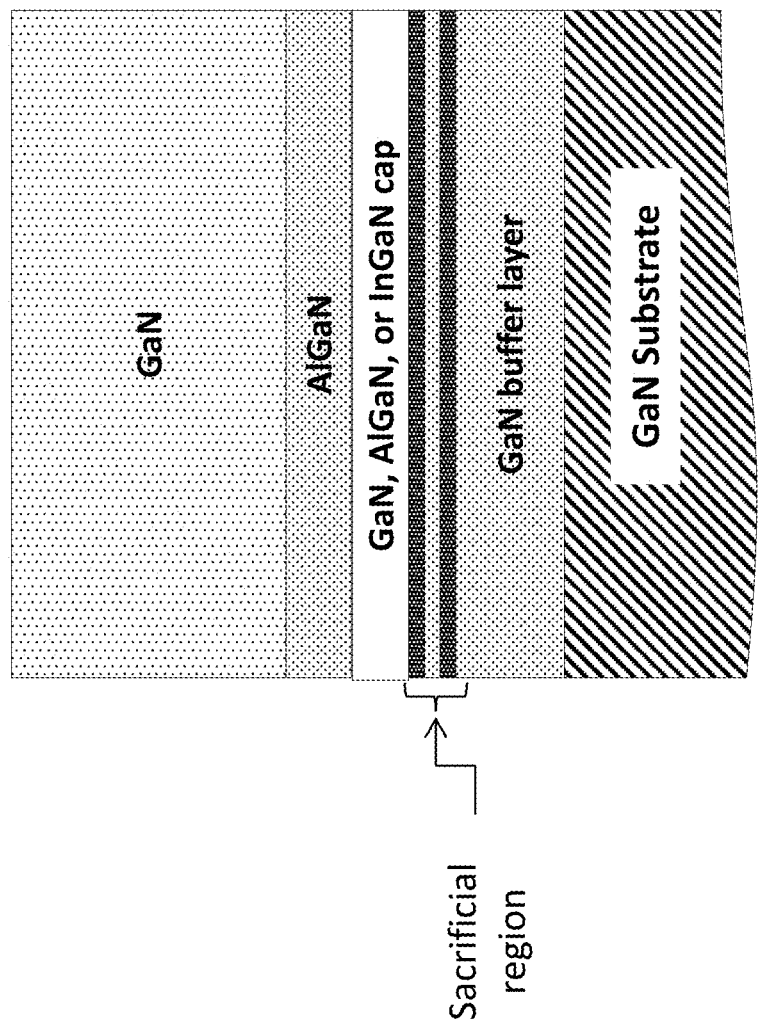
FIG. 12F: Example of epitaxial stack

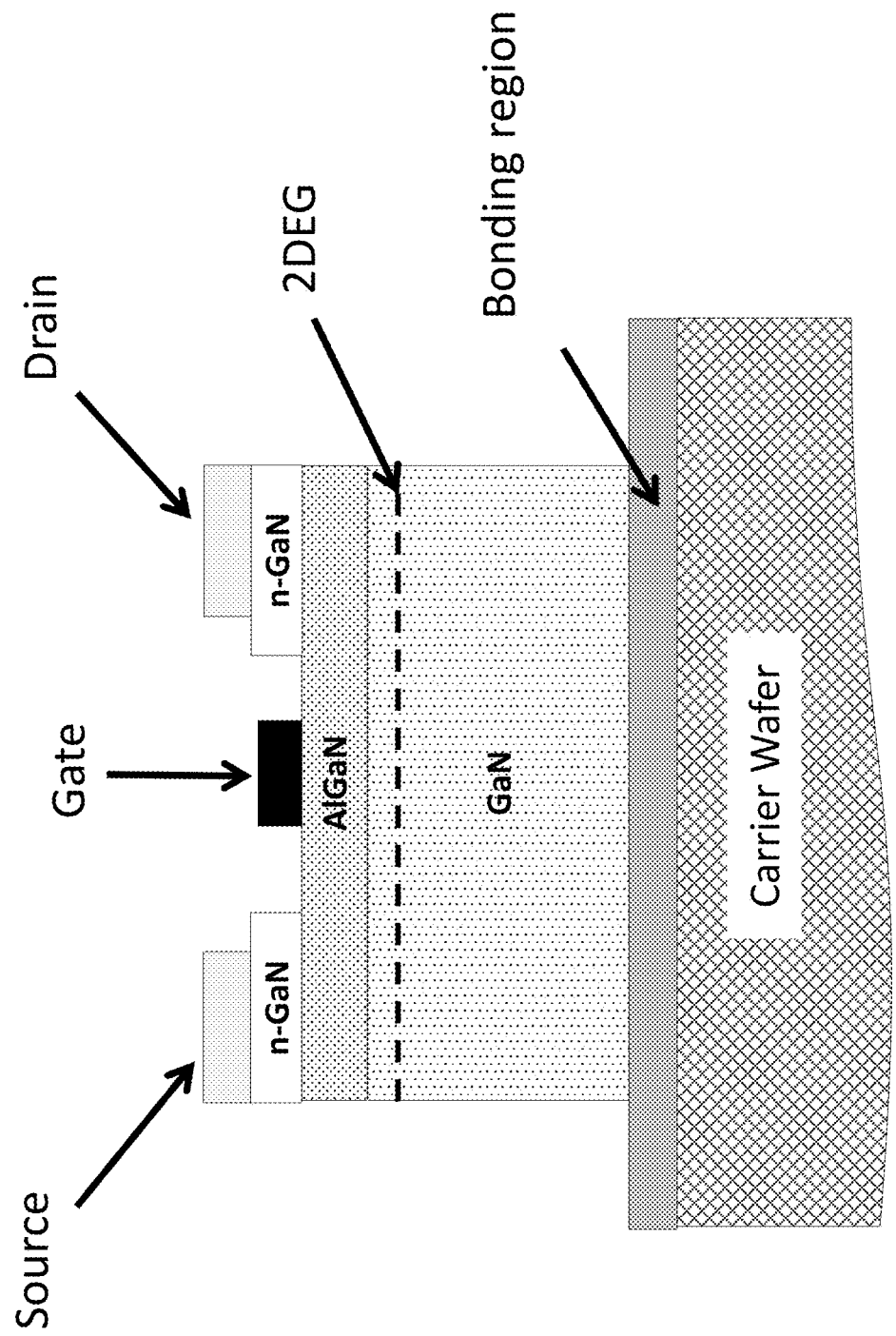
FIG. 12G: Example of a HEMT device

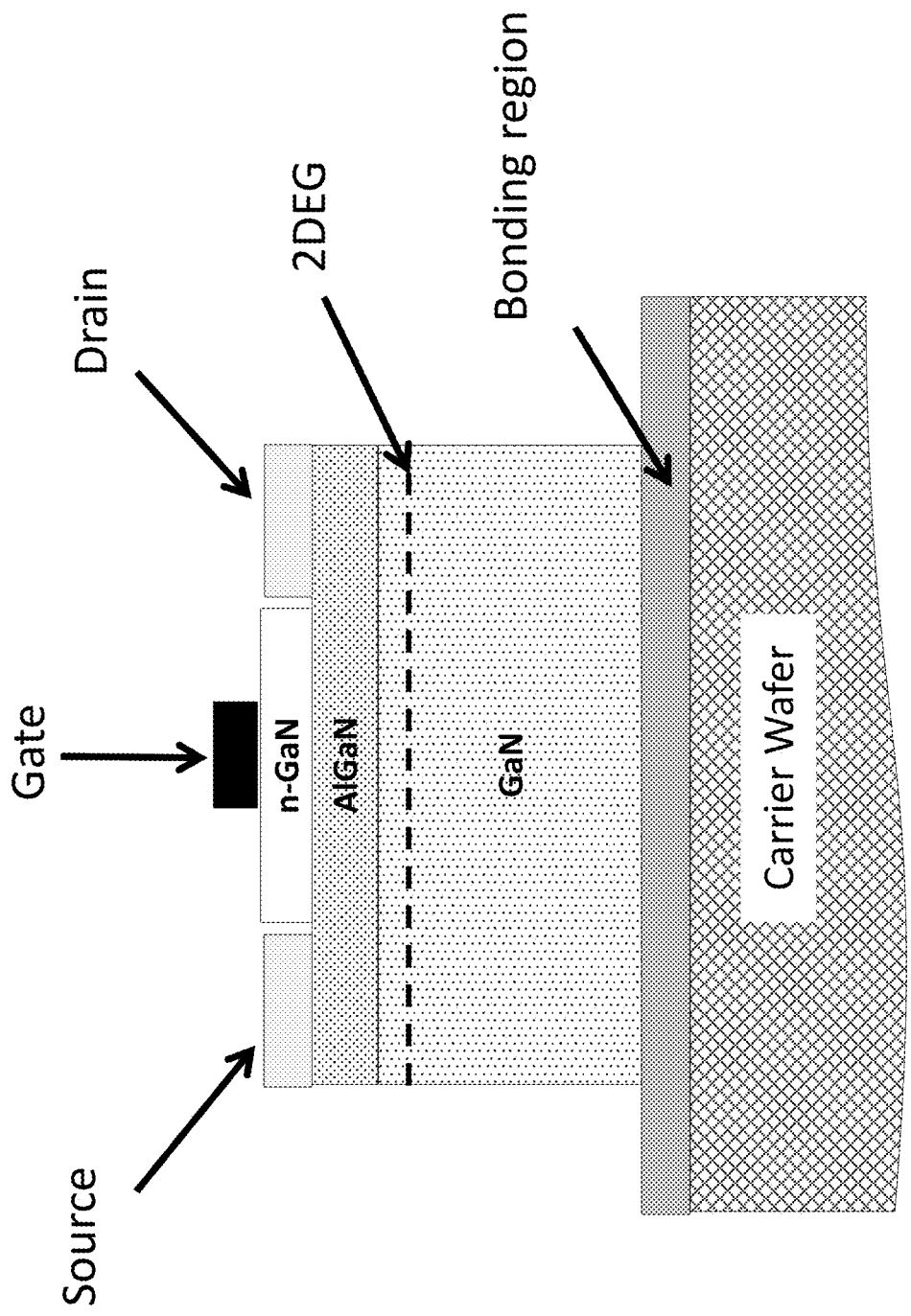
FIG. 12H: Example of a HEMT device

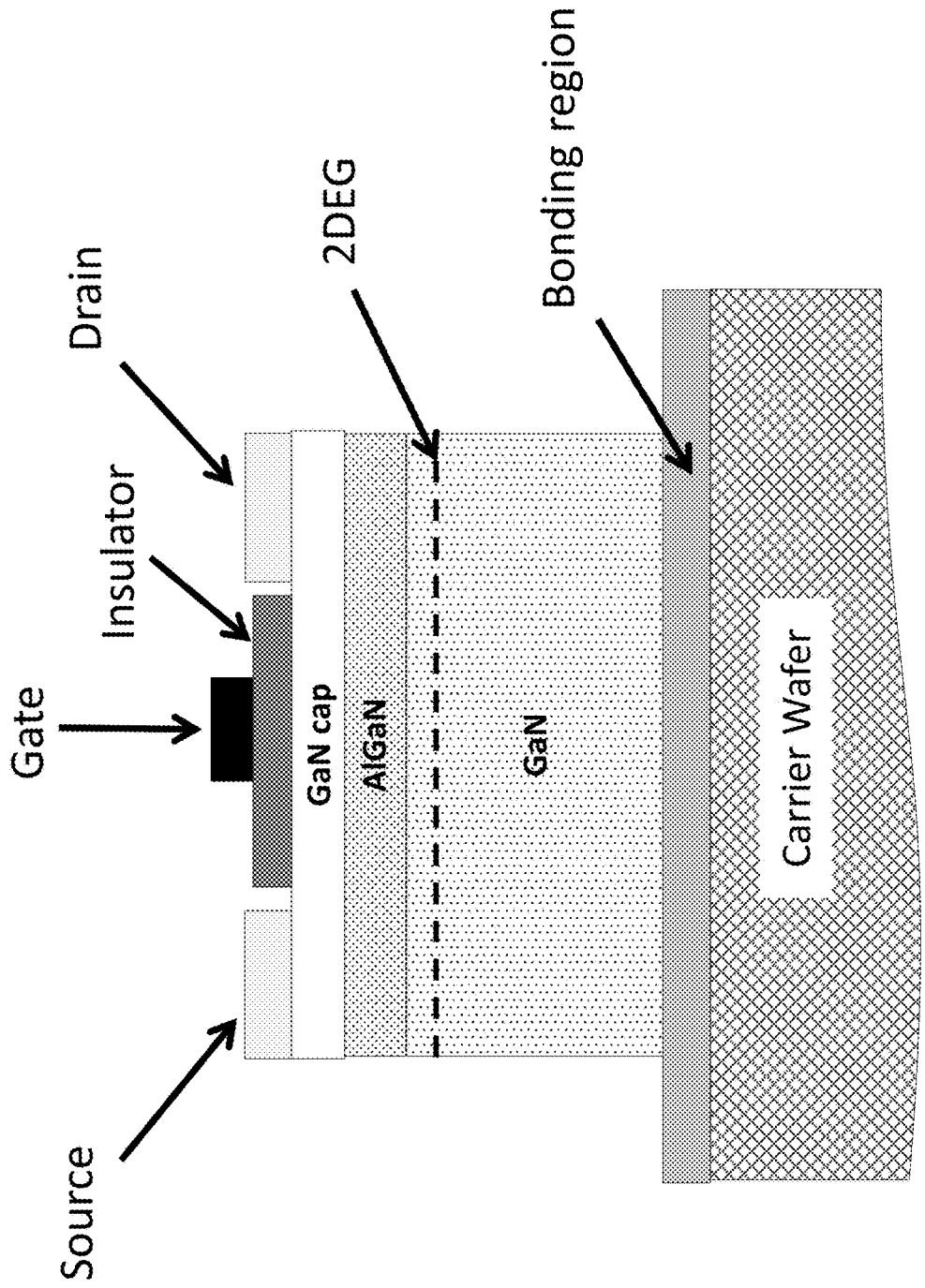
FIG. 12I: Example of a HEMT device

FIG. 12J: Example of a recessed gate HEMT device
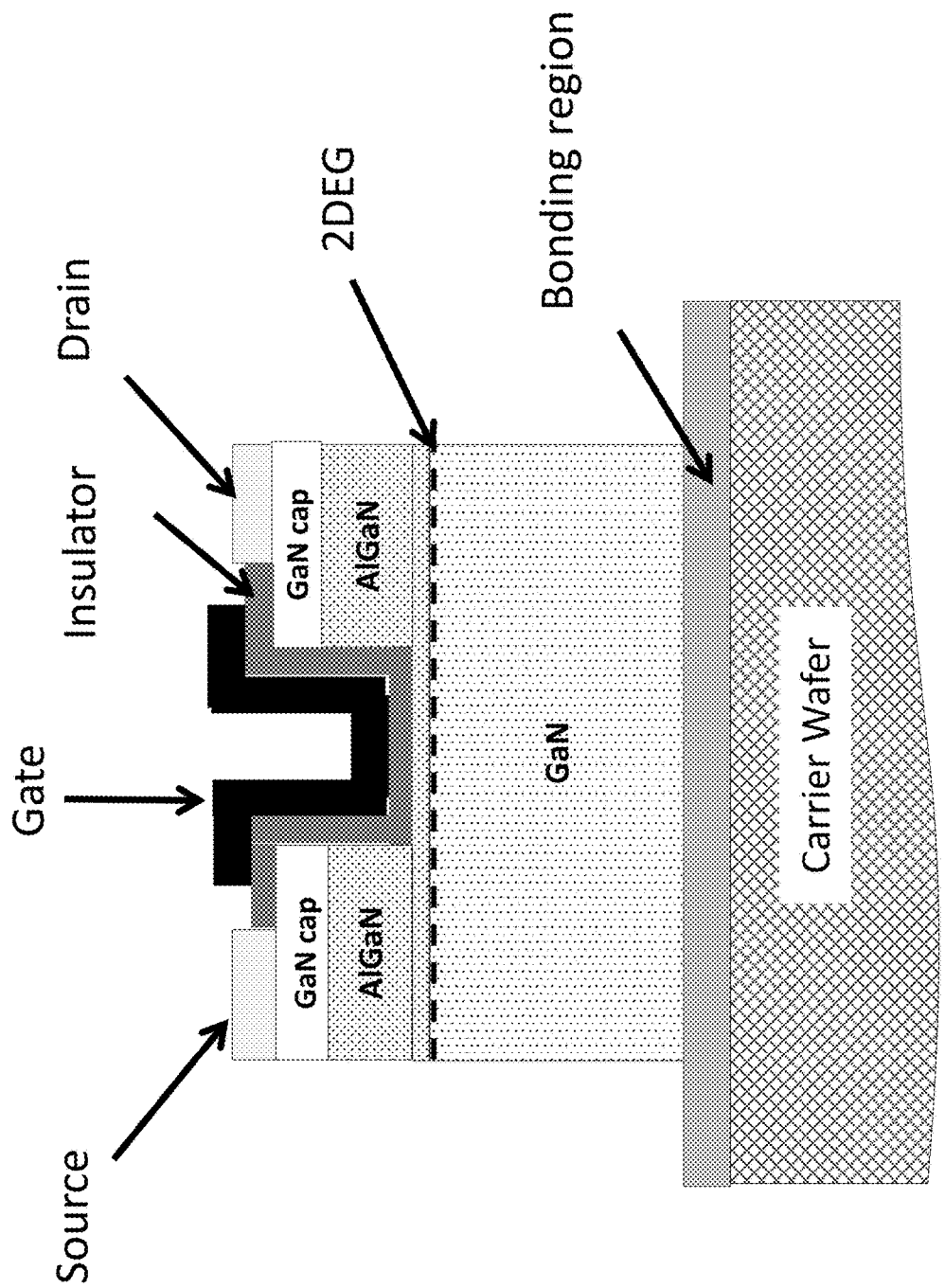

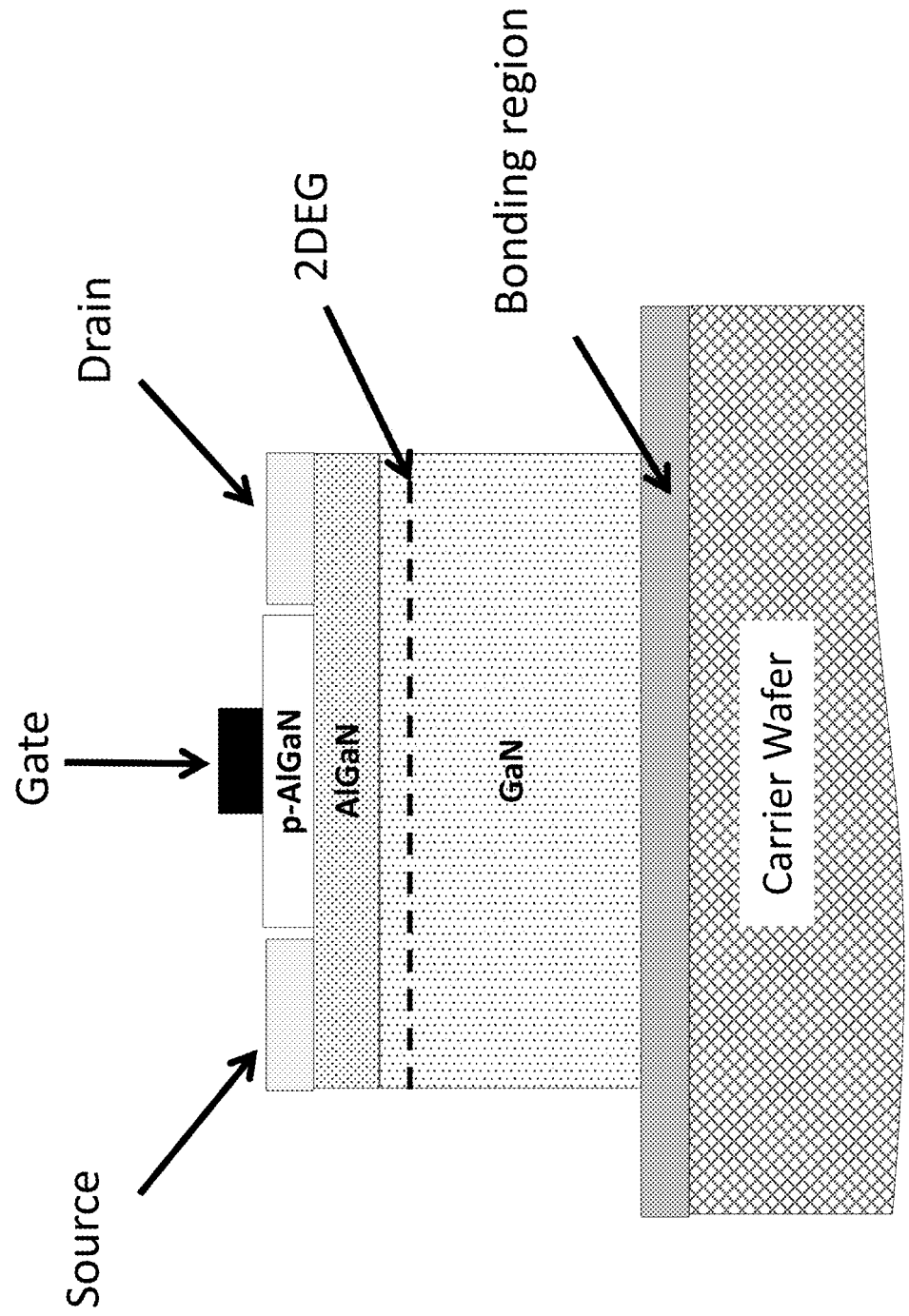
FIG. 12K: Example of a GIT device

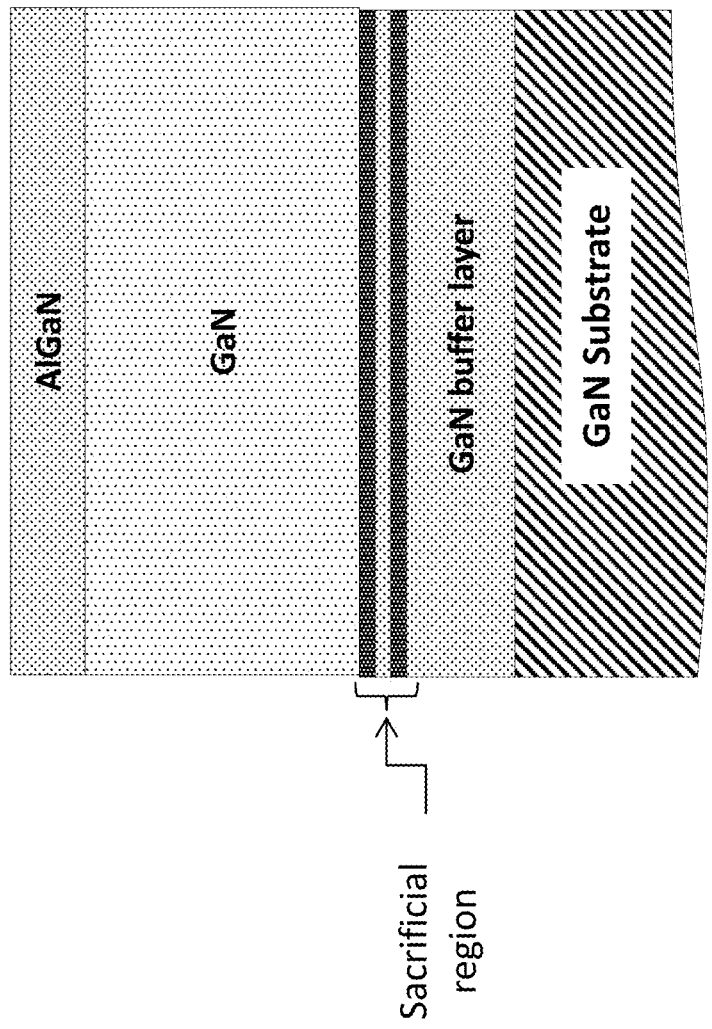
FIG. 12L: Example of epitaxial stack

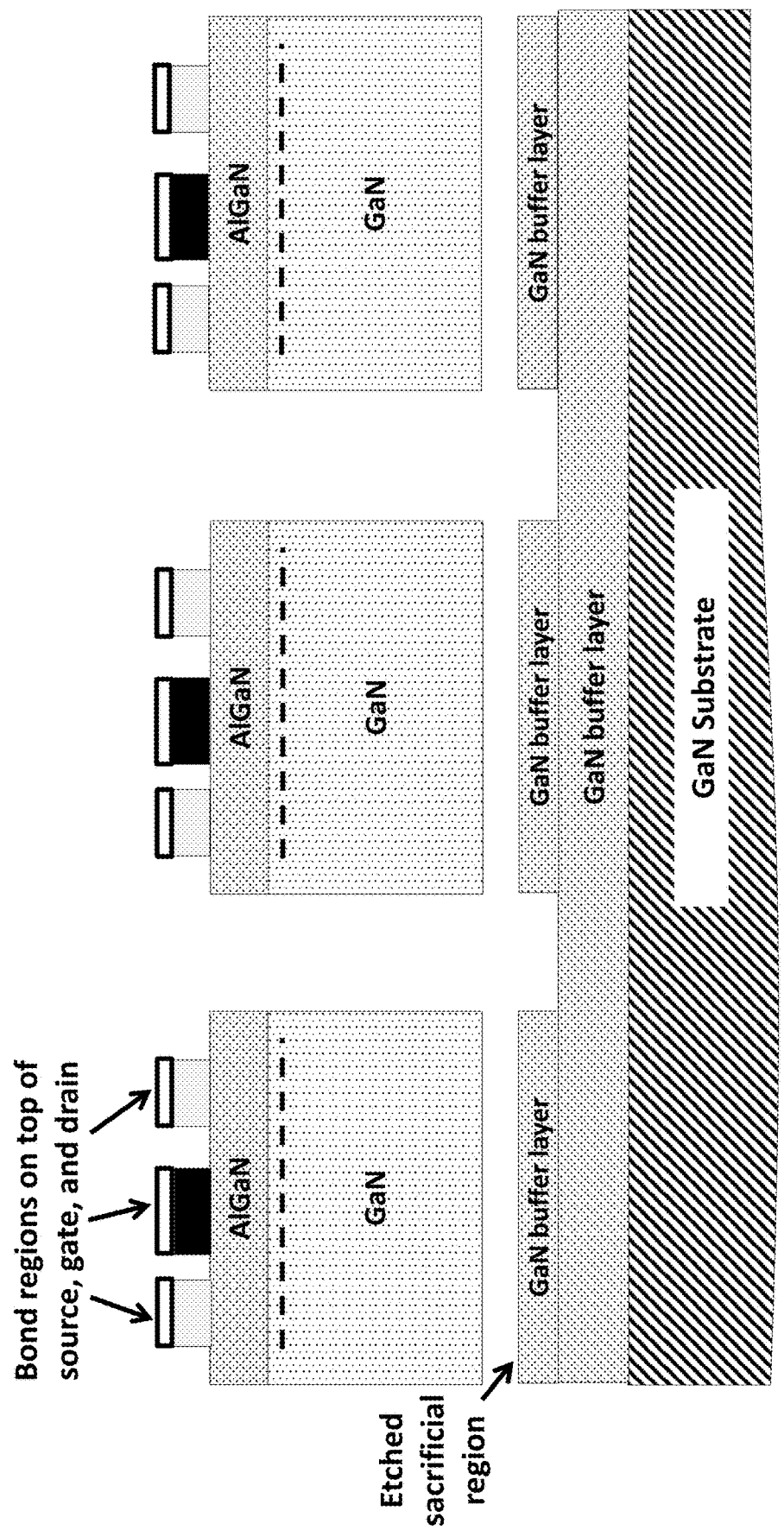
FIG. 12M: Example of HEMT devices

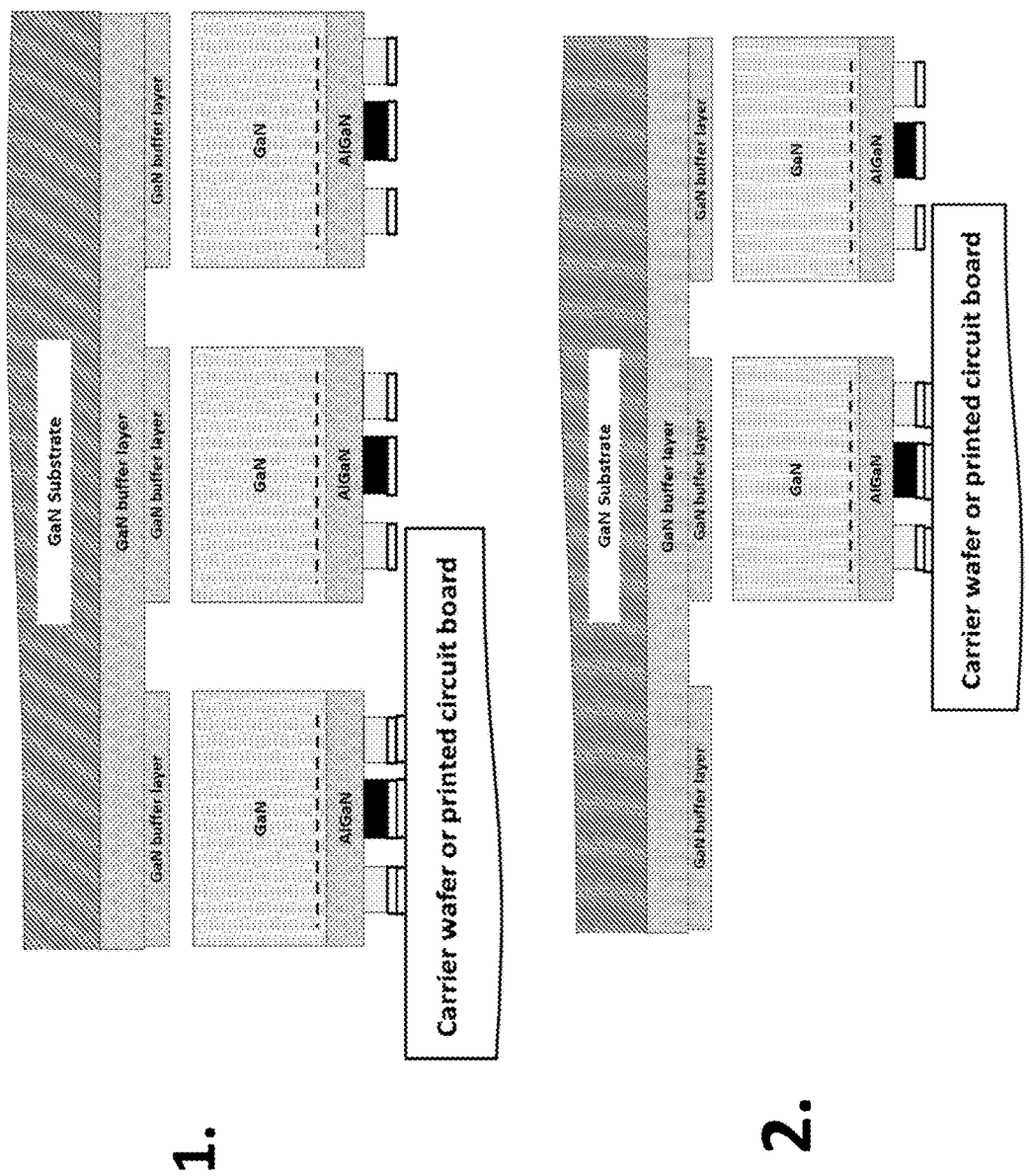
FIG. 12N: Example of HEMT devices selectively transferred

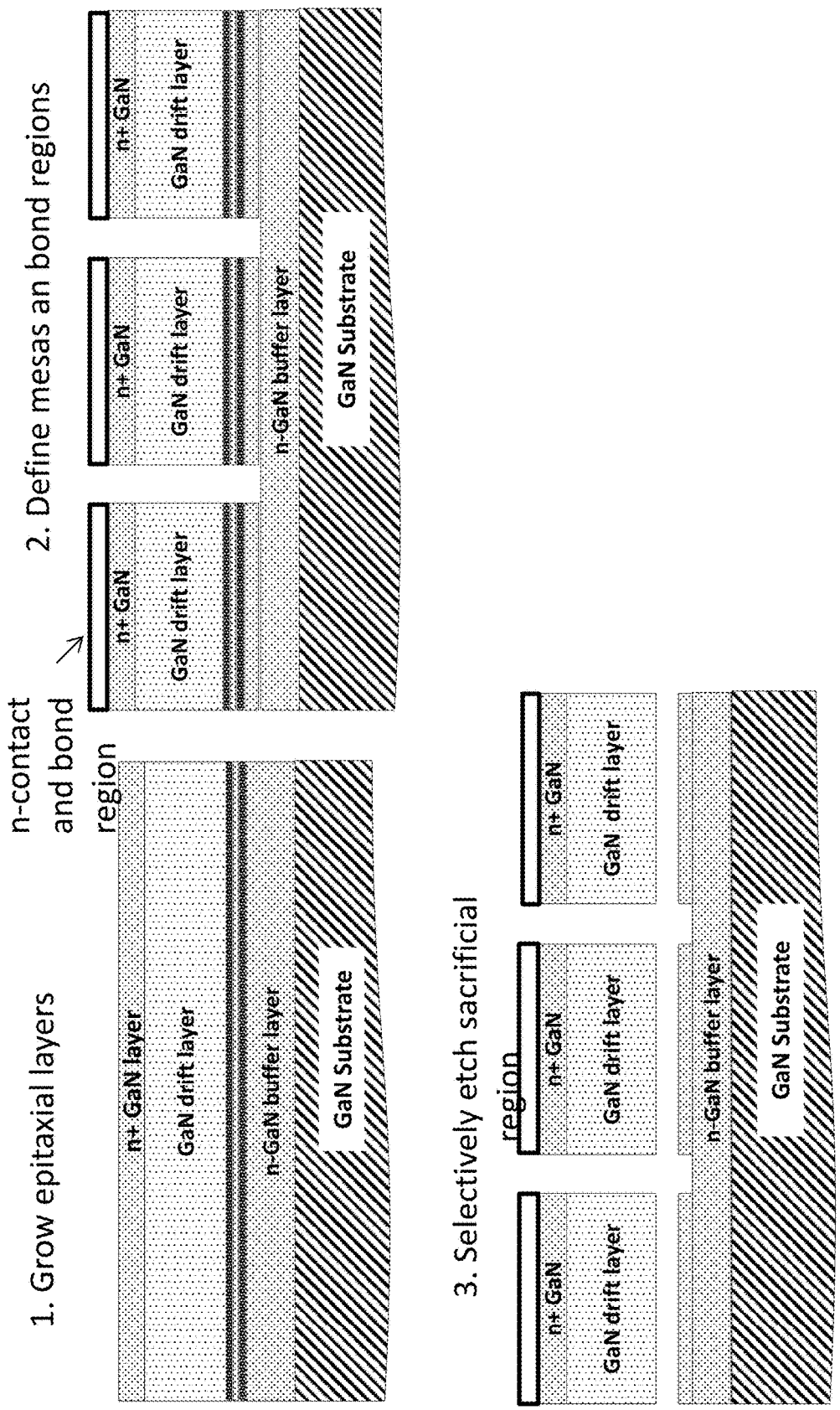
FIG. 13A: Schottky diode epitaxial for die expanded transfer

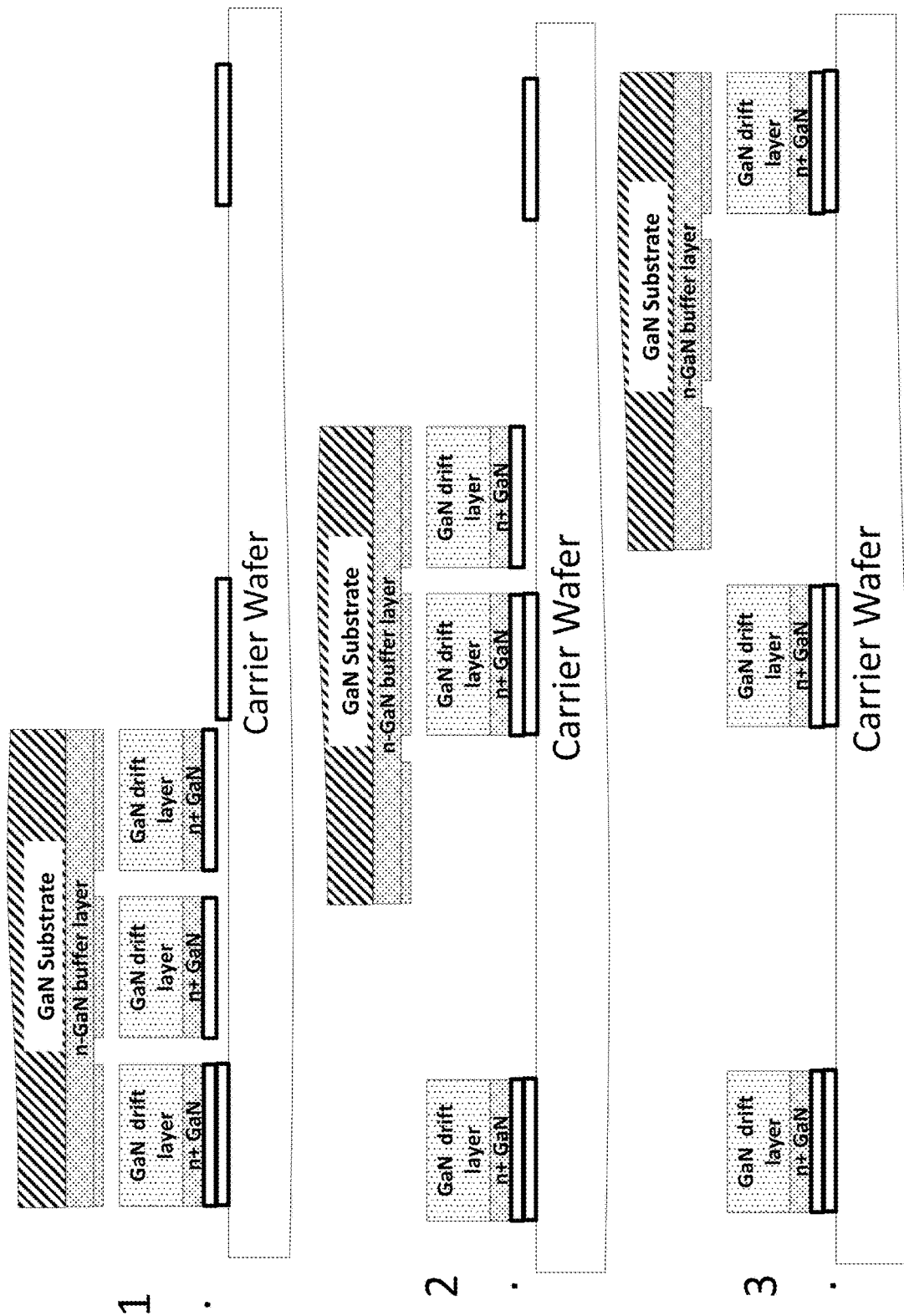
FIG. 13B: Example of selective bonding for die expansion of Schottky diode devices

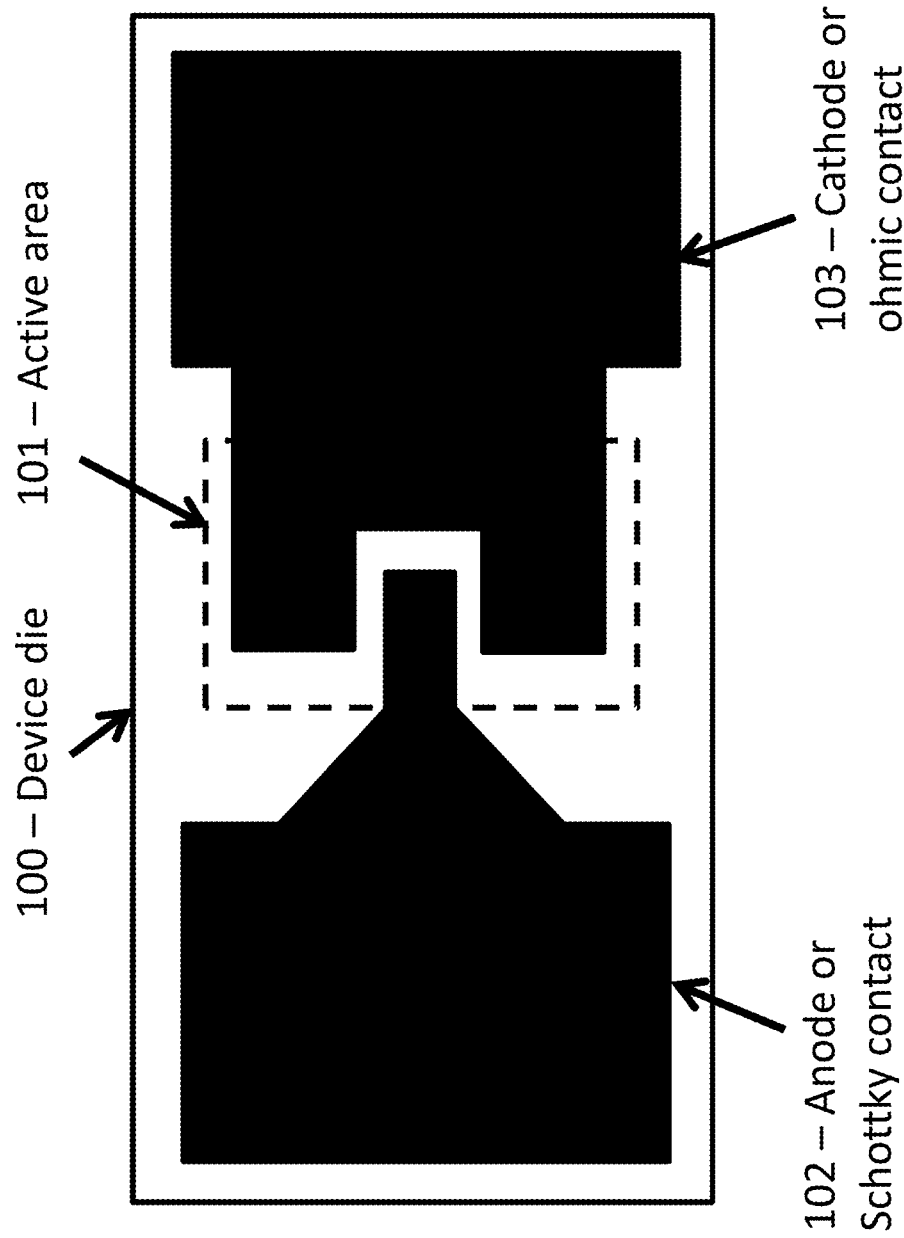
FIG. 13C – Top View of Conventional Shottky diode device

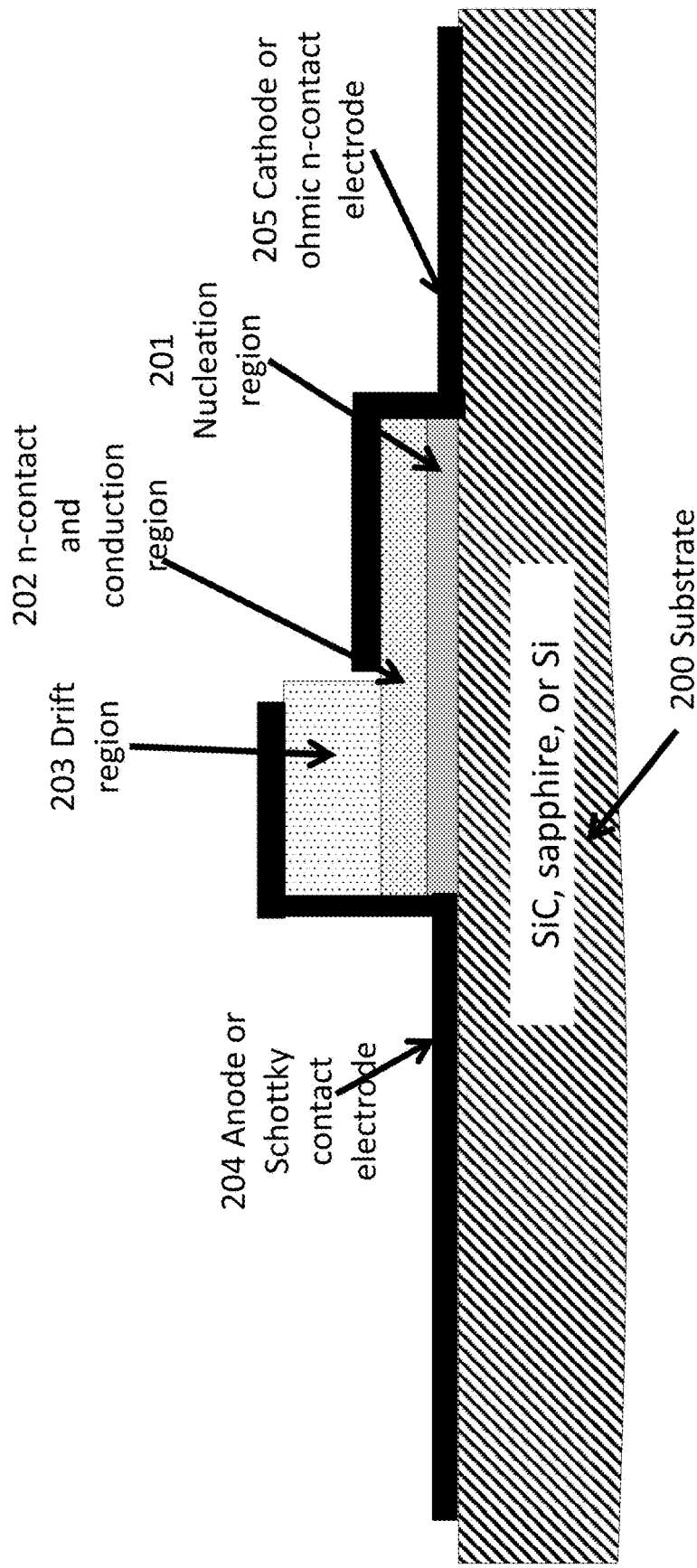
FIG. 13D – Cross-sectional view of conventional Schottky diode

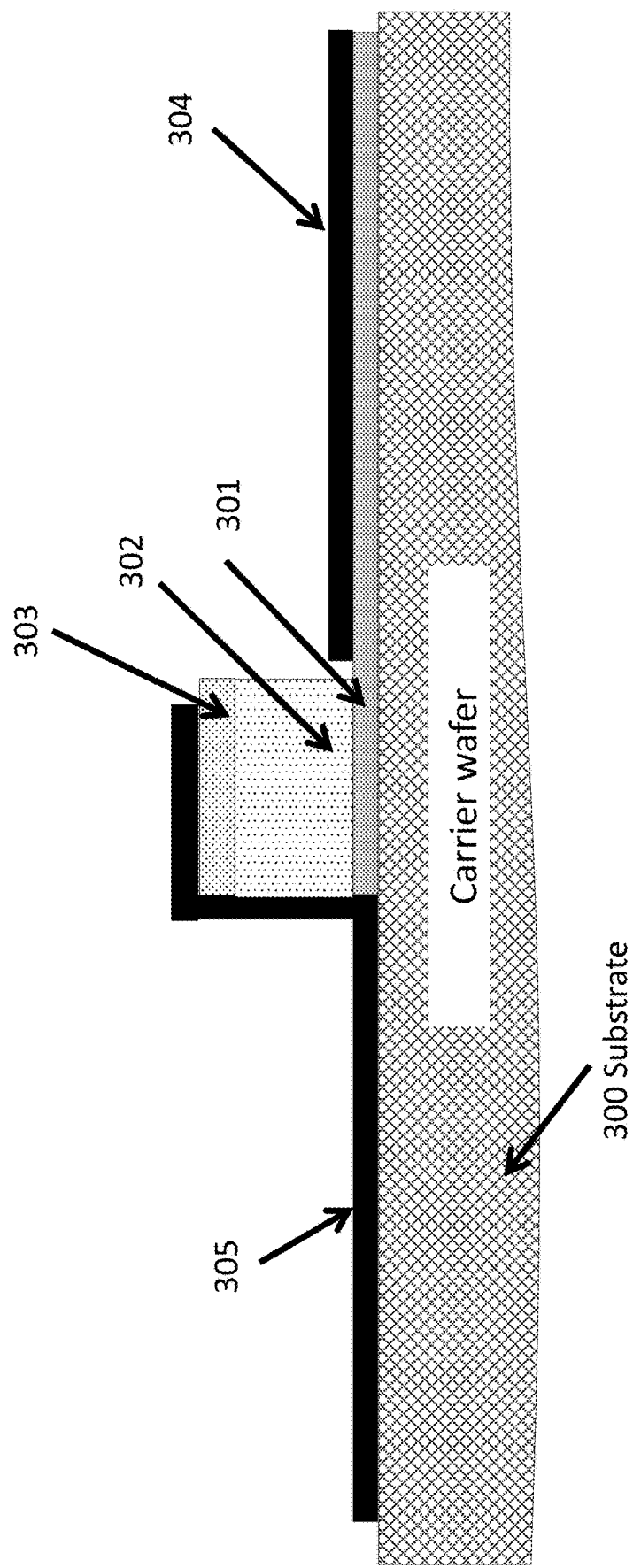
FIG. 13E – Cross-sectional view of Schottky diode device

FIG. 13F – Top-view of conventional HEMT device
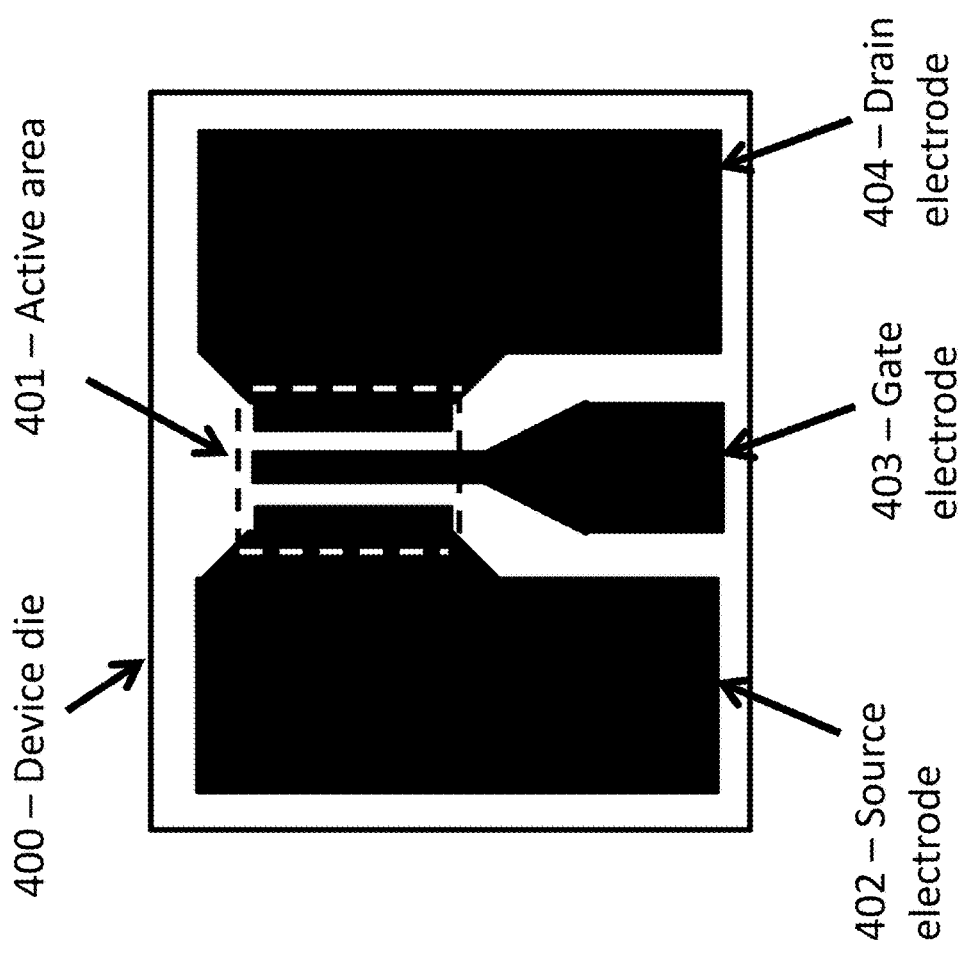

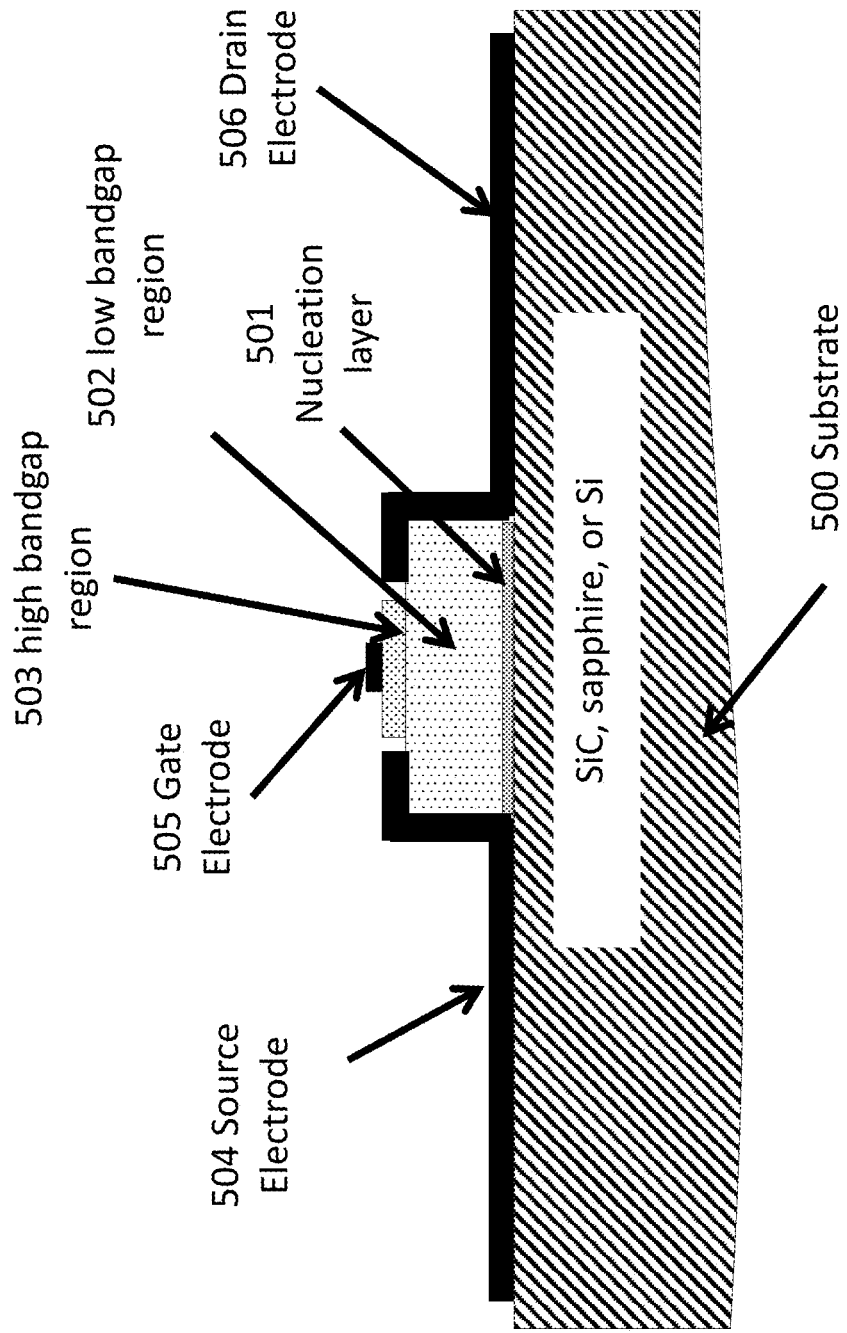
FIG. 13G – Cross-sectional view of conventional HEMT device

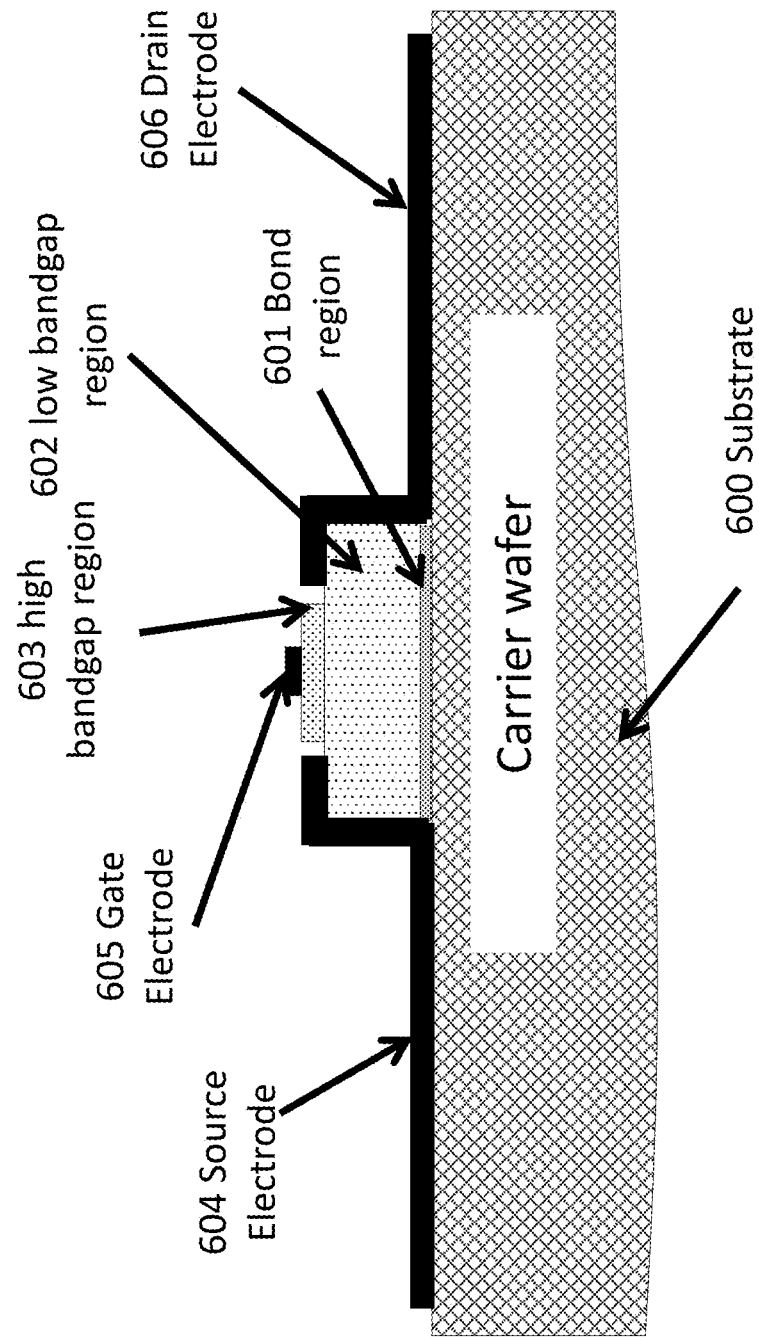
FIG. 13H – Cross-sectional view of HEMT device

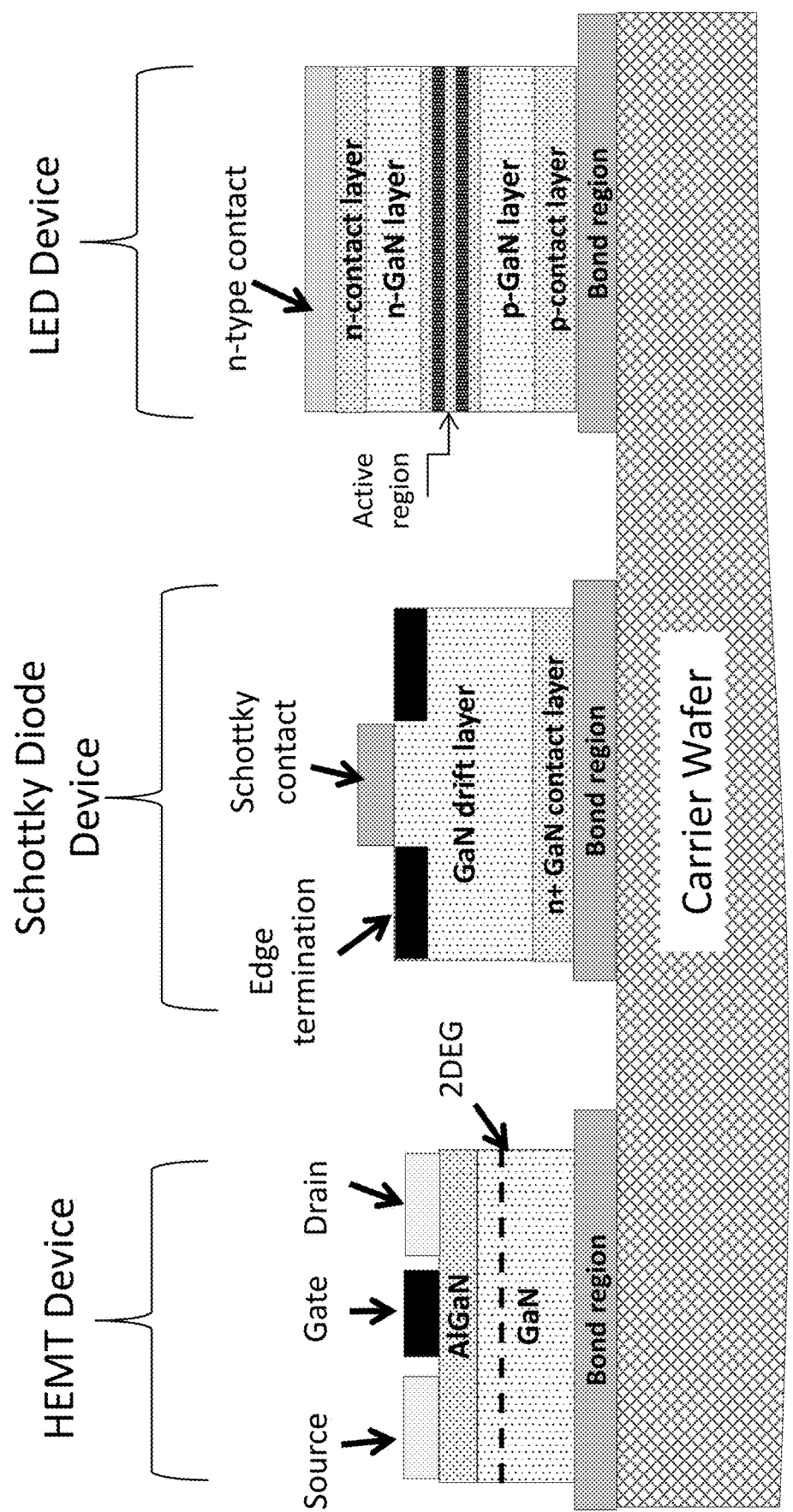
Figure 14A: Device integration on the carrier

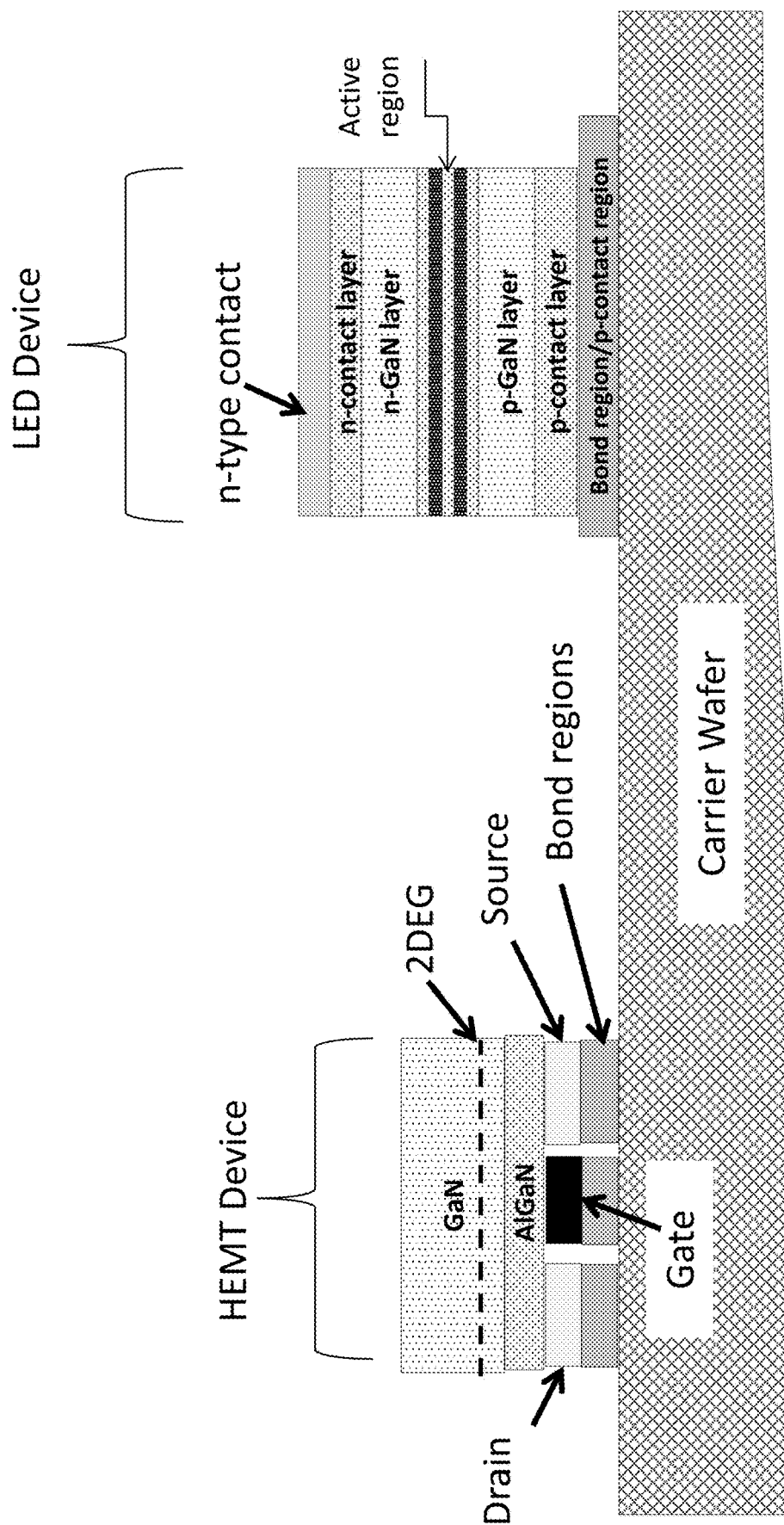
Figure 14B: Device integration on carrier wafer

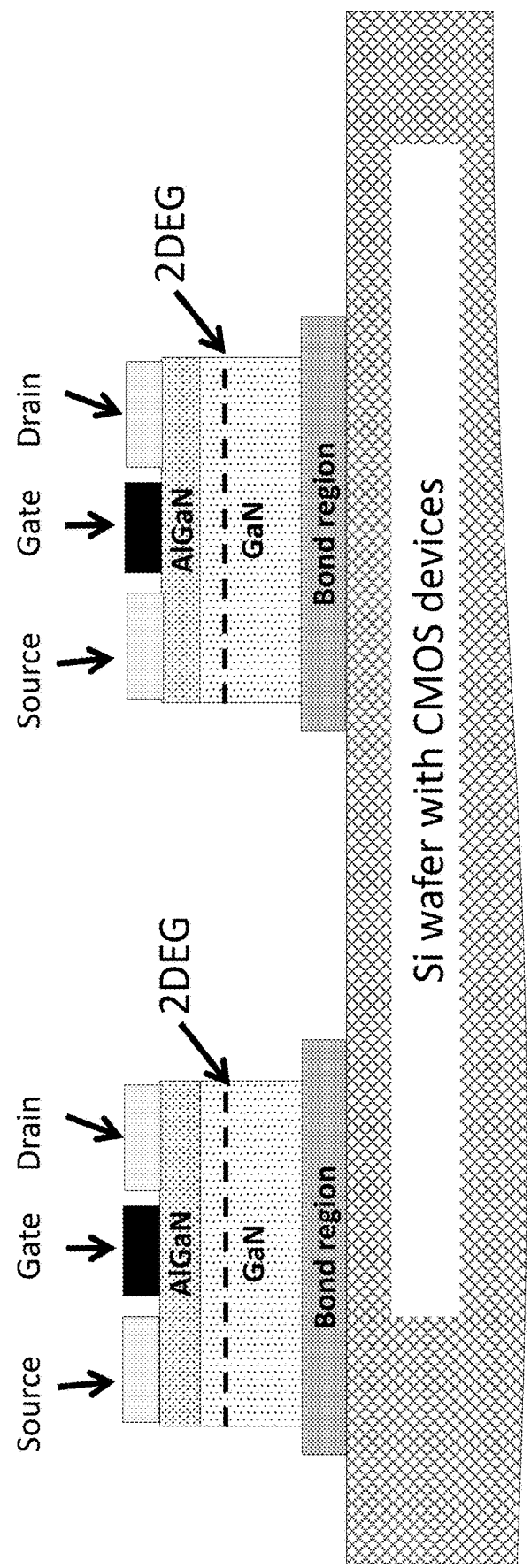
Figure 14C: Device integration on carrier wafer

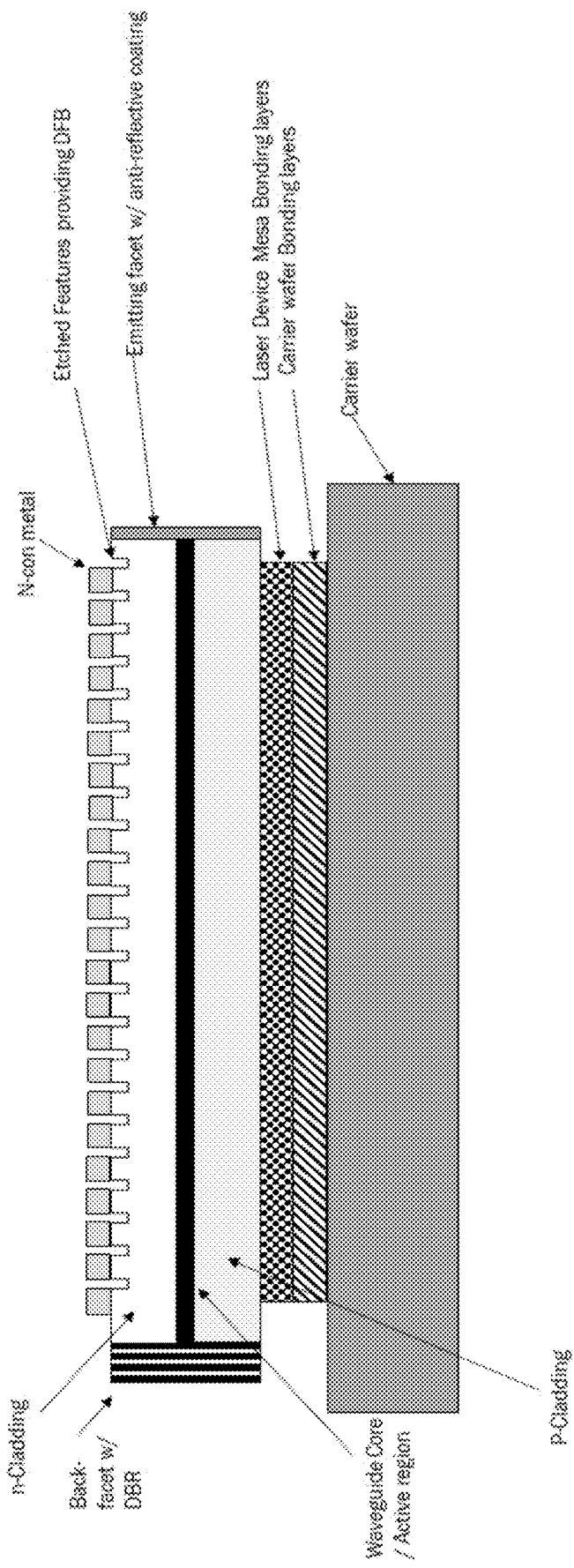
Figure 15: Transferred DFB device on carrier wafer

Preferred embodiment – grating litho, etch into nClad, via fill, etch back, nCon Figure 19: Alternate embodiments: Grating shape is sawtooth or blazed Alternate embodiments: Selectively patterned grating Alternate embodiment— nCon, grating litho, etch through nCon into nClad Figure 26: Alternate embodiments: HCSEL with outcoupler grating Figure 28: Alternate embodiments: HCSEL with turning mirror and feedback grating

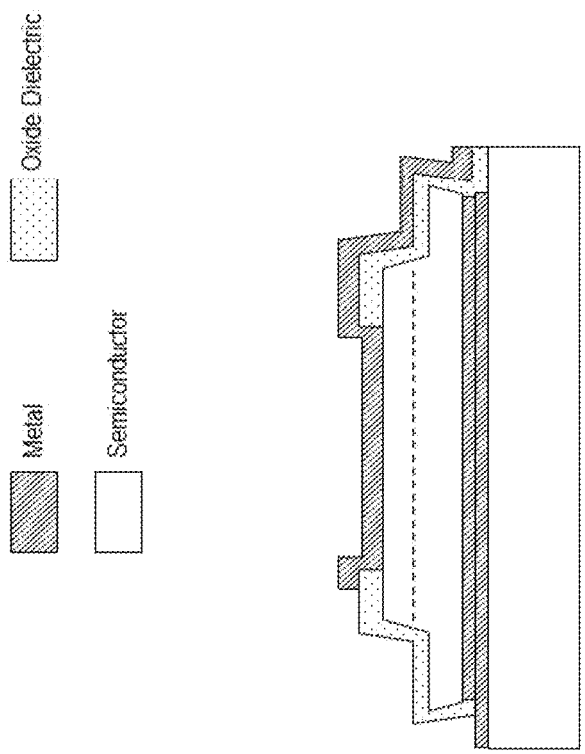
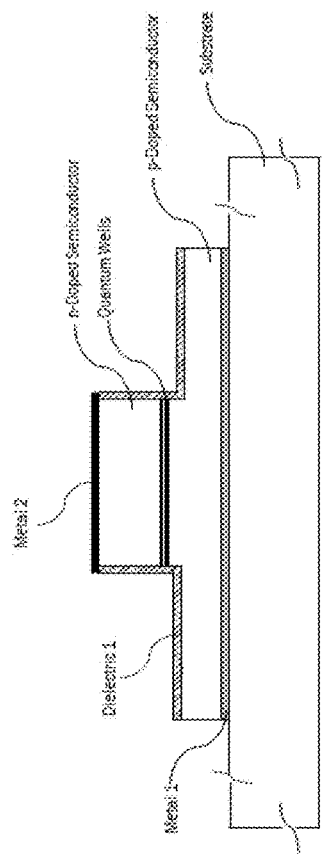
FIG. 39b
FIG. 39a

MANUFACTURABLE GALLIUM AND NITROGEN CONTAINING SINGLE FREQUENCY LASER DIODE

CROSS-REFERENCE TO RELATED APPLICATIONS

This application is a continuation-in-part of U.S. application Ser. No. 17/078,389, filed Oct. 23, 2020, which is a continuation of U.S. application Ser. No. 16/835,082, filed Mar. 30, 2020, which is a continuation of U.S. application Ser. No. 16/796,154, filed Feb. 20, 2020, which is a continuation of U.S. application Ser. No. 16/005,255, filed Jun. 11, 2018, which is a continuation of U.S. application Ser. No. 15/480,239, filed Apr. 5, 2017, which is a continuation of U.S. application Ser. No. 15/209,309, filed Jul. 13, 2016, which is a continuation-in-part of U.S. application Ser. No. 14/580,693, filed Dec. 23, 2014, the contents of which are incorporated herein by reference in their entirety for all purposes.

BACKGROUND

Devices based on wide bandgap III-V semiconductor materials such as gallium nitride (GaN) play a major role in our modern world. They play critical roles in essentially all of our electronic devices and are instrumental in almost all of the machines and apparatus we rely on every day. Examples of such semiconductor devices include light emitting devices such as light emitting diodes and laser diodes Forming such GaN devices of the highest performance often requires epitaxial structures with minimum defect density and the highest crystal quality and purity. To achieve the low defect density and high crystal quality it is most optimum to grow the epitaxial device epitaxial layers on a native GaN substrates to form a pseudomorphic epitaxial structure that is relatively free from strain related defects that occur when growing on foreign substrates.

Unfortunately, the synthesis of GaN single crystal substrates has been an extraordinarily difficult task. The highly successful Czochralski method for silicon crystal growth would have impractical process requirements comparable to conditions very deep within the Earth's mantle. Alternative approaches have been investigated for growing GaN bulk substrates, such as hydride vapor phase epitaxy (HVPE) and ammonothermal growth. Additionally it is still a great challenge to scale up bulk GaN growth to larger wafer sizes. GaN substrates are currently available in 2" diameter at high volume and recent announcements have revealed availability in 4" in the near future, which is still drastically smaller than more mature substrate technologies such as 12" single crystal silicon. At the current GaN wafer diameter and prices, the native substrate option is not economically feasible for realizing semiconductor devices in many applications, specifically light emitting diode applications and power electronic applications. Given the obstacles in GaN native substrate manufacturing, there has been substantial effort devoted to the epitaxy on foreign substrate materials. Common choices for GaN heteroepitaxy include sapphire, silicon carbide, and silicon. In the past decade, SiC and sapphire substrates have been widely used in nitride LEDs and RF transistors.

A laser diode is a two-lead semiconductor light source that emits electromagnetic radiation that is comprised primarily of stimulated emission. The laser diode is comprised of a gain medium that functions to provide emission through the recombination of electron-hole pairs and a cavity region that functions as a resonator for the emission of the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. Unlike LEDs, laser diodes emit very directional light and have orders of magnitude higher spatial brightness. Moreover, above threshold, they do not suffer from the droop phenomenon that plagues LEDs.

Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Based on essentially all the pioneering work on GaN LEDs, visible laser diodes based on GaN technology have emerged. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common bulk GaN c-plane substrate size today with recent progress enabling 4" diameter, which are still relatively small compared to the 6" and greater diameters that are commercially available for mature substrate technologies.

Lasers rely on feedback of light into an optical cavity. In a Fabry-Perot laser, this feedback is from facets and dielectric facet coatings which are broadband reflectors. Because the facets and coatings reflect over a broad wavelength range, many longitudinal modes are supported in the cavity. This leads to wide spectral widths in the hundreds or thousands of picometers. Some applications, for example sensing, communication or coupling into an external waveguide, benefit from narrow spectral widths or even a single longitudinal lasing mode. To achieve a single longitudinal mode or single frequency operation, narrow-band mirrors in the form of gratings provide wavelength-dependent feedback to the cavity and act as a mode filter.

SUMMARY

Grating lasers are used in the InP and GaAs material system for telecommunications and data-communications. They are broadly categorized into distributed Bragg reflector (DBR) and distributed feedback (DFB) lasers. In a DBR laser, grating sections at one or both ends of a cavity provide feedback and mode filtering. In this configuration, the grating sections are separated from the gain section and can be independently pumped to tune the lasing wavelength. Because of this, active/passive integration maybe necessary to reduce loss in the cavity from the un-pumped or underpumped active region in the mirror section(s). These passive sections are typically produced with either a regrowth to completely omit the active region or by modifying the bandgap of the active region through intermixing of epitaxial layers. This intermixing process may be achieved by causing disorder to the crystal lattice by ion-implantation and then removing the damage with an anneal. In a DFB laser, the grating and gain section may be combined removing the need for active/passive integration.

Both DBR and DFB lasers remain challenging in GaN. Active/passive integration in DBR lasers requires a regrowth or quantum well intermixing. Regrowths are expensive and difficult in III-nitrides and quantum well intermixing is not feasible because of the thermal stability of GaN. DFB lasers remove this requirement, but the gratings themselves are challenging to produce. The pitch of a first order grating in a blue laser is under 100 nm, almost an order of magnitude smaller than conventional i-line lithography can achieve. Additionally, the top p-GaN surface is resistive and susceptible to plasma damage adding complexity to the grating design.

Single frequency GaN-based lasers have several potential applications, a few of which are listed here. Second harmonic generation with a violet laser down to the UV-C wavelength range could allow for human-safe sterilization. For viable efficiencies with such a system, an optical resonator can be used with a single frequency pump laser. DFB and DBR lasers are most commonly used in telecommunications. In the visible spectrum, stable single frequency operation can achieve high bandwidths for underwater communications or LiFi. Finally, atomic absorption lines are very narrow, so sampling around the absorption line for gas-sensing or spectroscopy requires a narrow-bandwidth laser. Similarly, strontium has a laser cooling absorption line at 461 nm and precise excitation of this line enables quantum computing and atomic clocks.

This patent describes a manufacturable III-nitride-based laser diode operating at a single spectral mode. Single mode operation is achieved by use of a distributed Bragg reflector (DBR) or grating, as in a distributed feedback (DFB) laser where the grating is distributed across the active or gain section of the laser. Some DFB lasers have been demonstrated in the III-nitrides and have shown single mode operation in violet, blue and green wavelengths.

Gratings are a result of features periodically impinging on the waveguided lasing mode and changing the effective index of the waveguide. These features may be perturbations in the transverse epitaxial waveguide or lateral ridge waveguide. Gratings in the transverse waveguide may be embedded in the epitaxy (buried gratings) or on the surface of the structure (surface gratings). Gratings in the lateral waveguide manifest as periodic changes in the ridge width (sidewall gratings). Some various types of gratings are depicted in FIG. 1. In literature, the term surface grating is sometimes used to refer to any non-buried grating including surface gratings in the transverse waveguide as well as sidewall gratings in the lateral waveguide.

Several reports of each of these grating types exist in the InGaN material system. Producing a buried grating require a regrowth step over etched topology which adds complexity and can cause defects in the epitaxy.[1,2] Also, because of the high strain in the InGaN material system, epitaxial waveguide and claddings are low contrast making this approach less appealing. Surface gratings can be either etched into the epitaxial layers' or embedded into the contacting material.[4-6] P-GaN is extremely sensitive to defects from plasma etching. Since the grating pitches required to achieve single mode operation are on the order of hundreds of nanometers, etch damage could render the entire contact resistive leading to high voltages. Even without etch damage p-GaN is quite resistive and forms relatively poor contacts when compared to n-GaN, so reducing the contact area to half will further increase the voltage. For this reason, etched surface gratings in the p-GaN are generally avoided. One approach taken by Zhang et al. is to embed the grating in the contacting material rather than etching it into the p-GaN.[4-6] By forming a planar p-contact out of indium-tin-oxide (ITO) with a periodically embedded lower index material such as hydrogen silsesquioxane (HSQ) or $SiO_2$, a full-area p-contact is formed without dry etching. This approach trades voltage for loss as, to achieve index contrast, there must be significant mode overlap with the ITO and the highly doped p-contact layer, both of which are absorbing. Finally, several groups have demonstrated single mode DFBs with sidewall gratings.[7-11] However, this approach can suffer from reduced modal overlap with the grating. Additionally, many applications further benefit from single lateral or special mode operation, which reduces the design space available for sidewall gratings.

Embodiments of the invention provide methods for fabricating semiconductor devices based on high quality gallium and nitrogen containing epitaxial materials pseudomorphically grown on native gallium and nitrogen containing substrates such as GaN substrates. Typically these devices are fabricated using an epitaxial deposition of semiconductor device layers on a gallium and nitrogen containing substrate followed by processing steps on the epitaxial substrate and overlying epitaxial material. By using a selective etch process such as a photo electrochemical (PEC) etch combined with a bonding process at least a portion of the epitaxial material is transferred to the carrier wafer. Subsequently, the carrier wafer with the bonded epitaxial material is subjected to subsequent processing steps to form semiconductor devices including optical devices such as lasers and light emitting diodes, or electronic devices such as diode or transistor devices, Schottky diodes, pn diodes, transistors, field effect transistors, bipolar junction transistors, high electron mobility transistor, or solar cell devices. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, flat panel displays, curved or flexible panel displays, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like. In other embodiments the semiconductor devices are fully or partially formed in the epitaxial material before transfer to a carrier wafer or to an integrated circuit. What follows is a general description of the typical configuration and fabrication of these devices.

Some embodiments leverage an epitaxial transfer process technology wherein the gallium and nitrogen containing epitaxial layers are transferred from a native gallium nitride substrate or other type of substrate to a carrier or acceptor wafer to produce manufacturable DFBs using gratings on the n-side of the active region. By using the n-type material exposed on the top of the transferred gallium and nitrogen containing layers the challenges of forming DFB or DBR type lasers in gallium nitride-based lasers are overcome. The original epitaxial growth substrate has p-contact and bonding pad metals patterned. A second substrate of arbitrary composition is also patterned with base and bond metals. The epi-layers are undercut from the original substrate using a photo-electrochemical etch and then transferred and die-expanded to the second substrate using, for example, gold-gold thermocompression bonding.

After bonding the epi-layers to the acceptor, ridges are etched into the mesas in some embodiments. Next, a grating is patterned using displacement Talbot, nanoimprint or holographic lithography and etched into the n-cladding using either a photoresist or oxide hard mask. These lithography techniques allow for third or higher order gratings to be patterned in a manufacturable way. This etched grating is then filled by ALD SiO2 to produce a low loss grating without ITO or metal impinging on the lasing mode. The ALD oxide is then etched back to expose the tops of the grating and an n-contact deposited. Finally, facets are formed.

In accordance with an embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material and forming mesas to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming grating features in the one or more n-type gallium and nitrogen containing layers of each of the mesa regions; and forming an optical waveguide in each of the mesa regions, the optical waveguide configured as a cavity to form a laser diode of the electromagnetic radiation; wherein the grating features in the one or more n-type gallium and nitrogen containing layers are configured to provide feedback to the electromagnetic radiation.

In an embodiment, the resonator is configured as a laser diode operating in a 390 nm to 550 nm wavelength range, and wherein the grating features are configured to provide optical feedback to form a distributed feedback laser diode.

In another embodiment, the resonator is configured as a laser diode operating in a 390 nm to 550 nm wavelength range, and wherein the grating features are configured as a 1st order grating, a $2^{nd}$ order grating, a $3^{rd}$ order grating, a $4^{th}$ order grating, or a higher order grating.

In another embodiment, the resonator is configured as a laser diode operating in a 390 nm to 550 nm wavelength range, and wherein the grating features are configured to provide a single frequency operation of the laser diode device.

In another embodiment, the resonator is configured as a laser diode operating in a 390 nm to 550 nm wavelength range, and wherein the grating features are configured to provide a spectral width of the electromagnetic radiation characterized by a full width at half maximum (FWHM) of less than 1 nm, less than 0.5 nm, less than 0.2 nm, or less than 0.1 nm.

In another embodiment, the resonator is configured as a laser diode operating in a 390 nm to 550 nm wavelength range, and wherein the grating features are configured to provide a vertical coupling of the electromagnetic radiation in a direction orthogonal to the one or more n-type gallium and nitrogen containing layers, the one or more light emitting gallium and nitrogen containing layers, and the one or more p-type gallium and nitrogen containing layers.

In another embodiment, forming the grating features includes: planarizing the carrier wafer with the first plurality of dice by depositing a fill layer and using a chemical mechanical polishing (CMP) process to planarize the fill layer; defining the grating features using one or more lithography steps; and forming the grating features using one or more etch processes. The fill layer may include at least one of a nitride, an oxide, a polymer, a spin-on material, or a combination of these materials. Planarizing the carrier wafer may include depositing a stop layer underlying the fill layer, and wherein the CMP process planarizes the fill layer and stops at the stop layer. The stop layer may include at least one of a nitride, an oxide, a metal, or a polymer.

In another embodiment, the cavity has a length of less than 50 µm, less than 130 µm, less than 300 µm, less than 600 µm, less than 1 mm, less than 2 mm, or less than 3 mm; and wherein the cavity has a width of less than 1.5 µm, less than 3 µm, less than 6 µm, less than 15 µm, less than 30 µm, less than 100 µm, or greater than 100 µm.

In another embodiment, the method also includes forming an n-contact overlying the grating features of each of the mesa regions, wherein the n-contact includes a gain section for controlling power and a mirror section for injecting current.

In another embodiment, the method also includes forming an n-contact overlying the grating features of each of the mesa regions, wherein the n-contact includes a gain section for controlling power and front and back mirror sections for injecting current.

In another embodiment, the method also includes transferring a second plurality of dice to the carrier wafer, wherein the second plurality of dice are configured to emit electromagnetic radiation at a second wavelength; and forming second grating features in one or more n-type gallium and nitrogen containing layers of each of the second plurality of dice.

In another embodiment, the method also includes transferring a second plurality of dice and a third plurality of dice to the carrier wafer, wherein the second plurality of dice are configured to emit electromagnetic radiation at a second wavelength, and the third plurality of dice are configured to emit electromagnetic radiation at a third wavelength; and processing the carrier wafer with the first plurality of dice, the second plurality of dice, and the third plurality of dice to form an RGB emitting laser diode device.

In another embodiment, the resonator is configured with an optical waveguide coupled to an amplifier to provide a master-oscillator power amplifier (MOPA) device.

In another embodiment, an augmented reality (AR) system, a virtual reality (VR) system, a mixed reality (MR) system, a metaverse system, a second harmonic generation (SHG) system, a metrology system, or a measurement system comprising an optical device formed using the embodiments described herein.

In another embodiment, the method also includes forming an n-side dielectric region overlying the one or more n-type gallium and nitrogen containing layers; forming n-contacts adjacent to the n-side dielectric region; forming a p-contact vertically aligned with the n-side dielectric region, the p-contact electrically coupled to the one or more p-type gallium and nitrogen containing layers to provide vertical optical confinement; forming high resistivity regions on each side of the p-contact to block current flow through adjacent portions of the one or more p-type gallium and nitrogen containing layers; and forming a p-side ridge aligned with the p-contact to provide lateral optical confinement.

In another embodiment, the method also includes forming an n-side dielectric region overlying the one or more n-type gallium and nitrogen containing layers; forming n-contacts adjacent to the n-side dielectric region; forming a transmissive conductive oxide (TCO) vertically aligned with the n-side dielectric region, the TCO electrically coupled to the one or more p-type gallium and nitrogen containing layers to provide vertical optical confinement; forming high resistivity regions on each side of the TCO to block current flow through adjacent portions of the one or more p-type gallium and nitrogen containing layers; and forming a p-side ridge aligned with the TCO to provide lateral optical confinement.

In yet another embodiment, the method also includes forming an n-side dielectric region overlying the one or more n-type gallium and nitrogen containing layers; forming n-contacts adjacent to the n-side dielectric region; forming a transmissive conductive oxide (TCO) vertically aligned with the n-side dielectric region, the TCO electrically coupled to the one or more p-type gallium and nitrogen containing layers to provide vertical optical confinement; forming a p-side ridge aligned with the TCO to provide lateral optical confinement; forming high resistivity regions in at least one of the one or more p-type gallium and nitrogen containing layers, the high resistivity regions formed on opposite sides of the p-side ridge from the TCO to block current flow through adjacent portions of the one or more p-type gallium and nitrogen containing layers; and forming sloped sidewalls on the mesa regions so that a top surface area of the one or more n-type gallium and nitrogen containing layers is less than a bottom surface area of the one or more p-type gallium and nitrogen containing layers.

In accordance with another embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material and forming mesas to form a plurality of first dice arranged in an array; forming a first interface region overlying the first epitaxial material, the first interface region comprising a metal, a semiconductor, dielectric, oxide, glass, or a polymer; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming grating features in a material overlying the one or more n-type gallium and nitrogen containing layers of each of the mesa regions, or in a material overlying the one or more n-type gallium and nitrogen containing layers and in the one or more n-type gallium and nitrogen containing layers of each of the mesa regions; and forming an optical waveguide in each of the mesa regions, the optical waveguide configured as a cavity to form a laser diode of the electromagnetic radiation; wherein the grating features are configured to provide feedback to the electromagnetic radiation.

In an embodiment, the material overlying the one or more n-type gallium and nitrogen containing layers comprises a dielectric or transparent conducive oxide (TCO) material.

In another embodiment, the material overlying the one or more n-type gallium and nitrogen containing layers comprises a silicon oxide, silicon nitride, or transparent conducive oxide (TCO) material.

In another embodiment, the resonator is configured as a laser diode operating in a 390 nm to 550 nm wavelength range, and wherein the grating features are configured to provide optical feedback to form a distributed feedback laser diode.

In another embodiment, the resonator is configured as a laser diode operating in a 390 nm to 550 nm wavelength range, and wherein the grating features are configured as a 1st order grating, a $2^{nd}$ order grating, a $3^{rd}$ order grating, a $4^{th}$ order grating, or a higher order grating.

In another embodiment, the resonator is configured as a laser diode operating in a 390 nm to 550 nm wavelength range, and wherein the grating features are configured to provide a single frequency operation of the laser diode device.

In another embodiment, the resonator is configured as a laser diode operating in a 390 nm to 550 nm wavelength range, and wherein the grating features are configured to provide a spectral width of the electromagnetic radiation characterized by a full width at half maximum (FWHM) of less than 1 nm, less than 0.5 nm, less than 0.2 nm, or less than 0.1 nm.

In another embodiment, the resonator is configured as a laser diode operating in a 390 nm to 550 nm wavelength range, and wherein the grating features are configured to provide a vertical coupling of the electromagnetic radiation in a direction orthogonal to the one or more n-type gallium and nitrogen containing layers, the one or more light emitting gallium and nitrogen containing layers, and the one or more p-type gallium and nitrogen containing layers.

In another embodiment, forming the grating features includes planarizing the carrier wafer with the first plurality of dice by depositing a fill layer and using a chemical mechanical polishing (CMP) process to planarize the fill layer; defining the grating features using one or more lithography steps; and forming the grating features using one or more etch processes. The fill layer may include at least one of a nitride, an oxide, a polymer, a spin-on material, or a combination of these materials. Planarizing the carrier wafer may include depositing a stop layer underlying the fill layer, and wherein the CMP process planarizes the fill layer and stops at the stop layer. The stop layer include at least one of a nitride, an oxide, a metal, or a polymer.

In another embodiment, the cavity has a length of less than 50 μm, less than 130 μm, less than 300 μm, less than 600 μm, less than 1 mm, less than 2 mm, or less than 3 mm; and wherein the cavity has a width of less than 1.5 μm, less than 3 μm, less than 6 μm, less than 15 μm, less than 30 μm, less than 100 μm, or greater than 100 μm.

In another embodiment, the method also includes forming an n-contact overlying the grating features of each of the mesa regions, wherein the n-contact includes a gain section for controlling power and a mirror section for injecting current.

In another embodiment, the method also includes forming an n-contact overlying the grating features of each of the mesa regions, wherein the n-contact includes a gain section for controlling power and front and back mirror sections for injecting current.

In another embodiment, the method also includes transferring a second plurality of dice to the carrier wafer, wherein the second plurality of dice are configured to emit electromagnetic radiation at a second wavelength; forming second grating features in a second material overlying the one or more n-type gallium and nitrogen containing layers of each of the second plurality of dice.

In another embodiment, the method also includes transferring a second plurality of dice and a third plurality of dice to the carrier wafer, wherein the second plurality of dice are configured to emit electromagnetic radiation at a second wavelength, and the third plurality of dice are configured to emit electromagnetic radiation at a third wavelength; and processing the carrier wafer with the first plurality of dice, the second plurality of dice, and the third plurality of dice to form an RGB emitting laser diode device.

In another embodiment, the resonator is configured with an optical waveguide coupled to an amplifier to provide a master-oscillator power amplifier (MOPA) device.

In another embodiment, the method also includes forming an n-side dielectric region overlying the one or more n-type gallium and nitrogen containing layers; forming n-contacts adjacent to the n-side dielectric region; forming a p-contact vertically aligned with the n-side dielectric region, the p-contact electrically coupled to the one or more p-type gallium and nitrogen containing layers to provide vertical optical confinement; forming high resistivity regions on each side of the p-contact to block current flow through adjacent portions of the one or more p-type gallium and nitrogen containing layers; and forming a p-side ridge aligned with the p-contact to provide lateral optical confinement.

In another embodiment, the method also includes forming an n-side dielectric region overlying the one or more n-type gallium and nitrogen containing layers; forming n-contacts adjacent to the n-side dielectric region; forming a transmissive conductive oxide (TCO) vertically aligned with the n-side dielectric region, the TCO electrically coupled to the one or more p-type gallium and nitrogen containing layers to provide vertical optical confinement; forming high resistivity regions on each side of the TCO to block current flow through adjacent portions of the one or more p-type gallium and nitrogen containing layers; and forming a p-side ridge aligned with the TCO to provide lateral optical confinement.

In yet another embodiment, the method also includes forming a n-side dielectric region overlying the one or more n-type gallium and nitrogen containing layers; forming n-contacts adjacent to the n-side dielectric region; forming a transmissive conductive oxide (TCO) vertically aligned with the n-side dielectric region, the TCO electrically coupled to the one or more p-type gallium and nitrogen containing layers to provide vertical optical confinement; forming a p-side ridge aligned with the TCO to provide lateral optical confinement; forming high resistivity regions in at least one of the one or more p-type gallium and nitrogen containing layers, the high resistivity regions formed on opposite sides of the p-side ridge from the TCO to block current flow through adjacent portions of the one or more p-type gallium and nitrogen containing layers; and forming sloped sidewalls on the mesa regions so that a top surface area of the one or more n-type gallium and nitrogen containing layers is less than a bottom surface area of the one or more p-type gallium and nitrogen containing layers.

In accordance with another embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material and forming mesas to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming grating features in a material overlying the one or more n-type gallium and nitrogen containing layers of each of the mesa regions, or in a material overlying the one or more n-type gallium and nitrogen containing layers and in the one or more n-type gallium and nitrogen containing layers of each of the mesa regions; and forming an optical waveguide in each of the mesa regions, the optical waveguide configured as a cavity to form a laser diode of the electromagnetic radiation; wherein the grating features are configured to provide feedback to the electromagnetic radiation and to provide vertical coupling of the electromagnetic radiation in a direction orthogonal to the one or more n-type gallium and nitrogen containing layers, the one or more light emitting gallium and nitrogen containing layers, and the one or more p-type gallium and nitrogen containing layers.

In accordance with another embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming an optical waveguide in each of the mesa regions, the optical waveguide configured as a cavity to form a laser diode of the electromagnetic radiation; forming an n-side dielectric region overlying the one or more n-type gallium and nitrogen containing layers; and forming n-contacts adjacent to the n-side dielectric region, the n-contacts configured to provide lateral current injection.

In an embodiment, the method also includes forming a p-contact vertically aligned with the n-side dielectric region, the p-contact electrically coupled to the one or more p-type gallium and nitrogen containing layers to provide vertical optical confinement; forming high resistivity regions on each side of the p-contact to block current flow through adjacent portions of the one or more p-type gallium and nitrogen containing layers; and forming a p-side ridge aligned with the p-contact to provide lateral optical confinement.

In another embodiment, the method also includes forming a transmissive conductive oxide (TCO) p-contact vertically aligned with the n-side dielectric region, the TCO p-contact electrically coupled to the one or more p-type gallium and nitrogen containing layers to provide vertical optical confinement; forming high resistivity regions on each side of the TCO p-contact to block current flow through adjacent portions of the one or more p-type gallium and nitrogen containing layers; and forming a p-side ridge aligned with the TCO p-contact to provide lateral optical confinement.

In another embodiment, the method also includes forming a transmissive conductive oxide (TCO) p-contact vertically aligned with the n-side dielectric region, the TCO p-contact electrically coupled to the one or more p-type gallium and nitrogen containing layers to provide vertical optical confinement; forming a p-side ridge aligned with the TCO p-contact to provide lateral optical confinement; forming high resistivity regions in at least one of the one or more p-type gallium and nitrogen containing layers, the high resistivity regions formed on opposite sides of the p-side ridge from the TCO p-contact to block current flow through adjacent portions of the one or more p-type gallium and nitrogen containing layers; and forming sloped sidewalls on the mesa regions so that a top surface area of the one or more n-type gallium and nitrogen containing layers is less than a bottom surface area of the one or more p-type gallium and nitrogen containing layers.

In yet another embodiment, the method also includes forming grating features in the n-side dielectric region, or in the n-side dielectric region and in the one or more n-type gallium and nitrogen containing layers, wherein the grating features are configured to provide feedback to the electromagnetic radiation.

In accordance with another embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming an optical waveguide in each of the mesa regions; forming an n-side contact region coupled to the one or more n-type gallium and nitrogen containing layers; and forming a p-side contact region coupled to the one or more p-type gallium and nitrogen containing layers, wherein first dielectric regions on each side of the n-side contact region and second dielectric regions on each side of the p-side contact region have a thickness greater than a thickness of the mesa regions and provide cladding to the electromagnetic radiation.

In an embodiment, the n-side contact regions and the p-side contact regions are vertically aligned and comprise at least one of a transmissive conductive oxide or a metal contact.

In another embodiment, the method also includes forming grating features in the n-side contact region, in the first dielectric regions; and/or in the one or more n-type gallium and nitrogen containing layers, wherein the grating features are configured to provide feedback to the electromagnetic radiation.

In accordance with yet another embodiment, a method for manufacturing an optical device includes providing a carrier wafer; providing a first substrate having a first surface region; forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material; patterning the first epitaxial material to form a plurality of first dice arranged in an array; forming a first interface region overlying the first epitaxial material; bonding the first interface region of at least a fraction of the plurality of first dice to the carrier wafer to form bonded structures; releasing the bonded structures to transfer a first plurality of dice to the carrier wafer, the first plurality of dice transferred to the carrier wafer forming mesa regions on the carrier wafer; forming an optical waveguide in each of the mesa regions;

forming an n-side transmissive conductive oxide (TCO) contact coupled to the one or more n-type gallium and nitrogen containing layers; and forming a p-side TCO contact coupled to the one or more p-type gallium and nitrogen containing layers.

In an embodiment, the method also includes forming a ridge in the one or more n-type gallium and nitrogen containing layers.

In another embodiment, the method also includes forming grating features in the n-side TCO contact, in the one or more n-type gallium and nitrogen containing layers, or in the n-side TCO contact and in the one or more n-type gallium and nitrogen containing layers, wherein the grating features are configured to provide feedback to the electromagnetic radiation.

This method has several advantages over producing gratings on the p-side. Firstly, n-GaN is much more robust to plasma etching than p-GaN. Induced etch damage can be recovered or contended with to achieve low resistance ohmic n-type contacts. Additionally, n-GaN is significantly more conductive and forms less resistive contacts than p-GaN, so the effects of reducing the contact area are not as great. Together, these effects allow for surface gratings that are etched into the epitaxial cladding layers rather than embedded in the contacting material which increases the epitaxial design space. Finally, p-GaN is significantly more absorbing than n-GaN due to the poor doping efficiency. Etching the grating into the n-cladding eliminates the need for high mode overlap with lossy p-contact layers or ITO. Instead, the index contrast comes only from high quality, ALD-deposited oxide impinging on the mode.

BRIEF DESCRIPTION OF THE DRAWINGS

FIG. 1 includes simplified cross-sectional and plan views of laser devices with various grating structures.

FIG. 2A is a simplified process flow for epitaxial preparation in an example of the present invention.

FIG. 2B is a simplified process flow for epitaxial preparation in an example using active region protect layers of the present invention.

FIG. 3A is a simplified process flow for bonding and then etching the sacrificial regions in an example of the present invention.

FIG. 3B is a simplified process flow for partially or nearly completely etching the sacrificial region and then bonding wherein the unetched regions act as anchors used for mechanical support to epitaxial mesas in an example of the present invention.

FIG. 3C is a simplified process flow for etching the sacrificial region and then bonding wherein non semiconductor anchor features are used for mechanical support to epitaxial mesas in an example of the present invention.

FIG. 3D is a simplified process flow for etching the sacrificial region and then bonding wherein semiconductor anchor features are used for mechanical support to epitaxial mesas in an example of the present invention.

FIG. 3E is a simplified top-view schematic of semiconductor anchor features providing mechanical support to epitaxial mesas in an example of the present invention.

FIG. 3F is a simplified side-view schematic of process flow for using semiconductor anchor features providing mechanical support to epitaxial mesas in an example of the present invention.

FIG. 3G is a simplified top-view schematic of metal anchor features providing mechanical support to epitaxial mesas in an example of the present invention.

FIG. 3H is a simplified side-view schematic of process flow for using metal anchor features providing mechanical support to epitaxial mesas in an example of the present invention FIG. 3I is a simplified schematic of electrical circuit formed during PEC etching with metal anchors connecting the anode and cathode in an example of the present invention.

FIG. 4 is a simplified side view of a selective area bonding process in an example of the present invention.

FIG. 5A is a simplified schematic diagram illustrating transferring epitaxy device layers from various substrate sizes to 100, 200 and 300 mm carrier wafers in an example of the present invention.

FIG. 5B is a simplified schematic illustrating how the of carrier wafer can be processed to form the submount of the final semiconductor device structure in an example of the present invention.

FIG. 6 is a simplified schematic process flow illustrating substrate re-use in an example of the present invention.

FIG. 7A is a simplified schematic of an epitaxial structure of an LED device according to an example of the present invention.

FIG. 7B is a simplified schematic of an epitaxial structure of an LED according to an example of the present invention.

FIG. 7C is a simplified schematic process flow of bonding of the LED device wafer epitaxial wafer to the carrier wafer in an example of the present invention.

FIG. 7D is a simplified top-view schematic process flow of bonding of the LED device wafer epitaxial wafer to the carrier wafer in an example of the present invention.

FIG. 7E is a simplified top-view schematic illustration of die expansion of an LED device epitaxial structure in an example of the present invention.

FIG. 7F is a simplified schematic illustration of die expansion of an LED device epitaxial structure with a non-rectangular shape in an example of the present invention.

FIG. 7G is a simplified schematic illustrating the formation of a micro LED display panel example according to the present invention.

FIG. 7H is a simplified schematic illustrating the formation of a micro LED display panel example according to the present invention.

FIG. 7I is a simplified schematic illustrating the formation of a micro LED display panel example according to the present invention.

FIG. 7J is a simplified schematic illustrating the formation of a micro LED display panel example according to the present invention.

FIG. 7K is a simplified schematic illustrating an example of a multiplexing configuration in a transferred micro LED display array according to this invention.

FIG. 7L is a simplified schematic illustrating an example of a multiplexing configuration in a transferred micro LED display array according to this invention.

FIG. 7M is a simplified schematic illustrating the micro LED display apparatus example according to the present invention.

FIG. 8A is a simplified schematic of an epitaxial structure of a laser diode according to an example of the present invention.

FIG. 8B is a simplified schematic cross-section of a structure of a laser diode device according to an example of the present invention.

FIG. 8C is a simplified cross-sectional schematic illustration of die expansion of a laser diode device structure in an example of the present invention.

FIG. 8D is a simplified top-view schematic illustration of die expansion of a laser diode device epitaxial structure in an example of the present invention.

FIG. 8E is a simplified top-view schematic illustration of die expansion of a laser diode device epitaxial structure in an example of the present invention.

FIG. 9A is a table listing example material properties of GaN, SiC, and Si at 300K.

FIG. 9B is a plot of theoretical on-resistance vs blocking voltage for GaN, SiC, and Si.

FIG. 10A is a simplified schematic of an epitaxial structure of a Schottky diode power device according to an example of the present invention.

FIG. 10B is a simplified schematic cross-section of a structure of a Schottky diode power device according to an example of the present invention.

FIG. 10C is a simplified schematic of an epitaxial structure of a Schottky diode power device according to an example of the present invention.

FIG. 10D is a simplified schematic cross-section of a structure of a Schottky diode power device according to an example of the present invention.

FIG. 11A is a simplified schematic of an epitaxial structure of a p-n diode power device according to an example of the present invention.

FIG. 11B is a simplified schematic cross-section of a structure of a p-n diode power device according to an example of the present invention.

FIG. 11C is a simplified schematic of an epitaxial structure of a p-n diode power device according to an example of the present invention.

FIG. 11D is a simplified schematic cross-section of a structure of a p-n diode power device according to an example of the present invention.

FIG. 12A is a simplified example of a conventional HEMT device formed epitaxially on a foreign substrate.

FIG. 12B is a simplified schematic of an epitaxial structure of a HEMT device according to an example of the present invention.

FIG. 12C is a simplified schematic cross-section of a structure of a HEMT device according to an example of the present invention.

FIG. 12D is a simplified schematic cross-section of a structure of a HEMT device according to an example of the present invention.

FIG. 12E is a simplified schematic cross-section of a structure of a HEMT device according to an example of the present invention.

FIG. 12F is a simplified schematic of an epitaxial structure of a HEMT device according to an example of the present invention.

FIG. 12G is a simplified schematic cross-section of a structure of a HEMT device according to an example of the present invention.

FIG. 12H is a simplified schematic cross-section of a structure of a HEMT device according to an example of the present invention.

FIG. 12I is a simplified schematic cross-section of a structure of a HEMT device according to an example of the present invention.

FIG. 12J is a simplified schematic cross-section of a structure of a HEMT device according to an example of the present invention.

FIG. 12K is a simplified schematic cross-section of a structure of a HEMT device according to an example of the present invention.

FIG. 12L is a simplified schematic of an epitaxial structure of a HEMT device according to an example of the present invention.

FIG. 12M is a simplified schematic cross-section of a structure of a plurality of HEMT devices formed on a bulk GaN substrate according to an example of the present invention.

FIG. 12N is a simplified schematic cross-section of a structure of a plurality of HEMT devices selectively bonded to multiple carrier wafers or printed circuit boards according to an example of the present invention.

FIG. 13A is a simplified cross-section schematic example of preparation of Schottky diode epitaxial device layers for die expanded transfer according to one embodiment of this invention.

FIG. 13B is a simplified cross-sectional schematic example of selective bonding of Schottky diode epitaxial device layers for die expansion according to one embodiment of this invention.

FIG. 13C is an example top-view schematic of conventional Schottky diode device.

FIG. 13D is an example cross-sectional view of a conventional Schottky diode device.

FIG. 13E is an example cross-sectional view of Schottky diode device according to this invention.

FIG. 13F is an example top-view schematic of conventional HEMT device.

FIG. 13G is an example cross-sectional view of a conventional HEMT device.

FIG. 13H is an example cross-sectional view of HEMT device according to this invention.

FIG. 14A is a simplified schematic example of semiconductor device integration onto a common carrier wafer according to this invention.

FIG. 14B is a simplified schematic example of semiconductor device integration onto a common carrier wafer according to this invention.

FIG. 14C is a simplified schematic example of semiconductor device integration onto a carrier wafer configured with device functionality.

FIG. 15 is a simplified cross-sectional view of an exemplary transferred distributed feedback (DFB) device on a carrier wafer in accordance with an embodiment.

FIG. 39(a)-39(b) are simplified cross-sectional views of a transferred semiconductor laser diode on a carrier wafer in accordance with some embodiments.

DETAILED DESCRIPTION

Figure 16:
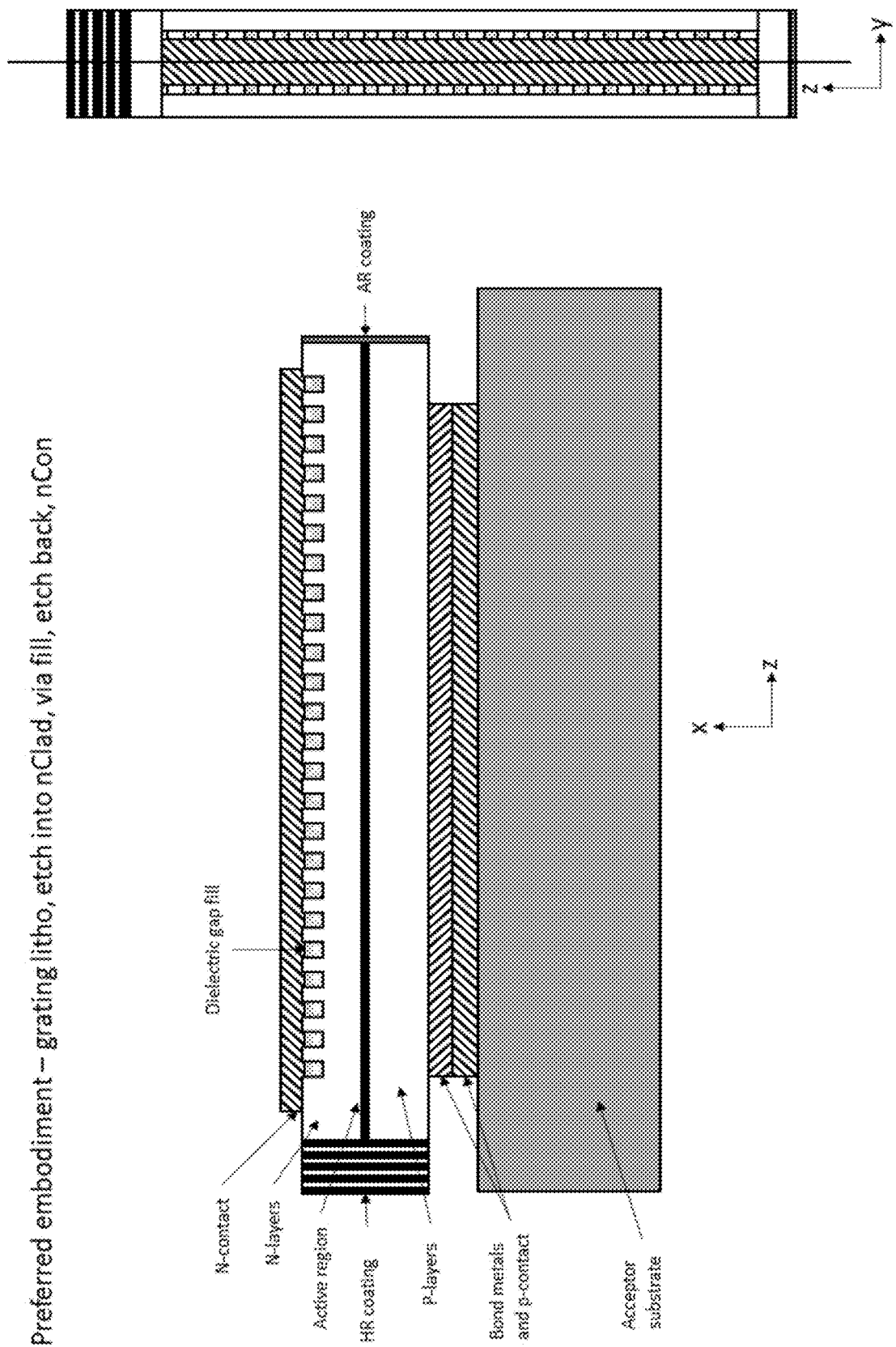
FIG. 16 is a simplified cross-sectional and plan view of an exemplary DFB laser in accordance with an embodiment.

Embodiments of the invention provide methods for fabricating semiconductor devices based on gallium and nitrogen containing epitaxial materials grown on bulk gallium and nitrogen containing substrates. Typically these devices are fabricated using an epitaxial deposition on a gallium and nitrogen containing substrate followed by processing steps on the epitaxial substrate and overlying epitaxial material. In some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. By using a selective etch process such as a photoelectrochemical (PEC) etch combined with a bonding process at least a portion of the epitaxial material is transferred to one or more carrier wafers. Subsequently, the carrier wafer with the bonded epitaxial material is subjected to processing steps to form semiconductor devices including optical devices such as lasers and light emitting diodes, or electronic devices such as Schottky diode, pn diode, transistors, field effect transistors, bipolar junction transistors, high electron mobility transistor, or solar cell devices. In other embodiments the semiconductor devices are fully or partially formed in the epitaxial material before transfer to a carrier wafer or to an integrated circuit. In other embodiments, different types of semiconductor devices are configured on a common carrier using the selective bonding and etching process to form an integrated device. Merely by way of example, the present invention can be applied to applications such as white or infrared lighting, white or infrared spot lighting, general lighting, specialty lighting, dynamic lighting, smart lighting, flash lights, automobile headlights, automobile interior lighting, automobile position lighting and any lighting function, mobile machine lighting such as autonomous machine lighting and drone lighting, all-terrain vehicle lighting, light, sensing or communication systems, navigation systems, advanced driver assistance systems (ADAS), autonomous or semi-autonomous mobile machines and robots, sources used in recreational sports such as biking, surfing, running, racing, boating, light sources used for drones, planes, robots, other mobile or robotic applications, safety, counter measures in defense applications, multi-colored lighting, lighting for flat panels, medical applications, including cancer treatment or ablation or cosmetic surgery, metrology and measurement applications, beam projectors and other display devices and systems, frequency doubling systems such as second harmonic generation (SHG) systems, SHG systems combined with nonlinear crystals like barium borate (BBO) for producing wavelengths in the 200 nm to 400 nm range, wearable displays, augmented reality systems, mixed reality systems, virtual reality systems, high intensity lamps, spectroscopy, entertainment, theater, music, and concerts, analysis fraud detection and/or authenticating, tools, purification, sterilization, anti-virus, anti-bacterial, water treatment, security systems, laser dazzlers, targeting, communications, LiFi, visible light communications (VLC), sensing, detecting, distance detecting, Light Detection And Ranging (LIDAR), smart infrastructure such as smart factories or smart homes, transformations, transportations, leveling, curing and other chemical treatments, heating, cutting and/or ablating, welding, marking, laser direct imaging, pumping other optical devices, other optoelectronic devices and related applications, storage systems, quantum computing, quantum cryptography, quantum storage, and source lighting and the like.

The invention involves a semiconductor device wafer composed of one or more sacrificial layers and one or more device layers overlying the surface region of a substrate wafer. The substrate wafer comprising a bulk gallium and nitrogen containing material such as GaN, but can be others. In the example of a GaN substrate, the GaN substrate can be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the substrate surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

Current state of the art is to use bulk GaN substrates produced by growth of reduced defect density boules either by hydride vapor phase epitaxy or ammonothermal growth. In both cases relatively large (e.g. typically two inch diameter or greater) GaN c-plane substrates can be produced which have relatively low density of uniformly distributed defects. Growth on c-plane wafers is advantageous to growth on non-polar and semi-polar oriented GaN wafers only in the aspect that two-inch and greater diameter c-plane wafers are currently available and non-polar and semi-polar orientations are generally restricted in size due to their being crosscut from c-plane oriented boules.

Polar c-plane GaN wafers with no offcut are oriented primarily with the surface normal parallel to the [0001] direction of the wurtzite crystal lattice. The wafer may have an offcut, where the surface normal of the wafer is tilted towards one or a combination of the <11-20> or <10-10> directions. For an arbitrary offcut direction one would normally specify the tilt towards orthogonal pairs of directions found in the <11-20> and <10-10> families. For example, [10-10] and [1-210] are orthogonal and might be used to specify an arbitrary offcut. In general, offcuts will be predominantly towards only one of the <11-20> or <10-10> directions, with only relatively small deviations. For example, a c-plane wafer may have an offcut between 0.1 and 10 degrees towards the [10-10] direction or it may have an offcut between 0.1 and 10 degrees towards the [11-20] direction. Though larger and smaller offcuts would be possible, a wafer with an offcut less than 0.1 degrees would be considered to be nominally on-axis.

Wafer offcut is important because it will determine both the density of atomic steps on the wafer surface as well as the termination of the step edges. Because an arbitrarily oriented surface of a crystal is likely to have a high surface energy, a crystal will tend to form an approximation of an inclined face using a collection of low energy planes. In general, an offcut c-plane wafer would result in a stepped surface comprised of [0001] step surfaces and step-edges composed of prismatic planes (i.e. (11-20) or (10-10)). Due to anisotropy in the crystal structure the number and configuration of dangling bonds at (11-20) step edges will be different from those at a (10-10) step edge. Since the direction and magnitude of the offcut controls the density and orientation of the step edges, a large amount of control over the chemical character of the substrate can be affected by offcut. Many growth processes such as chemical ordering, incorporation of volatile species and formation of stacking faults can be linked to the way atoms incorporate at the edges of steps. Therefore, proper selection of substrate offcut is critical to achieving the best epitaxial film quality.

Though c-plane wafers are larger than non-polar and semi-polar oriented wafers and offer a cost advantage, they have a severe drawback is in some semiconductor devices that result from internal fields originating from spontaneous and piezo induced polarization fields. In light emitting devices that use quantum wells, the internal polarization field result in a spatial separation of electron and hole states within the quantum wells that negatively impacts the radiative recombination efficiency. Using narrow wells has been the approach taken in both LED and laser devices based on polar GaN. In LEDs, the narrow quantum wells lead to high carrier density, which exacerbates the droop phenomenon that leads to the nonlinear light output versus current input of LEDs, and ultimately limits the efficiency. In laser devices the quantum wells are not effective at guiding the optical mode due to the limited index contrast that can be achieved between the active region and GaN cladding layers. In order to increase the index contrast between the active region and the cladding layers and thereby increase the optical confinement, c-plane devices typically utilize aluminum containing cladding layers. By using nonpolar or semipolar GaN substrate orientations for LEDs and laser diodes, these internal fields can be reduced and improved performance is possible. Similarly, in electronic devices there are aspects wherein having reduced internal fields or reduced polarization fields, semiconductor electronic devices with improved performance can be formed.

The limited currently available size and increased cost of nonpolar and semipolar substrates limits their practicality for deployment in commercial semiconductor devices. A powerful breakthrough enabled by this present invention is the use of nonpolar or semipolar substrates at a low cost since die expansion can be used, substrates can be re-used, and the overlying epitaxy of small wafers can be transferred onto larger carrier wafers for device fabrication. In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \le x, y, x+y \le 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$.

Of course, in some embodiments for the fabrication of devices such as LEDs or power electronic devices the gallium and nitrogen containing epitaxial materials could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

Another advantage offered by the present invention is the ability to access either the Ga-face or the N-face of the gallium and nitrogen containing epitaxial device layers for device fabrication and contact formation. For example, if the epitaxial layers are grown on a Ga-face substrate the epitaxial layers will be formed terminating with a Ga-face surface. After the epitaxy is transferred to the carrier wafer for process the N-face will be exposed for process. The N-face may provide an advantage to the device such as an improved contact property or an improved behavior for the semiconductor layers. In the case where it is desirable to do the device fabrication with the Ga-face on the surface, semiconductor process steps may be performed on the epitaxial wafers prior to transfer to the carrier wafer. The order of the epitaxial stack can be arranged to provide the most benefit to the device.

Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to one or more carrier wafers. In one embodiment, a bonding material is deposited on the surface overlying the semiconductor device layers. A bonding material is also deposited either as a blanket coating or patterned on a carrier wafer. Standard lithographic processes are used to selectively mask the semiconductor device layers. The wafer is then subjected to an etch process such as dry etch or wet etch processes to define via structures that expose the one or more sacrificial layers on the sidewall of the mesa structure. As used herein, the term mesa region or mesa is used to describe the patterned epitaxial material on the gallium and nitrogen containing substrate and prepared for transfer to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is used to fully or partially remove the one or more sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the one or more sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

The preparation of the epitaxy wafer is shown in FIG. 2A. A substrate 100 is overlaid by a buffer layer 101, a selectively removable sacrificial layer 107, an buffer layer 101, a collection of device layers 102 and a contact layer 103. The sacrificial region is exposed by etching of vias that extend below the sacrificial layer and segment the layers 101, 102, 103, and 107 into mesas. A layer composed of bonding media 108 is deposited overlaying the mesas. In some embodiments the bonding layer is deposited before the sacrificial layer is exposed. Finally the sacrificial layer is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 2A is a top down etch to expose the sacrificial layers, followed by a bonding metal deposition as shown in FIG. 2A. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention involving light emitting devices uses a sacrificial region with a higher bandgap than the active region such that both layers are absorbing during the bandgap PEC etching process.

In one embodiment involving light emitting devices, the active region can be prevented from etching during the bandgap selective PEC etch using an insulating protective layer on the sidewall, as shown in FIG. 2B. The device layers 102 are exposed using an etch and an etch resistant protect layer 104 is deposited overlaying the edges of the device layers such that they are not exposed to the etch chemicals. The sacrificial layer is then exposed by an etch of vias. A bonding layer 108 is deposited and a selective etch process is used to remove the sacrificial layers. In some embodiments the bonding layer is deposited after the selective etch. This workflow is advantageous when the device layers are susceptible to damage from the etch process used to remove the sacrificial layer. With the sacrificial region exposed a bandgap selective PEC etch is used to undercut the mesas. At this point, the selective area bonding process shown in FIG. 2B is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching. In other embodiments involving electronic devices or power electronic devices that do not contain light emitting layers, no special measures need to be taken to protect the semiconductor device layers during the selective etch.

Sacrificial layers for lift-off of the substrate via photochemical etching would incorporate at a minimum a low-bandgap or doped layer that would absorb the pump light and have enhanced etch rate relative to the surrounding material. The sacrificial layer can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In one embodiment wherein the semiconductor device comprises active light emitting layers such as LEDs, PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with one or more of acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide is deposited overlying the device layer mesa region to form a bond region. The carrier wafer is also prepared with an oxide layer to form a bond region. The oxide layer overlying the carrier could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with one or more of acids, bases or plasma treatments to produce a surface that yields a weak bond when brought into contact with the oxide surface. Bonding is performed at elevated temperatures and elevated pressures.

In another embodiment the bonding media could be a dielectric such as silicon dioxide or silicon nitride. Such a media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In one embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In another embodiment, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

In one embodiment of this invention, the bonding of the semiconductor device epitaxial material to the carrier wafer process can be performed prior to the selective etching of the sacrificial region and subsequent release of the gallium and nitrogen containing substrate. FIG. 3A is a schematic illustration of a process comprised of first forming the bond between the gallium and nitrogen containing epitaxial material formed on the gallium and nitrogen containing substrate and then subjecting the release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material consists of at least a sacrificial release layer and one or more device layers. In some embodiments a buffer layer is grown on between the substrate surface region and the sacrificial release region. In FIG. 3A substrate wafer 101 is overlaid by a buffer layer 102, a selectively etchable sacrificial layer 104 and a collection of device layers 101. The sacrificial layer is exposed using the process described in FIG. 2A. The bond layer 105 is deposited along with a cathode metal 106 that will be used to facilitate the photoelectrochemical etch process for selectively removing the sacrificial layer.

The device layers can be comprised of many configurations suited for the specific semiconductor device. For example, an LED device structure would be comprised of one or more n-type gallium and nitrogen containing layers, an active region comprised of one or more quantum well layers, and one or more p-type gallium and nitrogen layers. In another example, a laser diode device structure would be comprised of one or more n-type gallium and nitrogen containing cladding layers, an active region comprised of one or more quantum well layers, and one or more p-type gallium and nitrogen cladding layers. In yet another example, a p-n diode device would be comprised structure would be comprised of at least one or more n-type gallium and nitrogen containing layers and one or more p-type gallium and nitrogen layers. In yet another example, a Schottky diode device would be comprised of an n-type gallium and nitrogen containing layer and a very low doped layer intended to be an intrinsic layer. As used herein, the term intrinsic or intrinsic region is used to describe a semiconductor material with very low doping or carrier concentration. The intrinsic region can be formed by growing epitaxial materials that are not intentionally doped [NID], unintentionally doped [UID], or may be intentionally doped to compensate the unintentional background doping to reduce the carrier concentration. The intrinsic region is typically configured as an insulating region, a semi-insulating region, or a drift region. The epitaxial material is subjected to processing steps such as metal and dielectric deposition steps, lithography, and etching steps to form mesa regions with a bond region on the top. The carrier wafer 108 which is patterned with bond pads 107 is brought into contact with the bond layers 105 using a precision alignment process. After the bonding process is complete, the sacrificial etch is carried out. The selective etch of the sacrificial layer releases the mesas from the substrate.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In an example, FIG. 3B is a schematic representation of the "etch then bond" process flow where the mesas are retained on the substrate by controlling the etch process such that not all of the sacrificial layer is removed. A substrate wafer 101 is overlaid by a buffer layer 102, a selectively etchable sacrificial layer 104 and a collection of device layers 101. The sacrificial layer is exposed using the process described in FIG. 2A. The bond layer 105 is deposited along with a cathode metal 106 that will be used to facilitate the photoelectrochemical etch process for selectively removing the sacrificial layer. The selective etch process is carried out to the point where only a small fraction of the sacrificial layer is remaining, such that the mesas are retained on the substrate, but the unetched portions of the sacrificial layer are easily broken during or after the mesas are bonded to the carrier wafer.

A critical challenge of the etch then bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions are used to mechanically support the mesas to the gallium and nitrogen containing substrate prior to the bonding step wherein they are releases from the gallium and nitrogen containing substrate and transferred to the carrier wafer.

Anchor regions are special features that can be designed into the photo masks which attach the undercut device layers to the gallium and nitrogen containing substrate, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate and prevent the device layers from spatially shifting. This attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

In one embodiment the anchor region is formed by features that are wider than the device layer mesas such that the sacrificial region in these anchor regions is not fully removed during the undercut of the device layers. FIG. 3C is a schematic representation of the "etch then bond" process flow where the mesas are retained on the substrate by deposition of an etch resistant material acting as an anchor by connecting the mesas to the substrate. A substrate wafer 101 is overlaid by a buffer layer 102, a selectively etchable sacrificial layer 104 and a collection of device layers 101. The sacrificial layer is exposed using the process described in FIG. 2A. The bond layer 105 is deposited along with a cathode metal 106 that will be used to facilitate the photoelectrochemical etch process for selectively removing the sacrificial layer. A layer of etch resistant material 107, which may be composed of metal, ceramic, polymer or a glass, is deposited such that it connects to both the mesa and the substrate. The selective etch process is carried out such that the sacrificial layer is fully removed and only the etch-resistant layer 107 connects the mesa to the substrate FIG. 3D is a simplified schematic representation of the "etch then bond" process flow where the mesas are retained on the substrate by use of an anchor composed of epitaxial material. A substrate wafer 101 is overlaid by a buffer layer 102, a selectively etchable sacrificial layer 104 and a collection of device layers 101. The sacrificial layer is exposed using the process described in FIG. 2A. The bond layer 105 is deposited along with a cathode metal 106 that will be used to facilitate the photoelectrochemical etch process for selectively removing the sacrificial layer. The anchor is shaped such that during the etch, a small portion of the sacrificial layer remains unetched 108 and creates a connection between the undercut mesa and the substrate wafer.

In one embodiment the anchors are positioned either at the ends or sides of the undercut die such that they are connected by a narrow undercut region of material. FIG. 3E shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing regions of an etch-resistant material that adheres well to the epitaxial and substrate material. These regions overlay a portion of the semiconductor device layer mesa and some portion of the structure that will not be undercut during the etch such as the substrate. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could comprise about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

FIG. 3E shows a top-view schematic of an example of a transferable mesa of GaN epitaxial material with a metal anchor bridging between the bond metal on the top of the mesa and the cathode metal in the etched field. FIG. 3F presents a cross-sectional view of an example of a transferable semiconductor device layer mesa at the location of a metal anchor. Here the mesa is formed by dry or wet chemical etching, and for an example of an LED structure includes the one or more p-type GaN layers, the light emitting layers, and the one or more n-type GaN layers, the sacrificial layer, and a portion of the n-type GaN epitaxial layer beneath the sacrificial layer. A p-contact metal is first deposited on the p-type GaN in order to form a high quality electrical contact with the p-type GaN. A second metal stack is then patterned and deposited on the mesa, overlaying the p-contact metal. The second metal stack consists of an n-contact metal, forming a good electrical contact with the n-type GaN beneath the sacrificial layer, as well as a relatively thick metal layer that acts as both the mesa bond pad as well as the cathode metal. The bond/cathode metal also forms a thick layer overlaying the edge of the mesa and providing a continuous connection between the mesa top and the substrate. After the sacrificial layer is removed by selective photochemical etching the thick metal provides mechanical support to retain the mesa in position on the GaN wafer until the bonding to the carrier wafer is carried out.

FIG. 3G is a schematic representation of charge flow in a device using a metal anchor during PEC etching of the sacrificial layer. It is possible to selectively etch the sacrificial layer even if the pump light is absorbed by the active region. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal anchors where they recombine. The flat band conditions in the sacrificial region result in a buildup of holes that result in rapid etching of the sacrificial layers.

The use of metal anchors as shown have several advantages over the use of anchors made from the epitaxial device material. The first is density of the transferrable mesas on the donor wafer containing the epitaxial semiconductor device layers and the gallium and nitrogen containing bulk substrate or on the foreign substrate in the case of heteroepitaxy. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. Removing the active region protecting layer reduces the number of fabrication steps while also reducing the size of the mesa required.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate or foreign substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below the one or more sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 microns to about 500 microns or to about 5000 microns. Each of these mesas is a 'die'.

In a preferred embodiment, these die are transferred to a carrier wafer at a second pitch using a selective bonding process such that the second pitch on the carrier wafer is greater than the first pitch on the gallium and nitrogen containing substrate. In this embodiment the die are on an expanded pitch for so called "die expansion". In an example, the second pitch is configured with the die to allow each die with a portion of the carrier wafer to be a semiconductor device, including contacts and other components. For example, the second pitch would be about 50 microns to about 1000 microns or to about 5000 microns, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

FIG. 4 is a schematic representation of the die expansion process with selective area bonding according to the present invention. A device wafer is prepared for bonding in accordance with an embodiment of this invention. The wafer consists of a substrate 106, buffer layers 103, the fully removed sacrificial layer 109, the device layers 102, the bonding media 101, the cathode metal utilized in the PEC etch removal of the sacrificial layer and the anchor material 104. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer 107 and bond pads 108 at second pitch. The substrate is aligned to the carrier wafer such that a subset of the mesa on the gallium and nitrogen containing substrate with a first pitch align with a subset of bond pads on the carrier at a second pitch. Since the first pitch is greater than the second pitch and the mesas will comprise device die, the basis for die expansion is established. The bonding process is carried out and upon separation of the substrate from the carrier wafer the subset of mesas are selectively transferred to the carrier. The process is then repeated with a second set of mesas and bond pads on the carrier wafer until the carrier wafer is populated fully by epitaxial mesas. The gallium and nitrogen containing epitaxy substrate 201 can now optionally be prepared for reuse.

In the example depicted in FIG. 4, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 4. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process.

In one embodiment, the carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 4. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 micron and about 500 microns wide or between about 500 micron and about 3000 microns wide and between about 100 and about 3000 µm long. In an example, the second die pitch on the carrier wafer is between about 100 microns and about 200 microns or between about 200 microns and about 1000 microns or between about 1000 microns and about 3000 microns. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components, which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring die at close spacings from multiple epitaxial wafers, it is important for the un-transferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate transfer a second set of die to the carrier. Finally, the semiconductor devices are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of devices per dice from each substrate.

In some embodiments, multiple semiconductor device die are transferred to a single carrier wafer and placed within close proximity to each other. Dice in close proximity are preferably within one millimeter of each other, but could be other.

In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

A most important breakthrough of this technology is enabling the die expansion technology as described above. By enabling the gallium and nitrogen containing epitaxial layer dice to be transferred to the carrier wafer at a larger pitch the expensive gallium and nitrogen containing substrate and epitaxial device layers can be more efficiently utilized. Additionally, a larger area will be required on the carrier wafer than the area of the gallium and nitrogen containing substrate. For example, in a fix expansion configuration, a carrier wafer with 4 times larger area will be required to receive all of the transferred device dice. This is powerful feature for GaN devices formed on GaN substrates since currently bulk GaN substrates are commercially available in 2" diameter with recent announcements of 4" diameter sampling. These wafer diameters are relatively small compared to the well-established silicon substrate technology, which are currently available at diameters up to 12". For example, a 12" substrate has 36 times the substrate area of a 2" GaN substrate and 9 times the substrate area of a 4" GaN substrate, which are not yet available in high volume. This drastically larger area enables device processing with orders of magnitude more device die per wafer to provide massive reductions in manufacturing costs.

FIG. 5A is an illustration of bondable area for various substrate dimensions on a 100 mm diameter carrier wafer 1001. In this configuration die expansion is happening in one dimension only. The number of transfers possible is fixed by the size and shape of the substrate relative to the carrier. Several examples are shown, including 25.4 mm diameter wafers 1002, 32 mm diameter wafers 1003 and 2×2 cm² substrates 1004. Other combinations of 50 mm diameter substrates 1006 and various carrier wafers are shown: 100 mm 1001, 200 mm 1005 and 300 mm 1007.

Selection of the carrier wafer with high thermal conductivity (e.g. greater than about 150 K/mW) can offer many advantages including enabling a lower device operation temperature, which typically improves device performance. In addition, a high thermal conductivity submount may also allow for the use of full thickness carrier wafers (e.g. > about 300 microns) with low thermal resistance, therefore no thinning of the carrier wafer is required. In another embodiment of the invention bar and die singulation is achieved with a sawing process. Sawing is a well-established process used for the singulation of LEDs and other semiconductor devices.

In one example where high thermal conductivity is desired, SiC is used as both a carrier and a submount. SiC is available in wafer diameters up to about 150 mm from multiple vendors with high thermal conductivities ranging from about 360-490 W/mK depending on the crystal polytype and impurities. FIG. 5B (12) shows a schematic of the cross section of a SiC wafer 402 used as both a carrier wafer and a submount for a resulting semiconductor device. Before transfer of the device material the SiC wafer is fabricated with a bonding layer 401 for attachment to the semiconductor device package. The opposing face of the SiC wafer is fabricated with a thin, electrically insulating layer 403, electrically conductive traces and wire-bond pads 405 and an electrically conductive bonding media 108. The device material is then transferred to the carrier via previously described processes. Electrical isolation layers 408 are fabricated on the wafer using standard lithographic processes and electrical contacts and wire bond pads 407 are made to the top-side of the semiconductor device. The electrical isolation layers are important to insure that the semiconductor devices are electrically isolated from the package or heat sink. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401.

After completion of fabrication of the semiconductor devices on the carrier wafer, the carrier wafer will be diced into semiconductor devices in a die singulation process. In one embodiment of the invention, the die singulation is achieved with a sawing process. Sawing is a well-established process used for the singulation of LEDs and other semiconductor devices. For example, DISCO saws can be used. DISCO's dicing saws cut semiconductor wafers (Si, GaAs, etc.), glass, ceramic, and a wide variety of other materials at a level of precision measured in micrometers.

In another embodiment of the invention the die singulation is achieved by a scribing and breaking process. For example, a diamond or laser scribing process may be used wherein the carrier wafer is subjected a scribing. In the case of a laser scribing process, a UV laser may be used induce a scribe profile in the carrier substrate. The carrier substrate is then subjected to a breaking process.

In another embodiment of the invention the die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment the carrier wafer is a device wafer itself. In one example, the carrier wafer is a silicon wafer and comprised of Si Complementary metal-oxide-semiconductor (CMOS) devices such as transistors.

Another advantage is that this invention transfers the epitaxial material comprising the semiconductor device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. Since it is both substrate size and substrate cost associated with many types of semiconductor devices formed on bulk gallium and nitrogen containing substrates preventing mainstream adoption, this technology overcomes this barrier and can enable mainstream adoption of highly cost sensitive devices such as LEDs and power electronic devices. Relative to more mature substrate technologies such as silicon, sapphire, and silicon carbide, GaN substrates are both small and expensive. This in itself is prohibitive to the realization of cost competitive LED and electronic power devices using conventional methods on bulk GaN substrates. By enabling both die expansion and substrate re-use, this invention breaks those barriers and allows for the fabrication of high performance LED devices and power devices at a competitive cost. Moreover, it enables the fabrication of GaN-based laser diodes at a fraction of the cost of laser diodes fabricated with conventional technologies where die expansion and substrate re-use are not possible.

In this invention the substrate can be recycled by reconditioning the surface to an epi-ready state using a combination of one or more of lapping, polishing and chemical mechanical polishing. Substrate recycling would require removal of any variation in wafer height remaining from the transfer process. FIG. 6 is an illustration of a substrate re-use process. According to this embodiment, an epitaxial substrate 504 is provided. An epitaxial process is carried out where a buffer-layer 503 is deposited with a thickness between 1 and 50 microns. The buffer layer consists of the same material as the substrate. The buffer layer is overlaid by the selectively removable sacrificial layer 502 and the device layers 501. The epitaxial wafer is then processed in accordance with embodiments of this invention including deposition of a cathode layer 505 and a bond layer 506. The selective etch and bond process is carried out such that the device mesas are transferred from the substrate. The substrate now consists of the original substrate, the buffer layer which is now patterned with mesas and trenches and the cathode layer. The cathode layer is optionally removed with etches. Finally, the buffer layer is removed by lapping, polishing and chemical mechanical polishing (CMP) such that the semiconductor substrate surface is returned to an equivalent condition as before the epitaxial growth. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process. Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (< about 10 nm) roughness. Final cleaning steps may include use of a surfactant to remove residual slurry as well as cleans to remove contaminants such as exposure to acidic solutions (for example HCl, HCl:HNO$_3$, HF and the like) and exposure to solvents (for example isopropanol, methanol and acetone). In some embodiments the buffer layer thickness is chosen such that the substrate thickness is not reduced after lapping and CMP. In other embodiments the substrate is allowed to thin during successive reclamations. We estimate a substrate could be recycled more than 10 times without significant change in thickness. In some embodiments, the epitaxial layers include thick buffers that are subsequently removed by the recycling process, thereby leaving the net thickness of the substrate unchanged or even enabling the thickness to increase.

With the basics of the invention describing the transfer of the gallium and nitrogen containing device layers from the bulk gallium and nitrogen containing substrate to a carrier wafer using a PEC undercut and bonding technology described that enables die expansion, leveraging of large carrier wafer size for fabrication, re-use of native gallium and nitrogen containing substrates, and integration of multiple functionality semiconductor devices, specific examples of device layers and the resulting devices can now be described. This invention can be extended to many and almost all semiconductor devices so the descriptions provided here are merely examples and there could be many others.

Of course, in some embodiments of the present invention the gallium and nitrogen containing epitaxial device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In a preferred embodiment, the gallium and nitrogen containing epitaxial materials are deposited on sapphire or SiC due to their relatively low cost and ability to achieve relatively low defectivity and low strain epitaxial films. In a less preferred embodiment the gallium and nitrogen containing epitaxial materials are deposited on silicon wafers due to the low cost of silicon wafers and availability of large area silicon wafers; i.e. wafers with greater than 150 mm diameter.

In an embodiment of this invention, the epitaxial device layers comprise an AlInGaN light emitting diode (LED). AlInGaN LEDs contain n-type and p-type cladding layers surrounding light emitting layers. The p-GaN is typically kept thin with p-GaN thicknesses typically on the order of 100-300 nm and preferably on the order of 0.5 to 1.5 times the wavelength in GaN of the light emitted from the LED. The p-contact metal is usually either highly reflective, such as Ag, or in the case where light is extracted through the p-GaN surface the contact is formed from a transparent conductive oxide [i. e., ITO or ZnO] such that adequate current spreading is achieved in the relatively resistive but thin p-GaN. The n-type cladding is normally thicker than the p-type. Often the surface of the n-type GaN is roughened or the interface between the n-type GaN and a heteroepitaxial substrate (as in the case of GaN grown on sapphire) is roughened so as to scatter light out of the crystal.

AlInGaN LEDs are typically more efficient as the operational current density is reduced. In order to produce useful amounts of light with high efficiency, LED die tend to be relatively large compared to other devices such as laser diodes. State of the art LEDs often have areas bigger than 1 mm2, and at industry standard operating currents of 350, 750 and 1000 mA operate at current densities of 35, 75 and 100 A/cm2. These current densities are 1-2 orders of magnitude lower than typical operational current densities for state of the art high-power blue-light-emitting GaN laser diodes. Due to the large amount of epitaxial material used in LEDs it is highly advantageous for manufacturers to utilize as high a fraction of the epitaxial material as possible from each wafer, and unlike a conventional laser diode the majority of the device area is light emitting. In typical AlInGaN LED manufacturing processes, the die are singulated from the epitaxial device wafer by thinning and either cleaving or sawing the wafer. The dice are then transferred to a submount using a serial pick-and-place process. The submount is typically formed from a wafer or tile of electrically insulating material, can be patterned with bond pads and electrical interconnects, acts as a mechanical support for the LED die, provides a means of electrical access to the die, supports primary optics and encapsulation materials which are in general formed from silicone and often supports accessory semiconductor devices such as diodes providing protection from electrostatic discharge damage.

In an embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical (PEC) etch process where the sacrificial InGaN is optically pumped with wavelengths of light shorter than 450 nm. Overlying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is an active region consisting of one or more InGaN quantum wells with thickness between 1.5 and 10 nm separated by barriers of substantially wider bandgap. Typically the barriers will be formed from GaN. Overlaying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3. An example of this embodiment is shown in FIG. 7A. The n-type InGaN buffer is typically included to improve the internal quantum efficiency of the LED. Many explanations are given for the mechanism behind this improvement, including relaxation of strain in the active region quantum wells, a surfactant effect of the indium resulting in advantageous surface morphology during active region growth and alteration of the electric fields in the active region.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that shown in FIG. 7A wherein the GaN substrate would be replaced by the foreign substrate such as sapphire, SiC, or silicon. Further, in many embodiments of hetereoepitaxial growth a nucleation layer would be included on the foreign substrate underlying the buffer layer.

In another embodiment of this invention, a gallium and nitrogen containing substrate is overlaid with epitaxially grown device layers. Overlaying the substrate is a n-type GaN buffer layer which may vary in thickness from 0.25 to 5 microns. Overlaying the n-type GaN buffer is an n-type InGaN buffer layer. The n-InGaN buffer will have a total thickness of 25 to 100 nm and may be either a single InGaN layer of low composition (<10% InN) or may consist of a short-period superlattice of alternating GaN and InGaN layers. Overlaying the n-InGaN buffer is a sacrificial region composed of one or more InGaN quantum wells with InN concentrations of approximately 10%. These sacrificial wells may vary in thickness from 1 to 10 nm or larger depending on composition. The sacrificial wells are selectively etchable, relative to the surrounding GaN, using a photoelectrochemical etch process where the sacrificial InGaN is optically pumped with wavelengths of light shorter than 450 nm. Overlying the sacrificial InGaN layers are an n-type contact layer and an n-type GaN current spreading layer. The contact layer is highly doped with a carrier concentration of 1E18 to 1E20 cm-3, while the n-type current spreading layer is more lightly doped with carrier concentrations from 1E17 to 5E18 cm-3. The n-type current spreading layer may vary in thickness from 0.25 to 5 microns but will typically be on the order of 2 microns. Above the n-type current spreading layer is an active region consisting of one or more InGaN quantum wells with thickness between 1.5 and 10 nm separated by barriers of substantially wider bandgap. Typically the barriers will be formed from GaN. Overlying the active region is a GaN upper barrier with thickness varying from 5 to 50 nm. Overlaying the GaN upper barrier is an electron blocking layer with thickness of 10 to 50 nm. Typically the electron blocking layer (EBL) will be composed of a material with a wider bandgap than GaN. In many cases this is AlGaN, with typical compositions ranging from 10 to 30% AlN. In some embodiments the EBL will be composed of a AlGaInN quaternary alloy. In general the EBL is doped highly p-type, with Mg concentrations on the order of 3E18 cm-3 or higher. Overlaying the EBL is a p-type GaN layer ranging in thickness from 50 to 400 nm. The upper 10-50 nm of the p-type GaN consists of a p-contact layer that is heavily doped with Mg concentrations typically above 1E20 cm-3. An example of this structure is shown in FIG. 7B.

In an alternative embodiment the gallium and nitrogen containing epitaxial LED device layers could be provided by heteroepitaxial growth on a substrate that is not gallium nitride. These heteroepitaxial substrates may include sapphire, SiC, gallium oxide, spinel, lanthanum aluminate, magnesium oxide, and silicon among others. In one embodiment, the gallium and nitrogen containing epitaxial materials are deposited on sapphire or SiC due to their relatively low cost and ability to achieve relatively low defectivity and low strain epitaxial films. In an alternative embodiment the gallium and nitrogen containing epitaxial materials are deposited on silicon wafers due to the low cost of silicon wafers and availability of large area silicon wafers; i.e. wafers with greater than 150 mm diameter. The epitaxial layer structure would look very similar to that shown in FIG. 7B wherein the GaN substrate would be replaced by the foreign substrate such as sapphire, SiC, or silicon. Further, in many embodiments of hetereoepitaxial growth a nucleation layer would be included on the foreign substrate underlying the buffer layer.

In an embodiment, blue and green LEDs based on gallium and nitrogen containing epitaxial materials could be provided by heteroepitaxial growth of on a substrate that is not gallium nitride. These heteroepitaxial substrates may include sapphire, SiC, gallium oxide, spinel, lanthanum aluminate, magnesium oxide, and silicon among others. The orientation of these gallium and nitrogen containing epitaxial films may be configured with a polar surface such as a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}. In some embodiments the film surface orientation is configured with an offcut of less than about 10 degrees toward a c-direction, a-direction, and/or m-direction a c-plane surface, a nonpolar surface such as an m-plane surface, or a semipolar surface such as a {30-32}, {20-21}, {30-31}, {50-51}, {30-3-2}, {20-2-1}, {30-3-1}, {50-5-1}, {11-22}, or {10-1-1}.

In an example embodiment, a gallium and nitrogen containing epitaxial film is deposited via heteroepitaxial growth on a sapphire substrate. The sapphire substrate is first overlaid with a nitrogen containing nucleation layer. Typically the nucleation layer material is GaN, though it may also be AlN or AlGaN and may also contain a layer provided by converting part of the sapphire wafer surface. For example, the surface of the sapphire wafer could be converted from $Al_2O_3$ to AlN or $AlO_xN_y$ (where x+y=1) by exposing the sapphire substrate to ammonia at high temperatures in the MOCVD reactor. The nucleation layer is grown relatively cold, at a temperature below 700 degrees Celsius. Relatively cold growth is used to produce a high density of individual GaN crystals on the substrate surface. Each crystal of the nucleation layer is partially or fully strain-relaxed, which is accommodated by a network of misfit dislocations that form at the interface between the nucleation layer and the substrate. The substrate is then annealed in the MOCVD reactor at elevated temperature; typically above 1000 degrees Celsius. The anneal is intended to refine the grain structure of the nucleation layer by desorbing material such that smaller grains are fully desorbed. After the anneal, a gallium and nitrogen containing "buffer" or "coalescence" layer is grown. The buffer layer is grown under conditions promoting lateral growth of gallium and nitrogen containing crystals preferentially to vertical growth. This results in the coalescence of the individual crystals into a continuous and fully dense film covering the sapphire surface. When individual crystals coalesce into a continuous film the misfit dislocations that relieve strain turn upwards at the boundaries between the individual crystals and form a network of threading dislocations that extend through the thickness of the epitaxial film. Threading dislocation density of the resulting gallium and nitrogen containing film is dependent on three factors: minimizing the number of crystals in the nucleation layer and thereby limiting the amount of interface between coalescing crystals, selecting conditions for nucleation layer growth and anneal that minimize misorientation of the nitrogen containing crystals relative to the heteroepitaxial substrate crystal orientation, and selection of buffer layer growth conditions that cause threading dislocations to bend such that as the epitaxial layers are grown thicker threading dislocations have the opportunity to intersect and either combine or annihilate such that the total threading dislocation density is reduced. By using such techniques, it is possible to achieve threading dislocation densities in the range of 1E7-1E8 $cm^{-2}$.

The fully coalesced epitaxial layer is then overlaid with a gallium and nitrogen containing buffer layer where dislocation density is further reduced and surface morphology improved; i.e. made smoother. The buffer layer is overlaid by a sacrificial layer as previously described to be used in the selective removal of the epitaxial device layers from the heteroepitaxial substrate. The sacrificial layer is overlaid by an n-type conducting cladding layer (n-cladding). The n-cladding layer is overlaid by the light emitting layers and other layers comprising the active region of the device and which may have the same or similar designs to those of homoepitaxially grown devices on bulk gallium and nitrogen containing substrates as previous described. The active region is overlaid by a p-type conducting cladding layer (p-cladding). The n-cladding may contain a more highly n-type doped layer which is exposed by the device transfer and fabrication process and which is used to make low-resistance, ohmic contacts to the n-cladding. The p-cladding is terminated by a more highly p-type doped layer which is the last layer grown in the process and which is used to make an electrical contact to the p-cladding with relatively low-resistance and relatively low schottky barrier.

In some embodiments, the nucleation and buffer layers are used to chemically passivate the heteroepitaxial substrate. For example, in growth on silicon and SiC it is possible for a gallium-rich environment to result in dissolution of the substrate yielding degradation of the substrate surface morphology as well as subsequent unintentional doping of the heteroepitaxial layers with silicon or carbon. In an example, a nucleation layer of AlN grown under highly nitrogen rich conditions is used as a nucleation layer on Si and SiC substrates to prevent gallium from accessing the substrate surface.

In some cases, the heteroepitaxial gallium and nitrogen containing device layers are highly strained. This can be caused either by growth on a heteroepitaxial substrate with a very large difference in lattice constant relative to GaN or, as is the case silicon when the thermal expansion coefficient of the heteroepitaxial substrate is small relative to GaN and related alloys. In this case, while the heteroepitaxial films may be sufficiently lattice matched to the substrate during growth, after growth is complete and the epitaxial wafer is cooled to room temperature, the gallium and nitrogen containing epitaxial films reduce in lattice constant more than the substrate, which places the films under a large tensile stress. Such large tensile stresses can result in film cracking. In an embodiment, a heteroepitaxial film is grown on silicon such that it is under compressive strain during growth. The compressive strain is chosen such that the film is under a small strain or no strain after cooling to room temperature. In an example, a AlGaN nucleation layer is used or a thick AlGaN buffer layer is grown and partially or fully relaxed and overlaid with a GaN layer. Because the relaxed AlGaN layer has a smaller lattice constant than GaN, the GaN film is grown under compression, such that upon cooldown the net tensile strain imposed by the mismatch in coefficient of thermal expansion with the silicon substrate is partially or fully canceled by the compressive strain of the GaN film.

In another embodiment of this invention the LED device wafer does not contain separate n-InGaN buffer layers and InGaN sacrificial layers. Rather the InGaN buffer layer and the sacrificial layer are the same. In this case either the composition of the InGaN buffer is increased such that it absorbs the pump light for PEC etching, or the wavelength of the PEC etch pump light is shortened to a wavelength absorbed by the n-InGaN buffer.

In an embodiment the LED mesa is fabricated with both a p-contact metal and an n-contact metal before transfer. This is shown in the left-hand side of FIG. 7C in a schematic cross-section. The carrier wafer 209 has two sets of bond pads 206 and 208 that correspond to the on-die p-type bond pad 205 and on-die n-type bond pad 207 respectively. To form the on-die n-type bond pad A via is etched through the p-type 204 and active region 203 layers exposing the n-type layer 202. In this depiction, the removed sacrificial layer is shown between the mesa layers and the epitaxial substrate 201. Metal anchors would be used in this embodiment, but are not shown in this depiction. The right-hand side of FIG. 7C shows the die on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. Bonding alignment tolerances using modern flip-chip bonders is on the order of several microns or less, which is adequate for aligning these types of vias in relatively large area LED mesas. Bonding in this way is advantageous because it allows for immediate on-wafer testing of devices after transfer, exposes the entire n-type GaN surface to allow for roughening to enhance light extraction and does not require any opaque metal features on the n-type GaN surface that might block light. The p-type contact would act as a reflector, and as such must be formed from a material with low absorption of the emitted light. The preferred metal is silver, which has the highest reflectivity in the visible range of light wavelengths. Aluminum could be used, but would not form a good electrical contact to p-type GaN by itself. Aluminum would need to be combined with a transparent conductive oxide (TCO) such that the TCO formed a transparent contact to the p-type GaN and the aluminum formed the electrical contact to the TCO as well as the reflective surface. The n-type contact metal can be anything that forms a good electrical contact to n-type GaN, such as Al, Ti, Ni, among others. Ideally the contact would be highly reflective. While the active region is absent in the regions occupied by the n-contacts, laterally guided light may interact with the n-contact metal. Reducing the absorption of this light is therefore highly important for achieving high extraction efficiencies.

In another embodiment the LED mesa is fabricated without an n-contact metal before transfer. This is shown in the left-hand side of FIG. 7D in a schematic cross-section. The carrier wafer 307 has only one set of bond pads 304 per die corresponding to the on-wafer p-side bond pad 306. The p-type 305, active region 303 and n-type 302 layers are only exposed at the edges of the mesa. In this depiction, the removed sacrificial layer is shown between the mesa layers and the epitaxial substrate 301. Metal anchors would be used in this embodiment, but are not shown in this depiction. The right-hand side of FIG. 7D depicts in schematic-cross-section the die on carrier wafer after transfer. The surface of the n-type layer 308 is exposed. In this embodiment, a transparent or semi-transparent n-type contact would be deposited on the n-type surface in order to make electrical contact to the LED while enabling light to escape from the top of the device. Possible contact materials would be semi-transparent annealed Ni/Au and transparent conducting oxides such as ZnO, indium tin oxide (ITO), gallium oxide, GaZnO, InZnO, AlZnO, AlInGaZnO, among others. The n-contacts may also be formed from high aspect ratio metal features that are limited in area but efficiently and uniformly inject electrons into the n-type material such that the active region is uniformly illuminated. Electrical contact is made to the n-contact material using either inter-connect metal lines deposited with lithography or by wire bonding.

The LED structures are prepared with a lithographically defined etch exposing forming mesas on the epitaxial wafer and exposing the sacrificial layers at the mesa sidewalls. P-type contact metals are deposited on top of the mesas and n-type contact metals are deposited in the trenches between mesas. Metal interconnects are deposited, which connect electrically the p-type and n-type contact metals. These interconnects both electrically short the active region pn-junction, thereby inhibiting PEC etching as described above, and function as non-etchable anchors that retain the mesas on the epitaxial wafer after sacrificial layers are fully removed by the selective PEC etch. The left half of FIG. 7E shows a schematic representation of the plan-view of a closely packed array of LED die before transfer to a carrier wafer. The metal stack consists of the p-contact metal and bond pad 403, the metal anchors 404 and the cathode and n-contact metal 401. The p-contact and bond pad overlay the LED device mesa 402, which has a square shape. Note that the schematic is not drawn to scale. The mesas may be of the typical dimension of 1×1 mm2 found in many state-of-the-art high-power LEDs, while the trenches between wafers may only be 50 microns or less wide. The right half of FIG. 7E shows mesas after a 4-to-1 transfer process where by one fourth of the LED die are transferred in a single bonding process (or "stamp"). The dotted square 405 indicates the area of the carrier wafer occupied by a single LED die. It is clear that, after singulation of the carrier wafer, a single LED will be bonded to a chip at least four times the area of an individual mesa. The trench area between mesas on the epitaxial wafer will be similar to the kerf loss from sawing or dicing the wafer with a laser, therefore there is little improvement in epitaxial material utilization from transferring the die in this way. There are, however, other advantages. For example, the transfer can be carried out in a highly parallel way, with all die on a wafer transferred in a few (e.g. less than 10) bonding operations depending on the relative decrease of die density from substrate to carrier. This is an improvement over the typical pick-an-place method of transferring die to carrier wafers, which is a serial process. This advantage becomes more significant as the die area is reduced. In an example, one may wish to operate an LED at a fixed current density using a fixed device area. In some applications on may wish the surface brightness of the device to be limited, such that it is advantageous to use a plurality of die with a total area equivalent to the target area but with large spacing between die on the submount such that the average surface brightness is reduced. A similar configuration could be advantageous for the elimination of waste heat in heat-sinks. Many small die widely spaced may be cooled more efficiently than a single die operated at the same power due to the finite thermal conductivity of the LED packaging. It is obvious that in a pick-and-place based die transfer model the number of transfer operations required scales with the number die. This invention is therefore advantageous in that the number of transfer operations scales only with the change in die density from substrate to carrier wafer.

In another embodiment, the transferred dice have non-rectangular or non-square shapes. FIG. 7F shows an example with hexagonal die. On the left of FIG. 7F is a schematic representation of an array of closely packed hexagonal LED die that are coded to show how all the die may be transferred to carrier wafers in four bonding operations. On the right of FIG. 7F is a schematic representation of a subset of the die transferred to a carrier wafer after a bonding operation. The dotted line 501 indicates the area occupied by a single hexagonal die. In this case the present invention is advantageous in that the die shapes are defined by a lithographic process rather than by a physical sawing or scribing of the epitaxial substrate wafer. Dicing saws blades are relatively large compared to die, such that it would be impossible to singulate a wafer into die of shapes with edges that do not form continuous parallel lines. A laser scribing process may be able to draw guide scribes on the epitaxial substrate, however it is unlikely that the subsequent cleaving process would follow the guide scribes accurately and yield loss would be very high.

Once the carrier wafer is populated with die, wafer level processing can be used to fabricate the die into LED devices. For example, in many embodiments the bonding media and die will have a total thickness of less than about 5 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools. In an example wherein the mesa dice are expanded onto a carrier and then fabricated into an array of individual LEDs spaced out on a carrier wafer for enhanced thermal or light extraction performance the packaging would be inherent to the process. Here, then, you would have a truly wafer-scale LED package, fabricated on a wafer level using standard semiconductor manufacturing techniques and equipment, which, once singulated from the carrier wafer, would be ready for encapsulation and combination with phosphor materials.

A powerful and important enabling element of this invention is the ability to perform integration of different color emitting epi layers and resulting device structures from various substrate members onto a common carrier wafer. In one such example of integration a blue LED based on gallium and nitrogen containing epitaxial materials is integrated onto a common carrier with a green LED based on gallium and nitrogen containing epitaxial materials. In this embodiment one could form a system with comprising of a network of blue and green LED functions. In an alternative example, red, green, and blue LEDs are combined on the common carrier. In yet, an additional example red, green, yellow, and blue LEDs are combined on the common carrier. The LEDs could be electrically addressed in several configurations including series connections, parallel connections, and fully separate addressability of the blue and green diodes.

In one embodiment, the present invention is applied to the manufacturing of a display device. Specifically, the technology is used to make a highly efficient, cost effective, and high performance display based on micro-LEDs by transferring multiple color small LEDs to a common carrier such that the multiple color LEDs form individual pixels, which can be individually addressed to adjust the color and brightness of the pixel. Existing display devices based on liquid crystal technology are highly inefficient due to the use of multiple polarizers, color filters, light guides, and the need to electrically drive both the liquid crystal element and the backlighting element such as LEDs. Such displays typically result in single digit electrical to optical energy efficiency values and require complicated fabrication technologies with many elements leading to high cost. Advances have been made in organic LED [OLED] display technology over the past several years. However, OLED displays suffer from poor OLED efficiency, lower brightness, manufacturing challenges, and reliability barriers.

The present invention breaks the barriers associated with currently available display technology. Specifically, by patterning arrays of micro-LEDs into multiple donor wafers with different emission colors and then selectively transferring these LEDs onto a carrier or host wafer a 2-dimensional matrix of individual pixels comprising multiple color LEDs, such as red, green, and blue LEDs, can be configured. For example a first donor wafer comprised of a gallium and arsenic substrate can be fabricated to form an array of red emitting LED structures, a second donor wafer comprised of a gallium and nitrogen substrate can be fabricated to form an array of green emitting LED structures, and a third donor wafer comprised of a gallium and nitrogen substrate can be fabricated to form an array of blue emitting LED structures can be formed. Subsequently, the donor wafers can then be subjected to the transfer process described in this invention wherein only a fraction of the LED structures are transferred to a carrier wafer. In some embodiments the carrier wafer is comprised of a gallium and nitrogen containing substrate or a gallium and arsenic containing substrate, or an alternative substrate and comprises micro LEDs with one of the emission colors formed directly on the carrier wafer.

The carrier wafer is designed to receive the different color LEDs into pixel domains. The micro LEDs can be formed in various shapes such as circles, squares, rectangles, triangles, pentagons, hexagons, octagons, or any geometrical shape possible. The largest dimension of the LED emission areas could be smaller than 1 mm, smaller than 200 um, smaller than 100 um, smaller than 50 um, smaller than 20 um, smaller than 10 um, or smaller than 5um. The carrier wafer is comprised with an interconnect network configured to enable addressability of the micro LEDs in the pixels to generate high resolution display images. Any relevant interconnect schemes, configurations, processes could be taken from existing display technologies such as LCD or OLED, or even from other technologies such as imaging technologies like focal plane arrays (FPA) and applied to the present invention.

The present invention enables a highly manufacturable and cost efficient process for producing micro LED based displays not readily possible with prior art. Specifically, the current invention allows for a wafer level transfer process from a donor LED wafer to a common carrier wafer forming the display panel. Since it is a wafer level process, thousands, tens of thousands, or hundreds of thousands of LEDs can be transferred in one process step [depending on wafer size and pixel pitch] and hence avoiding any one-by-one pick and place techniques or mechanical transfer head techniques. This advantage can enable high throughput for low cost and high alignment tolerances for tight packing of the LEDs. Moreover, since it is a selective transfer process from the donor to the carrier and the pitch of the LEDs from the donor wafer to the carrier wafer can be expanded using the anchor technology, a much higher density of LEDs can be formed on the single color donor wafers than the final density of that single color as expanded on the carrier wafer to form the display panel. For example, a red donor wafer, green donor wafer, and blue donor wafer may be prepared with an LED pitch of X. At the transfer step to the first carrier wafer only ⅓ of the LEDs are transferred to the carrier wafer at a pitch of X/3 such that the resulting donor wafer has a repeating array of red, green, and blue LEDs that spaced from each other by X, but spaced from their next nearest neighbor with the same color by X/3. The same sequence can be performed on a second and a third carrier wafer or on a second and third location on the first carrier wafer if the carrier wafer is larger than the donor wafer. This die expansion or transferring at a larger pitch enables an increased use of epitaxial and substrate area of the donor wafer.

In one embodiment, the blue and green LEDs based on gallium and nitrogen containing epitaxial materials could be integrated with LEDs based on other material systems such as GaAs-based LEDs. In one example, the AlInGaAsP or GaAs-based LED is a red emitting LED resulting in system comprised of a network of red-green-blue LEDs to form an RGB emitter LED device such as a micro-LED display device wherein a two dimensional array of red, green, and blue LEDs are configured to create a two dimensional array or pixels, wherein each pixel comprises at least one red, one green, and one blue LED. Again, the red, green, and blue LEDs can be electrically connected and driven in many types of configurations. In preferred embodiments the red, green, and blue LEDs are individually addressable or addressable in a fashion that enables independent color control of each pixel in the micro-LED display. In fact, groups of red-green-blue LEDs can be used to comprise pixels to form an RGB based LED display. In alternative embodiments, different color or additional color LEDs are added to the pixels in the micro LED display. For example, a yellow emitting LED can be added to the pixels to achieve an enhanced display color quality.

With respect to LED devices based on GaAs and/or AlInGaAsP such as red LED devices, these devices include a substrate made of GaAs or Ge, but can be others. As used herein, the term "substrate" can mean the bulk substrate or can include overlying growth structures such as arsenic or phosphorus containing epitaxial region, or functional regions such as n-type GaAs, combinations, and the like. The devices have material overlying the substrate composed of GaAs, AlAs, AlGaAs, InGaAS, InGaP, AlInGaP, AlInGaAs or AlInGaAsP. Typically each of these regions is formed using at least an epitaxial deposition technique of metal organic chemical vapor deposition (MOCVD), molecular beam epitaxy (MBE), or other epitaxial growth techniques suitable for AlInGaAsP growth. In general these devices have an n-type and p-type conducting layer which may form part of a n-type cladding layer or p-type cladding layer, respectively, with lower refractive index than the light emitting active region. The n-cladding layers can be composed of an alloy of AlInGaAsP containing aluminum. The devices contain an active region which emits light during operation of the device. The active region may have one or more quantum wells of lower bandgap than surrounding quantum barriers.

Undercut AlInGaAsP based LEDs can be produced in a manner similar to GaN based LEDs and laser diodes described in this invention. There are a number of wet etches that etch some AlInGaAsP alloys selectively. In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>1E6 times that of GaAs) when etched with HF. InGaP and AlInP with high InP and AlP compositions can be etched with HCl selectively relative to GaAs. GaAs can be etched selectively relative to AlGaAs using $C_6H_8O_7:H_2O_2: H_2O$. There are a number of other combinations of sacrificial layer, etch-stop layer and etch chemistry which are widely known to those knowledgeable in the art of micromachining AlInGaAsP alloys. For example, phosphoric based etches, hydrogen peroxide based etches, hydrochloric acid based etches, and other etches can be employed, In one embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall. This step is followed by the deposition of a protective insulating layer on the mesa sidewalls, which serves to block etching of the active region during the later sacrificial region undercut etching step. A second top down etch is then performed to expose the sacrificial layers and bonding metal is deposited. With the sacrificial region exposed a compositionally selective etch is used to undercut the mesas. At this point, the selective area bonding process is used to continue fabricating devices. The device layers should be separated from the sacrificial layers by a layer of material that is resistant to etching. This is to prevent etching into the device layers after partially removing the sacrificial layers.

In one embodiment the LED RGB display is formed by transferring each of the red, green, and blue epitaxial structures to a common carrier using the undercut etching and selective bonding technique as described for gallium and nitrogen based devices. In this first RGB LED embodiment the carrier wafer could be comprised of Si, sapphire, SiC, GaAs, InP, polycrystalline AlN, polycrystalline SiC, metal-core printed circuit board (MCPCB), ceramic printed circuit board or other, and could include functionality such as photodetectors for monitoring individual LED output, and drive circuitry for the micro LEDs such as thin film transistors or other types of transistors. The LEDs would be configured with an interconnection system for electrical addressability to enable creation of high resolution images based on signals transmitted from a signal processing unit.

FIG. 7G shows a simplified schematic view of a two dimensional LED matrix comprising red, green, and blue LEDs to compromise an RGB display panel based on one embodiment of this invention. As shown in FIG. 7G, a first donor wafer with a first epitaxial material 401 is processed to form a first array of LED dice 402, a second donor wafer with a second epitaxial material 403 is processed to form a second array of LED dice 404, and a third donor with a third epitaxial material 405 is processed to form a third array of LED dice 406. In one example, the first epitaxial material is formed of gallium and nitrogen containing material and comprises a light emitting region configured to emit a blue wavelength, the second epitaxial material is formed of gallium and nitrogen containing material and comprises a light emitting region configured to emit a green wavelength, and the third epitaxial material is formed of gallium and arsenic containing material and comprises a light emitting region configured to emit a red wavelength. After subjecting the donor wafers to the process according to this invention wherein a release layer is removed underneath the LED epitaxial material, at least a fraction of the first array of LED dice 402, a fraction of the second array of LED dice 404, and a fraction of the third array of LED dice 406 are subsequently selectively transferred to the carrier wafer 407 in a predetermined pattern. The pattern shown in FIG. 7G is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels.

In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [eg ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In some embodiments, processes or designs are used to increase the light extraction from the LED. For example, wet or dry etching techniques can be used to roughen one or more surfaces from the LED and increase light extraction. In another example, shaping of the LED through etching, sawing, cutting, or other process is used to increase the light extraction. In an example, the p-contact layer of the LED dice is patterned prior to forming the p-contact and etched to produce features such as trenches or pits in the p-contact surface. These pits can be isolated electrically by application of a passivating dielectric prior to deposition of the reflective p-contact material. The features will scatter light incident on the p-contact at shallow angles that would normally not be reflected out of the LED die. In another example, after transfer of the LED dice the n-type conducting layer is patterned and etched to produce features such as trenches or pits. The features in the surface of the n-type conducting layer scatter light rays that would normally by totally internally reflected by the GaN to air interface. In an embodiment, features internal to the LED dice such as gratings or photonic crystals are used to promote scattering of light to enhance extraction. As an example, an LED device epitaxial wafer is grown up to the n-cladding layer. The growth is then interrupted and the wafer removed from the growth system. The wafer is patterned and etched to form features such as pits or trenches which may be of arbitrary configuration or be configured to produce a photonic crystal. The wafer is then reintroduced to the growth system and the remainder of the n-cladding is overlaid on the features such that they are either left as air-gaps or are filled in with a material of differing optical index so as to form a region of patterned index contrast. In the case of arbitrarily configured features, the features may act as random scattering centers that scatter light propagating laterally through the LED die such that more light is direct out through the upper surface of the die. In the case of a photonic crystal, the features are configured to promote scattering of light into specific modes defined by constructive interference which are more easily extracted from the LED die than the unscattered light. In an example, the LED dice are etched on the donor wafer such that the sidewalls of the die are inclined at some angle relative to the plane of the wafer. In the preferred embodiment the sidewalls are angled at 45 degrees with the base of the LED die being larger than the top. After selective etching and transfer, the top of the LED die now becomes the bottom, bonded surface and the die. Light propagating through the LED die in lateral guided modes can be reflected off of the inclined sidewall and directed upward through the n-type surface of the device. In an additional example alternative materials are used to encapsulate or coat one or more surfaces of the LEDs to enhance the light extraction. Specifically, high index materials may be used to reduce the index contrast between the LED chip and the outside world.

Reliability and conservation of the image quality are key considerations for a display system such as the micro LED display system according to this invention. In some embodiments of the present invention each pixel in the display comprises two or more of each color LED such as comprising two, three, or four of each of the red, green, and blue LEDs to provide a redundancy. This redundancy would help overall reliability of the display system since if one of the LEDs were to fail, the pixel would still be operable and the user or viewer would not recognize or comprehend the failed LED chip in the display.

In some embodiments of the present invention, each pixel in the display comprises more than three colors. For example, a single pixel may comprise a red, green and blue device emitting at center wavelengths of 630, 530 and 450 nm as well as a device emitting at a center wavelength of 480 nm. This has the advantage of allowing the display to render a wider color gamut than is achievable with only three colors. In a preferred embodiment, each pixel will comprise at least one red LED device with center wavelength between 600 and 650 nm, at least one blue LED device with center wavelength between 420 and 470 nm, at least one cyan LED device with center wavelength between 490 and 505 nm, at least one green LED device with center wavelength between 505 and 525 nm and at least one green LED device with center wavelength between 525 and 540 nm.

As described previously, a key benefit provided by this invention to the formation of a micro LED display panel is the ability to perform multiple transfer steps from the donor wafers to one or more carrier wafers. This is enabled by the selective nature of the transfer process according to this invention. This key feature allows for the LED dice to be placed on the carrier wafer at positional pitches greater than the pitch on the donor wafer and in various patterns, which is important for creating pixels. FIG. 7H illustrate this multiple-transfer process. FIG. 7H shows the first donor wafer 401 with the remaining epitaxial dice 402, the second donor wafer 403 with the remaining epitaxial dice 404, the third donor wafer 405 with the remaining epitaxial dice 406 after the first transfer process had been performed according to FIG. 7G. As can be seen in the figure some of the dice are depleted from each of the donor wafers due to the preceding transfer. A subsequent second transfer step to a separate carrier wafer or to a different region on the first carrier wafer is performed and results in the RGB LED matrix 407 comprised of repeating pixel elements 408. Subsequently, FIG. 7I illustrates first donor wafer 401 with the remaining epitaxial dice 402, the second donor wafer 403 with the remaining epitaxial dice 404, the third donor wafer 405 with the remaining epitaxial dice 406 after the second transfer process had been performed according to FIG. 7H. A subsequent third transfer step to a separate carrier wafer or to a different region on the first carrier wafer is performed and results in the RGB LED matrix 407 comprised of repeating pixel elements 408. According to this example, after the third transfer process all of the LED dice will be depleted from the donor wafers. At that point the donor wafers can be prepared for a re-use of the bulk gallium and nitrogen containing and bulk gallium and arsenic containing substrates. Of course this is just one example of the multiple transfer process using the selective transfer technique according to this invention and there could be many others.

In yet another embodiment of an RGB micro LED display panel based on this invention, the red, green, or blue LED is fabricated from epitaxial materials grown directly on the carrier substrate and the other color LEDs are fabricated from epitaxial material that is transferred from the bulk substrates they are epitaxially grown on to the carrier wafer. As an example, the carrier wafer could be comprised from the same GaAs substrate that the red LED epitaxial material is grown on and the red LEDs are fabricated in. In this embodiment the green and blue LEDs could be fabricated from gallium and nitrogen containing epitaxial materials grown on a GaN substrate that are transferred to the GaAs carrier substrate. This configuration may be desirable over using the GaN substrate from the green or blue epitaxial material because it allows for reuse of the GaN substrates, which are substantially higher cost than GaAs substrates. Moreover, GaAs substrates are available in larger diameters. FIG. 7H shows a schematic diagram of this configuration.

In one embodiment of this configuration presented in FIG. 7J, a first substrate with a first epitaxial material 401 is processed to form a first array of dice 402 and a second substrate with a second epitaxial material 403 is processed to form a second array of dice 404. However, in this embodiment the carrier wafer is a third substrate 405 with a third epitaxial material processed to form a third array of dice 406. In this example, the first epitaxial material comprises a light emitting region configured to emit a blue wavelength, the second epitaxial material comprises a light emitting region configured to emit a green wavelength, and the third epitaxial material formed on the carrier wafer comprises a light emitting region configured to emit a red wavelength. The first array of dice 402 and second array of dice 404 are transferred to the carrier wafer 405 to form a predetermined pattern array of RGB LEDs 407. FIG. 7J is an example RGB pattern where the first epitaxial material forming the first array of LED dice, second epitaxial material forming the second array of LED dice, and third epitaxial material forming the third array of LED dice are arranged in a repeating red-green-blue pattern to create domains or pixels 408 comprising the multiple color LEDs. The LEDs within these pixels are driven via electrical drive current fed through an interconnection and drive circuitry system to dynamically tune the brightness of R-G-B elements to achieve a full color tuning and provide the functional element of the resulting display panel. This is one such example pattern that could be used for an RGB display system, but there could be other shapes, sizes and arrangements of pixels and micro LEDs within the pixels. This is one such example pattern that could be used for an RGB display system.

After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others. In various embodiments of this invention the processing of the LED structure is performed to various degrees before and after the LED epitaxial dice are transferred to the carrier. For example, prior to transfer to the carrier wafer a p-contact may be formed on the epitaxial material. The p-contact may be a reflective p-contact such as comprising silver or aluminum, may be a transparent p-contact such as a conductive oxide [e. g., ITO or ZnO], or be a standard p-contact. After the epitaxial material is transferred to the carrier wafer, subsequent processing is performed to complete the process of forming LEDs from the epitaxial material. Process steps may include photolithography, etching processes, dielectric deposition processes, metal deposition processes, wet chemical techniques, and many others.

In alternative embodiments, the third substrate configured as the carrier wafer with the epitaxial material comprising the third array of dice could be a GaN substrate with epitaxial material configured to emit blue light, or alternatively the third substrate configured as the carrier wafer with the epitaxial material comprising the third array of dice could be a GaN substrate with epitaxial material configured to emit green light.

Further details of manufacturing, processing, and designing multiple color technologies such as RGB integration technologies according to this invention can be found in U.S. Pat. No. 9,379,525, and U.S. patent application Ser. No. 15/180,737, which are commonly owned, and hereby incorporated by reference herein. To create a high resolution display such as a 1080P display a dense two-dimensional array of LEDs is required. For example, wearable devices or handheld devices such as an Apple iWatch with a 312×390 resolution in a 1.5" diagonal screen requires a total pixel size of about 76 um with a pixel density of about 333 ppi, an Apple iPhone 6 with a 375×667 resolution in a 4.7" diagonal screen requires a pixel size of about 156 um with a pixel density of about 163 ppi, or an Apple iPad Pro with a resolution of 1024×1366 in a 12.9" diagonal screen requires a pixel size of about 191 um with a pixel density of about 132 ppi. Larger displays such as high definition television may have increased pixel size. For example a 1080P display with a 1920×1080 resolution on a 32" diagonal screen requires a pixel size of about 368 um with a density of about 69 ppi, on a 46" diagonal screen requires a pixel size of about 530 um with a density of about 38 ppi, or on a 80" diagonal screen requires a pixel size of about 922 um with a density of about 28 ppi. A 4K ultra high definition display with a 3840×2160 resolution on a 32" diagonal screen requires a pixel size of about 184 um with a density of about 138 ppi, on a 46" diagonal screen requires a pixel size of about 265 um with a density of about 96 ppi, or on a 80" diagonal screen requires a pixel size of about 461 um with a density of about 55 ppi. As can be understood from these examples and extending to more extreme cases such as smaller or larger displays, pixel sizes can range anywhere from less than 50 um to well greater than 1,000 um To accommodate these pixel sizes wherein at least three LEDs (such as red, green, and blue LEDs) must be configured along with other required components such as interconnects, isolating elements, and free space, etc, the LED die size must be substantially smaller than the pixel size. For example, the individual LED die size must be smaller than 1,000 um, smaller than 500 um, less than 250 um, less than 100 um, less than 50 um, less than 25 um, less than 10 um, or even less than 5um to accommodate pixel pitches of less than 3,000 um, less than 1000 um, less than 500 um, less than 250 um, less than 100 um, less than 50 um, less than 20 um, or even less than 10 um. In fact, in many preferred embodiments according to the present invention, more than three LEDs will be required in each pixel. In some examples of these preferred embodiments additional LEDs are included to enhance the color quality such as adding a yellow LED. In some examples of these preferred embodiments additional LEDs are included to for color redundancy to meet the strict reliability requirements of displays. In some examples, 2, 3, or even 4 of each color LED are included in each pixel. The inclusion of these additional LEDs within the pixel area further forces the area of the LED die to smaller dimensions.

Electrically addressing these pixels within such high pixel density displays in a suitable fashion is a key consideration within a LED display apparatus according to this invention. In one example an interconnect network is created with metal traces on the top surface of the carrier wafer such that the interconnects run between the LED die. Although this example may be the easiest from a process standpoint having the interconnects on the same plane as the LED consumes valuable display real estate area. In a preferred configuration, vertical interconnects are included wherein the interconnect network is formed above or below the plane that the LEDs are attached to and are configured to make a vertical electrical connection from the interconnect network to the micro LEDs. For example, an interconnection network would be formed on the carrier wafer itself, which is then buried in a dielectric layer such as silicon dioxide or silicon nitride, but could be other non-conductive layer such as benzocyclobutene (BCB), acrylic, photoresist, silicon oxide, poly(methyl methacrylate) (PMMA), polyimide, acrylate, or epoxy to planarize the surface. The micro LEDs are attached to a surface overlying the planarization layer such that the planarization layer electrically isolates the interconnects from the micro LEDs. Vias would be formed in the planarization layer to form electrical connections from the interconnect network to the individual LEDs to provide the electrical drive signal to form the display.

It is to be understood that the above descriptions are merely examples. There is a wide range of existing technology currently used for the fabrication of LCD displays, OLED displays, or other panel displays that can be easily applied to the present invention. Additionally, alternative interconnect technology like focal plane array interconnect technology, such as that found at www.raytheon.com/news/technology_today/2015_i1/wafer.html or in Quiping et al, Journal of Semiconductors Vol. 31, No. 11 Nov. 2010, can be applied to the present invention. The interconnection network routes electrical power from a power source to the LEDs within the display panel. Specifically, current must be supplied to the p-side [anode] of the LEDs. In a preferred embodiment of the present invention the p-side will be down on the carrier or back plane such that the LEDs are flip-chip bonded. Common circuitry can include switching transistors, driving transistors, and storage capacitors. These elements can be configured in an architecture to supply current to the anode or pull current from the cathode through various arrangements. There are many suitable drive architectures in the prior art that can be applied to the micro LED display according to the present invention.

The carrier wafer is selected from any suitable material and preferably is configured with interconnection scheme to provide current to the micro LEDs in the display panel and can be configured with electronics to form drive circuitry including resistors, capacitors, and transistor such as a thin film transistor (TFT) network. For example, the primary carrier wafer could be selected from a silicon wafer, a sapphire wafer, an aluminum nitride wafer, a silicon nitride wafer, a silicon carbide wafer, a glass wafer, a group V semiconductor, a III-V semiconductor, or a II-VI semiconductor, or others. In a preferred embodiment the carrier wafer is selected from a silicon wafer. In one example the silicon wafer has interconnects or integrated circuit functionality defined within the wafer such as TFT technology. Such circuits or features defined in the silicon wafer can be formed using Complementary metal-oxide-semiconductor (CMOS) processing. By using such CMOS technology electronic devices such as metal-oxide-semiconductor field-effect transistor (MOSFETs) including nMOSFETs and pMOSFETS and others can be defined directly in the carrier wafer. CMOS processing is ideal for high volume, high circuit density, low cost manufacturing of the logic gates and multiplexing drive circuitry required in the LED based display device. In an alternative embodiment including TFTs, the TFT substrate can be configured on a primary carrier wafer. In alternative embodiments, the carrier wafer material may be flexible or curved to create a flexible or curved display. Some examples of flexible materials would be polymers, other organic based materials, and thin metallic.

The bonding of the micro-LEDs to the carrier wafer is preferably comprised of conductive interfaces such as metallic interfaces like Au—Au bonds to provide an electrical pathway from the interconnection network formed on the carrier wafer to the anode or cathode of the micro LEDs. In some examples of metallic interfaces such as a Au—Au interface the bonding can be performed using a thermo-compressive process such as using a wafer bonding tool. In alternative embodiments, the micro-LEDs are bonded using a reflow process such as using an indium reflow or a AuSn reflow. Using an indium reflow process may be advantageous to limit the temperature exposure of the LED devices.

A display panel and a method of forming a display panel are described. In an embodiment a display panel electronic drive circuitry such as a TFT substrate including regions defining the RGB pixels and regions separating the RGB pixels. The pixel regions could include an array of bank openings and an array of bottom electrodes within the array of bank openings. A ground line would be formed to provide a grounding for the LED banks.

In some embodiments the micro LED devices may be vertical micro LED devices such that they conduct the electrical current parallel to the epitaxial growth direction. A combination of transparent and reflective contact layers and passivation layers are configured to maximize the light escape from the top and/or the sides of the LED chips at their respective emission wavelengths. In one example, an array of top electrode layers are configured over the array of micro LED devices to form an electrical connection of the array of micro LED devices to the ground line or other lines.

In other embodiments the LEDs may be formed for a lateral current conduction such that the current path is characterized by at least one flow of current that is perpendicular to the epitaxial growth direction. In this example, an array of separate top electrode layers are formed over the array micro LED devices electrically connecting the array of micro LED devices to the ground line.

In an example embodiment, an array of micro LED devices are on the array of bottom electrodes within the corresponding array of bank openings. The micro LED devices are flip-chip micro LED devices, and may have a maximum width of 1 μm-100 μm. By "flip chip" it is meant that the micro LEDs are configured as shown in FIG. 7C with a p-type contact region 205 as well as an n-type contact region 207 on the bonded side of the transferred epi layers. The carrier wafer 209 has two sets of bond pads 206 and 208 that correspond to the on-die p-type bond pad 205 and on-die n-type bond pad 207 respectively. To form the on-die n-type bond pad A via is etched through the p-type 204 and active region 203 layers exposing the n-type layer 202. In this depiction, the removed sacrificial layer is shown between the mesa layers and the epitaxial substrate 201. Metal anchors would be used in this embodiment, but are not shown in this depiction. The right-hand side of FIG. 7C shows the die on the carrier wafer after bonding and transfer. The heights of the on-carrier bond-pads 206 and 208 are chosen to accommodate the difference in height on wafer of the p-type and n-type on-wafer bond pads 205 and 207 and accommodate for any plastic deformation of the bond pad. The non-bonded side of the transferred epi layers 210 does not have an electrical contact, but may be patterned or coated as previously described to enhance light extraction. In this embodiment, the backplane comprises an array of a TFT substrate including a pixel area and a non-pixel area, where the pixel area includes an array of bank openings and an array of bottom electrodes within the array of bank openings. The TFT substrate also includes an array of cathode lines and an array of anode lines, with one cathode line corresponding to each row of the micro LEDS and one anode line corresponding to each column of the micro LEDs. The cathode and anode lines are comprised of metal or other conductors and are isolated from one another with a dielectric such as silicon dioxide, silicon nitride, BCB, hardened photoresist, epoxy, or a ceramic such as AlN, aluminum oxy-nitride or the like. The LEDs are configured such that the p-contact of the micro LED is bonded to an anode line and the n-contact is bonded to a cathode line such that each micro LED is individually addressable.

In an embodiment, the micro-LED devices are individually addressable via multiplexing. In an example, FIG. 7K shows a circuit diagram for a multiplexing scheme where positive voltage supply lines or anode lines run from a voltage source 1401. Each anode line is provided with a control transistor 1403 which converts a voltage supplied by control circuitry into a current. The cathode of each micro-LED is connected to a cathode or ground line. Each ground line is provided with a control transistor 1404. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates of the anode and ground line control transistors. In an example, if a sufficiently high voltage is provided to the control transistor 1403 of the first anode line the control transistor will allow current to pass. If sufficiently high voltage is provided to the control transistor 1404 of the first ground line then the transistor will conduct and short the ground line to ground. The micro-LED 1402 connecting the on-state anode control transistor to the ground line corresponding to the on-state ground-line control transistor 1404 will then be provided with current and emit light. All other micro-LED devices will not emit light because either their anode line is open and not conducting or their ground line is open and not conducting. Because the anode and ground lines are individually addressable via their control transistors, it is possible to run all micro-LEDs in each row simultaneously while keeping them individually addressable. An image can be formed by cycling through rows of micro-LEDs at rates too high for humans to perceive, for example cycling through all rows in less than one twentieth of a second or faster would be sufficient. It should be understood that larger, multiplexed micro-LED arrays are possible.

In another example, FIG. 7L shows a circuit diagram for a multiplexing scheme where positive voltage supply lines or anode lines run from a voltage source 1405. The anode of each micro-LED 1408 is tied to an anode line via a control transistor 1407. The gate of each anode line control transistor is tied to a control line 1409. The cathode of each micro-LED is connected to a cathode or ground line. Each ground line is provided with a control transistor 1406. When a voltage is supplied by control circuitry to the gate of the ground line control transistors the ground line is shorted to ground. When the control transistor is in the off-state, the ground line is isolated from ground by the high resistance of the transistor in the off state. Individual micro-LEDs are addressable by providing appropriate voltages to the gates ground line control transistor and to the control lines. In an example, if a sufficiently high voltage is provided to the control transistor 1407 of the first micro-LED by applying a voltage to the first control line 1409 the control transistor will enter an on-state and will conduct electricity. If sufficiently high voltage is provided to the control transistor 1406 of the first ground line then the transistor will conduct and short the ground line to ground. The micro-LED 1408 connecting the on-state anode control transistor to the ground line corresponding to the on-state ground-line control transistor 1406 will then be provided with current and emit light. All other micro-LED devices will not emit light because either their control transistor is in the off state and not conducting or their ground line is open and not conducting. Because the anode control lines and ground lines are individually addressable, it is possible to run all micro-LEDs in each column simultaneously while keeping them individually addressable. An image can be formed by cycling through columns of micro-LEDs at rates too high for humans to perceive, for example cycling through all columns in less than one twentieth of a second or faster would be sufficient. It should be understood that larger, multiplexed micro-LED arrays are possible.

The multiplexing configuration found in FIG. 7K is advantageous over that in FIG. 7L because significantly fewer transistors need to be fabricated on the backplane. In certain embodiments, the control transistors are provided by a separate control circuit that is not fabricated on the backplane. This embodiment greatly reduces the complexity of the backplane as it becomes only a grid of electrically isolated conductor lines and bond pads. The configuration in FIG. 7L is also limited to transistors that can be fabricated on the backplane. For example, if the backplane is glass or other insulating material, the transistors would be limited to those that can be fabricated on such substrates such as thin-film transistors (TFTs), organic or polymer semiconductor transistors and the like. In another example, if the backplane is a silicon wafer, then the transistors could be TFTs, bipolar junction-transistors (BJTs), metal-oxide-semiconductor field effect transistors (MOSFETs) or the like and could be fabricated either with deposition of semiconducting layers such as with TFTs or fabricated in the backplane wafer using diffusion processes as in BJTs or MOSFETs.

The multiplexing configuration found in FIG. 7L is advantageous over that in FIG. 7K in that control transistors in the FIG. 7K configuration would need to be able to source current for all micro-LED devices in a column. Design limitations of the transistor may therefore limit how big a micro-LED matrix is practical. By employing the FIG. 7L design, where each micro-LED is driven by a separate transistor, each transistor can be designed to source a relatively small current. It should be understood that other multiplexing configurations in accordance with an embodiment of this invention are possible. For example, a larger array of micro-LEDs could be segmented into individually addressable sub-arrays driven by one or more control circuits. Micro-LED apparent brightness can be controlled in several ways. In an example, the voltage on the control transistors is variable such that the current passed to the micro-LEDs is dynamically controllable. In another example, the voltage supplied to the control transistors is pulse-width-modulated with varying duty cycle such that the time average current passed to the micro-LED is dynamically controllable. In another example, the voltage supplied to the control transistors is applied for various amounts of time. For example, each row of micro-LEDs may be addressed for one millisecond. If one of the micro-LEDs in that row is held in the on-state for 0.1 millisecond every time the row is addressed, then on average it will appear to be 10% of the brightness of micro-LEDs held in the on-state for the entire millisecond every time the row is addressed.

Moreover, techniques used in other methods of forming micro LED displays can be applied such as that found in US 2014/0159067 A1 or US 2016/0013170 A1.

Of course, to form a full display apparatus from the micro LED display panel, the display apparatus must include additional elements such as input interfaces for electrical power and image and sound data, video processing and other imaging conditioning functions, and optionally memory storage. The display can include an input interface receives one or more frames of images to form a video. The input interface can include any conventional connection including hard wire connections such as USB, serial port, video, HDMI, etc., can include wireless interfaces such as WiFi or Bluetooth, and include interfaces to data storage devices such as compact discs, USB drives or thumb drives, hard drives, etc., and additionally the display apparatus may include an internal memory module to store video and sound content. The apparatus could include a video processing module to properly condition the image signal before routing it through the interconnects to the LEDs on the display panel. Moreover, the display device would include a power input interface to receive electrical power and could include batteries to form a portable display device. The display apparatus would be configured with a screen such as a glass screen or a plastic screen, wherein the screen could be configured to be sensitive to touching for data input and user functionality. An example display apparatus according to this invention is provided in FIG. 7M. The micro LED display apparatus according to the present invention could find use in a wide range of applications including mobile devices such as iPhones or Droid phones, tablet devices, televisions, laptop computers and computer monitors, digital camera, electronic book devices, gaming devices, or large lumen display like theatre and signage.

Of course, the LED based micro-display panel device according to this invention could be integrated with the other semiconductor device technologies according to this invention such as transistors, diodes, and laser diodes.

In an embodiment of this invention, the gallium and nitrogen containing epitaxial device layers comprise an AlInGaN laser diode (LD) device stack. Such GaN-based LDs contain n-type and p-type cladding layers surrounding light emitting layers to provide optical confinement in the transverse direction. The cladding layers are typically comprised of AlGaN, but can be comprised of GaN or AlInGaN. The layers must be low enough index and thick enough to provide sufficient modal overall lap within the active region while preventing overlap with the lossy metal contact regions. P-type and n-type contacts are made to inject current into the active region for radiative recombination.

In a specific embodiment, the gallium and nitrogen containing substrate member is a bulk GaN substrate characterized by having a polar, nonpolar, or semipolar crystalline surface region, but can be others. In a specific embodiment, the bulk nitride GaN substrate comprises nitrogen and has a surface dislocation density between about 10E5 cm$^{-2}$ and about 10E7 cm$^{-2}$ or below 10E5 cm$^{-2}$. The nitride crystal or wafer may comprise $Al_xIn_yGa_{1-x-y}N$, where 0≤x, y, x+y≤1. In one specific embodiment, the nitride crystal comprises GaN. In a specific embodiment, the device can be fabricated on a slightly off-cut polar substrate.

The substrate typically is provided with one or more of the following epitaxially grown elements, but is not limiting:
- a buffer layer such as an n-type GaN layer
- a sacrificial region such as an InGaN quantum well region
- an n-GaN or n-AlGaN cladding region with a thickness of about 50 nm to about 6000 nm with a Si or oxygen doping level of about 5E16 cm$^{-3}$ to about 1E19 cm$^{-3}$
- an InGaN SCH region with a molar fraction of indium of between about 1% and about 10% and a thickness of about 30 nm to about 300 nm;
- quantum well active region layers comprised of one to five about 1.0 to 7.5 nm InGaN quantum wells separated by about 1.5-15.0 nm GaN or InGaN barriers
- optionally, a p-side SCH layer comprised of InGaN with a molar fraction of indium of between about 1% and about 10% and a thickness from about 15 nm to about 250 nm
- optionally, an electron blocking layer comprised of AlGaN with molar fraction of aluminum of between about 5% and about 20% and thickness from about 10 nm to about 25 nm and doped with Mg.
- a p-GaN or p-AlGaN cladding layer with a thickness from about 400 nm to about 1000 nm with Mg doping level of about 5E17 cm$^{-3}$ to about 1E19 cm$^{-3}$
- a p++-GaN contact layer with a thickness from about 10 nm to about 40 nm with Mg doping level of about 2E19 cm$^{-3}$ to about 1E21 cm$^{-3}$ As in LED structures, each of these regions are typically formed using at least an epitaxial deposition technique of metal organic chemical vapor deposition (MOCVD), molecular beam epitaxy (MBE), or other epitaxial growth techniques suitable for GaN growth. The active region can include one to about twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with about 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where 0≤w, x, y, z, w+x, y+z≤1, where w<u, y and/or x>v, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or $Al_wIn_xGa_{1-w-x}N$ layer about 10 nm to about 100 nm thick surrounded by GaN or $Al_yIn_zGa_{1-y-z}N$ layers, where w<u, y and/or x>v, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where 0≤s, t, s+t≤1, with a higher bandgap than the active layer, and may be doped p-type or the electron blocking layer comprises an AlGaN/GaN super-lattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about 10E16 cm-3 and about 10E22 cm-3, and may have a thickness between about 5 nm and about 1000 nm. The outermost 1-50 nm of the p-type layer may be doped more heavily than the rest of the layer, so as to enable an improved electrical contact.

An example of an epitaxial structure for a laser diode device is shown in FIG. 8A. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of 5E18 cm-3, though is other embodiments the doping may range between 1E18 and 1E19 cm-3. Overlaying the contact layer is an n-type AlGaN cladding layer with a thickness of 1 micron with an average composition of 4% AlN, though in other embodiments the thickness may range from 0.25 to 2 microns with an average composition of 1-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting layers consisting of two 3.5 nm thick $In_{0.15}Ga_{0.85}N$ quantum wells separated by 4 nm thick GaN barriers, though in other embodiments there may 1 to five light emitting layers consisting of 1 nm to 6 nm thick quantum wells separated by GaN or InGaN barriers of 1 nm to 25 nm thick. Overlaying the light emitting layers is an InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an AlGaN electron blocking layer [EBL] with a composition of 10% AlN, though in other embodiments the AlGaN EBL composition may range from 0% to 30% AlN. Overlaying the EBL a p-type AlGaN cladding layer with a thickness of 0.2 micron with an average composition of 4% AlN, though in other embodiments the thickness may range from 0.25 to 2 microns with an average composition of 1-8% AlN. Overlaying the p-AlGaN cladding is p-GaN cladding with a thickness of 700 nm, though in other embodiments the p-GaN cladding thickness may range from 0 nm to 1500 nm. The p-GaN cladding is terminated at the free surface of the crystal with a highly doped p++ or p-contact layer that enables a high quality electrical p-type contact to the device.

Once the laser diode epitaxial structure has been transferred to the carrier wafer as described in this invention, wafer level processing can be used to fabricate the die into laser diode devices. For example, in many embodiments the bonding media and die will have a total thickness of less than about 7 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device will have laser stripe region formed in the transferred gallium and nitrogen containing epitaxial layers. In the case where the laser is formed on a polar c-plane, the laser diode cavity can be aligned in the m-direction with cleaved or etched mirrors. The laser stripe region is characterized by a cavity orientation substantially in an m-direction, which is substantially normal to an a-direction, but can be others such as cavity alignment substantially in the a-direction. The laser strip region has a first end 107 and a second end 109 and is formed on an m-direction on a {0001} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. Typical gases used in the etching process may include Cl and/or BCl3. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. Through the deployment of the die expansion technology enabled by this invention, the current invention is a method of maximizing the number of devices which can be fabricated from a given gallium and nitrogen containing substrate and overlying epitaxial material by spreading out the epitaxial material onto a carrier In an example of die expansion for the laser diode devices, the laser die are transferred to a carrier wafer at a second pitch where the second pitch is greater than the first pitch. This invention enables fabrication of laser die at very high density on a substrate. This high density being greater than what is practical for a laser device built using current fabrication processes. Laser die are transferred to a carrier wafer at a larger pitch (e.g. lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the die can be processed into laser devices using standard lithographic processes. The carrier wafer diameter can be chosen such that laser die from multiple gallium and nitrogen containing substrates can be transferred to a single carrier and processed into laser devices in parallel using standard lithographic processes.

Semiconductor devices play a key role in power electronic systems. Most of these applications today are enabled by silicon. Silicon has been a dominant material for power management since the late 1950's. The advantages silicon had over earlier semiconductors included enabling new applications, higher reliability, ease of use, and lower cost. All of these advantages stemmed from the basic physical properties of silicon combined with a huge investment in manufacturing infrastructure and engineering. Wide bandgap (WBG) semiconductors, such as silicon carbide (SiC) and gallium nitride (GaN) possess material properties that are superior to silicon for power switching operation. They have been under extensive academic research for more than 20 years and promise to replace silicon with better energy efficiency. In the example of hybrid electric vehicles (HEV), existing silicon insulated gate bipolar transistors (IGBT) and diodes contribute about 20-25% of traction inverter system cost. Power devices based on GaN is one of the most anticipated technology candidates for the next-generation HEV power conversion application.

Recent technology advancements make its application prospect increasingly realistic, such as the availability of native and GaN-on-silicon substrates, development of normally-off gate structures, suppression of the current collapse phenomenon as well as the demonstration of high-voltage blocking capability. Perfectly crystalline GaN has superior materials properties as compared to silicon for certain power electronics applications. It has a higher bandgap, higher thermal conductivity, higher breakdown voltage, and higher electron mobility than silicon. In principle, these properties should provide lower losses in high power conversion, higher frequency switching, and high operating temperatures.

FIG. 9A shows four key electrical properties of GaN, Si, and SiC—the primary three semiconductor materials currently competing for market share of the power management market. To compare potential device performance in a power transistor the best theoretical performance can be calculated. For power devices there are many characteristics that matter in the variety of power conversion systems available today. Five of the most important are conduction efficiency, breakdown voltage, switching efficiency, size and cost. Using the data from FIG. 9A (and adjusting for the enhanced mobility of the GaN 2 DEG), the theoretical minimum device on-resistance (the inverse of conductivity) as a function of breakdown voltage and as a function of material is calculated. As shown in FIG. 9B, SiC and GaN both have a superior relationship between on-resistance and breakdown voltage due to their higher critical electric field strength. This allows devices to be smaller and the electrical terminals closer together for a given breakdown voltage requirement. GaN has an extra advantage compared with SiC as a result of the enhanced mobility of electrons in the 2 DEG. This translates into a GaN device with a smaller size for a given on-resistance and breakdown voltage. Additional advantages of GaN over SiC include various device possibilities using GaN/AlGaN heterojunctions which are not available in the SiC and the ability to use AlGaN layers with larger band gaps to achieve higher critical electric fields than in GaN alone.

In the present invention a wide range of power electronic and transistor devices can be formed. Examples of such devices include Schottky diode devices, p-n diode devices, bipolar junction transistor (BJT), field-effect transistor (FET), metal-oxide-semiconductor field (MOSFET), junction field effect transistor (JFET), metal-semiconductor FETs (MESFETs), high-electron-mobility transistors (HEMT), insulated gate bipolar transistors (IGBT), heterojunction bipolar transistors (HBT), and others. In one embodiment, the semiconductor device layers are epitaxially grown on a bulk polar GaN substrate. In another embodiment, the semiconductor device layers are epitaxially grown on bulk nonpolar or semipolar GaN substrate, The devices may be processed to form contacts on the N-face and the Ga-face to provide performance enhancements and the layer structures may be ordered to provide an advantage over what is possible using conventional device fabrication technologies.

One embodiment of a GaN power device fabricated using this invention is a Schottky diode, which is a two terminal majority carrier device with a low forward voltage drop and a very fast switching action. When current flows through the Schottky diode device there is a small voltage drop across the diode terminals. An ideal Schottky diode should have characteristics such as high breakdown voltage, low leakage current, low forward voltage drop, low on-state resistance, and fast recovery. The keys characteristics for the fabrication of ideal Schottky diodes are the selection of a semiconductor material with optimum intrinsic properties, high crystal quality of the semiconductor layers, high quality intrinsic layer as a drift region with desired thickness, proper device structure and design, good edge termination, rectifying Schottky contact, low contact resistance for the ohmic contact, and high conductivity from the ohmic contacts to the intrinsic drift region. In GaN the majority carrier is most typically electrons, or n-type, but it can be p-type. As used herein, the term intrinsic or intrinsic region is used to describe a semiconductor material with very low doping or carrier concentration. The intrinsic region can be formed by growing epitaxial materials that are not intentionally doped [NID], unintentionally doped [UID], or may be intentionally doped to compensate the unintentional background doping to reduce the carrier concentration. The intrinsic region is typically configured as an insulating region, a semi-insulating region, or a drift region.

The three primary or typical device geometries for Schottky diodes are lateral, semi-vertical mesa, and vertical. The earliest GaN Schottky type diodes were lateral type, which suffer from very poor lateral conductivity. The semi-vertical structure comprises a mesa etched in GaN that is typically grown on a foreign substrate. A Shottky contact is made on top of the mesa and ohmic contacts are made on the etched region surrounding the mesa. These structures were improved over the lateral structures, but were still limited by lateral conductivity of the epi layers connecting the ohmically contacted material to the intrinsic material. With the advent of native bulk GaN substrates truly vertical Schottky diodes were enabled. By forming epitaxial intrinsic layers on top of highly doped GaN substrates and forming the ohmic contact to the substrate and the Schottky contacts to the intrinsic layers extremely high performance Schottky diodes were realized. This invention enables a truly vertical Schottky diode without the need for a substrate in the final device by using a highly conductive metal region to laterally conduct to the ohmic contact in one configuration or laterally conduct to the Schottky contact region in an alternative configuration. Since the metal layers are highly conductive and can be made several microns thick (1-15 microns or more) the lateral conductivity will be extremely high and even improved over the conductivity in conventional vertical Schottky diodes, which include the resistance of the substrate.

In a typical embodiment, a metal-semiconductor junction is formed between a metal and a semiconductor, creating a Schottky barrier on the anode side of the device. Typical metals used for the Schottky barrier are molybdenum, platinum, palladium, nickel, gold, chromium, tungsten, but can be others. The metal region forming the Schottky barrier can be comprised of a metal stack comprising multiple layers including additional metals such as gold. The semiconductor layers forming the Schottky barrier are typically comprised of a gallium and nitrogen containing material such as GaN with very low conductivity [intrinsic region or drift] that is either unintentionally doped or may be intentionally doped with a species to compensate the unintentional background doping to achieve a low conductivity. These regions may be comprised of one or more layers, wherein the layers are comprised of GaN or other gallium and nitrogen containing alloys. These layers typically need to have carrier concentrations of less than about 1E17 cm-3, less than about 6E16 cm-3, less than about 3E16 cm-3, or less than about 1E16 cm-3. The thickness of this region is typically between 0.5 um and 10 um, or about 10 um and 30 um, or about 30 um and 60 um. Sometimes referred to as the standoff region or the drift region, the thickness and conductivity of this intrinsic region sets the resistivity of the device, which will determine power dissipation and maximum current density of the device. The thicker and less conductive this region, the larger the breakdown voltage or critical field of the device.

In this embodiment, the cathode side of the device is typically formed with an ohmic metal contact to a semiconductor layer. Typical metals used to form the ohmic contact include titanium or aluminum, but could be others. The ohmic metal contact region is often comprised of a metal stack that may include additional metals such as gold, nickel, palladium, or platinum. The ohmic contact is made to a semiconductor contact layer such as an n-type gallium and nitrogen containing material such as GaN. In one example the n-type GaN layer is doped with an n-type dopant such as silicon at a doping level between 5E17 and 1E20 cm$^{-3}$. The n-type contact layer may have a thickness between about 25 nm and 100 nm, or about 100 nm to about 1000 nm, or about 1000 nm to about 3000 nm.

In one embodiment of this invention, a Schottky diode epitaxial structure is grown on a bulk gallium and nitrogen containing substrate. The growth is comprised of an epitaxial technique such as metal organic vapor deposition (MOCVD), molecular beam epitaxy (MBE), hydride vapor phase epitaxy (HVPE), or a combination. As shown in FIG. 10A, the epitaxial structure would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising an n-type contact layer such as n-type GaN and a nominally unintentionally doped or intrinsic region comprised of gallium and nitrogen containing material such as GaN overlying the n-type contact region. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical Schottky diode device structure is formed from the epitaxial structure in FIG. 10A to result in a device structure as shown in FIG. 10B. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. In this embodiment a Schottky diode contact is formed on top of epitaxial region on the intrinsic GaN material, which can be done either before or after the mesa is defined. The metal contact would be selected from one of or a combination of molybdenum, platinum, palladium, nickel, gold, chromium, tungsten, or others. Overlying the Schottky contact is a bonding region comprised of a metal. The metal may be the same metal as used for the Schottky contact, or in a preferred embodiment additional layers of metal would be deposited over the Schottky contact metal. In one embodiment, this metal would be a gold metal to form a gold-gold bond. Metal depositions can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote higher conductivity or coverage.

In addition to preparing the epitaxial device layers for transfer step with the formation of the mesa structures with Schottky contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the Schottky barrier contact. Once bonded, with the substrate released the remainder of the device process would be performed to the epitaxial device material on carrier wafer. The subsequent processing steps would include forming the n-type ohmic contact with the exposed n-type contact layer on the top of the transferred mesa. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. The ohmic metal deposition can be performed by conventional methods such as electron beam deposition, sputtering, or thermal evaporation, and annealing steps may be used to improve the contact quality.

Additional processing steps to form the completed Schottky diode device could include photolithography, deposition of dielectric passivation regions such as silicon dioxide or silicon nitride. Dry or wet etching or lift off of the dielectric may be necessary to form a patterned regions. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a Schottky diode epitaxial structure is grown on a bulk GaN substrate. The growth is comprised of an epitaxial technique such as metal organic vapor deposition (MOCVD), molecular beam epitaxy (MBE), hydride vapor phase epitaxy (HVPE), or a combination. As shown in FIG. 10C, the epitaxial structure in this embodiment would comprise a buffer layer grown on top of the substrate. The buffer layer could be comprised of GaN or n-type GaN. Overlying the buffer layer is a sacrificial region as described in this invention. Overlying the sacrificial region are the Schottky diode device layers comprising a nominally unintentionally doped or intrinsic region comprised of gallium and nitrogen containing material such as GaN and an n-type contact layer such as n-type GaN overlying the nominally unintentionally doped or intrinsic region. In one embodiment the intrinsic or drift region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In this embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In an alternative embodiment of a vertical Schottky diode device structure according to this invention the epitaxial structure in FIG. 10C is fabricated to result in a device structure as shown in FIG. 10D. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. In this embodiment an n-type ohmic contact is formed on top of epitaxial region on the n-type GaN contact layer, which can be done either before or after the mesa is defined. The n-type ohmic contact would comprise a metal to allow for a good ohmic contact such as titanium or aluminum. In many embodiments a metal stack would be deposited with more than one layers wherein the ohmic contact layer is in contact with the n-type GaN layer and metals such as gold and/or nickel are configured in the stack overlying the ohmic contact layer. Metal depositions can be performed by conventional methods such as electron beam deposition, sputtering, thermal evaporation, or others. In some embodiments electroplating may be used to deposit a thick layer of a conductive metal such as gold to promote higher conductivity or coverage. In addition to preparing the epitaxial device layers for transfer step with the formation of the mesa structures with Schottky contacts and comprising bonding regions, the carrier wafer would be prepared for the transfer process. Overlying the ohmic contact is a bonding region comprised of a metal. The metal may be the same metal as used for the ohmic contact layer, or in a preferred embodiment additional layers of metal would be deposited over the ohmic contact metal to form a metal layer stack. In one embodiment, this metal would be comprised of at least a gold metal to form a gold-gold bond.

In addition to preparing the epitaxial device layers for transfer step with the formation of the mesa structures with ohmic contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the ohmic contact in contact with the n-type contact layer. Once bonded, with the substrate released the remainder of the device process would be performed to the epitaxial device material on carrier wafer. The subsequent processing steps would include forming the Schottky barrier contact with an exposed portion of the intrinsic or nominally undoped layer on the top of the transferred mesa. The Schottky barrier metal contact would be selected from one of or a combination of molybdenum, platinum, palladium, nickel, gold, chromium, tungsten, or others. Metal depositions can be performed by conventional methods such as electron beam deposition, sputtering, or thermal evaporation.

Additional processing steps to form the completed Schottky diode device could include photolithography, deposition of dielectric passivation regions such as silicon dioxide or silicon nitride. Dry or wet etching or lift off of the dielectric may be necessary to form a patterned regions. Additionally, larger bond pad regions may be formed to make the device addressable by electrical power sources. The bond pads would be connected to the Schottky metal contact and/or the ohmic metal contact and may be configured to be partially or fully formed on the carrier wafer surrounding the epitaxial device material. Additionally, edge termination regions may be formed in the device. Edge termination is one of the key technologies for fabricating high voltage Schottky diodes, which functions to reduce the peak electric field along the Schottky contact edge and enhance the breakdown voltage. Several methods are used for edge termination including, but not limited to mesa, guard rings, field plates and high resistivity region by ion implantation can be used to reduce the chance of premature breakdown. A final device structure of this embodiment including edge termination regions is shown in FIG. 10D.

In another embodiment of this invention, a p-n diode power electronic device can be fabricated. A p-n diode power device is a two terminal semiconductor diode based upon the p-n junction wherein the diode conducts current in only one direction, and it is made by joining a p-type semiconducting layer to an n-type semiconducting layer. Under a forward bias current flows with a small resistance and in reverse bias little or no current is able to flow until the diode reaches breakdown. Semiconductor p-n diodes have multiple uses including rectification of alternating current to direct current, detection of radio signals, emitting light and detecting light.

An ideal p-n diode should have characteristics such as high breakdown voltage, low leakage current, low forward voltage drop, low on-state resistance, and fast recovery. The key properties to form ideal p-n diodes are the selection of a semiconductor material with optimum intrinsic properties, semiconductor crystal quality with very low defect density, high quality intrinsic layer as drift region with desired thickness, a good ohmic n-contact for low n-type contact resistance for, a good ohmic p-contact for low p-type contact resistance; highly conductive n-type and p-type semiconductor layers sandwiching the intrinsic drift region, proper device structure and design, and good edge termination.

Two typical device geometries for p-n diodes are semi-vertical mesa and vertical. The GaN-based semi-vertical mesa structure typically comprises a mesa structure formed with an etching process into gallium and nitrogen containing material such as GaN. The epitaxial structure can be grown on either native GaN or foreign substrates such as silicon or sapphire. In one example an ohmic metal contact is made to a p-type semiconductor on the top of the mesa and an ohmic metal contact to an n-type semiconductor is made in the region surrounding the mesa. This performance can be limited in the semi-vertical mesa structure by the lateral conductivity of the n-type epi layers connecting n-type ohmic contact to the mesa region where current will flow vertically. With the introduction of native bulk GaN substrates truly vertical p-n diodes were enabled. By forming epitaxial intrinsic drift layers overly a highly doped GaN substrates, forming a p-type gallium and nitrogen containing layer such as p-type GaN overlying the intrinsic layer, and forming ohmic contacts to both the p-type region overlying the intrinsic region and the highly doped n-type substrates high performance truly vertical p-n diodes were realized. In this invention enables a truly vertical p-n diode device without the need for a substrate in the final device by using a highly conductive metal region to laterally conduct to the n-type contact in one configuration or laterally conduct to the p-type contact region in an alternative configuration. Since the metal layers such as gold are highly conductive and can be made several microns thick (1-10 microns or more) the lateral conductivity will be extremely high and even improved over the conductivity in conventional vertical Schottky diodes, which include the resistance of the substrate.

In a typical embodiment, an gallium and nitrogen containing semiconductor material intrinsic or unintentionally doped drift region is sandwiched between a p-type semiconductor gallium and nitrogen containing semiconductor such as GaN and n-type semiconductor gallium and nitrogen containing semiconductor such as GaN. A metal-semiconductor contact is formed between a metal and a p-type semiconductor such as p-GaN and a metal-semiconductor contact is formed between a metal and an n-type semiconductor such as n-type GaN. Typical metals used for a high quality p-type contacts are palladium, platinum, nickel, or nickel-gold, but can be others. The metal region forming the Schottky barrier can be comprised of a metal stack comprising multiple layers including additional metals such as gold. The semiconductor unintentionally doped drift region or intrinsic region comprised of a gallium and nitrogen containing material such as GaN with very low conductivity is either unintentionally doped or may be intentionally doped with a species to compensate the unintentional background doping to achieve a low conductivity. These drift regions may be comprised of one or more layers, wherein the layers are comprised of GaN or other gallium and nitrogen containing alloys. These drift layers typically need to have carrier concentrations of less than about $1E17$ cm-3, less than about $6E16$ cm-3, less than about $3E16$ cm-3, or less than about $1E16$ cm-3. The thickness of this region is typically between 0.5 um and 10 um, or about 10 um and 30 um, or about 30 um and 60 um. The thicker and less conductive this region, the larger the breakdown voltage or critical field of the device.

In one embodiment of this invention, a p-n diode epitaxial structure is grown on a bulk gallium and nitrogen containing substrate such as GaN. The growth is comprised of an epitaxial technique such as metal organic vapor deposition (MOCVD), molecular beam epitaxy (MBE), hydride vapor phase epitaxy (HVPE), or a combination. As shown in FIG. 11A, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an n-type contact layer such as n-type GaN, a nominally unintentionally doped drift region or intrinsic region comprised of gallium and nitrogen containing material such as GaN overlying the n-type contact region, and an p-type contact layer such as p-type GaN overlying the nominally unintentionally doped drift region or intrinsic region comprised of gallium and nitrogen containing material. In one embodiment the n-contact layer is comprised n-type GaN with a thickness of between 10 nm and 100 nm or 100 nm and 3000 nm. In one embodiment the n-type GaN may be silicon doped GaN with a doping level of greater than $5E17$ cm-3 or less than about $1E20$ cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than $1E17$ cm-3, less than $5E16$ cm-3, less than $2E16$ cm-3, or less than $8E15$ cm-3. In another embodiment, the intrinsic region is comprised of an intentional dopant intended to compensate the unintentional background dopants to reduce the total carrier concentration and reduce the conductivity. In one embodiment the p-contact layer is comprised p-type GaN with a thickness of between 10 nm and 100 nm or 100 nm and 3000 nm. In one embodiment the p-type GaN may be magnesium doped GaN with a doping level of greater than $5E17$ cm-3 or less than about $1E20$ cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In one embodiment, a vertical p-n diode device structure is formed from the epitaxial structure in FIG. 11A to result in a device structure as shown in FIG. 11B. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. In this embodiment an ohmic contact is formed on top of epitaxial region on the p-type gallium and nitrogen containing material, which can be done either before or after the mesa is defined. The metal contact would be selected from one of or a combination of platinum, palladium, nickel, nickel-gold, gold, or others. Overlying the p-type contact is a bonding region comprised of a metal. The metal may be the same metal as used for the ohmic p-type contact, or in a preferred embodiment additional layers of metal would be deposited over the p-type contact metal. In one embodiment, this metal would be a gold metal to form a gold-gold bond. Metal depositions can be performed by conventional methods such as electron beam deposition, sputtering, thermal evaporation, or others, and annealing steps may be used to enhance the contact properties. In some embodiments electroplating may be used to deposit a thick layer of a conductive metal such as gold to promote higher conductivity or coverage.

In addition to preparing the epitaxial device layers for the transfer step with the formation of the mesa structures with p-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the p-type contact. Once bonded, with the substrate released the remainder of the device process would be performed to the epitaxial device material on the carrier wafer. The subsequent processing steps would include forming the n-type ohmic contact with the exposed n-type semiconductor contact layer on the top of the transferred mesa. The n-type contact would comprise a metal to allow for a good ohmic contact such as titanium or aluminum. In many embodiments a metal stack would be deposited with more than one layers wherein the n-type contact layer is in contact with the n-type GaN layer and metals such as gold, nicker, platinum, or palladium are configured in the stack overlying the n-type contact layer. The n-type metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

In an alternative embodiment of this invention, a p-n diode epitaxial structure is grown on a bulk gallium and nitrogen containing substrate such as GaN. The growth is comprised of an epitaxial technique such as metal organic vapor deposition (MOCVD), molecular beam epitaxy (MBE), hydride vapor phase epitaxy (HVPE), or a combination. The epitaxial structure according to this embodiment, as shown in FIG. 11A, comprises a buffer layer grown on top of the GaN substrate. The buffer layer could be comprised of GaN or n-type GaN. Overlying the buffer layer is a sacrificial region as described in this invention. Overlying the sacrificial region are the p-n diode device layers comprising an p-type contact layer such as p-type GaN, a nominally unintentionally doped drift region or intrinsic region comprised of gallium and nitrogen containing material such as GaN overlying the p-type contact region, and an n-type contact layer such as n-type GaN overlying the nominally unintentionally doped drift region or intrinsic region comprised of gallium and nitrogen containing material. In one embodiment the p-contact layer is comprised p-type GaN with a thickness of between 10 nm and 100 nm or 100 nm and 3000 nm. In one embodiment the p-type GaN may be magnesium doped GaN with a doping level of greater than 5E17 cm-3 or less than about 1E20 cm-3. In one embodiment the intrinsic region or drift region is comprised of a thickness of 1 um to about 10 um or about 10 um to about 30 um or about 30 um to about 60 um and is comprised of unintentionally doped GaN with a total carrier concentration of less than 1E17 cm-3, less than 5E16 cm-3, less than 2E16 cm-3, or less than 8E15 cm-3. In another embodiment, the intrinsic region is comprised of an intentional dopant intended to compensate the unintentional background dopants to reduce the total carrier concentration and reduce the conductivity. In one embodiment the n-contact layer is comprised n-type GaN with a thickness of between 10 nm and 100 nm or 100 nm and 3000 nm. In one embodiment the n-type GaN may be silicon doped GaN with a doping level of greater than 5E17 cm-3 or less than about 1E20 cm-3. In one embodiment of this invention the epitaxial layers are formed by MOCVD. In another embodiment the sacrificial region and n-type contact layers are formed by MOCVD and the intrinsic region is formed by HVPE where growth rates are much higher so it is more economical to grow very thick layers.

In this embodiment, a vertical p-n diode device structure is formed from the epitaxial structure in FIG. 11C to result in a device structure as shown in FIG. 11D. In this embodiment, the epitaxial device material is prepared for transfer by forming a mesa region by etching the epitaxial material to a depth at or below the sacrificial region. The etching process can be a dry etching process such as a reactive ion etch (ME), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. In this embodiment an ohmic contact is formed on top of epitaxial region on the n-type gallium and nitrogen containing material, which can be done either before or after the mesa is defined. The metal contact would be selected from one of or a combination of aluminum, titanium, platinum, palladium, nickel, nickel-gold, gold, or others. Overlying the n-type contact is a bonding region comprised of a metal. The metal may be the same metal as used for the ohmic n-type contact, or in a preferred embodiment additional layers of metal would be deposited over the n-type contact metal. In one embodiment, this metal would be a gold metal to form a gold-gold bond. Metal depositions can be performed by conventional methods such as electron beam deposition, sputtering, thermal evaporation, or others, and annealing steps may be performed. In some embodiments electroplating may be used to deposit a thick layer of a conductive metal such as gold to promote higher conductivity or coverage.

In addition to preparing the epitaxial device layers for the transfer step with the formation of the mesa structures with n-type contacts and comprising bonding regions, the carrier wafer would be prepared for the transfer process. The carrier wafer could be selected from silicon, silicon carbide, sapphire, aluminum nitride, or others. In preparation for the transfer process, bonding regions would be formed on the carrier wafer. In one embodiment the bonding region is a metal bonding region and is comprised of at least gold. Metal deposition can be performed by conventional methods such as electron beam deposition, sputtering, thermal evaporation, or others, and annealing steps may be used to improve the contact quality. In some embodiments electroplating may be used to deposit a thick layer of a conductive metal such as gold to promote high lateral conductivity. The transfer process would comprise a PEC etch to selectively remove the sacrificial release material followed by a bonding step to selectively transfer the epitaxial material to the carrier wafer and release the substrate. In this embodiment the bonding region is configured from a metal layer region comprising metal layers such as gold. The total thickness of this metal bonding region is a critical design aspect since it will be required to laterally conduct all of the device current from bonding pads positioned adjacent to the mesa to the n-type contact. Once bonded, with the substrate released the remainder of the device process would be performed to the epitaxial device material on the carrier wafer. The subsequent processing steps would include forming the p-type ohmic contact with the exposed p-type semiconductor contact layer on the top of the transferred mesa. The p-type ohmic contact would comprise a metal to allow for a good ohmic contact such as platinum, palladium, nickel, nickel-gold, or a combination thereof. In many embodiments a metal stack would be deposited with more than one layers wherein the ohmic contact layer is in contact with the n-type GaN layer and metals such as gold, nickel, platinum, or palladium are configured in the stack overlying the contact layer. The p-type contact metal deposition can be performed by conventional methods such as electron beam deposition, sputtering, or thermal evaporation, and annealing steps may be used to improve the contact quality.

Additional processing steps to form the completed p-n diode device could include photolithography, deposition of dielectric passivation regions such as silicon dioxide or silicon nitride. Dry or wet etching or lift off of the dielectric may be necessary to form a patterned region. Additionally, larger bond pad regions may be formed to make the device addressable by electrical power sources. The bond pads would be connected to the p-type contact metal and/or the n-type contact metal and may be configured to be partially or fully formed on the carrier wafer surrounding the epitaxial device material. Additionally, edge termination regions may be formed in the device. Edge termination is one of the key technologies for fabricating high voltage diodes, which functions to reduce the peak electric field along the contact edge and enhance the breakdown voltage. Several methods are used for edge termination including, but not limited to mesa, guard rings, field plates and high resistivity region by ion implantation can be used to reduce the chance of premature breakdown.

Another embodiment of a GaN power device fabricated according to this invention is a high electron mobility transistor device (HEMT), which is a three terminal device comprised of a source, a gate, and a drain. The HEMT is a heterostructure field-effect transistor (FET) based on a heterojunction which consists of at least two different semiconducting materials such as GaN and AlGaN brought into contact with each other to form an interface, typically using epitaxial growth. Due to the different band gaps of the semiconductor materials and their relative alignment to each other band discontinuities form at the interface. By choosing proper materials and compositions of the semiconductor materials, the conduction band offset can form a triangular shaped potential well confining electrons in the horizontal direction. Within the well the electrons can only move in a two-dimensional plane parallel to the heterointerface and are therefore referred to as a two-dimensional electron gas (2 DEG). Since the HEMT is a field effect transistor (FET) formed with a heterostructure it is also known as an (HFET) or modulation-doped FET (MODFET). The advantages of the HEMT include its high carrier concentration and its higher electron mobility due to reduced ionized impurity scattering. The combination of high carrier concentration and high electron mobility results in a high current density and a low channel resistance, which are especially important for high frequency operation and power switching applications.

GaN HEMTs have attracted attention due to their high-power performance. HEMT transistors are able to operate at higher frequencies than ordinary transistors, up to millimeter wave frequencies, and are used in high-frequency products such as cell phones, satellite television receivers, voltage converters, and radar equipment.

GaN power transistors are typically formed as planar HEMT devices, where the conductive transistor channel is a 2 DEG formed at the interface between a high bandgap layer such as AlGaN, AlN, or InAlGaN, and a lower bandgap layer such as GaN or InGaN. Source and drain contacts are formed to the 2 DEG, while a gate is formed over the higher bandgap layer such as AlGaN. Imperfections in the crystalline epitaxial structure that create traps or other defects can limit performance such as compressing the gain and other nonlinear effects. Forming a very high quality epitaxial material free from defects and excessive impurities is critical to the device performance. Efforts to form higher quality epi-layers in AlGaN/GaN HEMTs have resulted in significant improvement of the large-signal characteristics. This first step of device formation comprises forming the epitaxial layer structure on a substrate. The lack of large area, low cost GaN substrates has historically necessitated heteroepitaxy on compatible substrates, commonly sapphire, silicon carbide, or silicon, but can be others such as aluminum nitride. The epitaxial layers may be either grown entirely by MBE or MOCVD or on a resistive GaN buffer grown by vapor phase epitaxy.

Heteroepitaxy on such severely lattice-mismatched substrates makes the nucleation layer and buffer one of the most critical aspects of the growth. With sapphire as a substrate, the nucleation layer typically consists of GaN or AlN. Overlying the buffer layer is typically an insulating GaN layer with a thickness ranging from about 0.5 um to about 5 um or about 5 um to 10 um. The insulating layer can be an intrinsic region, a not intentionally doped region (NID) an unintentionally doped region (UID), or a region intentionally doped to compensate the unwanted background dopants and increase the resistance. Typical carrier concentrations in this insulating layer would be less than about 1E17 cm-3, less than about 5E17 cm-3, or less than about 1E16 cm-3. Overlying the insulating GaN layer is the AlGaN electron supply region. The AlGaN electron supply region may be comprised of an AlGaN layer doped with silicon at a concentration of between 5E17 cm-3 and 1E20 cm-3 with a thickness ranging from 5 nm to about 100 nm. In some embodiments no doping is used or a modulation doped is implemented. In some embodiments the AlGaN supply region is comprised of multiple layers including an undoped AlGaN spacer layer ranging in thickness from 1 nm to about 15 nm overlying the GaN insulating layer, the n-type doped AlGaN layer with a thickness ranging from 5 nm to 100 nm overlying the AlGaN spacer layer, and an undoped AlGaN barrier layer with a thickness ranging 5 nm to 100 nm overlying the n-type doped AlGaN layer. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The composition of the AlGaN electron supply region is a critical design parameter as it can influence the carrier concentration. In some embodiments, a GaN cap or n-type GaN layer may be formed over the AlGaN electron supply region.

An example of a conventional HEMT device grown on a foreign substrate is shown in FIG. 12A. Following the formation of the AlGaN and GaN epitaxial layers, device fabrication of a typical AlGaN/GaN HEMT as shown in FIG. 12A may initiate with the definition of the active device area. This can be either be defined through a patterning and etching of a mesa process or an implantation process. In the more typical etching embodiment, wet or dry etching techniques can be deployed wherein Cl2 or BCl3 are common gases used in etching by RIE, ICP, or CAME methods of etching. Next, the source and drain ohmic contacts are formed. In one embodiment the source and drain contacts are made by partially etching the AlGaN region in the source and drain regions and depositing the ohmic contact metals. In another embodiment the source and drain contacts are formed directly to the AlGaN surface region. In yet another embodiment the source and drain contacts are made by etching through the AlGaN region and into the insulating GaN region to form an ohmic contact directly with the 2 DEG. In yet another embodiment, the source and drain contacts are formed on an n-type GaN or NID GaN layer overlying the AlGaN region. The source and drain contact metallization is often followed by an annealing step to improve the contact characteristics. An example ohmic contact may be Ti/Al/Ni/Au, but it could be others such as Al/Ni/Au, a Ta-based ohmic contact, or others. The gate metal is typically defined by a deposition and lift-off process of a metal such as Ni/Au, but could be others such as Pt, Pd, or Au. The deposition method can be electron beam deposition, sputtering, thermal evaporation, or other techniques. In many of the early GaN transistors, this gate electrode was formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET. Dielectric passivation layers are formed on the device to electrically isolate certain features, protect certain regions, and to eliminate dispersion between the large signal alternating current (AC) and the direct current (DC) characteristics of the HEMT.

In the example conventional HEMT device in FIG. 12A, as with any power FET, there are gate, source, and a drain electrodes. The source and drain electrodes form an ohmic contact with the underlying 2 DEG. This creates a short-circuit between the source and the drain until the 2 DEG is depleted and the semi-insulating GaN crystal can block the flow of current. The gate electrode is placed on top of the AlGaN layer functioning to deplete the 2 DEG. In some embodiments, the gate electrode is formed as a Schottky contact to the top surface. By applying negative voltage to this contact, the Schottky barrier becomes reverse biased and the electrons underneath are depleted. Therefore, in order to turn this device OFF, a negative voltage relative to both drain and source electrodes is needed. This type of transistor is called a depletion mode, or d-mode, HFET and is a normally ON device. Embodiments for normally OFF devices are possible in the present invention.

In one embodiment according to this invention, a HEMT epitaxial device structure is grown on a bulk gallium and nitrogen containing substrate such as GaN. The growth is comprised of an epitaxial technique such as metal organic vapor deposition (MOCVD) or molecular beam epitaxy (MBE), but can be others. As shown in FIG. 12B, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the HEMT device layers comprising a higher bandgap material such as AlGaN electron supply region overlying the sacrificial region and an intrinsic region or nominally UID or NID insulating gallium and nitrogen containing material such as GaN overlying the higher bandgap region. The AlGaN electron supply region may be comprised of an AlGaN layer doped with silicon at a concentration of between 1E18 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an NID, UID, or an intentionally doped region to compensate the unwanted background dopants and increase the resistance and create the insulating property. The insulating region would comprise a thickness ranging from about 0.5 um to about 5 um or about 5 um to 10 um with a typical carrier concentrations of less than about 1E17 cm-3, less than about 5E16 cm-3, or less than about 1E16 cm-3, or less than about 5E15 cm-3. In other embodiments the high bandgap layer may be comprised of AlN.

In one embodiment according to this invention, the epitaxial device material, such as that shown in FIG. 12B, is prepared for transfer by forming a mesa region by etching the epitaxial material to a depth at or below the sacrificial region. The etching process can be a dry etching process such as a reactive ion etch (RIE), an inductively coupled plasma (ICP) etch, a chemical assisted ion beam etch (CAIBE), or other. Typical gases used in the etching process may include Cl and/or BCl3. Alternatively the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. Examples of insulating bond regions would oxide bonding regions, dielectric bonding regions, glass bonding regions, or polymer bonding regions, or other.

In addition to preparing the epitaxial device layers for the transfer step with the formation of the mesa structures and bonding regions, the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In a preferred embodiment, the bonding region would be similar to the bonding region on the top of the mesa structures such that the bond interface would be comprised of a like-like material, such as oxide-oxide, semiconductor-semiconductor, or metal-metal. In the case of oxide or dielectrics, depositions may be performed with chemical vapor deposition processes, sputtering processes, electron beam deposition processes, or other processes. For metal interfaces, the material can be deposited by conventional methods such as electron beam deposition, sputtering, thermal evaporation, or others. In an alternative embodiment the bonding region is comprised of two dissimilar materials such as semiconductor-glass, oxide-glass, semiconductor-polymer, or other. The transfer process would comprise a PEC etch to selectively remove the sacrificial release material followed by a bonding step to selectively transfer the epitaxial material to the carrier wafer and release the substrate. The bonding may be selected from a thermocompression bonding, a diffusion bonding, or other. Once bonded, with the substrate released the remainder of the device process would be performed to the epitaxial device material on the carrier wafer.

The subsequent processing steps would determine the final device structure of the HEMT device. Simplified example HEMT device structures that could be fabricated from the epitaxial structure in FIG. 12B according to this invention are shown in FIG. 12C and FIG. 12D. In both device structures the process includes forming an isolation structure for the active device area by etching a mesa or by ion implantation, or in a preferred embodiment the transferred epitaxial mesa would provide the isolation for the active device area. In the embodiment shown in FIG. 12C the source and drain contacts are made to the surface of the exposed AlGaN region. In the embodiment according to FIG. 12D the source and drain contacts are made after etching either into the AlGaN layer or through the AlGaN to directly contact the insulating layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In another embodiment of this invention a gate insulator is implemented by placing an insulating material such as a dielectric or oxide between the semiconductor material and the gate electrode. In this metal-insulator-semiconductor high-electron-mobility transistor (MIS-HEMT) device several insulator materials can be used including SiO2, SiNx, Al2O3, AlN, HfO2, ZrO2, La2O3, and Ta2O5. A gate insulator is not needed for RF devices, but is required for power devices to suppress the gate leakage current and current collapse. An example of a MIS-HEMT device according to one embodiment of this invention is shown in FIG. 12E.

In another HEMT device embodiment according to the present invention the epitaxial device stack would include a GaN layer between the sacrificial region and the AlGaN region. As shown in FIG. 12F, the epitaxial structure would comprise a buffer layer grown on top of the GaN substrate. The buffer layer could be comprised of GaN or n-type GaN. Overlying the buffer layer is a sacrificial region as described in this invention. Overlying the sacrificial region are the HEMT device layers comprising a cap layer, a higher bandgap material such as AlGaN electron supply region overlying the sacrificial region and an intrinsic region or nominally UID or NID insulating gallium and nitrogen containing material such as GaN overlying the higher bandgap region. In one embodiment the cap layer is a GaN cap layer comprised of UID or NID GaN to create an insulating region. In an alternative embodiment the cap layer is a GaN cap layer comprised of an n-type GaN to create a conductive region. In an alternative embodiment the cap layer is an AlGaN cap layer, which can be a p-type or n-type AlGaN. In an alternative embodiment the cap layer is an InGaN cap layer, which can be a p-type or n-type InGaN. The AlGaN electron supply region may be comprised of an AlGaN layer doped with silicon at a concentration of between 5E17 cm-3 and 1E20 cm-3 with a thickness ranging from about 5 nm to about 100 nm. In some embodiments no doping is used or a modulation doping is implemented. The AlGaN supply region may be comprised of multiple layers including an undoped AlGaN spacer layer ranging in thickness from 1 nm to about 15 nm, an n-type doped AlGaN layer with a thickness ranging from 5 nm to 100 nm, and an undoped AlGaN barrier layer with a thickness ranging 5 nm to 100 nm. The AlGaN supply region may be comprised of a substantially uniform AlGaN composition or a graded or non-uniform AlGaN composition. In some embodiments the AlGaN composition will range from 5% to 15% AlN, or about 15% to about 30% AlN, or about 30% to about 50% AlN. The insulating layer is comprised of GaN and may be an NID, UID, or an intentionally doped region to compensate the unwanted background dopants and increase the resistance and create the insulating property. The insulating region would comprise a thickness ranging from about 0.5 um to about 5 um or about 5 um to 10 um with a typical carrier concentrations of less than about 1E17 cm-3, less than about 5E16 cm-3, or less than about 1E16 cm-3, or less than about 5E15 cm-3.

In one embodiment according to this invention, the epitaxial device material, such as that shown in FIG. 12F, is prepared for transfer by forming a mesa region by etching the epitaxial material to a depth at or below the sacrificial region. The etching process can be a dry etching process such as a RIE, ICP etch, CAIBE, or other. Typical gases used in the etching process may include Cl and/or BCl3. Alternatively the mesa could be defined through a wet etch process. The wet etch process may be selective and designed to terminate on the sacrificial region. A bonding region is formed overlying the mesa region. The bonding region may be comprised of a metal, a dielectric, an oxide, or from a semiconductor layer overlying the GaN insulating layer. In some embodiments it is desirable to use an insulating bonding region to isolate the device and minimize parasitic capacitance of the final device. In this embodiment the carrier wafer is prepared for the transfer process. The carrier wafer could be selected from silicon, silicon carbide, sapphire, aluminum nitride, or others. In a preferred embodiment the carrier wafer would be insulating or semi-insulating and would be selected from sapphire, silicon carbide, or aluminum nitride. In preparation for the transfer process, bonding regions may be formed on the carrier wafer. The bonding region could be comprised of metal, dielectric, oxide, semiconductor, glass, polymer, or other, or a combination thereof. In one embodiment, the bonding region would be similar to the bonding region on the top of the mesa structures such that the bond interface would be comprised of a like-like material, such as oxide-oxide, semiconductor-semiconductor, or metal-metal. In an alternative embodiment the bonding region is comprised of two dissimilar materials such as semiconductor-glass, oxide-glass, semiconductor-polymer, or other.

The subsequent processing steps would determine the final device structure of the HEMT device. Simplified example HEMT device structures that could be fabricated from the epitaxial structure in FIG. 12F according to this invention are shown in FIG. 12G, FIG. 12H, FIG. 12I, FIG. 12J, and FIG. 12K. In all device structures the process includes forming an isolation structure for the active device area by etching a mesa or by ion implantation, or in a preferred embodiment the transferred epitaxial mesa would provide the isolation for the active device area. In the embodiment shown in FIG. 12G the cap layer is an n-type GaN cap layer. In this embodiment the source and drain contacts are made to the surface of the exposed n-type GaN cap layer overlying the AlGaN region to form good ohmic contacts, while the gate contact is made to the AlGaN region. In the embodiment according to FIG. 12H the cap layer is an n-type GaN cap layer. In this embodiment the source and drain contacts are made after etching through the n-GaN cap layer to contact the AlGaN region, while the gate contact is made to the n-type GaN cap layer. In yet another embodiment according to FIG. 12I the cap layer is a UID or NID GaN cap layer. In this embodiment the source and drain contacts are made to a UID or NID GaN cap layer and an insulator material is placed between gate and the GaN cap layer. In one embodiment, the source and drain contacts would be comprised of Ti/Al/Ni/Au, but could be others such as Al/Ni/Au, a Ta-based ohmic contact, or others. The source and drain contact metallization is often followed by an annealing step to improve the contact characteristics. Next, the gate metal is defined. In one embodiment the gate is formed by a lift-off process of a metal such as Ni/Au, but could be others such as Pt, Pd, or Au. The deposition method can be electron beam deposition, sputtering, thermal evaporation, or other techniques. Dielectric passivation layers such as silicon nitride are formed on the device to electrically isolate certain features, protect certain regions, and to eliminate dispersion between the large signal AC and the DC characteristics of the HEMT.

In a conventional HEMT applying a bias to the gate electrode depletes electrons in the channel below to prohibit current flow and turn the device OFF, the device is a normally ON device. Normally OFF devices are desirable for several applications. For example, a normally-off device operation is required to simplify the inverter circuit for in electric or hybrid electric vehicles. Normally-off operation in GaN HEMT can be achieved by several methods, although they face limitations and tradeoffs. The most widely used method is by gate recess etching.

This can be performed by ICP plasma to remove the AlGaN layer on top of the GaN channel layer. The reduction of AlGaN thickness results in a lower polarization-induced 2 DEG density. A recessed gate HEMT device according to one embodiment of this invention is show in FIG. 12J as an example. In this embodiment the cap layer is a GaN cap layer. In this embodiment the source and drain contacts are made to the GaN cap layer. An etch is performed to etch into the AlGaN region in the gate region. A passivation layer or insulating layer is applied in the etched region and the gate electrode is formed.

Another HEMT device enabling normally OFF operation is the gate injection transistor (GIT) device. In this device a p-type GaN, InGaN, or AlGaN layer is placed between the gate electrode and the AlGaN supply region. In the example of p-type AlGaN, the GIT structure is normally off because a p-AlGaN layer raises the potential at the AlGaN/GaN interface channel above the Fermi level. This could also be understood as a natural depletion of mobile electrons on the n-side due to the built-in p-n junction. By applying a positive gate bias, the channel begins to accumulate 2 DEG as the quantum well reaches the Fermi level, thereby turning the device on.

A GIT device according to one embodiment of the present invention is show in FIG. 12K as an example. In this embodiment the cap layer is a p-type AlGaN cap layer. In this embodiment the source and drain contacts are made to the AlGaN supply layer after etching through the p-type AlGaN cap layer. The gate contact is made to the p-type AlGaN cap region between the source and the drain.

In alternative embodiment according to this invention, a HEMT epitaxial device layers would be grown on the gallium and nitrogen containing substrate in a reverse order compared to FIG. 12B and FIG. 12F. That is, overlying the sacrificial region first the lower bandgap intrinsic region or nominally UID or NID insulating gallium and nitrogen containing material such as GaN is formed. Overlying the insulating region the higher bandgap region such as AlGaN is formed. An example of this embodiment according to the present invention is shown in FIG. 12L. Of course this is just one example and the structure could include additional features such as a cap layer overlying the AlGaN region. The cap layer could be comprised of UID, n-type, or p-type GaN, AlGaN, or InGaN. The HEMT power devices would then be fabricated on the gallium and nitrogen containing substrate such as GaN. In the process, source, drain, and gate electrodes would be applied and sufficient insulating and passivating layers would be configured on the devices according to the descriptions provided in earlier examples. Mesas would be formed using an etching process to expose the sacrificial region. The etching process can be a dry etching process such as RIE, ICP etch, a CAIBE, or other. Typical gases used in the etching process may include Cl and/or BCl3. Alternatively the mesa could be defined through a wet etch process. The wet etch process may be selective and designed to terminate on the sacrificial region. Following the mesa formation process the sacrificial region would be fully or partially removed using a selective etch process such as PEC etching. In a preferred embodiment an anchor regions would be formed to mechanically support the HEMT device mesas and hold them in place with sacrificial region removed prior to the bonding step. The anchor regions could be formed from a semiconductor material, a metal material, an oxide, or a dielectric. Bonding regions would be formed configured to bond the HEMT devices to a carrier wafer. In a preferred embodiment the bonding regions would be metal regions overlying the source, drain, and gate electrodes, but can be others. FIG. 12M shows an example of an array of HEMT devices prepared for transfer to a carrier wafer according to this invention.

In addition to preparing the HEMT devices for the transfer step with the fabrication of the devices structures including forming the source, gate, and drain regions along with the applying the necessary passivation layers, formation of the mesa structures, anchor structures, and bonding regions, along with selectively etching the sacrificial region, the carrier wafer is prepared for the transfer process. The carrier wafer could be selected from silicon, silicon carbide, sapphire, aluminum nitride, or others. In one embodiment the carrier wafer would be insulating or semi-insulating and would be selected from sapphire, silicon carbide, or aluminum nitride. In another embodiment the carrier wafer would be configured from silicon and comprise electronic devices formed from a Complementary metal-oxide-semiconductor (CMOS) process. In another embodiment the power devices would be transferred directly to a printed circuit board. In preparation for the transfer process, bonding regions may be formed on the carrier wafer. In a preferred embodiment, the bonding regions would be comprised of metal and be configured to bond to the source, gate, and drain metal bond regions. The metal regions on the carrier may be comprised of gold, platinum, titanium, palladium, copper, aluminum, or a combination thereof. The metal material can be deposited by conventional methods such as electron beam deposition, sputtering, thermal evaporation, or others such as electroplating.

The bonding may be selected from a thermocompression bonding, a diffusion bonding, or other. Once bonded, with the substrate released the remainder of the device process would be performed to the epitaxial device material on the carrier wafer. In one configuration bond pad regions to access the source, gate, and drain would be formed substantially on the carrier wafer. In another configuration electrical interconnects would be used to connect the GaN power devices to other devices on the carrier wafer such as CMOS devices integrated within the carrier or other devices transferred to the carrier wafer according to this invention. FIG. 12N shows an example of selective bonding wherein the bond interface regions from the GaN wafers comprising the HEMT devices is bonded to the bond region on a carrier wafer or a printed circuit board. By selective bonding, one or more HEMT devices can be transferred to multiple carrier wafers or printed circuit boards. An advantage to this device structure is the lack of conduction layers below the insulating GaN region.

As in any of the gallium and nitrogen containing semiconductor devices according to this invention, the die expansion process can be applied to electronic devices such as Schottky diode devices, p-n diode devices, HEMT devices, FET devices, heterojunction bipolar transistor, or any other transistor devices. As an example a cross-sectional schematic process flow illustrating the semiconductor epitaxial device layers of a Schottky diode device in preparation for die expansion is shown in FIG. 13A. As described in this invention, after deposition of the device layers over the sacrificial region mesa regions are defined at a first pitch. Before or after the mesa regions are defined the ohmic contact is formed to the n-type contact layer and a bonding region is formed overlying the mesa. The sacrificial region is then selectively etched using a selective etching process such as PEC etching. The etch can be a full etch wherein the entirety of the sacrificial region is removed or wherein the sacrificial region is partially removed such that a portion remains unetched. The unetched sacrificial region could function as an anchor region, providing mechanical support to the epitaxial layers to hold them in place prior to the bonding steps. As previously described, other materials can be used for anchor features such as metal regions, dielectric regions, oxide regions, or other. FIG. 13B is an example illustration of the selective bonding process to a carrier wafer wherein the mesa on the GaN substrate comprised of the Shottky diode device layers are transferred to the carrier wafer in a sequential fashion according to a second pitch that is greater than the pitch that mesa was formed on the GaN substrate. After bonding to the carrier wafer the remaining steps for the fabrication of the Schottky diode device.

The value of such die expansion applied to electronic devices could be enormous through the greatly increased utilization of the epi area similar to its application to laser diodes. The origin of this large value creation is that typical GaN based power devices have a very small "active" area relative to the total chip area required for the device. This is due to the fact that the electrodes or bond pads that are used to connect the "active" device area to external or on-chip power sources often require factors of 5 or more area than the active devices themselves require. As an example, a top-view schematic of an example conventional Schottky diode device is shown in FIG. 13C. According to FIG. 13C, the device is comprised by a total area depicted by 100. Within the total area 100 of the device, the active area 101 is depicted with the dashed line. As shown, the active area wherein Schottky diode function is generated where the Schottky contact electrode 102 and the ohmic contact electrode 103 actually connects to the active area 101 is much smaller than the area 100 configured to provide sufficient area for the full Schottky contact electrode 102 and the ohmic contact electrode 103.

A cross section of the conventional Schottky diode device shown in FIG. 13C is shown in FIG. 13D. According to FIG. 13D, Epitaxial layers are formed on the substrate 200, which may be selected from silicon, silicon carbide, sapphire, or other. The epitaxial layers are configured with a nucleation layer 201 overlying the substrate 200, an n-contact layer and/or conduction region 202 overlying the nucleation region 201, and an intrinsic, UID, or NID drift region 203 overlying the n-contact layer region 202. In this example, a mesa region is formed to define the active area. In some embodiments the mesa is formed using an etching process wherein the etch destructively removes the epitaxial semiconductor material and terminates at or near the substrate. On top of the active area mesa the Schottky diode contact is made with a Schottky diode contact electrode 204 to the drift region 203 in the active area. In this embodiment, the Schottky contact electrode is primarily positioned overlying the substrate wherein the semiconductor was destructively etched. In typical configurations, insulating layers such as dielectrics or oxides would be positioned between the mesa and the electrode and/or between the substrate and the electrode. On the side of the active area wherein the semiconductor layers have been exposed to leave a portion of the n-contact layer region 202 exposed, the ohmic n-contact and n-contact electrode 205 is formed. In this conventional embodiment, the ohmic n-contact electrode is primarily positioned overlying the n-contact and lateral conduction regions and/or overlying the substrate wherein the semiconductor was etched to the substrate. In typical configurations, insulating layers such as dielectrics or oxides would be positioned between the mesa and the electrode and/or between the substrate and the electrode.

A cross section of a Schottky diode device according to this invention is shown in FIG. 13E. According to FIG. 13E, the Shottky diode device layer mesa has been transferred from a native gallium and nitrogen containing substrate to a carrier wafer 300. In this embodiment, the transferred mesa region substantially defines the active area of the device. Overlying the carrier wafer 300 is the bond region 301, overlying the bond region 301 is the intrinsic, or UID, or NID drift region 302, and overlying the drift region 302 is the n-contact layer region 303. In this embodiment the bond region 301 is formed from a highly conductive metal configured with the designed thickness and conductivity to enable a high current operation with minimal resistance and hence, enable a vertical Schottky diode device. According to the present invention, the Schottky contact electrode is overlying the metallic bond region to form an electrical contact. In some embodiments a thick electrode metal is formed over the metallic bond region to enable probing or wirebonding. In another embodiment, the bond region metal on the carrier wafer is the electrode region. Overlying the n-contact layer region 303 is the ohmic n-contact electrode 305, which extends off the mesa and onto the carrier wafer. In typical configurations, insulating layers such as dielectrics or oxides would be positioned between the mesa and the electrode and/or between the carrier wafer and the electrode. The critical aspect of this invention embodiment is the transferred epitaxial material that was initially formed on a bulk GaN substrate is only occupying the "active" area where it is needed and a vast majority of the electrode metal is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a Schottky diode device, very little of the gallium and nitrogen containing epitaxial material is wasted.

In an alternative example of die expansion for semiconductor power electronic devices, a top-view schematic of an example conventional HEMT device is shown in FIG. 13F. According to FIG. 13F, the device is comprised by a total area depicted by 400. Within the total area 400 of the device, the active area 401 is depicted with the dashed line. As shown, the HEMT function is generated where the source electrode 402, gate electrode 403, and drain electrode 404 actually connect to the active area 401 is much smaller than the area 400 configured to provide sufficient area for the full area of the source contact electrode 402, gate contact electrode 403, drain contact electrode 404.

A cross section of the conventional HEMT diode device shown in FIG. 13F is shown in FIG. 13G. According to FIG. 13G, epitaxial layers are formed on the substrate 500, which may be selected from silicon, silicon carbide, sapphire, or other. The epitaxial layers are configured with a nucleation layer 501 overlying the substrate 500, a low bandgap region 502 such as GaN that is typically, UID, or NID overlying the nucleation layer 501, and a high bandgap region 503 such as AlGaN overlying the low bandgap region 502. In this example, a mesa region is formed to define the active area. In some embodiments the mesa is formed using an etching process wherein the etch destructively removes the epitaxial semiconductor material and terminates at or near the substrate. On top of the active area mesa the source contact is made with a source contact electrode 504, a gate contact is made with a gate contact electrode 505, and drain contact is made with the drain contact electrode 506. In this embodiment, the source, gate, and drain contact electrodes are primarily positioned overlying the substrate wherein the semiconductor was destructively etched. In typical configurations, insulating layers such as dielectrics or oxides would be positioned between the mesa and the electrode and/or between the substrate and the electrode.

A cross section of a HEMT device according to this invention is shown in FIG. 13H. According to FIG. 13H, the HEMT diode device layer mesa has been transferred from a native gallium and nitrogen containing substrate to a carrier wafer 600. In this embodiment, the transferred mesa region substantially defines the active area of the device. Overlying the carrier wafer 600 within the active area is the bond region 601, the lower bandgap material such as GaN region 602 overlying the bond region 601, and the higher bandgap region 603 overlying the lower bandgap region 602. In this embodiment the bond region 601 may be formed from an insulating region such as an oxide material. In alternative embodiments it may be formed by a metal. On top of the active area mesa the source contact is made with a source contact electrode 604, a gate contact is made with a gate contact electrode 605, and drain contact is made with the drain contact electrode 606. In this embodiment, the source, gate, and drain contact electrodes are primarily positioned overlying the carrier wafer. In typical configurations, insulating layers such as dielectrics or oxides would be positioned between the mesa and the electrode and/or between the substrate and the electrode. The critical aspect of this invention embodiment is the transferred epitaxial material that was initially formed on a bulk GaN substrate is only primarily occupying the "active" area where it is needed to generate the HEMT function and a vast majority of the electrode metal that is required for making electrical connections is contained on the carrier wafer. This is a drastic improvement in the use of epitaxy material and epitaxial substrate area since in conventional methods the electrodes occupy regions wherein the epitaxial material is present or was present prior to using a destructive removal process such as etching. In the present invention for forming a HEMT device, very little of the gallium and nitrogen containing epitaxial material is wasted.

A powerful feature of the present invention is the ability to fabricate devices with increased functionality by transferring various semiconductor components to a common carrier wafer to form an integrated semiconductor device. There are many applications where it would be advantageous to have various semiconductor components on a common carrier wafer to form an integrated device. One example is the integration of LEDs with electronic power devices. GaN based LEDs used in lighting applications typically require dedicated electronic driver circuits for AC-DC power conversion, current sourcing, and dimming using pulse-width modulation (PWM) or analog current control methods. GaN power devices such as MOSFETs, HEMTs, and MOS-Channel HEMTs (MOSCHEMTs) have shown outstanding performance. Thus, integration of GaN-based LEDs and GaN power devices such as HEMTs can reduce the cost, size, and efficiency of solid state lighting systems. Another emerging application wherein LEDs would benefit from the integration with electronics is in LI-FI, which is a bidirectional, high speed and fully networked wireless communications, like WI-FI, using visible light. Since LI-FI requires driver circuitry to modulate the light output of the LED devices, merging electronic devices onto the same chip as the LED would be advantageous. FIG. 14A is an example of an LED device integrated with a HEMT device and Schottky diode device. The integrated devices in FIG. 14A is merely an example of integration using the present invention. According to this invention any configuration and any number of semiconductor devices can be integrated onto a common carrier wafer, and in some embodiments the carrier wafer is comprised of semiconductor devices such as silicon devices. In this embodiment shown in FIG. 14A, a HEMT device is fabricated on a substrate, which could be on a native GaN substrate or a foreign substrate. The HEMT device is comprised of a sacrificial region underlying the HEMT device layers. Mesas are formed using an etching process and the sacrificial region is selective etched. In a preferred embodiment, anchor structures or regions are formed to maintain the structural integrity of the HEMT device layers to hold them in place. Following the formation of the bond region overlying the mesa region the HEMT structure is transferred to a carrier wafer. Similar process steps are employed to transfer the Schottky device layers and the LED device layers to the carrier wafer. The HEMT, Schottky diode, and LED device layers are then processed into their respective devices. A simplified schematic of the resulting structure is shown in FIG. 14A.

In another embodiment of integrating an LED device with a HEMT device, the HEMT device is processed on the gallium and nitrogen substrate such as GaN. The gate, source, and drain regions are formed along with all of the passive regions. The HEMT device is then transferred to the carrier wafer such that the gate, source, and drain regions form metal bonds to the carrier wafer. In one embodiment the LED epitaxial layers are transferred to the carrier wafer and then the LED device is formed using process steps. In other embodiments, processing steps are performed on the LED epitaxial layers on the gallium and nitrogen containing substrate.

In yet another embodiment of semiconductor device integration according to this invention a gallium and nitrogen semiconductor device or epitaxial layer structure is transferred to a carrier wafer comprising semiconductor devices. An example of this embodiment is transferring an LED device to a silicon wafer with CMOS circuitry configured as the driver for the LED device. In another example of this embodiment a GaN based HEMT is bonded to a silicon carrier wafer comprising silicon MOSFET devices. By cascading a high-voltage, normally-on GaN device and a low-voltage silicon MOSFET device, a normally OFF high power device can be formed. This approach can provide a simple and low cost method to deliver a normally-off GaN device. A simplified schematic of the device is shown in FIG. 14C.

Some embodiments describe a flip-chip bonded InGaN-based DFB with a grating etched in the n-cladding layers. The epitaxial layer stack is grown p-side up and may consist of n-cladding, active region and p-cladding layers. The epitaxial layers and their original substrate are referred to as the donor. The donor is the patterned with metal acting as a p-contact. Mesas are etched and additional metal is patterned for bonding. Finally, the mesas are undercut using a photo-electrochemical etch through a sacrificial quantum or multi-quantum well. The mesas are retained by an area or areas where the bond metal anchors the mesa to the donor substrate. An acceptor or carrier substrate of arbitrary composition is patterned with bond metal and the donor mesas are then bonded to the acceptor using a method such as thermocompression bonding.

Some embodiments cover GaN laser device layers that are removed from their original epitaxial growth substrate and are transferred to a second carrier substrate of arbitrary composition. In some embodiments, the epitaxial layer stack is inverted during transfer to the carrier wafer, such that the n-type cladding layers are now exposed on the top of the epitaxial device stack. This is advantageous because n-type GaN is highly robust compared to p-type GaN and supports electrical contacts that are greatly superior to electrical contacts in p-type GaN. Etching DFB grating features into the n-cladding of an epi-transferred laser device will have limited impact on the conductivity of the n-cladding layers and the resistance of the n-contact. FIG. 15 shows a schematic representation of such a transferred device. A carrier wafer is provided and overlaid with a bonding media. The epitaxial device layers comprise a p-cladding region, active region, and n-cladding region. Bonding media overlays the epitaxial device layers p-cladding region. The bond interface is made between the carrier wafer bonding media and the epitaxial device layers bonding media. A laser cavity is formed by etching a ridge into the n-cladding layers and etching facets into both ends of the device layers. The back facet is coated with a highly reflective coating while the front, emitting facet is coated with an anti-reflective coating. The n-cladding is etched with a DFB grating which overlays the ridge or is etched on either side of the ridge. For the DFB overlaying the ridge, the n-con metal only overlays the n-cladding layer in the unetched regions. Since the etched portions of the grating must be etched deep enough to interact with the optical mode, placing n-contact metal into the etched regions would lead to high levels of optical loss as the absorbing metal layers would overlap the optical mode.

Cross-section and plan view of some embodiments are depicted in FIG. 16. The device is flip-chip bonded as described onto an acceptor substrate so that the n-layers are on the top. A surface grating is depicted on the n-side with a dielectric fill and blanket-deposited n-contact metal. Facet coatings are shown on the facets of the laser, one of which is highly reflective (HR) and one of which is antireflective (AR). As shown in the plan view, a ridge has been formed on which the grating and n-metal sit. In a later step not shown, a larger pad metal may connect to the n-contact metal.

Figure 17:
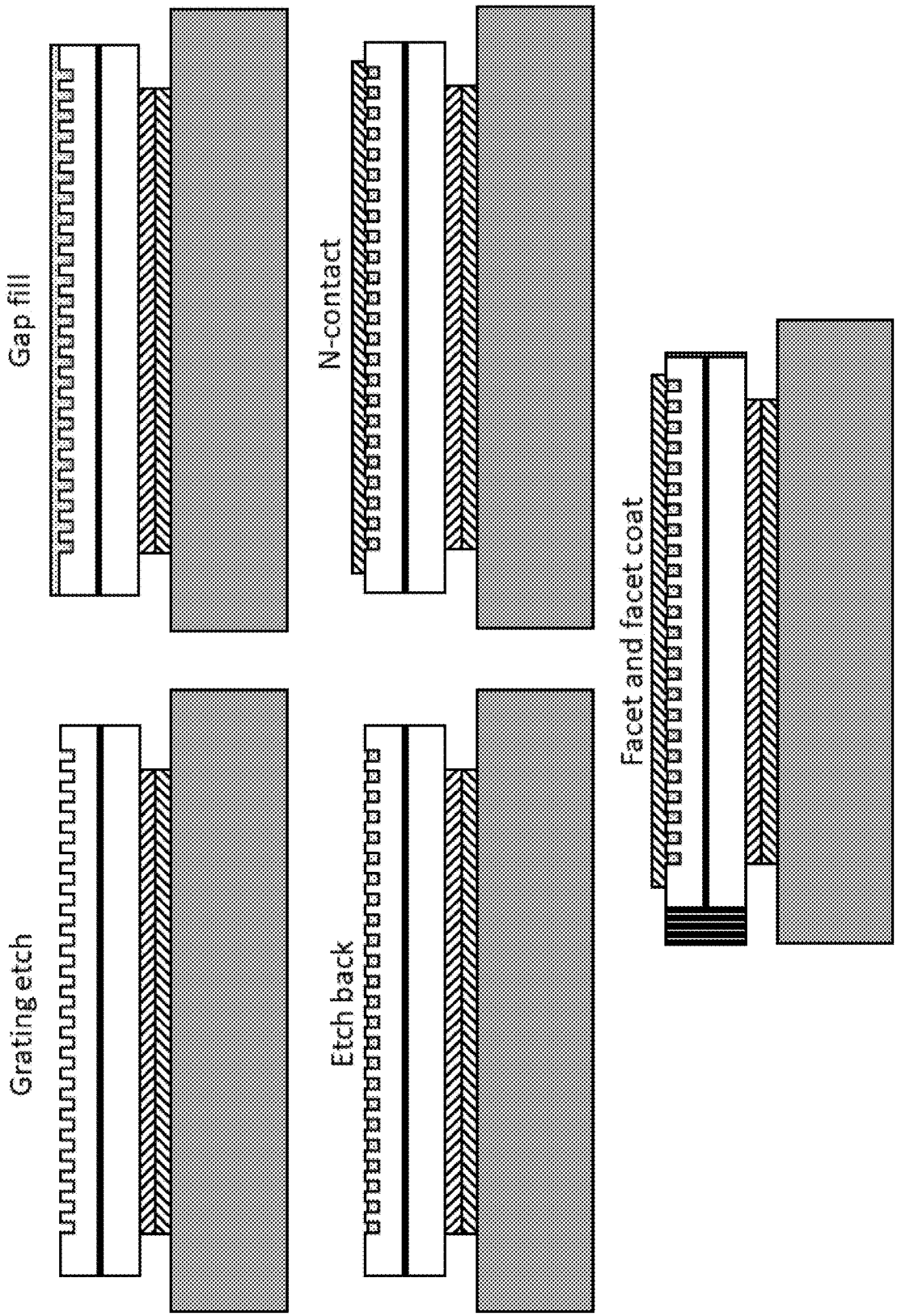
FIGS. 17-18 provide simplified process flows for forming DFB laser devices in accordance with some embodiments.
Figure 18:
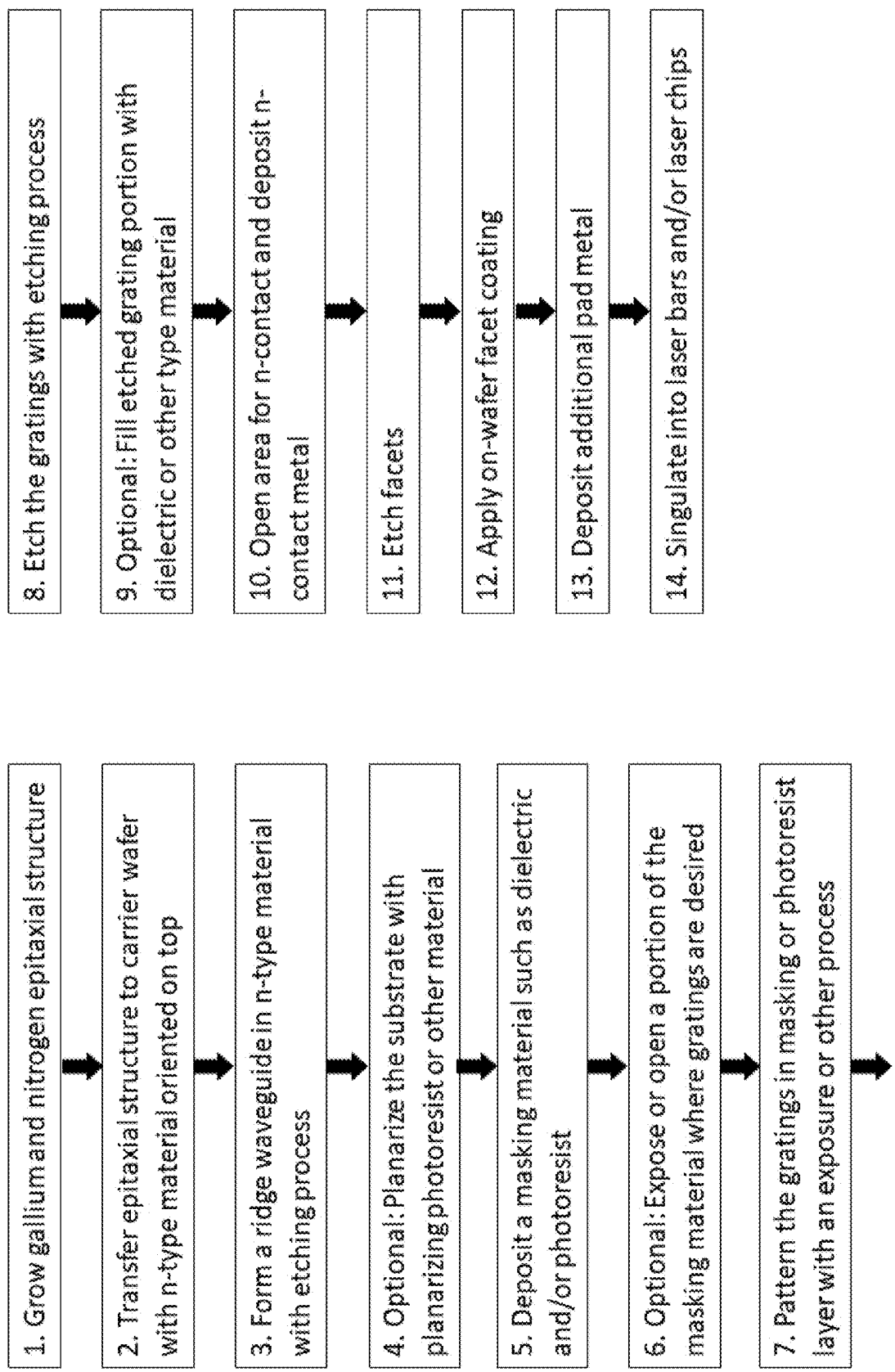

Sample process flows are shown in FIGS. 17 and 18 in accordance with some embodiments. After transfer, a ridge is etched into the mesa to form the laser cavity. The sample may optionally be planarized using a planarizing photoresist, deposited dielectric, polymer thin films coatings such as BCB or polyamides, spin-on-glass or another planarizing material. The planarizing materials can be temporary to facilitate the patterning process for the gratings, or can be permanent to also serve as a passivation layer. This step may require the application of material followed by an etch or exposure/development to reveal the mesas or ridges. A grating is patterned over the mesa or part of the mesa using ebeam lithography, displacement-Talbot, nanoimprint, deep UV, selective nanoimprint, nanopattern transfer, or holographic lithography. The patterning of the grating may require a two-step process in order to open a portion of the masking material where the grating is desired. The grating is then either transferred into an oxide or metal hard mask for subsequent grating etch or etched directly with the photoresist mask into the n-cladding. The etch typically uses Cl-based dry etch chemistries using RIE, ICP, ECR, a physical Ar-based dry etch or a combination. The etch is not limited to RIE, ECR, ICP, as ion milling, CAIBE or RIBE may be used to achieve high aspect ratios, vertical sidewalls, blazed gratings or other grating profiles to enhance laser performance. In addition, other GaN etch chemistries can be considered such as Br-based (HBr), I-based ($BI_3$), and methane/hydrogen (MHA).

After the gratings have been formed in the gallium and nitrogen containing material or formed in other types of material, a low-loss dielectric such as $SiO_2$ is then deposited to fill the grating. This is done so that the n-contact metal may be deposited across the ridge without entering the gaps in the grating and adding additional loss to the mode. Gap fills are typically done by ALD to yield a conformal coating that coalesces without the presence of voids. However, other deposition techniques are possible. These can include, but not limited to: PECVD, HDPECVD (ICP or ECR), FCVD, APCVD, LPCVD, PVD, solid source ECR, sputter deposition, ebeam deposition, ion beam deposition, or spin on dielectrics. The gap fill can consist of multiple materials using multiple deposition techniques to facilitate processing or generate different effective indexes in the gaps. The index and loss of the gap fill dielectric also will impact the grating coupling since it is the material that impinges on the mode to yield an index contrast. This dielectric material is blanket deposited and then etched back to expose the unetched portions of the grating. In the case of $SiO_2$, this etch back may be done with a F-based dry etch or HF-based wet etch. N-contact metal is patterned and deposited on the ridge after a $SiCl_4$ etch to recover the etch damage in the n-GaN.

Facets may be etched and coated. Facet etch may be done in a variety of ways, but typically use an $SiO_2$ hard mask (not shown in the figure) and $Cl_2$-based CAIBE etch. In other embodiments, other hard mask materials may be used, or no hard mask at all. In still other embodiments, the facets may be etched using RIBE, RIE, FIB or other etching techniques. The facets may be coated with one HR and one AR coating to break mode degeneracy and enhance light output in one direction. However, in other embodiments, AR/AR coatings or HR/HR coatings may be used in certain applications such as to improve yield of a phase-shifted DFB or low power performance. Additional pad metal is deposited on the n-side, p-side or both. This step may require the etching of any dielectric on top of the existing n-contact or p-contact. Finally, the wafer is singulated into laser bars or chips depending on the final application.

The wavelength of operation is determined by the grating pitch. The reflectivity spectrum of the grating should fall at or near the peak of the epitaxial-determined emission spectrum for efficient operation. This grating may contain a quarter wave shift, either in one grating line or distributed over several periods, to break mode degeneracy. The etch as well as the design of the epitaxial transverse waveguide determine the coupling between the lasing mode and grating. The etch depth as well as verticality must be repeatable and well controlled as they contribute to the grating coupling.

In some embodiments the grating is comprised of a first order grating. In other embodiments the grating is comprised of a second order grating. In yet other embodiments the grating is comprised of a third order or a fourth order grating. In other embodiments the gratings are comprised of fifth or higher order gratings.

Figure 19:
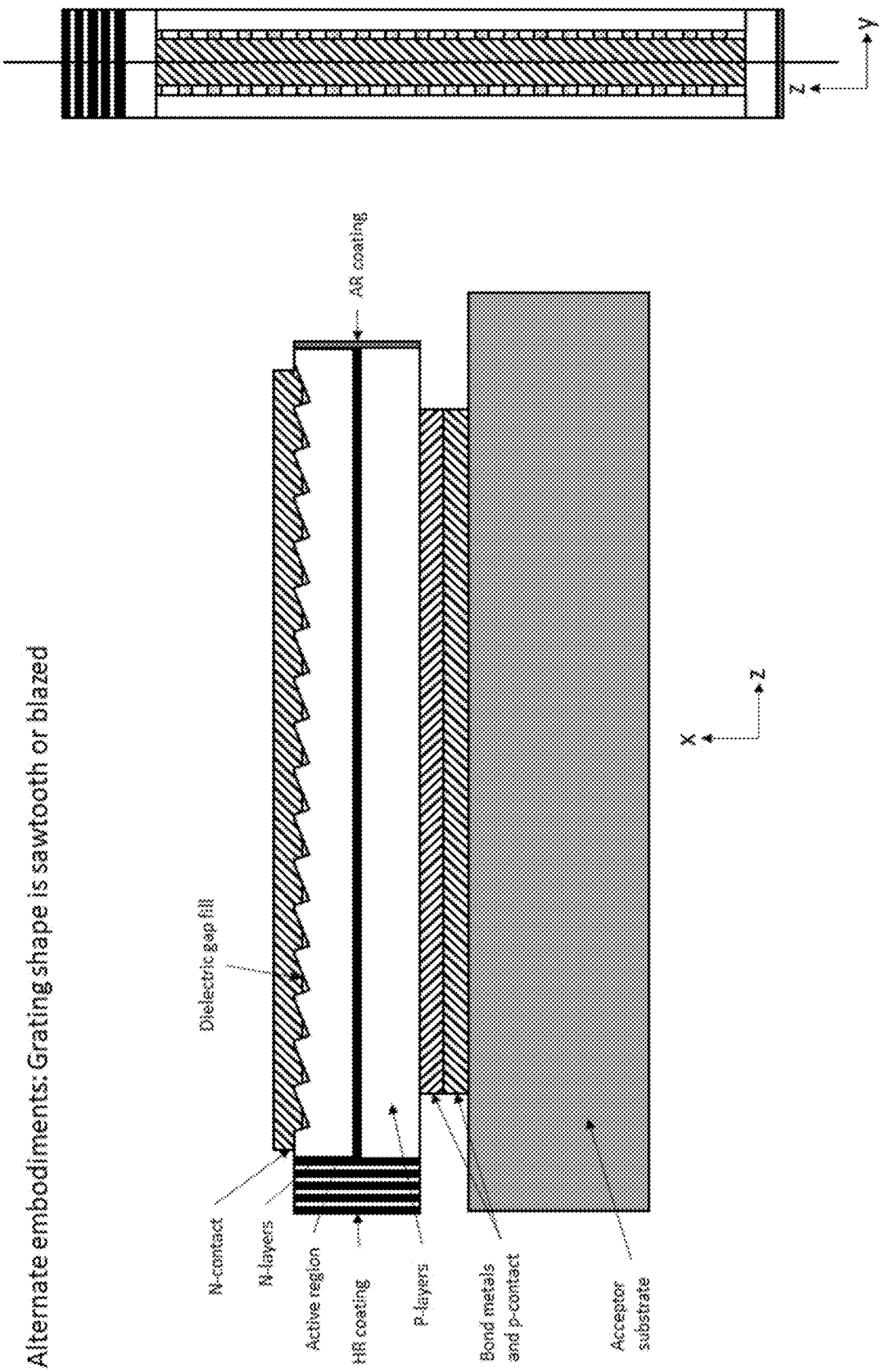
FIG. 19 is a simplified cross-sectional and plan view of an exemplary DFB laser in accordance with an embodiment.
Figure 20:
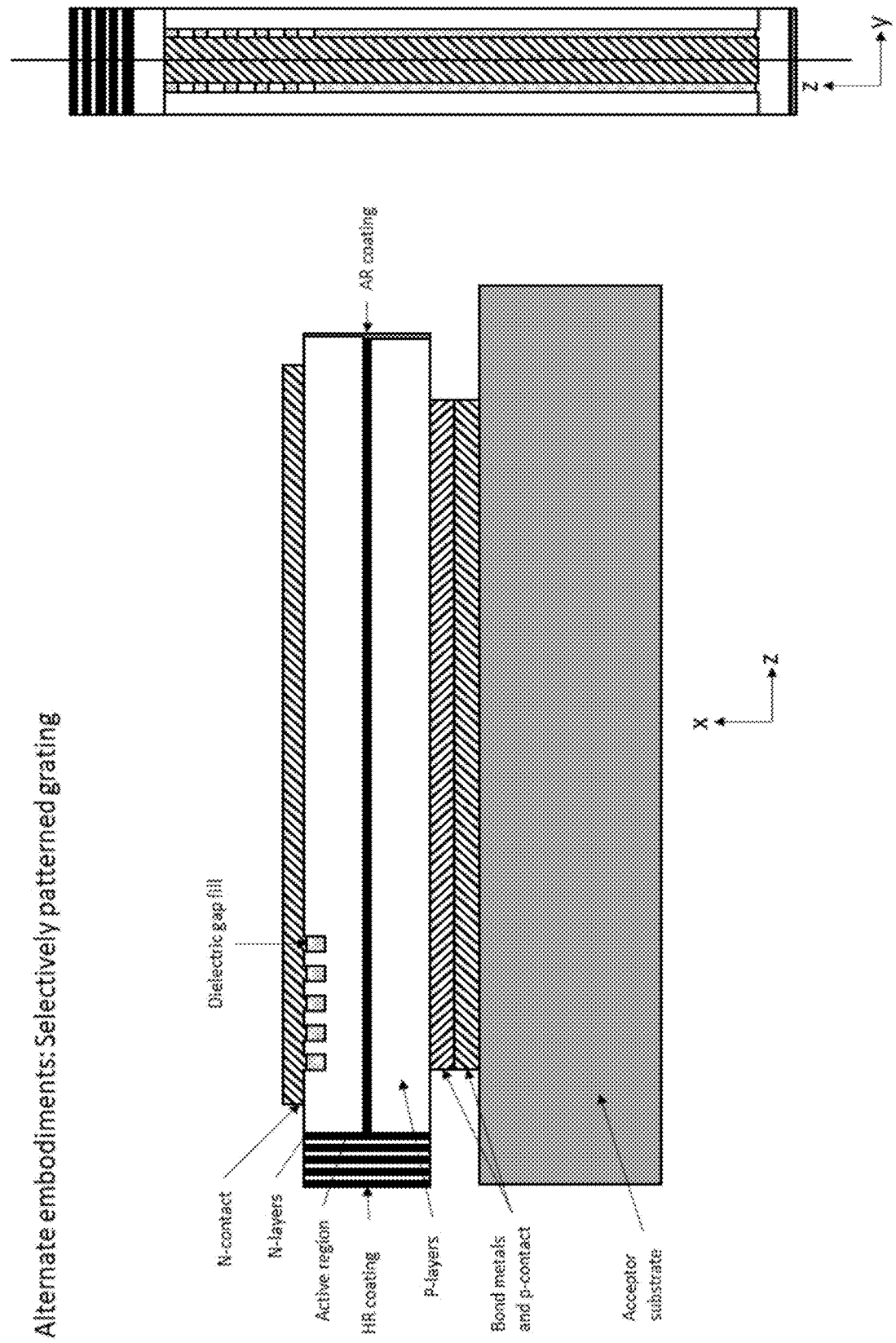
FIG. 20 is a simplified cross-sectional and plan view of an exemplary DFB laser in accordance with another embodiment.

In some embodiments the gratings comprise a square or binary shaped profile. In other embodiments the gratings comprise a sinusoidal shaped profile. In yet other embodiments the gratings comprise a saw tooth shaped profile or a triangular shaped profile. Of course, these profiles are merely examples and there could be many other grating profiles within this invention. In some embodiments, the gratings are a blazed type of grating. In other embodiments or in the same embodiments, the gratings are chirped gratings where the period of the grating changes along the ridge waveguide. In some embodiments, the gratings are apodized or spatially varied in the lateral dimension. The grating need not be patterned over the entire lateral ridge waveguide. In some embodiments the grating is selectively patterned in one, or several, portions of the waveguide. FIG. 19 shows one embodiment with a blazed or saw-tooth shaped grating and gap fill dielectric. FIG. 20 shows one embodiment with a selectively patterned grating only present over a portion of the ridge waveguide.

The shape of the grating, etch depth of the grating, duty cycle of the grating, period of the grating, materials the gratings are formed in, and the vicinity of the grating to the optical mode traversing the cavity all play a strong role in the optical feedback provided by the grating. Therefore, careful design and process to achieve the proper grating structure is key to some embodiments. There are many such combinations of these different variables that can be deployed to achieve the desired effect in the laser diode device.

Figure 21:
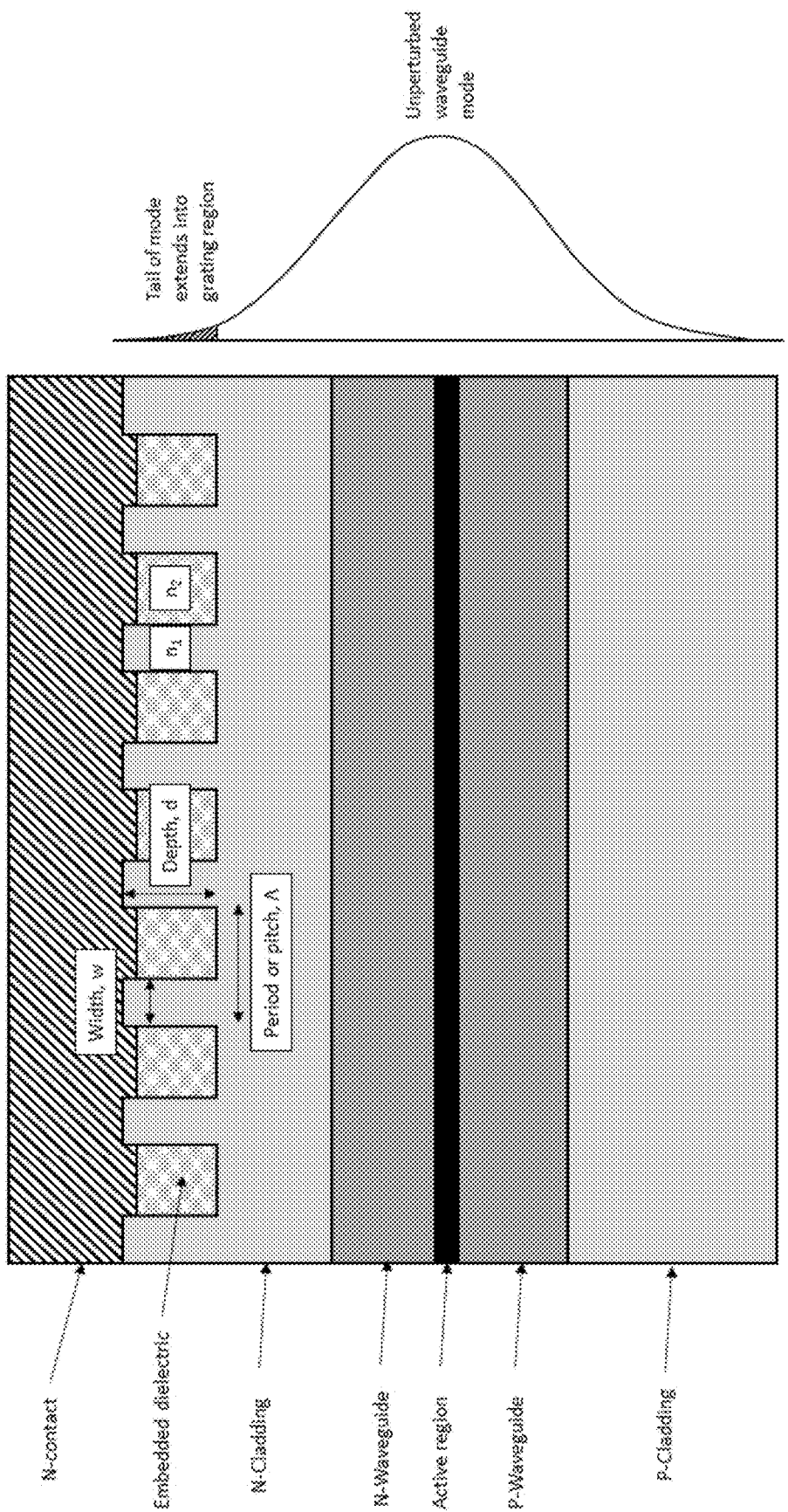
FIG. 21 is a simplified cross-sectional view of an exemplary DFB laser in accordance with an embodiment.

FIG. 21 shows various key dimensions of the grating. The transverse epitaxial waveguide is shown as a separate confinement heterostructure. The high index of refraction active region is encapsulated with a p-type and n-type waveguiding layers of lower index of refraction, which are themselves encapsulated in a p-type and n-type cladding with even lower index of refraction. An approximate unperturbed waveguide optical mode is depicted to the right to show the extension of the mode into the grating. The pitch or period of the waveguide, A, as well as the etch depth, d, and the width, w, are labeled. The duty cycle is the ratio of the width to the period. As mentioned above, in some embodiments, the width or period does not remain constant across the ridge. The etch depth as well as the index of refraction difference between the materials ($n_1$ and $n_2$) both contribute to the contrast in effective index between the etched and unetched region. This contrast determines the optimal duty cycle of the grating, the coupling of the grating with the lasing mode and various laser performance parameters.

The epitaxial structure shown in FIG. 21 is just representative of a single embodiment. In other embodiments, the p-cladding is replaced completely or in-part with a dielectric or transparent conducting oxide. In other embodiments, the n-cladding is replaced completely or in-part with a dielectric or transparent conducting oxide. In other embodiments, the waveguiding layers are asymmetric in either thickness or composition. In other embodiments still, one or both waveguides are completely omitted. The epitaxial structure may contain multiple interlayers for reasons such as electron blocking, contact formation or strain reduction.

In an alternate embodiment no intentional filler material is deposited in the etched portion of the grating regions. In such an embodiment the index contrast between the unetched and the etched portion of the grating region can be maximized with the etched region having an index of air to provide maximum feedback to the optical field in the cavity of the laser diode.

In an alternate embodiment, the gaps may be filled with a dielectric material which is extremely porous to maximize index contrast. In addition, the gap fill process can be designed to intentionally create voids in the material so the effective index of the gap can be a ratio of air/dielectric.

Figure 22:
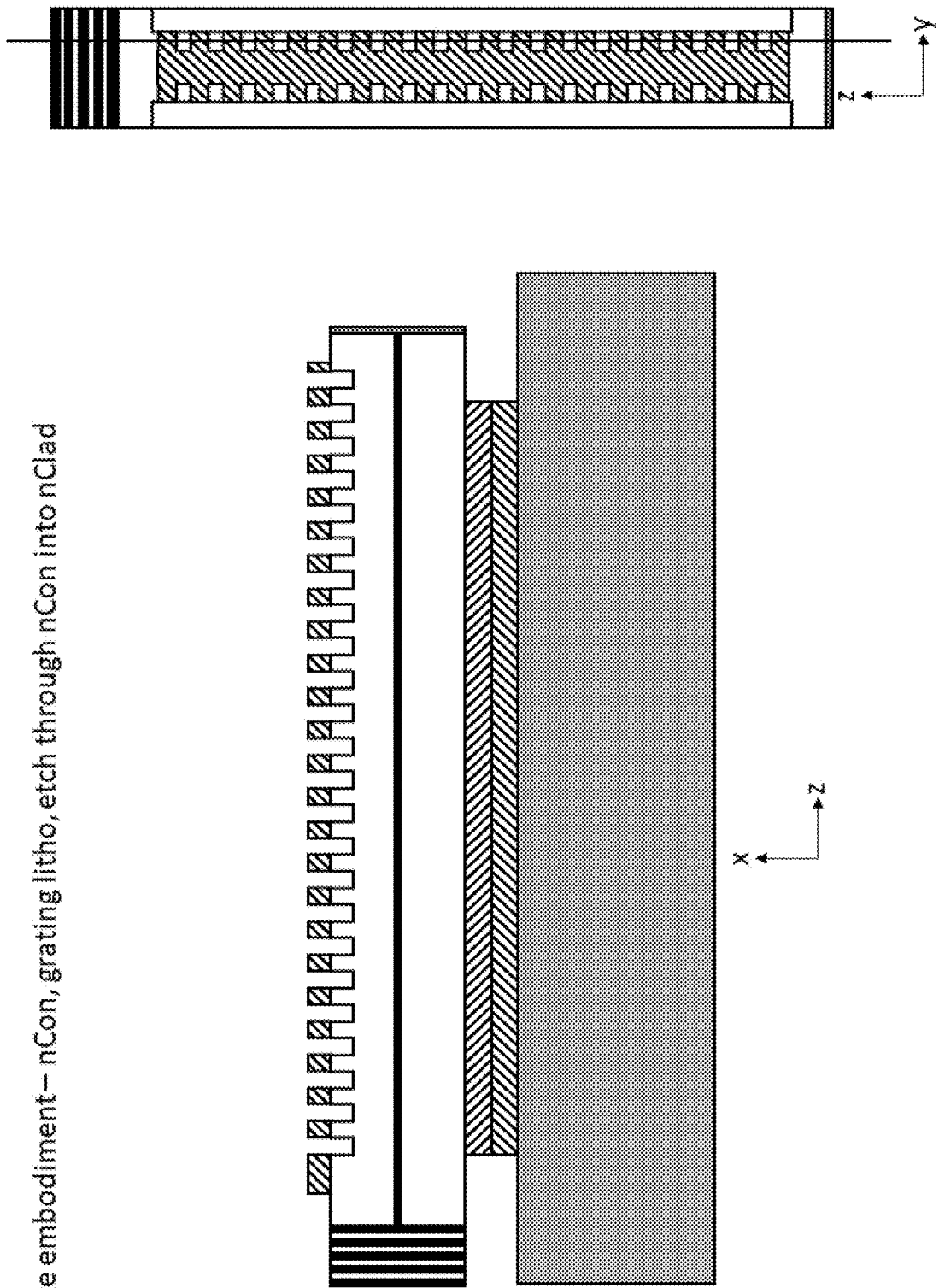
FIG. 22 is a simplified cross-sectional and plan view of an exemplary DFB laser in accordance with another embodiment.

In an alternate embodiment shown in FIG. 22, the n-contact metal is deposited before the grating is patterned. The grating is then patterned and a Cl- or Ar-based dry etch is used to etch through the n-contact metal. The Cl-based etch continues through the metal into the n-cladding layer. As in the previously described embodiments, the grating may be left with air-gaps or gap-filled with a dielectric material. In this embodiment, a stripe in the center of the ridge is left unetched to allow for a pad metal to connect to the n-contact metal.

Figure 23:
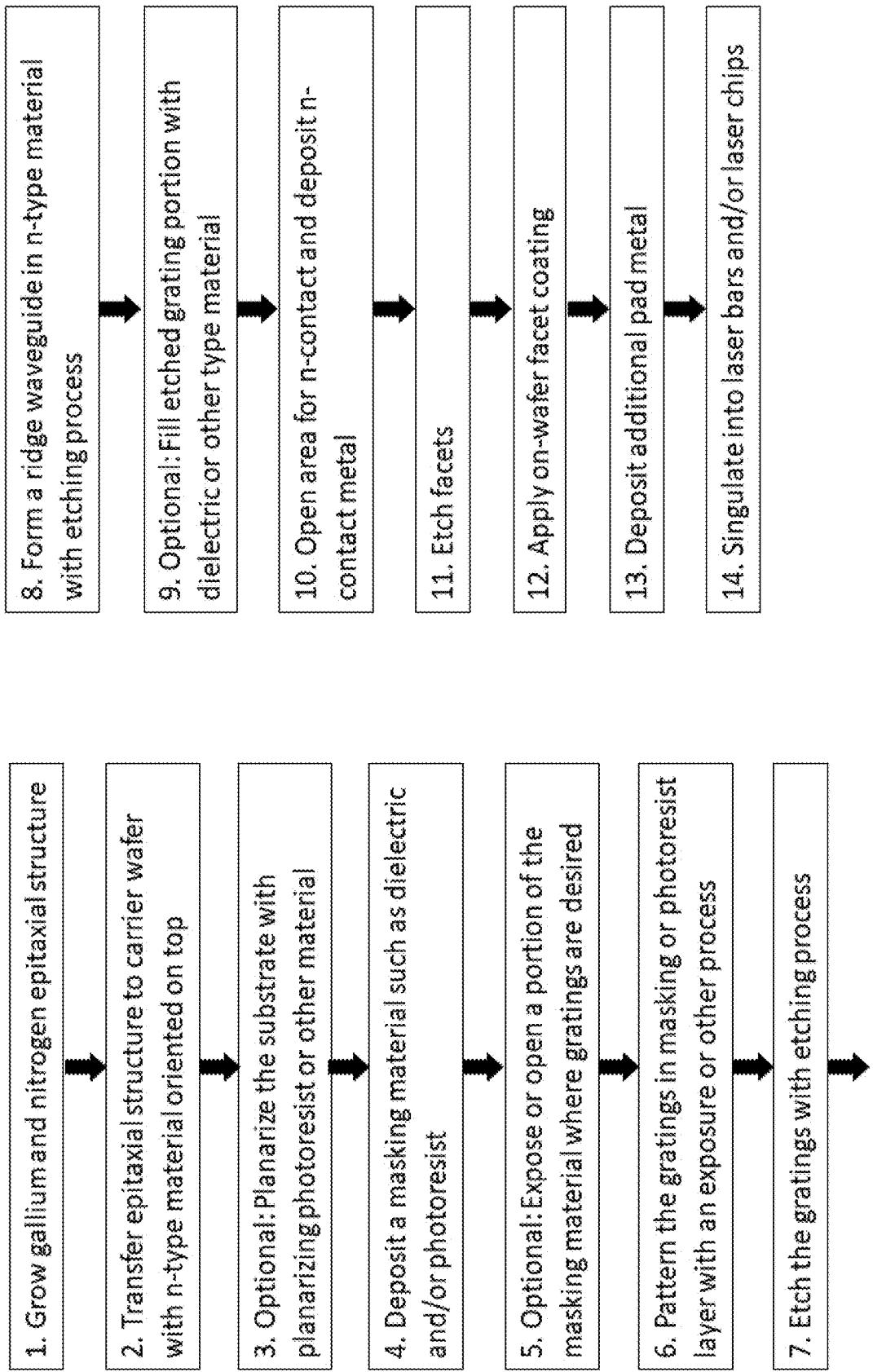
FIGS. 23-25 provide simplified process flows for forming DFB laser devices in accordance with some embodiments.

The order of the ridge etch and grating etch may be switched. In an alternate embodiment, the lateral ridge waveguide is formed after a grating is etched. This process flow is approximated in FIG. 23.

Figure 24:
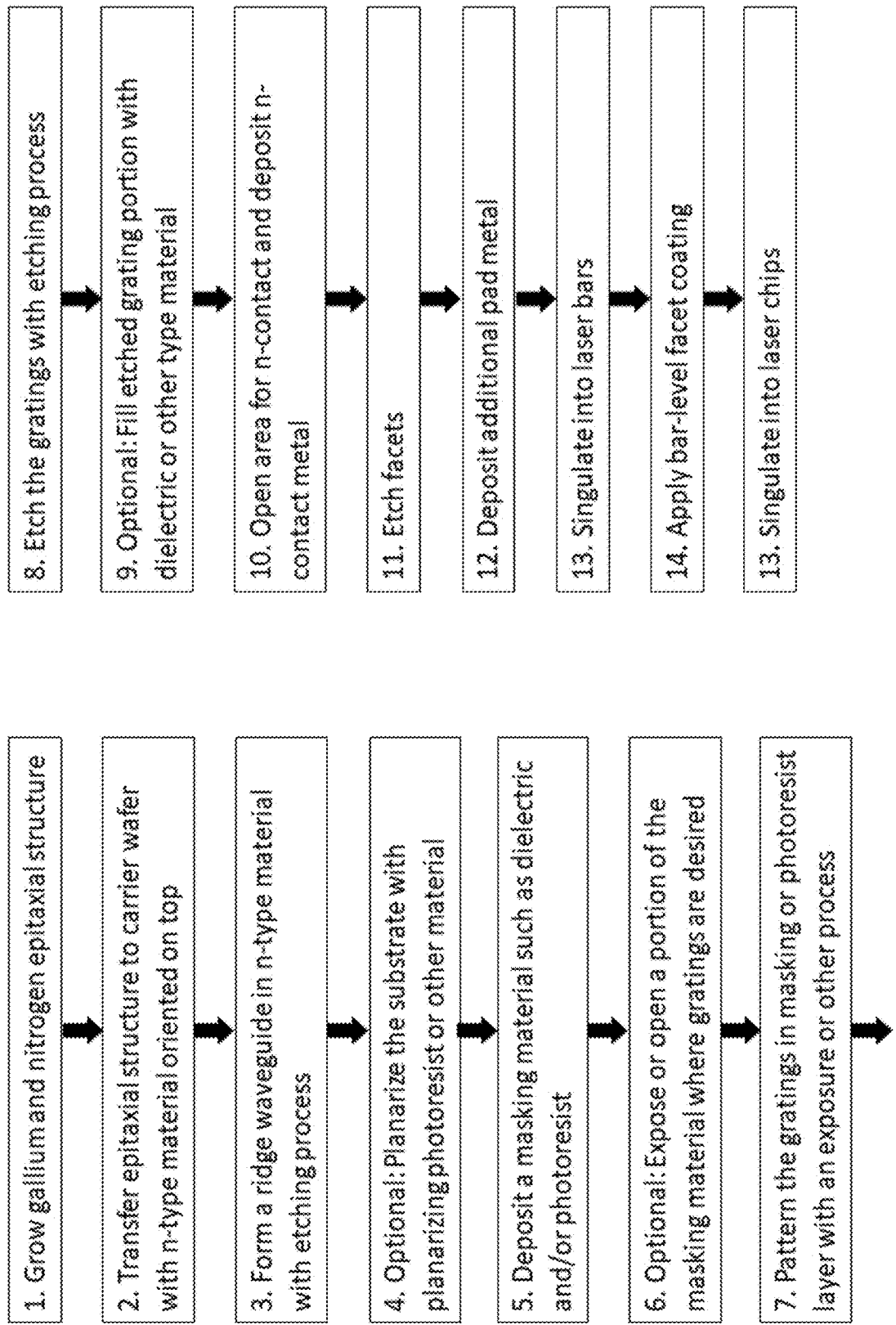
Figure 25:
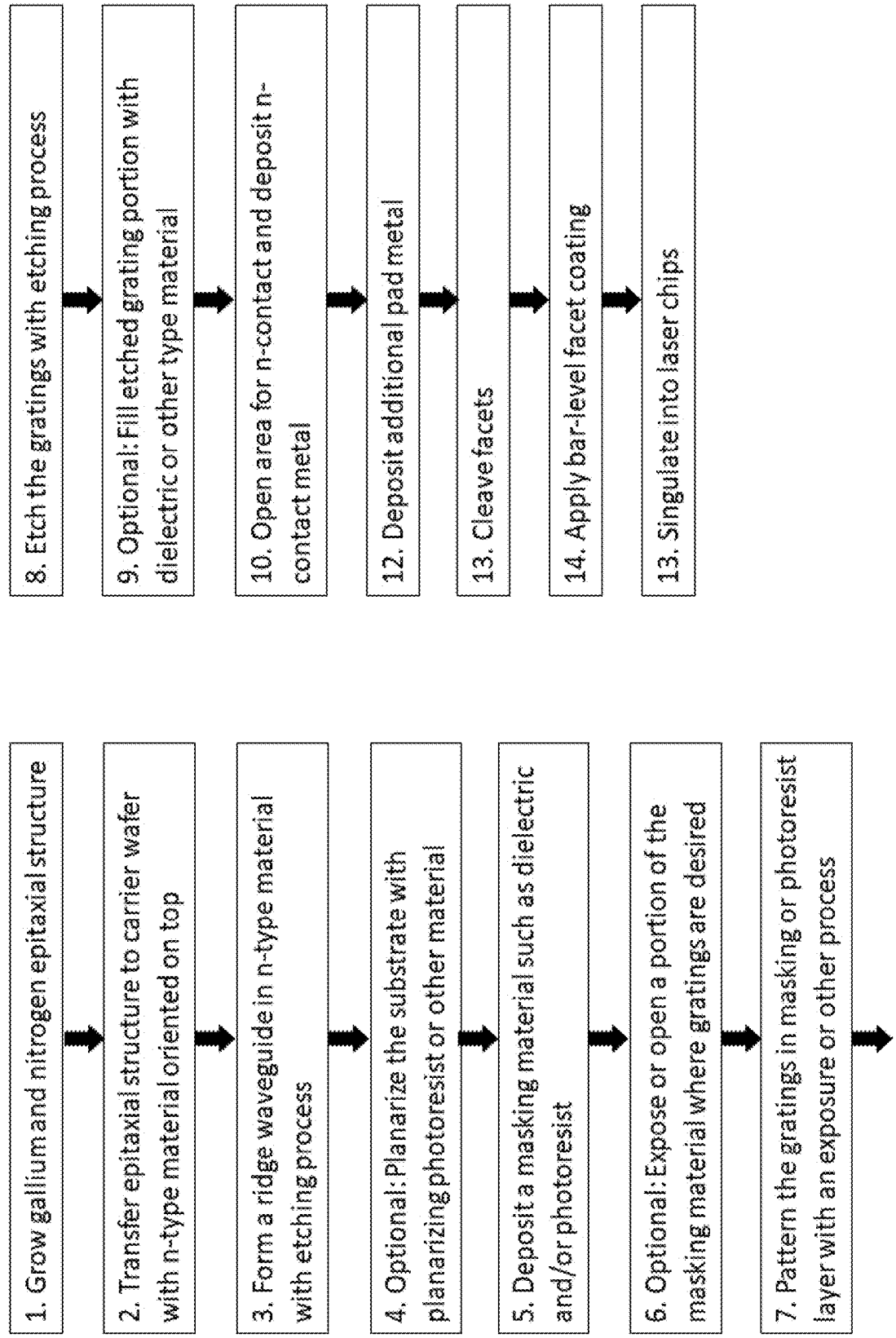

As previously described, the facets may be formed by etching and an on-wafer coating is applied. The facets may be etched together or one at a time. The facet coating may be applied to both facets or individually. A single facet may be etched and coated before etching the opposite facet. In an alternate embodiment, a bar-level facet coating is applied as shown in FIG. 24. In this process, the facets are etched, pad metal is deposited, and the wafer is singulated into laser bars. The bars are then coated using a bar-stacking method and, depending on application, may be singulated into laser chips. In another embodiment described in FIG. 25, the facets are cleaved. In yet another embodiment, facets are created by mechanical polishing.

Gap fill can be dielectric, TCO, metal, or any other material with a distinct index of refraction from the cladding material in accordance with some embodiments. For example, the gap fill may be binary (cladding material and dielectric, for example) as depicted in the figures or have several materials. For example, keyholing may be present in gap fill. In this process, the fill material coalesces during deposition at the corners of the grating first, leaving air gaps enclosed in the fill material. The structure described has three different materials interacting with the optical mode: the cladding, fill material and air. In this structure, the grating consists of three different indices of refractions with one period consisting of cladding, fill material, air, and fill material.

Figure 26:
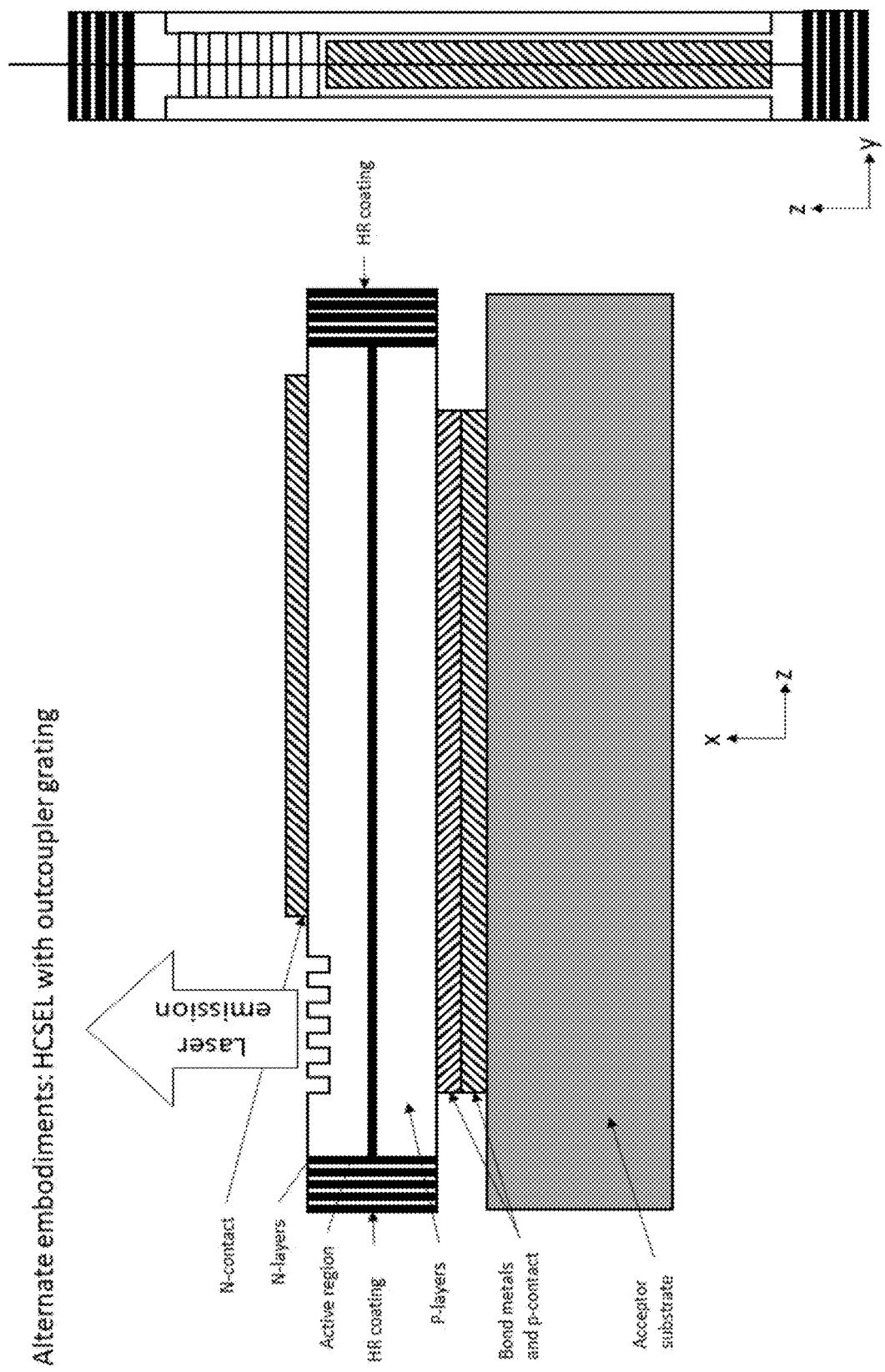
FIG. 26 is a simplified cross-sectional and plan view of an exemplary HCSEL in accordance with an embodiment.

In one embodiment, the grating may be second order, fourth order or higher even order. Even order gratings can couple light into and out of the plane of the grating. This grating is selectively patterned to one area, or several areas, of the cavity. In an embodiment, the facets are both HR coated. The even order grating is designed to outcouple light. In this configuration, the emission direction of the laser is out of the plane of the device while the lasing cavity is in the plane of the device as a horizontal cavity surface emitting laser (HCSEL). An exemplary HCSEL device with selective grating is shown in FIG. 26.

Figure 27:
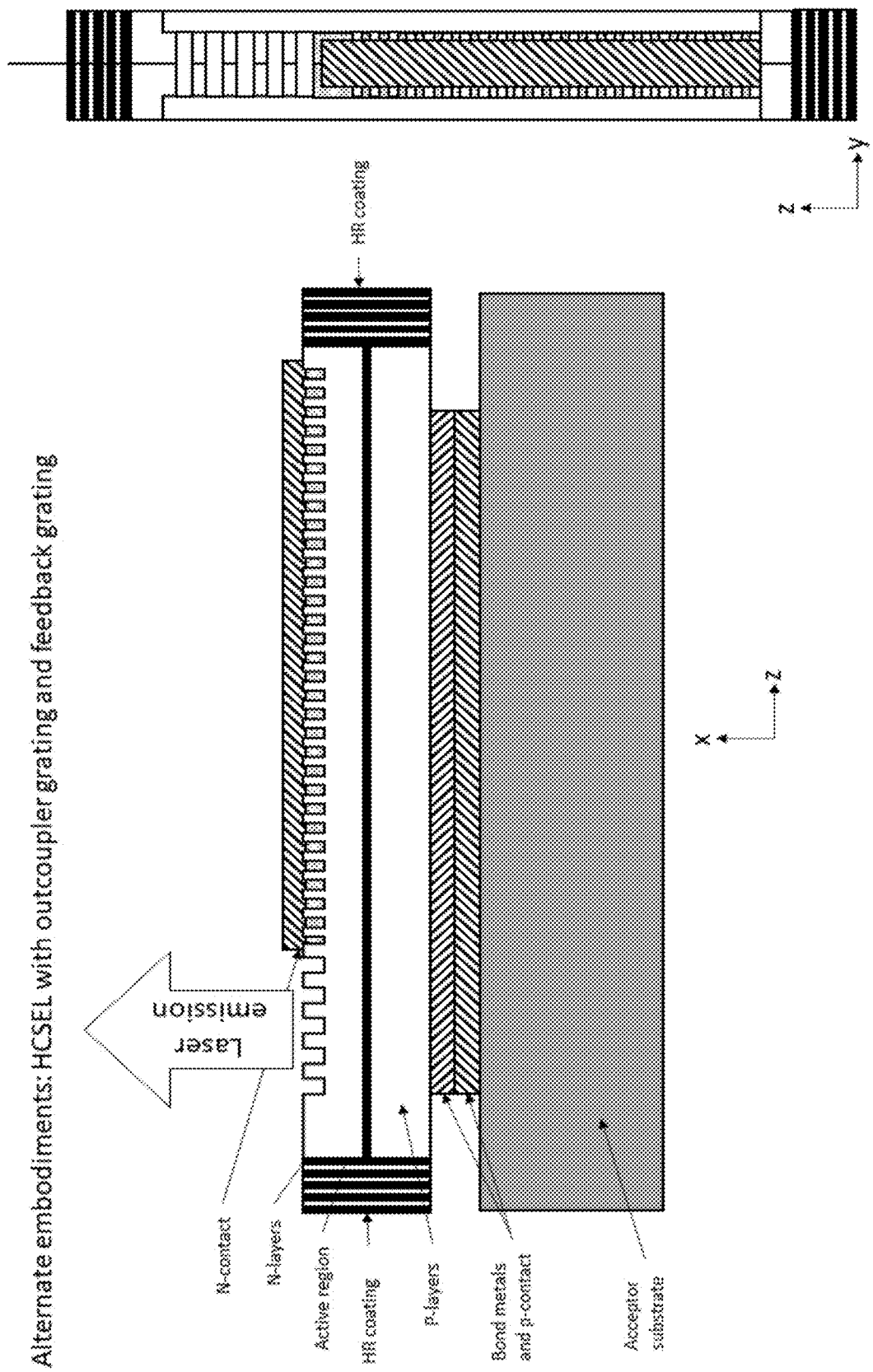
FIG. 27 is a simplified cross-sectional and plan view of an exemplary HCSEL with multiple grating pitches in accordance with an embodiment.

Multiple grating pitches may be used across the laser cavity. For example, in another embodiment, a first order grating may be patterned across most of the cavity to provide the feedback to achieve single frequency operation, while a second order grating acts to outcouple the light to form the laser beam. In another embodiment, a third order grating provides feedback while a fourth order grating outcouples light. Any grating order may be used. These gratings may be independently designed with separate pitch, duty cycle, etch depths and fill materials. An example is shown in FIG. 27.

Figure 28:
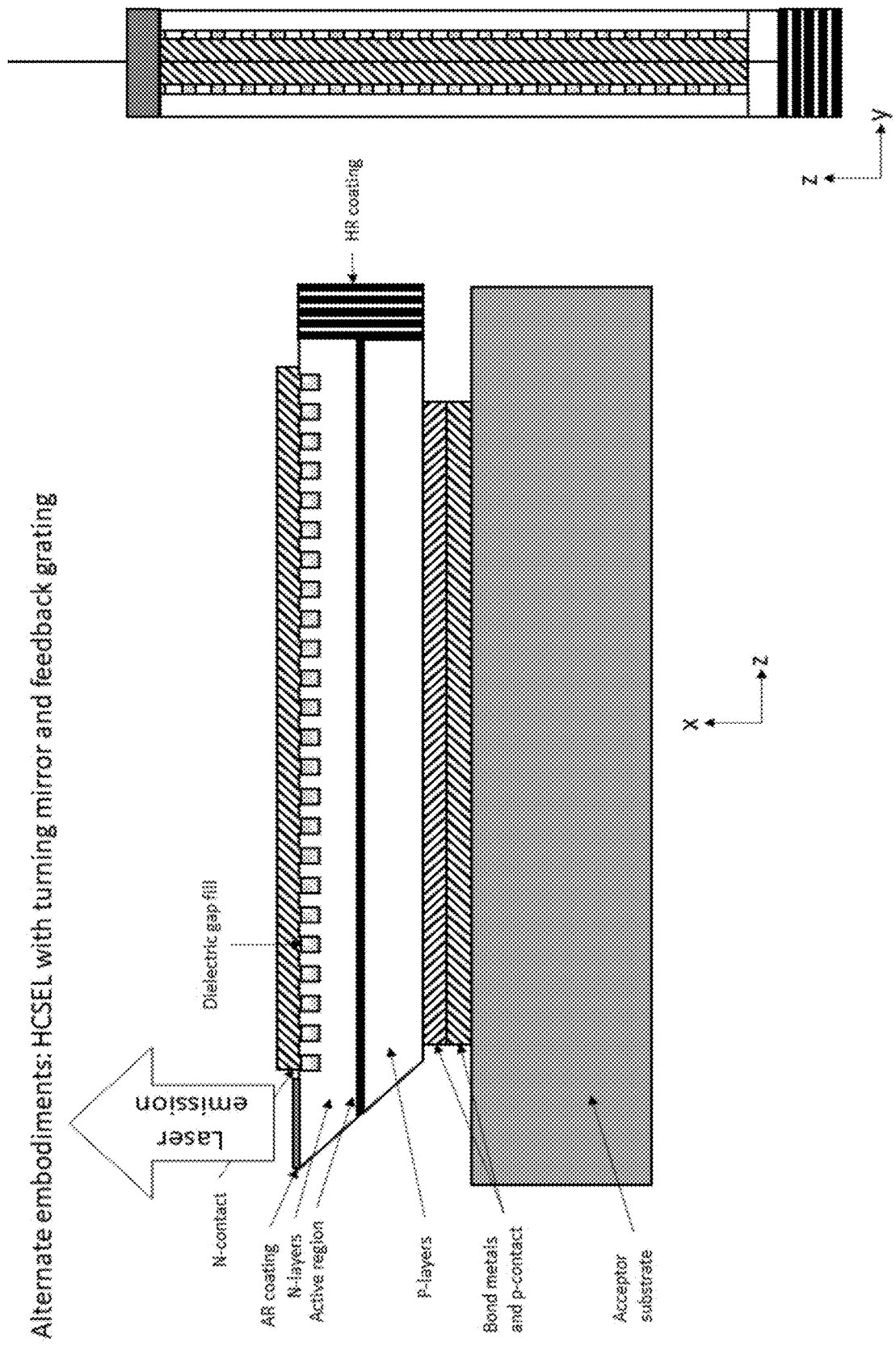
FIG. 28 is a simplified cross-sectional and plan view of an exemplary HCSEL with a turning mirror in accordance with an embodiment.

In another embodiment, a grating may provide feedback for single frequency operation while a turning mirror allows for surface emission. In this embodiment, one facet is etched intentionally at an angle, such that internal reflection turns the light to emit towards the surface or at an angle. This facet may be HR coated. An AR coating is placed at the surface through which emission occurs. This turning mirror may turn the light so that it emits downwards towards the substrate, sideways in the plane of the substrate, or upwards for surface emission. In yet another embodiment, both facets are angled to emit from the surface. An example is shown in FIG. 28.

In some embodiments, planarization of the substrate enables fine line lithography for the grating and single-mode ridge definition. Without planarization, the thick photoresist needed to achieve mesa coverage and resist nonuniformity from the topology may make resolving features in the hundreds of nanometers difficult.

In planarizing the substrate, the change in height across the topography is reduced. This topography may be the bonded mesas and the acceptor substrate surface or any other features present. The change in height may be reduced in one or several areas of the substrate, called local planarization. The change in height may be reduced across the entire substrate, called global planarization. The substrate may have various amounts of planarization locally or globally. The change in height may be reduced by different amounts, using different methods, or in a non-uniform way across the substrate.

The planarization used may be temporary and last for only one lithography step. The planarization used may be semi-permanent and be retained through one lithography step, two lithography steps, or three or more lithography steps. The planarization may be permanent and be retained throughout the entire remaining process. The substrate may be planarized immediately after epi-layer bonding or at any subsequent step, such as immediately before grating lithography. Several planarization steps may be used in the process. In some embodiments, planarization is completely omitted. Planarization need not be used if sufficient lithographic resolution on the bonded mesas can be achieved without it.

Figure 29:
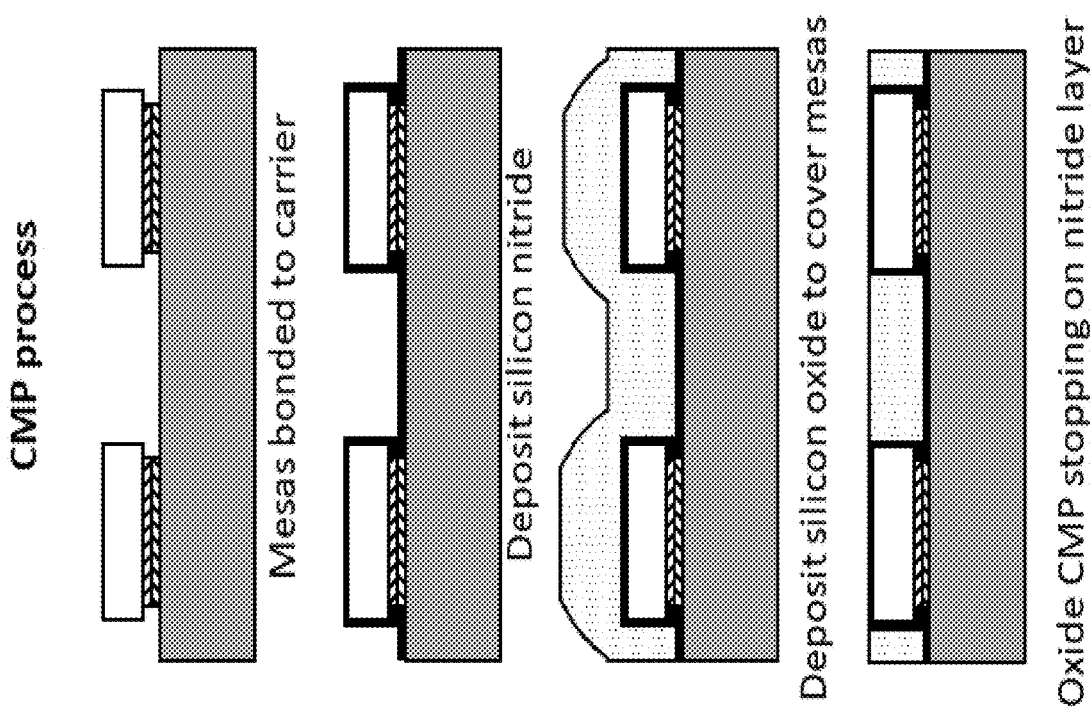
FIGS. 29-30 provide simplified planarization process flows in accordance with some embodiments.

In one embodiment, planarization is achieved after mesa bonding by use of a silicon oxide fill, silicon nitride stop layer and chemical mechanical polishing (CMP). After bonding the epi-layer mesas, silicon nitride is deposited as a stop layer. Thick silicon oxide is deposited to cover the mesas and over-fill the trenches. The oxide layer may be deposited by any method. In one embodiment, it is deposited by chemical vapor deposition with tetraethyl orthosilicate (TEOS) as the source. In other embodiments, the oxide is deposited by plasma-enhanced chemical vapor deposition or low-pressure chemical vapor deposition. In other embodiments, it is deposited by sputtering. The wafer is then put through an oxide CMP process that stops at the nitride layer. An example is shown in FIG. 29. The nitride layer may then be selectively or blanket removed by dry etch or wet etch. The nitride layer may be used as a hard mask for subsequent ridge etch, grating etch, or other process step. In other embodiments, the fill material may be nitride, oxide, polymer, or some combination of these materials. The stop layer may be nitride, oxide, metal, polymer or may be omitted. The CMP step may stop at the stop layer material or stop above it or the mesa. An additional dry or wet etch of the fill or stop material may be used to finish planarization. In one embodiment, no stop layer is used, and the CMP planarization is stopped above the mesa height. A blanket dry etch is then used to expose the mesas.

Figure 30:
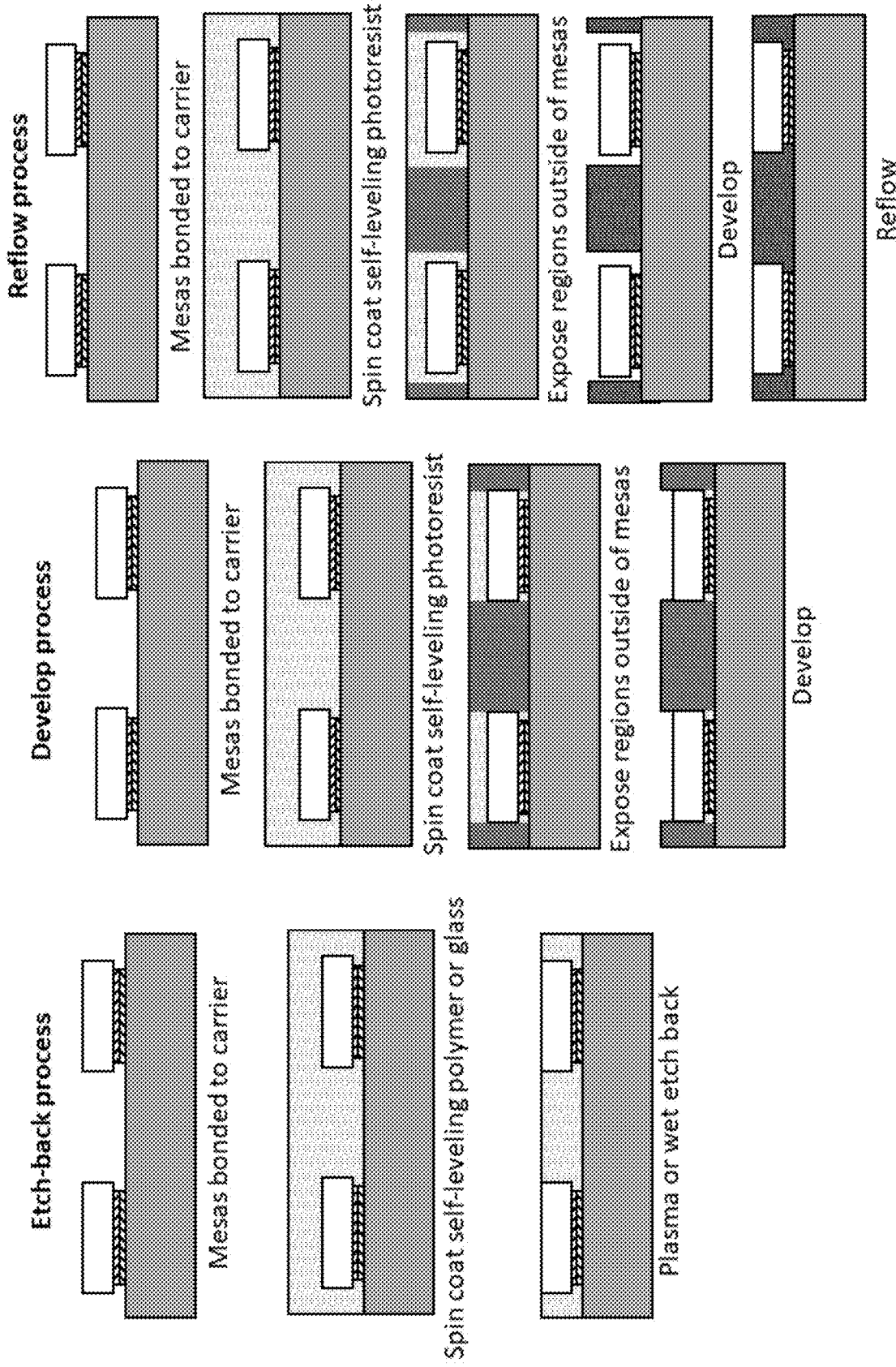

In other embodiments, spin-on materials are used. These materials may be self-leveling to enhance planarization. The material may be glass or polymer and may be photoactive. In one embodiment, a spin-on glass, such as HSQ is used. The spin-on glass is then baked, and blanket etched back using a F-based dry etch to expose the mesas and finish planarization. In another embodiment, the spin-on glass is wet etched back using HF-based wet etch to expose the mesas and finish planarization. In another embodiment, the spin-on material is a polymer, such as a photoresist. The polymer is then dry-etched with an 02-based plasma etch to expose the mesas and planarize. In another embodiment, the polymer is wet etched with a TMAh-based developer. In another embodiment, the polymer is negative and exposed in regions outside of the mesas and developed. In another embodiment, the polymer is positive photoresist and exposed in regions inside the mesas and developed. In another embodiment, the polymer is negative photoresist and exposed in regions outside of the mesas, developed and then reflowed with a bake process. In another embodiment, the polymer is positive photoresist and exposed in regions in within the mesas, developed and then reflowed with a bake process. Exemplary process flows are provided in FIG. 30.

Other architectures than HR/AR or AR/AR coated DFB may be fabricated in accordance with some embodiments. The use of gratings for feedback may reduce, or in some cases eliminate, the need for high quality facets commonly used in fabry-perot laser diodes. Laser performance and lifetime are typically both sensitive to facet roughness, verticality and contamination making the facet etch, handling and coating steps important for device yield. Eliminating the need for these steps improves ease of device fabrication and yield.

Figure 31:
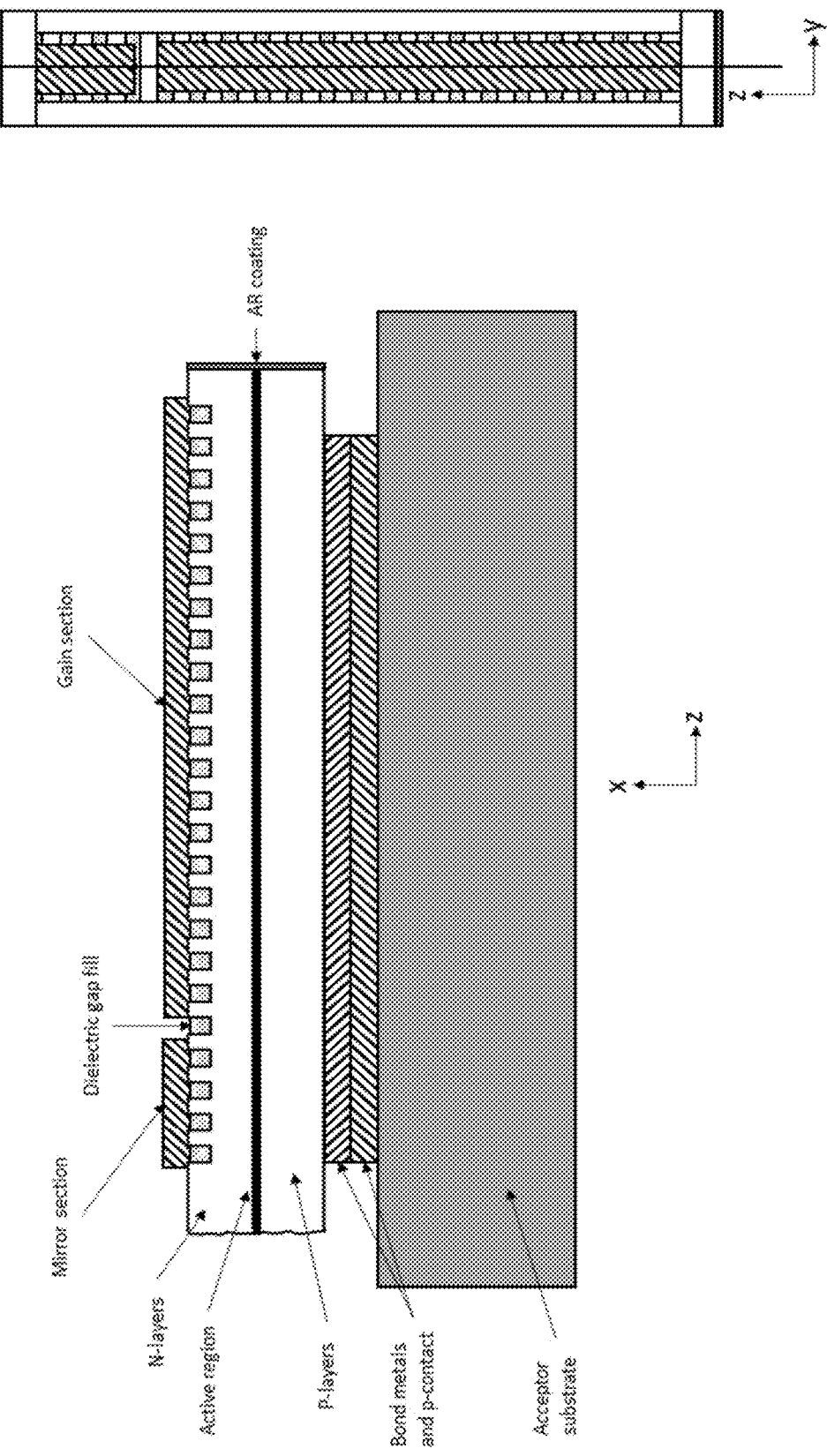
FIGS. 31-32 are simplified cross-sectional and plan views of exemplary laser devices without back facets in accordance with some embodiments.

In one embodiment, the need for a high-quality back facet is eliminated. In this embodiment, the top n-contact is separated into two sections, a mirror and gain section. The gain section is operated as normally to control laser output power. Current is injected into the mirror section to reduce the loss introduced by the quantum wells in this section. This embodiment incorporates aspects of both a DFB and DBR laser, where the back DBR mirror is pumped to eliminate the need for active/passive integration. This embodiment trades efficiency in the power lost to pumping the mirror for the processing ease of not having to fabricate an HR-coated facet or include active/passive integration. An example is provided in FIG. 31.

Figure 32:
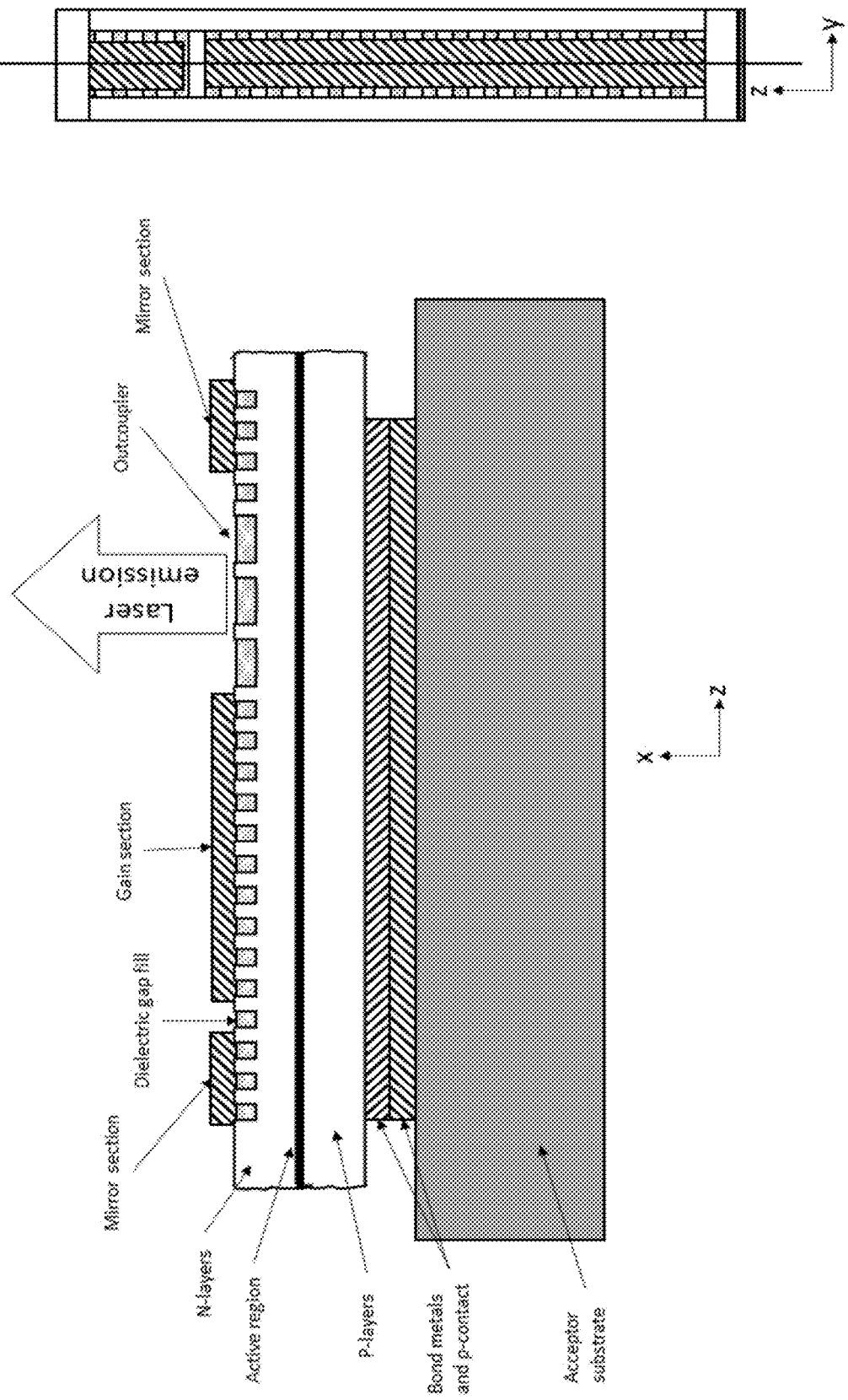

In another embodiment, the need for high-quality back facets is completely eliminated. In this embodiment, the top n-contact is further separated into front and back mirror section as well as a gain section. Both front and back mirror sections are pumped to reduce loss and eliminate the need for active/passive integration. To get light out, an even order outcoupler is employed in the cavity. This embodiment further trades efficiency for completely eliminating the need for high quality facets. An example is provided in FIG. 32.

DFB lasers are usually symmetric and emit light equally from both sides. HR coating the back facet, as is typical for a Fabry-Perot laser, fixes this but introduces a yield and wavelength instability issue since the phase of the reflection from the HR coated facet cannot be controlled. The reflection from the HR facet may add in-phase, out of phase, or somewhere in-between creating uncertainty in device performance and lasing mode. To increase yield and device stability, reducing feedback in the cavity not from the grating can be important. To do this, both facets can be AR-coated. However, in this case, the AR/AR-coated DFB emits equally from both facets half of which may be completely unused.

Figure 33:
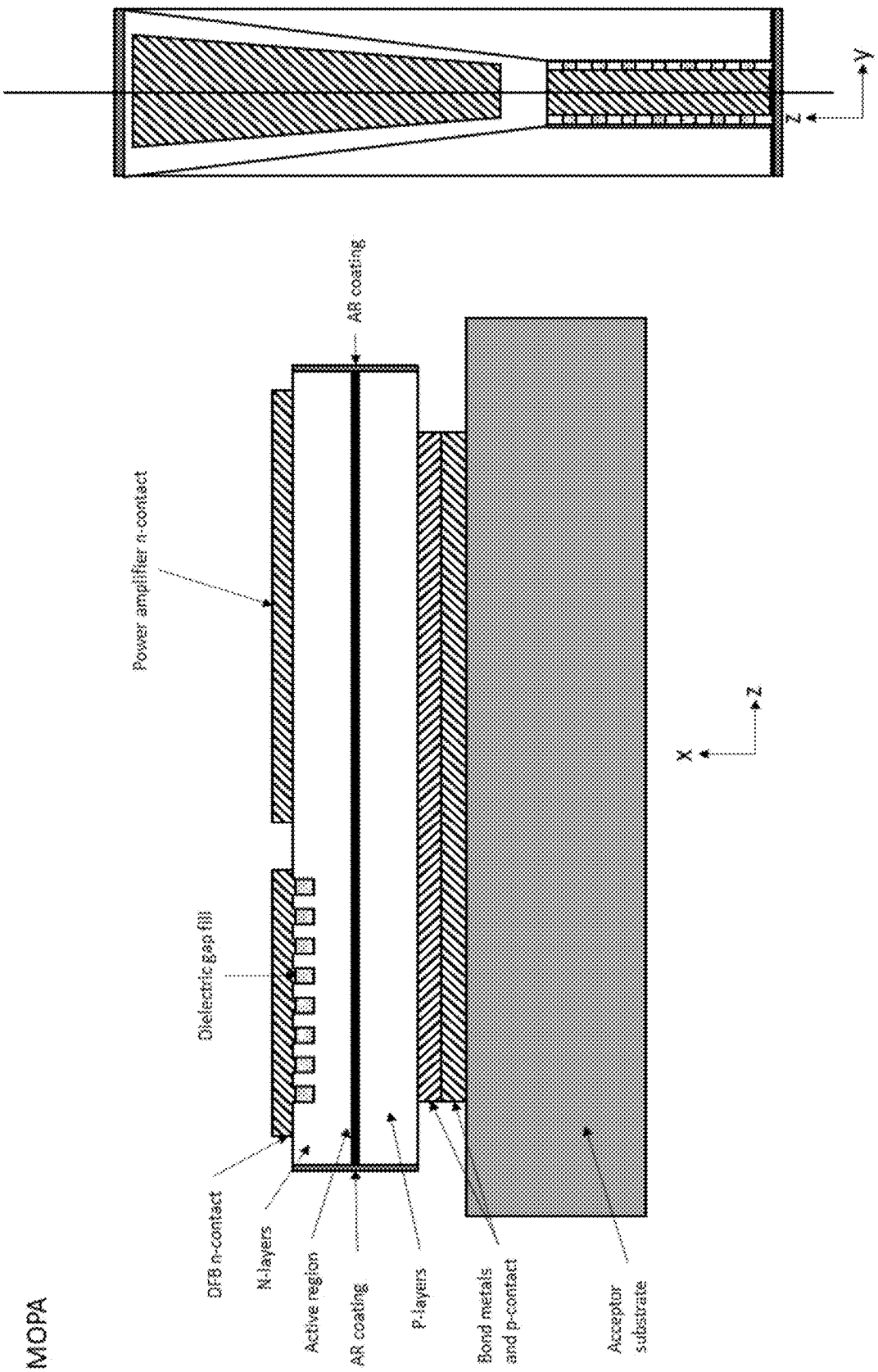
FIG. 33 is a simplified cross-sectional and plan view of an exemplary master-oscillator power amplifier (MOPA) device in accordance with an embodiment.

The master-oscillator power amplifier (MOPA) design gets around this by making the DFB operate at low power. At low power, only a small amount of light is lost out of the AR-coated back facet. Connected to the front facet is a semiconductor optical amplifier (SOA) or power amplifier. This is a section of gain material that does not have feedback from a grating or facet reflection. In this way, high power single-frequency output is achieved with relatively less light wasted from the back facet. An example is provided in FIG. 33.

In this embodiment, the fabrication processes remain similar to the previously described embodiments. The mesa is bonded to an acceptor substrate as previously described. In this embodiment, the grating window is defined over only a portion of the mesa. The ridge is defined to include a tapered section. In other embodiments, this section may be straight with no taper. The n-contact is split into two sections between the DFB and the tapered power amplifier to provide independent control. In other embodiments, the n-contact may be split into three or more sections to include one or two independently pumped mirrors.

The grating may be etched into the nitrogen and gallium containing layers or formed by another material on top of the nitrogen and gallium containing layers. Forming the grating in materials other than the nitrogen and gallium containing layers may provide benefits in manufacturability or optical mode confinement. In some embodiments, this material is a dielectric such as silicon dioxide, silicon nitride, aluminum oxide, aluminum nitride, titanium oxide, or titanium nitride. In other embodiments, this material is a transparent conducting oxide such as indium tin oxide or zinc oxide. In other embodiments, this material is a metal or stack of metals. In other embodiments, this material is a polymer. The grating may be formed by this material and air or by two or more different materials.

The transverse waveguiding ridge may be formed from the n-side of the device after transferring the epitaxial layers to the carrier. In other embodiments, the transverse waveguiding ridge is formed from the p-side of the device before transferring the epitaxial layers to the carrier. In some embodiments, this ridge is shallow-etched and does not penetrate through the active region. In other embodiments, the ridge is deeply-etched and does penetrate through the active region.

In one embodiment, the DFB is formed with a dielectric and air grating. A p-contact is formed with a transparent conducting oxide and the ridge is shallow-etched into the p-side of the device. Isolation dielectric is deposited and patterned so that current is only injected through the ridge. The epitaxial layers are transferred to a carrier wafer. The gratings are formed by deposition of a dielectric and patterned either by etching or a lift-off process. The n-contact metal is formed off-set from the ridge to inject current into the device laterally through the n-type nitrogen and gallium containing layers. The facets can then be formed.

In another embodiment, the grating is transparent conducting oxide and air. In this case, the metal may overlap the grating to give both lateral and vertical injection through the device.

In another embodiment, the grating is dielectric material and transparent conducting oxide. The dielectric grating is deposited and patterned. Transparent conducting oxide is then deposited over the dielectric, filling in the spaces. In this case, metal may be deposited over the ridge for vertical and lateral injection.

In another embodiment, the grating is formed by dielectric and nitrogen and gallium containing layers. The grating is etched into the nitrogen and gallium containing layers and then filled with dielectric. Metal is then deposited over the ridge to laterally inject current into the device.

Figure 34:
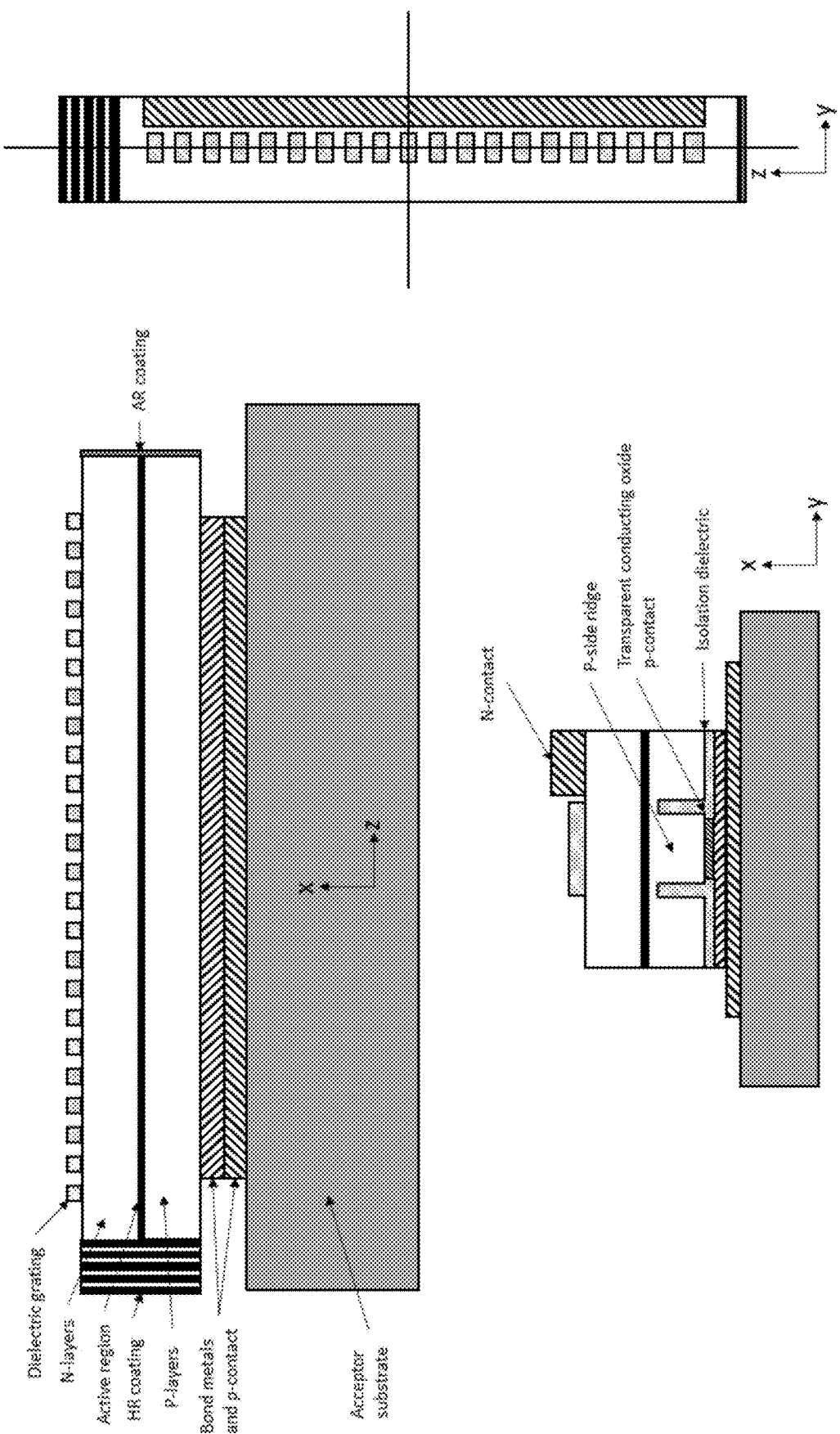
FIG. 34 is an example of a DFB with a dielectric grating in accordance with an embodiment.

FIG. 34 is an example of a DFB with a dielectric grating. The ridge is shallow-etched into the p-side of the device before transfer. The grating is formed by a dielectric material and air. The dielectric may be, for example, silicon oxide (e.g., SiO2), silicon nitride (e.g., SixNy), or a transparent conductive oxide (TCO) (e.g., indium tin oxide (ITO)). The n-contact may be off-set from the ridge to inject the device laterally.

Figure 35:
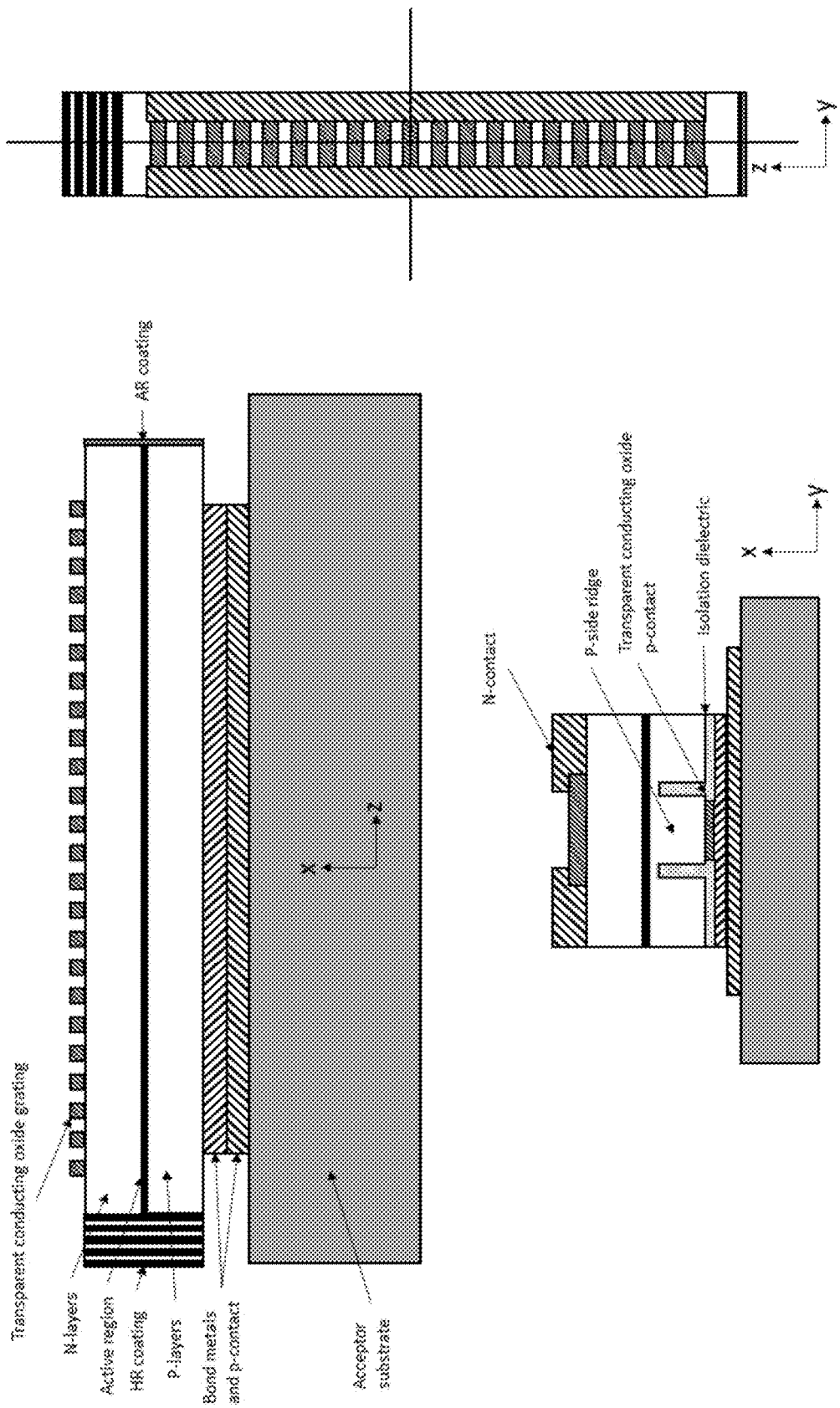
FIG. 35 is an example of a DFB with a transparent conducting oxide grating in accordance with an embodiment.

FIG. 35 is an example of a DFB with a transparent conducting oxide grating. The ridge is shallow-etched into the p-side of the device before transfer. The grating is formed by a transparent conducting oxide and air. The n-contact is formed by the grating material as well as by metal off-set from the ridge.

Figure 36:
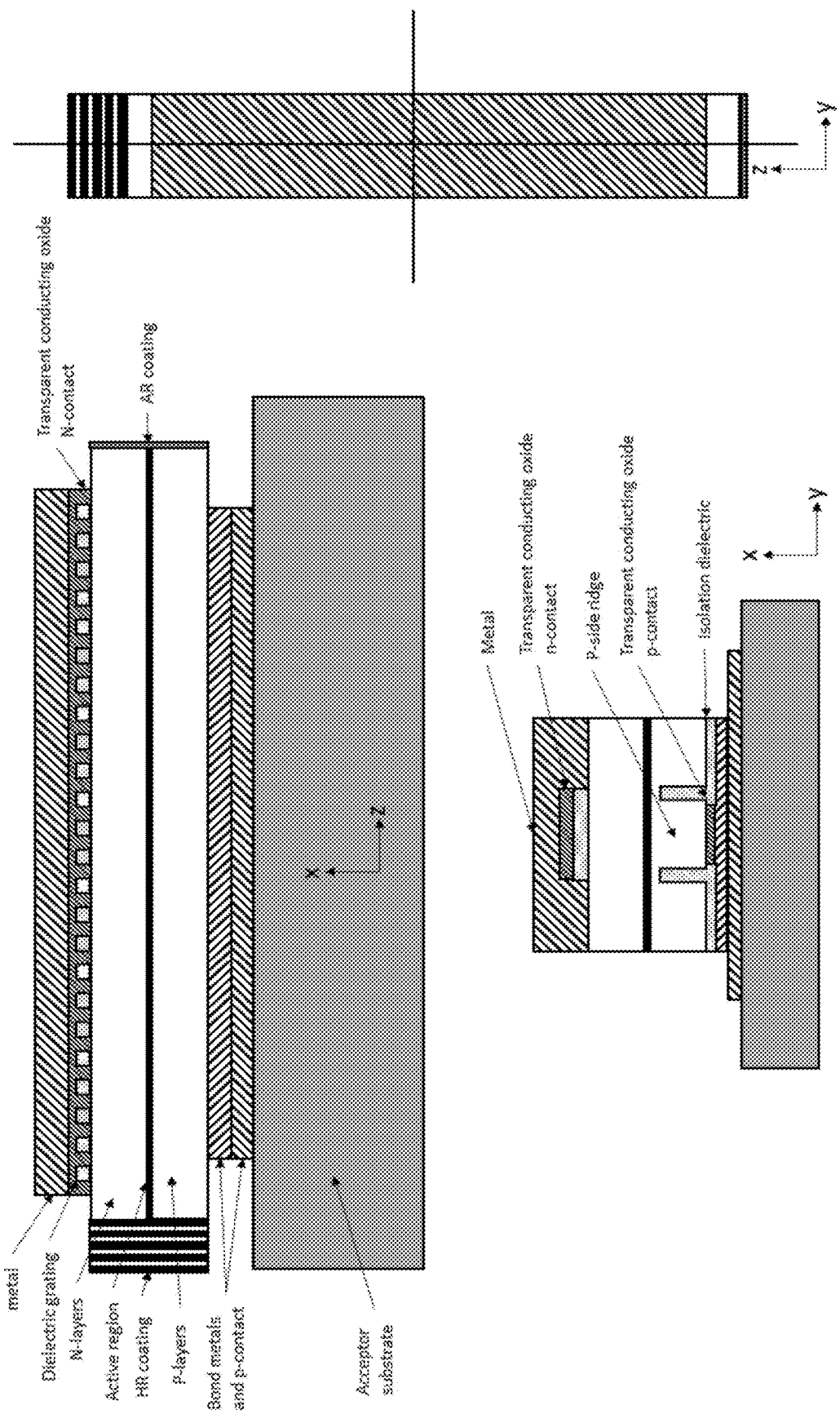
FIG. 36 is an example of a DFB with a transparent conducting oxide and dielectric grating in accordance with an embodiment.
Figure 37:
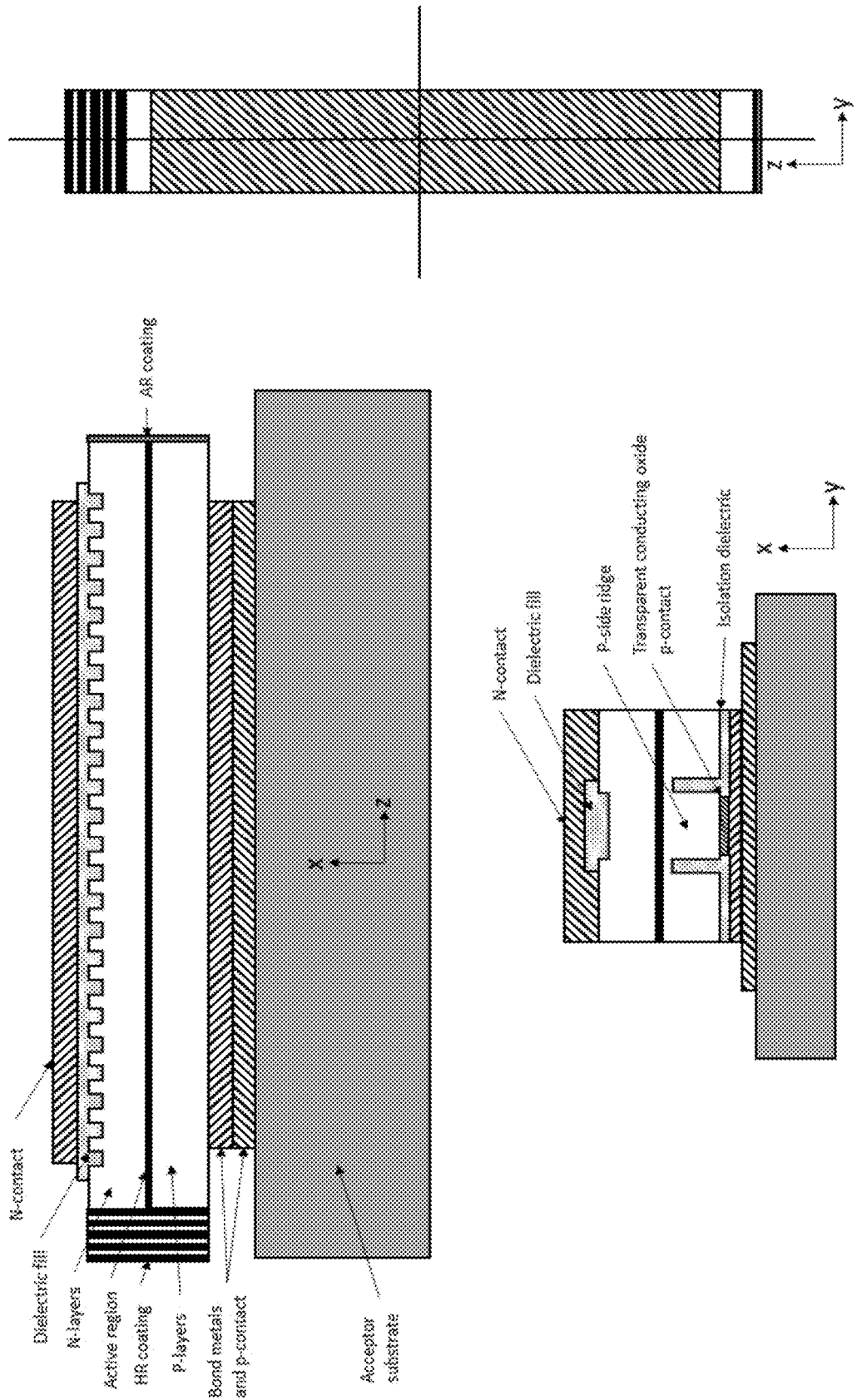
FIG. 37 is an example of a DFB with a dielectric grating in accordance with an embodiment.

FIG. 36 is an example of a DFB with a transparent conducting oxide and dielectric grating. The ridge is shallow-etched into the p-side of the device before transfer. The grating is formed by a transparent conducting oxide and a dielectric. The n-contact is formed by the grating transparent conducting oxide as well as by metal off-set from the ridge.

Example 37 is an example of a DFB with a dielectric grating. The ridge is shallow-etched into the p-side of the device before transfer. The grating is formed by a dielectric material and nitrogen and gallium containing layers. The n-contact is off-set from the ridge to inject the device laterally.

Figure 38B:
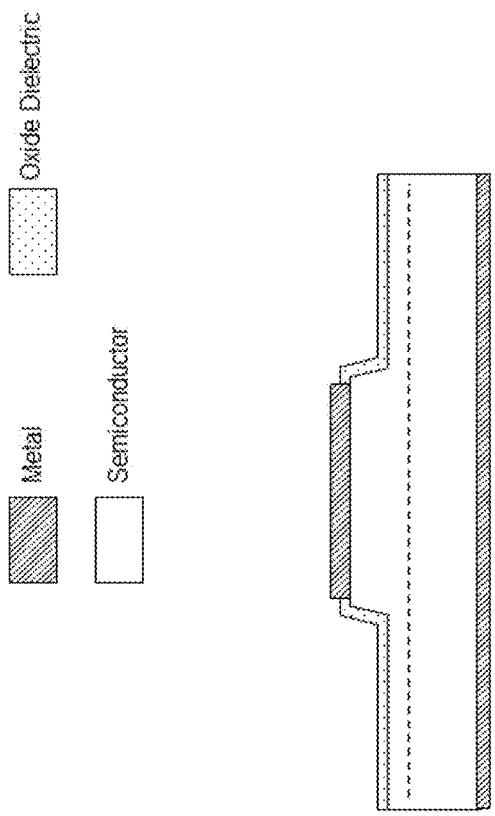
FIGS. 38(a)-38(b) are simplified cross-sectional views of a conventional laser diode structure.
Figure 38A:
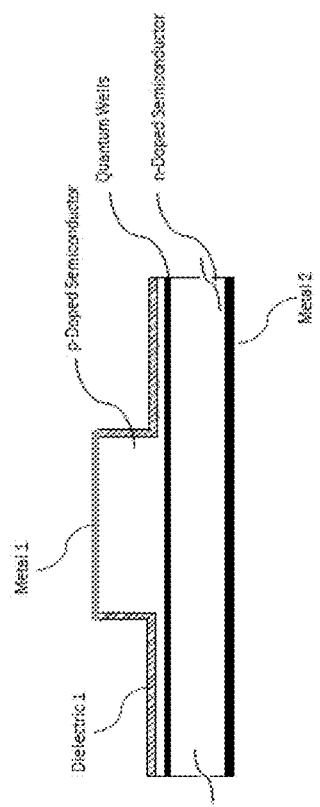

FIGS. 38(a)-38(b) are simplified cross-sectional views of a conventional laser diode structure. The semiconductor laser diode may be formed by etching a ridge into the semiconductor material and depositing a metal p-contact atop the ridge. The ridge may provide both optical and electrical confinement. The n-contact may be formed using a blanket metal deposition on the back side of the semiconductor. While the top (p-) side of the semiconductor is free to be patterned, there is little opportunity for patterning or adding materials directly to the n-side of the active region of the laser device since the active device region is formed as a series of thin layers overlying a thick substrate.

FIGS. 39(a)-39(b) are simplified cross-sectional views of a transferred semiconductor laser diode on a carrier wafer in accordance with some embodiments. In these examples, a laser diode making use of an epitaxial transfer technology is illustrated. The laser diode device may be formed by transferring the semiconductor material onto a substrate using metallic bonding. In this case, the optical waveguide may be formed by etching a ridge into the n-type semiconductor, where the etch depth is selected to penetrate into or through the active layers of the device and provide confinement of electrical current. In this example, the n-contact may be formed on the n-type ridge, and the p-contact may be formed as a blanket metal contact on the p-side of the semiconductor.

Figure 40B:
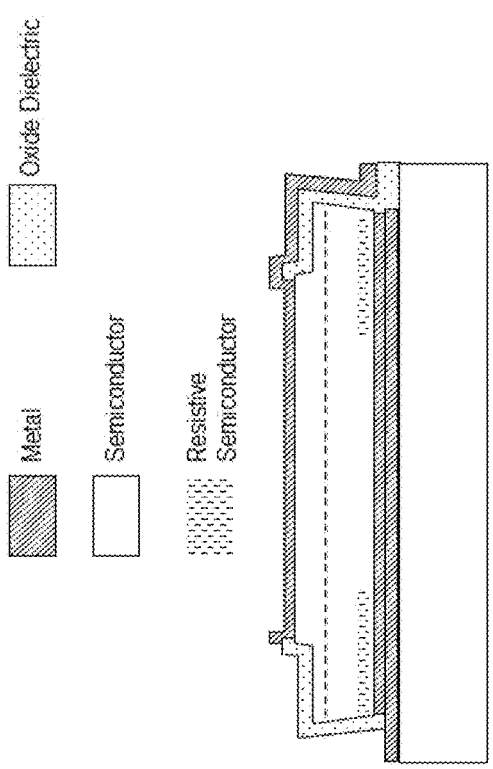
FIG. 40(a)-40(b) are simplified cross-sectional views of a transferred semiconductor laser diode with electrically resistive regions that provide current confinement in accordance with some embodiments.
Figure 40A:
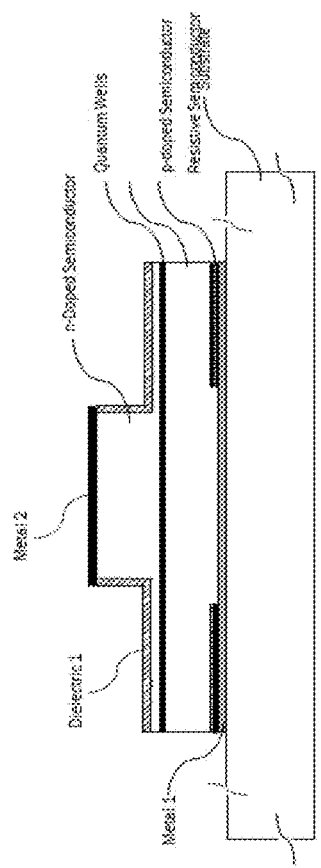

FIGS. 40(a)-40(b) are simplified cross-sectional views of a transferred semiconductor laser diode with electrically resistive regions that provide current confinement in accordance with some embodiments. In this example, the optical waveguide may be formed by etching a ridge into the n-type gallium and nitrogen containing layers. However, in this embodiment the etch depth may be shallower than the waveguide or active layers of the epitaxial structure. Since the remaining n-type gallium and nitrogen containing material above the active region will be highly electrically conductive and result in excessive current spreading, additional measures may be implemented to avoid current spreading. In an embodiment, the p-type contact regions outside of the p-type contact region underneath the ridge waveguide may be rendered to be electrically resistive such that when the blanket p-type contact layer is deposited, only the center region underneath the waveguide will have a low contact resistance forcing electrical injection into this region and provide current confinement. The p-type material may be rendered resistive in many ways such as ion implantation, plasma damage, local dopants, or oxide or dielectric layers can be deposited on the surface to provide current confinement. In this embodiment, the n-type contact may be made directly on top of the ridge waveguide.

Figure 41B:
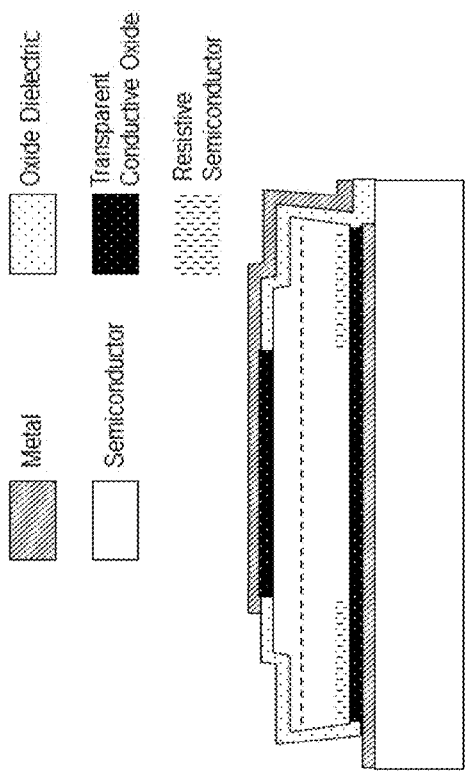
FIG. 41(a)-41(b) are simplified cross-sectional views of a transferred semiconductor laser diode with n-type and p-type contacts formed using transparent conductive oxide (TCO) layers in accordance with some embodiments.
Figure 41A:
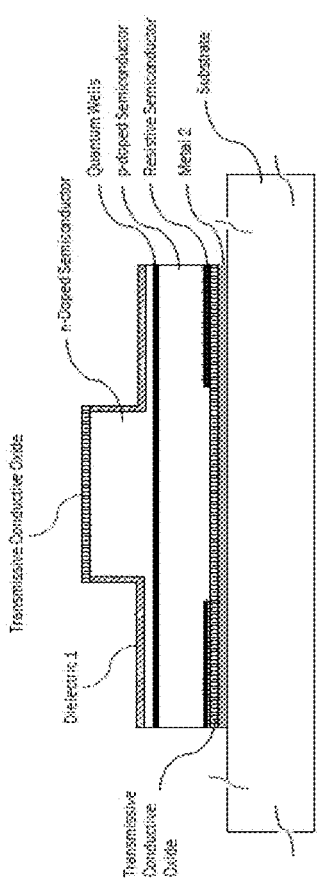

FIGS. 41(a)-41(b) are simplified cross-sectional views of a transferred semiconductor laser diode with n-type and p-type contacts formed using transparent conductive oxide (TCO) layers in accordance with some embodiments. In this example, the optical waveguide may be formed by etching a shallow ridge into the n-type gallium and nitrogen containing layers. In this embodiment, the p-type and n-type contacts may be formed using TCO layers that provide electrical injection and optical confinement with low loss. The TCO layers on either side may be patterned into a stripe to provide lateral optical confinement, or may be deposited as blanket layers and combined with passivation to provide current confinement. In this particular embodiment, the p-side TCO may be a blanket layer providing transverse optical confinement, whereas current confinement may be provided by passivation of the p-type semiconductor outside the laser stripe. The n-side TCO may be patterned into a stripe providing both lateral and transverse optical confinement. TCO layers cannot be used on both sides of conventional laser structures. This embodiment makes use of epitaxial transfer technology to enable a dual-side TCO clad laser diode device. In this embodiment, the n-side TCO, dielectric, and/or semiconductor may be patterned into a grating to form a DFB laser structure.

Figure 42B:
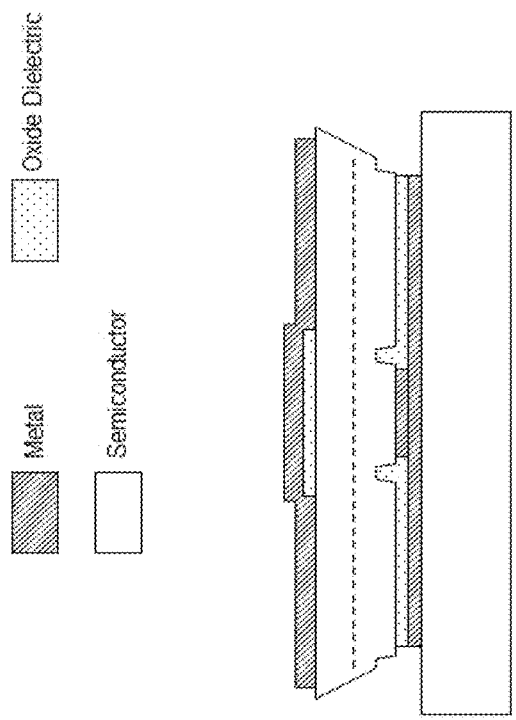
FIG. 42(a)-42(b) are simplified cross-sectional views of a transferred semiconductor laser diode with a TCO current blocking regions in accordance with some embodiments.
Figure 42A:
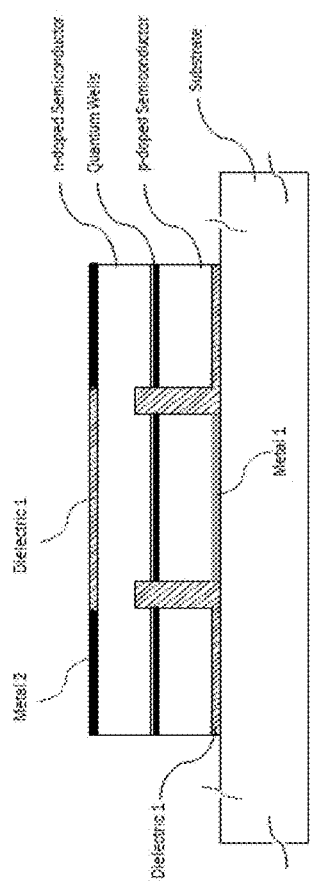

FIGS. 42(a)-42(b) are simplified cross-sectional views of a transferred semiconductor laser diode with a TCO current blocking regions in accordance with some embodiments. In an embodiment, a transparent dielectric waveguide material may be deposited above the n-type semiconductor as a stripe to form a low-loss, high index-contrast waveguide structure. Because the dielectric is electrically insulating, current confinement may no be achieved on the n-side of the device as in FIGS. 39(a)-39(b). Instead, current confinement may be defined on the p-side of the device similar to FIGS. 40(a)-40(b) and 41(a)-41(b). In this example, p-side current confinement may be achieved using a patterned structure in which the p-contact is aligned with the n-side oxide stripe, and the other portions of the p-side of the semiconductor are blocked from carrying current by a dielectric layer. In alternative embodiments, the p-type semiconductor may instead or additionally be made insulating using ion implantation, plasma damage, or local dopants similar to FIGS. 40(a)-40(b) and 41(a)-41(b). In an embodiment, the n-side dielectric and/or semiconductor may be patterned into a grating to form a DFB laser structure. In an embodiment, the p-side ridge etch depth may be selected to be either beyond the depth of the active region (a) for maximum optical and electrical confinement, or less than the depth of the active region (b) for reduced loss.

Figure 43B:
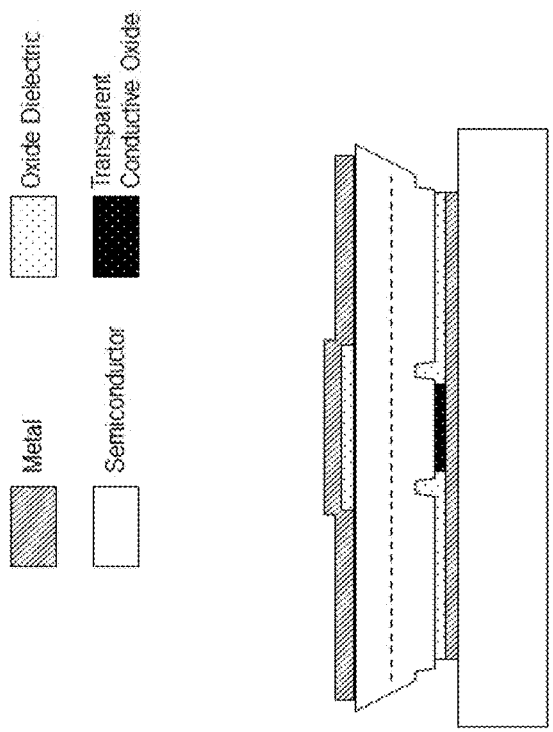
FIG. 43(a)-43(b) are simplified cross-sectional views of a transferred semiconductor laser diode with p-side current confinement and n-side DFB grating in accordance with some embodiments.
Figure 43A:
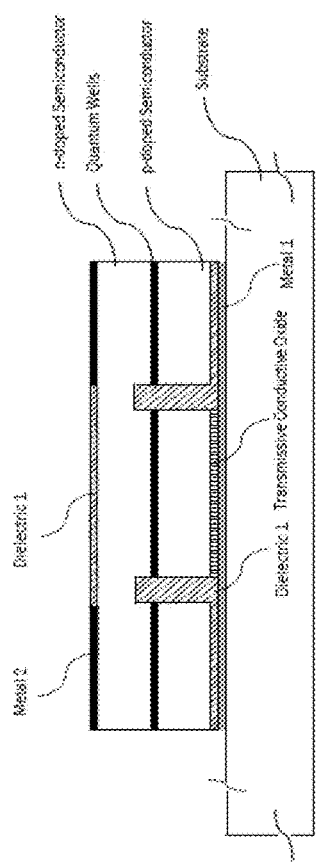

FIGS. 43(*a*)-43(*b*) are simplified cross-sectional views of a transferred semiconductor laser diode with p-side current confinement and n-side DFB grating in accordance with some embodiments. In this example, a transmissive conductive oxide material such as ITO may be used as the conductive p-contact aligned with the n-side oxide stripe, and the other portions of the p-side of the semiconductor may be electrically insulated by depositing a dielectric layer. The conductive oxide provides electrical contact and current confinement, while also acting as a low-refractive-index waveguiding layer. In an embodiment, the n-side dielectric and/or semiconductor may be patterned into a grating to form a DFB laser structure. In an embodiment, the p-side ridge etch depth may be selected to be either beyond the depth of the active region (a) for maximum optical and electrical confinement, or less than the depth of the active region (b) for reduced loss.

Figure 44B:
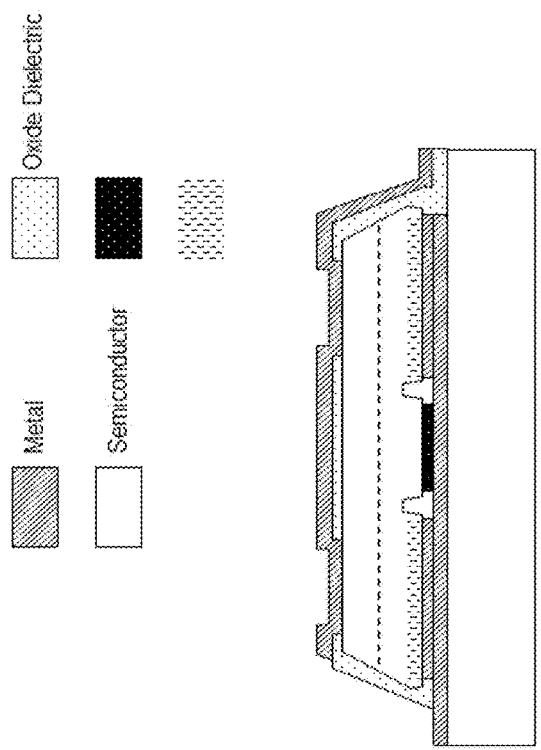
FIG. 44(a)-44(b) are simplified cross-sectional views of a transferred semiconductor laser diode with p-side current confinement and sloped mesas in accordance with some embodiments.
Figure 44A:
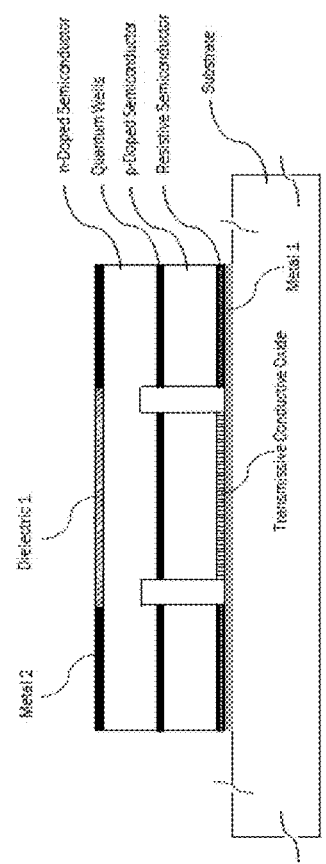

FIGS. 44(*a*)-44(*b*) are simplified cross-sectional views of a transferred semiconductor laser diode with p-side current confinement and sloped mesas in accordance with some embodiments. In this example, a transmissive conductive oxide material such as ITO may be used as the conductive p-contact aligned with the n-side oxide stripe, and the other portions of the p-side of the semiconductor may be rendered electrically insulating using ion implantation, plasma damage, doping, or some other method. In an embodiment, the n-side dielectric and/or semiconductor may be patterned into a grating to form a DFB laser structure. In an embodiment, an additional mesa trim etch on the sides of the mesa structure may be implemented. This etch can be used to form a sloped (see FIG. 44(*b*)) or stepped structure to improve metal connectivity along the mesa sidewall. This mesa etching technology may provide reliable metallization across mesa sidewall steps with heights greater than 1 micrometer. In an embodiment, the p-side ridge etch depth may be selected to be either beyond the depth of the active region (a) for maximum optical and electrical confinement, or less than the depth of the active region (b) for reduced loss.

Figure 45B:
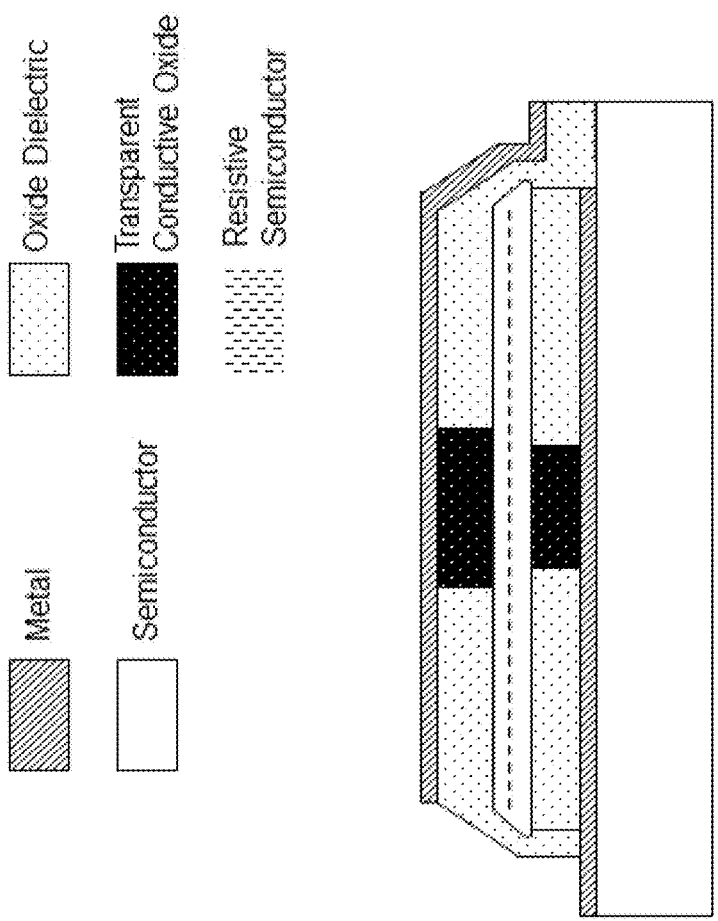
FIG. 45(a)-45(b) are simplified cross-sectional views of a transferred semiconductor laser diode with optical and electrical confinement provided by TCO layers in accordance with some embodiments.
Figure 45A:
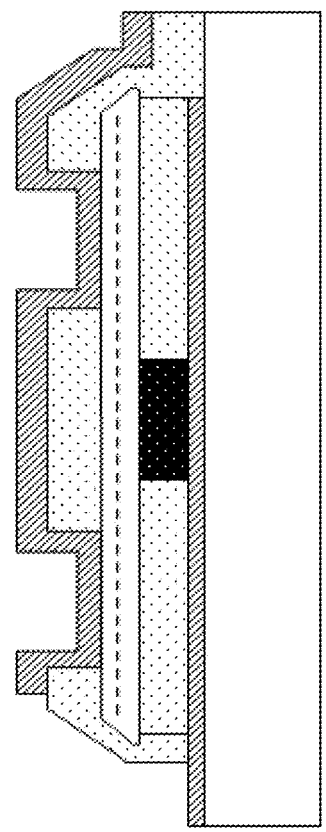

FIGS. 45(*a*)-45(*b*) are simplified cross-sectional views of a transferred semiconductor laser diode with optical and electrical confinement provided by TCO layers in accordance with some embodiments. In this example, the semiconductor material may be made thinner than the oxide layers, such that no ridge is needed and all of the lateral optical and electrical confinement is provided by the patterned TCO and/or metal contacts. In an embodiment, the semiconductor material may provide gain, while the passive oxide cladding layers may form the laser stripe geometry and serve as the cladding layers. This thin-film laser diode structure is made possible by the epitaxial transfer method described in this disclosure and is not possible in the prior art which cannot achieve dual-side oxide cladding. Because the n-type semiconductor may provide current spreading, the n-side cladding may be formed by either a dielectric insulating material (a), or a TCO (b). In this embodiment, the n-side TCO, dielectric, and/or semiconductor may be patterned into a grating to form a DFB laser structure.

In one embodiment of the present invention 2 or more laser, N, diodes using grating features are configured for spectral beam combining. In this embodiment the grating features are configured to lock the lasing wavelength of the 2 to N laser diodes to specific predetermined wavelengths that are different from each other. The gratings can be used to "lock" the peak wavelengths to specified narrow bands with a spectral linewidth of less than 1 nm, less than 0.5 nm, less than 0.1 nm, or less than 0.05 nm. The output beam of the 2 to N laser diodes are then combined into a single spatial beam using spectral beam combining optics that are designed for the specific output wavelengths of the 2 to N laser diodes. In one example a high power blue laser diode module is formed by spectrally beam combining blue laser diodes with wavelengths around 450 nm. As an example N laser diodes with gratings and gain medium designed to establish lasing at wavelengths between 435 nm and 460 nm are spectrally beam combined. For example, the separate peak wavelengths could be spaced across this range by 0.5 nm, 1 nm, 2 nm, 3 nm, or more such that 10 or more, 20 or more, 40 or more, or 60 or more lasers could be spectrally beam combined. With each laser diode operating with 10 mW or more, 1 W or more, 3 W or more, 6 W or more, or 10 W or more, the power of the output beam could achieve total power levels of 1 W or more, 20 W or more, 60 W or more, 100 W or more, 250 W or more, 500 W or more, or 1 KW or more. In some applications spectral beam combining can be combined with spatial beam combining and/or polarization beam combining to achieve even higher power or larger wavelength ranges. In one example of a 1 KW laser module, ten submodules are configured with 10 laser diodes operating at 5 watts of optical output power with distinct wavelengths in the range of 445 nm to 455 m with peak wavelengths separated by ~1 nm can be spectrally beam combined with a beam combing optic such as a grating to form a beam with ~50 watts. The ten ~50 watt laser beams from the submodules are then spatially beam combined into the main laser module with a single fiber carrying a ~1 KW laser beam. Further power scaling could be achieved to realize a ~2 KW laser module by polarization combining two of the 1 KW laser modules. The optical fiber core diameter used in the submodules or the main module could be 50 microns or less, 100 microns or less, 200 microns or less, 500 microns or less, 1 mm or less, or greater than 1 mm. In some embodiments, the peak wavelengths of the beam combined module are in the violet wavelength range of 395 nm to 420 nm, in the 420 nm to 470 nm range, 470 nm to 500 nm range, the green wavelength range of 500 nm to 550 nm, or other wavelength ranges, or a combination of the wavelength ranges. Of course these configurations are merely examples and are not intended to be examples according to the present invention.

In some embodiments of the present invention using spectral beam combining, laser diodes with grating structures operating with peak lasing wavelengths in different color regions or different portions of the electromagnetic spectrum are beam combined. For example, an integrated RGB laser module could be formed by spectrally beam combining a blue laser diode, a green laser diode, and red laser diode. In yet another example, one or more laser diodes operating in the IR wavelength range could be combined with one or more laser diodes operating in the visible wavelength range, or one or more laser diodes operating in the ultraviolet wavelength range could be combined with one or more laser diode operating in the visible wavelength range. Of course this present invention can cover any possible combination of different wavelengths, different beam combining methods, and different modules or devices using grating structures according to the present invention. In some embodiments, other types of devices such as superluminescent diodes or light emitting diodes are deployed instead of laser diodes. Of course these configurations are merely examples and are not intended to be examples according to the present invention.

In one variant of the present invention using a beam combining approach, arrays of laser diodes utilizing the grating structures are beam combined. The arrays could be 1-dimensional linear arrays, 2-dimensional arrays, or any variant type of array. In one preferred embodiment the arrays are formed using the epitaxial transfer technology according to the present invention. By using the transfer technology different wavelength ranges from the light emitting gain material or light emitting epitaxial material can be included in the array on the same carrier to result in a single-chip multi emitter device structure. In the beam combined device or module utilizing the 1D or 2D array of laser devices with grating structures, spectral beam combining, spatial beam combining, polarization beam combining, or any combination thereof can be realized. The beams can be combined to aggregate the total power in the final output beam for applications such as industrial, welding, cutting, 3D printing, large display applications, small wearable display applications, lighting applications, or phosphor pumping for wavelength conversion applications. In other embodiments the combined beam contains beams emitting in red, blue, and green wavelengths for RGB display modules. In yet other embodiments the wavelengths in the combined beam can be using for lighting, display, sensing, communication, visible illumination, infrared illumination, and/or sterilization or disinfecting. Of course these configurations are merely examples and are not intended to be examples according to the present invention.

As described in this invention, grating structures can be used to achieve vertical [orthogonal to chip plane] light emission from the chip. Vertically emitting lasers or superluminescent diodes can be arrayed in 1D or 2D configurations. In these configurations the laser diodes within the array can be electrically configured in series, parallel, or a series parallel type of circuit and can be driven in an individually addressable manner or electrically addressed all together, in groups or subgroups, blocks or based on certain regions of the chip in any type of fashion or geometry. The vertically emitted light can be coupled to optics such as collimating optics or focusing optics and can be coupled to wavelength converters. In some example embodiments, 2D arrays of high power blue laser diodes with vertically emission are configured on the same chip or submount. For example, the 2D array could be a 2×2 array, a 5×5 array, a 10×10 array, a 100×100 array, or even a 1000×1000 array, or any other arrays including asymmetric arrays or 1D arrays. The laser diodes in the array can operate with power levels of less than 1 mW, greater than 1 mW, greater than 10 mW, greater than 100 mW, greater than 1 W, greater than 10 W, or greater. The lasers can operate with wavelengths in the ultraviolet wavelength range, the visible wavelength range such as violet, blue, green, and red, or the infrared wavelength range. In one embodiment a 2D array of M×N blue laser diodes operating in the 430 nm to 470 nm range is configured on a single chip or chip on submount. The vertical output emission from the M×N laser diodes is then coupled into a collimating optic member that could have an array of collimating optical elements aligned with the output laser beams from the array. The collimating optic is configured to collimate and transmit the 2D array of parallel laser beams. These parallel laser beams could then be beam combined into a single beam and routed to an intended location. In one example application, the beams would be combined into a single beam and used to pump a phosphor in a display or lighting application. In another embodiment, the multiple parallel laser beams from the M×N array are incident on a phosphor member and the M×N laser diodes are individually addressable. With the 2D array of laser diodes pumping the phosphor in an individually addressable configuration, a dynamic light source can be created, which could be used for dynamic or adaptive lighting applications or in display applications. The laser output spots on the phosphor would essentially serve as pixels in the dynamic light source. In this embodiment including a phosphor member, there may or may not be an intermediate optical member between the output of the laser diode and the phosphor. In some embodiments, the laser beams are directly pumping the phosphor. The phosphor could be configured to generate a white light for a white light source or the phosphor members or wavelength converter members could be configured to emit multiple colors such as red, green, blue, yellow, or any subset, combination, or other colors. In the multiple color embodiment, a full color RGB display could be created. The phosphor can be shaped, patterned, or modified to create effects such as improved pixel isolation. Of course there can be many other embodiments such as different wavelength laser diodes such as violet or green laser diodes, a combination of different wavelengths, different type of optics or optical members coupled to the output of the laser diodes, and various different kinds of phosphors coupled to the laser beams including YAG phosphors and others.

Merely by way of example, the present invention can be applied to applications such as white or infrared lighting, white or infrared spot lighting, general lighting, specialty lighting, dynamic lighting, smart lighting, flash lights, automobile headlights, automobile interior lighting, automobile position lighting and any lighting function, mobile machine lighting such as autonomous machine lighting and drone lighting, all-terrain vehicle lighting, light, sensing or communication systems, navigation systems, advanced driver assistance systems (ADAS), autonomous or semi-autonomous mobile machines and robots, sources used in recreational sports such as biking, surfing, running, racing, boating, light sources used for drones, planes, robots, other mobile or robotic applications, safety, counter measures in defense applications, multi-colored lighting, lighting for flat panels, medical applications including cancer treatment or ablation or cosmetic surgery, metrology and measurement applications, beam projectors and other display devices and systems, frequency doubling systems such as second harmonic generation (SHG) systems, SHG systems combined with nonlinear crystals like barium borate (BBO) for producing wavelengths in the 200 nm to 400 nm range, wearable displays, augmented reality systems, mixed reality systems, virtual reality systems, high intensity lamps, spectroscopy, entertainment, theater, music, and concerts, analysis fraud detection and/or authenticating, tools, purification, sterilization, anti-virus, anti-bacterial, water treatment, security systems, laser dazzlers, targeting, communications, LiFi, visible light communications (VLC), sensing, detecting, distance detecting, Light Detection And Ranging (LIDAR), smart infrastructure such as smart factories or smart homes, transformations, transportations, leveling, curing and other chemical treatments, heating, cutting and/or ablating, welding, marking, laser direct imaging, pumping other optical devices, other optoelectronic devices and related applications, storage systems, quantum computing, quantum cryptography, quantum storage, and source lighting and the like.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and 1 is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

REFERENCES

1. S. Masui, K. Tsukayama, T. Yanamoto, T. Kozaki, S. Nagahama and T. Mukai, Japanese J. Appl. Physics, Part 2 Lett., 45, 749 (2006)
2. D. Hofstetter, L. Romano, T. Paoli, D. Bour and M. Kneissl, Appl. Phys. Lett., 76 (17), 2337 (2000)
3. R. Hofmann, H.-P. Gauggel, U. Griesinger, H. Grabeldinger, F. Adler, P. Ernst, H. Bolay, V. Harle, f. Scholz, H. Schweizer and M. Pilkuhn, Appl. Phys. Lett., 69, 2068 (1996)
4. H. Zhang, D. Cohen, P. Chan, M. Wong, S. Mehari, D. Becerra, S. Nakamura and S. DenBaars, Optics Lett., 44 (12), 3106 (2019)
5. H. Zhang, D. Cohen, P. Chan, M. Wong, P. Li, H. Li, S. Nakamura and S. DenBaars, Optics Lett., 45 (20), 5844 (2020)
6. H. Zhang, D. Cohen, P. Chan, M. Wong, S. Mehari, S. Nakamura and S. DenBaars, Proc. Of SPIE 11301, 1130102 (2020)
7. Z. Deng, J. Li, M. Liao, W. Xie and S. Luo, Micromachines, 10, 699 (2019)
8. J. Holguin-Lerma, T. Ng and B. Ooi, Appl. Phys. Express, 12, 042007 (2019)
9. J. Kang, H. Wenze, E. Freier, V. Hoffmann, O. Broz, J. Fricke, L. Sulmoni, M. Matalla, C. Stolmacker, M. Kneissl, M. Weyers and S. Einfeldt, Opt. Lett., 45 (4), 935 (2020)
10. H. Schweizer, H. Grabeldinger, V. Dumitru, M. Jetter, S. Bader, G. Bruderl, A. Weimar, A. Lell and V. Harle, Phys. Stat. Sol. (a), 192 (2), 301 (2002)
11. T. Slight, O. Odedina, W. Meredish, K. Docherty and A. Kelly, Proc. Of SPIE, 9748, 97481A (2016)

What is claimed is:

1. A method for manufacturing an optical device, the method
    providing a carrier wafer;
    providing a first substrate having a first surface region;
    forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material;
    patterning the first epitaxial material and forming mesas to form a plurality of first dice arranged in an array;
    forming a first interface region overlying the first epitaxial material;
    bonding the first interface region of at least a fraction of the plurality of first dice to the carrier wafer to form bonded structures;
    releasing the bonded structures to transfer a first plurality of dice to the carrier wafer, the first plurality of dice transferred to the carrier wafer forming mesa regions on the carrier wafer;
    forming grating features in the one or more n-type gallium and nitrogen containing layers of each of the mesa regions; and
    forming an optical waveguide in each of the mesa regions, the optical waveguide configured as a cavity to form a laser diode of the electromagnetic radiation; wherein the grating features in the one or more n-type gallium and nitrogen containing layers are configured to provide feedback to the electromagnetic radiation.

2. The method of claim 1, wherein the cavity is configured as a laser diode operating in a 390 nm to 550 nm wavelength range, and wherein at least one of:
    the grating features are configured to provide optical feedback to form a distributed feedback laser diode;
    the grating features are configured as a $1^{st}$ order grating, a $2^{nd}$ order grating, a $3^{rd}$ order grating, a $4^{th}$ order grating, or a higher order grating;
    the grating features are configured to provide a single frequency operation of the laser diode;
    the grating features are configured to provide a spectral width of the electromagnetic radiation characterized by a full width at half maximum (FWHM) of less than 1 nm, less than 0.5 nm, less than 0.2 nm, or less than 0.1 nm; or
    the grating features are configured to provide a vertical coupling of the electromagnetic radiation in a direction orthogonal to the one or more n-type gallium and nitrogen containing layers, the one or more light emitting gallium and nitrogen containing layers, and the one or more p-type gallium and nitrogen containing layers.

3. The method of claim 1, wherein forming the grating features includes:
    planarizing the carrier wafer with the first plurality of dice by depositing a fill layer and using a chemical mechanical polishing (CMP) process to planarize the fill layer, wherein planarizing the carrier wafer includes depositing a stop layer underlying the fill layer, and wherein the CMP process planarized the fill layer and stops at the stop layer, the fill layer including at least one of a nitride, an oxide, a polymer, a spin-on material, or a combination of these materials, and the stop layer including at least one of a nitride, an oxide, a metal, or a polymer;
    defining the grating features using one or more lithography steps; and
    forming the grating features using one or more etch processes.

4. The method of claim 1, further comprising forming an n-contact overlying the grating features of each of the mesa regions, wherein the n-contact includes a gain section for controlling power and a mirror section for injecting current.

5. The method of claim 1, further comprising forming an n-contact overlying the grating features of each of the mesa regions, wherein the n-contact includes a gain section for controlling power and front and back mirror sections for injecting current.

6. The method of claim 1, further comprising:
    transferring a second plurality of dice to the carrier wafer, wherein the second plurality of dice are configured to emit electromagnetic radiation at a second wavelength; and forming second grating features in one or more n-type gallium and nitrogen containing layers of each of the second plurality of dice.

7. The method of claim 1, further comprising:
transferring a second plurality of dice and a third plurality of dice to the carrier wafer, wherein the second plurality of dice are configured to emit electromagnetic radiation at a second wavelength, and the third plurality of dice are configured to emit electromagnetic radiation at a third wavelength; and
processing the carrier wafer with the first plurality of dice, the second plurality of dice, and the third plurality of dice to form an RGB emitting laser diode.

8. The method of claim 1, wherein the cavity is configured with an optical waveguide coupled to an amplifier to provide a master-oscillator power amplifier (MOPA) device.

9. The method of claim 1, further comprising:
forming an n-side dielectric region overlying the one or more n-type gallium and nitrogen containing layers;
forming n-contacts adjacent to the n-side dielectric region;
forming a p-contact vertically aligned with the n-side dielectric region, the p-contact electrically coupled to the one or more p-type gallium and nitrogen containing layers to provide vertical optical confinement;
forming high resistivity regions on each side of the p-contact to block current flow through adjacent portions of the one or more p-type gallium and nitrogen containing layers; and
forming a p-side ridge aligned with the p-contact to provide lateral optical confinement.

10. The method of claim 1, further comprising:
forming an n-side dielectric region overlying the one or more n-type gallium and nitrogen containing layers;
forming n-contacts adjacent to the n-side dielectric region;
forming a transmissive conductive oxide (TCO) vertically aligned with the n-side dielectric region, the TCO electrically coupled to the one or more p-type gallium and nitrogen containing layers to provide vertical optical confinement;
forming high resistivity regions on each side of the TCO to block current flow through adjacent portions of the one or more p-type gallium and nitrogen containing layers; and
forming a p-side ridge aligned with the TCO to provide lateral optical confinement.

11. The method of claim 1, further comprising:
forming an n-side dielectric region overlying the one or more n-type gallium and nitrogen containing layers;
forming n-contacts adjacent to the n-side dielectric region;
forming a transmissive conductive oxide (TCO) vertically aligned with the n-side dielectric region, the TCO electrically coupled to the one or more p-type gallium and nitrogen containing layers to provide vertical optical confinement;
forming a p-side ridge aligned with the TCO to provide lateral optical confinement;
forming high resistivity regions in at least one of the one or more p-type gallium and nitrogen containing layers, the high resistivity regions formed on opposite sides of the p-side ridge from the TCO to block current flow through adjacent portions of the one or more p-type gallium and nitrogen containing layers; and
forming sloped sidewalls on the mesa regions so that a top surface area of the one or more n-type gallium and nitrogen containing layers is less than a bottom surface area of the one or more p-type gallium and nitrogen containing layers.

12. The method of claim 1, wherein the grating features are configured to provide optical feedback to form a distributed Bragg reflector laser diode.

13. The method of claim 12, wherein Bragg gratings are formed on both ends of the cavity.

14. The method of claim 12, wherein a coating for a high reflective mirror is disposed on one end of the cavity.

15. The method of claim 1, wherein the grating features are configured to provide optical feedback to form a distributed feedback laser diode.

16. A method for manufacturing an optical device, the method comprising:
providing a carrier wafer;
providing a first substrate having a first surface region;
forming a first gallium and nitrogen containing epitaxial material overlying the first surface region, the first epitaxial material comprising a first release material overlying the first substrate and one or more n-type gallium and nitrogen containing layers, one or more light emitting gallium and nitrogen containing layers comprising an active region configured to emit electromagnetic radiation at a first wavelength, and one or more p-type gallium and nitrogen containing layers overlying the first release material;
patterning the first epitaxial material and forming mesas to form a plurality of first dice arranged in an array;
forming a first interface region overlying the first epitaxial material;
bonding the first interface region of at least a fraction of the plurality of first dice to the carrier wafer to form bonded structures;
releasing the bonded structures to transfer a first plurality of dice to the carrier wafer, the first plurality of dice transferred to the carrier wafer forming mesa regions on the carrier wafer;
forming grating features in a material overlying the one or more n-type gallium and nitrogen containing layers of each of the mesa regions, or in a material overlying the one or more n-type gallium and nitrogen containing layers and in the one or more n-type gallium and nitrogen containing layers of each of the mesa regions; and
forming an optical waveguide in each of the mesa regions, the optical waveguide configured as a cavity to form a laser diode of the electromagnetic radiation; wherein the grating features are configured to provide feedback to the electromagnetic radiation.

17. The method of claim 16, wherein the material overlying the one or more n-type gallium and nitrogen containing layers comprises a dielectric or transparent conducive oxide (TCO) material.

18. The method of claim 16, wherein the material overlying the one or more n-type gallium and nitrogen containing layers comprises a silicon oxide, silicon nitride, or transparent conducive oxide (TCO) material.

19. The method of claim 16, wherein the cavity is configured as a laser diode operating in a 390 nm to 550 nm wavelength range, and wherein at least one of:
the grating features are configured to provide optical feedback to form a distributed feedback laser diode;
the grating features are configured as a $1^{st}$ order grating, a $2^{nd}$ order grating, a $3^{rd}$ order grating, a $4^{th}$ order grating, or a higher order grating;

the grating features are configured to provide a single frequency operation of the laser diode;

the grating features are configured to provide a spectral width of the electromagnetic radiation characterized by a full width at half maximum (FWHM) of less than 1 nm, less than 0.5 nm, less than 0.2 nm, or less than 0.1 nm; or the grating features are configured to provide a vertical coupling of the electromagnetic radiation in a direction orthogonal to the one or more n-type gallium and nitrogen containing layers, the one or more light emitting gallium and nitrogen containing layers, and the one or more p-type gallium and nitrogen containing layers.

20. The method of claim 16, wherein forming the grating features includes:

planarizing the carrier wafer with the first plurality of dice by depositing a fill layer and using a chemical mechanical polishing (CMP) process to planarize the fill layer, wherein planarizing the carrier wafer includes depositing a stop layer underlying the fill layer, and wherein the CMP process planarized the fill layer and stops at the stop layer, the fill layer including at least one of a nitride, an oxide, a polymer, a spin-on material, or a combination of these materials, and the stop layer including at least one of a nitride, an oxide, a metal, or a polymer;

defining the grating features using one or more lithography steps; and forming the grating features using one or more etch processes.

21. The method of claim 16, further comprising forming an n-contact overlying the grating features of each of the mesa regions, wherein the n-contact includes a gain section for controlling power and a mirror section for injecting current.

22. The method of claim 16, further comprising forming an n-contact overlying the grating features of each of the mesa regions, wherein the n-contact includes a gain section for controlling power and front and back mirror sections for injecting current.

23. The method of claim 16, further comprising:

transferring a second plurality of dice to the carrier wafer, wherein the second plurality of dice are configured to emit electromagnetic radiation at a second wavelength;

forming second grating features in a second material overlying the one or more n-type gallium and nitrogen containing layers of each of the second plurality of dice.

24. The method of claim 16, further comprising:

transferring a second plurality of dice and a third plurality of dice to the carrier wafer, wherein the second plurality of dice are configured to emit electromagnetic radiation at a second wavelength, and the third plurality of dice are configured to emit electromagnetic radiation at a third wavelength; and processing the carrier wafer with the first plurality of dice, the second plurality of dice, and the third plurality of dice to form an RGB emitting laser diode.

25. The method of claim 16, wherein the cavity is configured with an optical waveguide coupled to an amplifier to provide a master-oscillator power amplifier (MOPA) device.

* * * * *